United States Patent
Inagaki et al.

(10) Patent No.: US 6,876,554 B1
(45) Date of Patent: Apr. 5, 2005

(54) PRINTING WIRING BOARD AND METHOD OF PRODUCING THE SAME AND CAPACITOR TO BE CONTAINED IN PRINTED WIRING BOARD

(75) Inventors: Yasushi Inagaki, Ibi-gun (JP); Motoo Asai, Ibi-gun (JP); Dongdong Wang, Ibi-gun (JP); Hideo Yabashi, Ibi-gun (JP); Seiji Shirai, Ibi-gun (JP)

(73) Assignee: Ibiden Co., Ltd., Ogaki (JP)

( * ) Notice: Subject to any disclaimer, the term of this patent is extended or adjusted under 35 U.S.C. 154(b) by 51 days.

(21) Appl. No.: 09/830,361
(22) PCT Filed: Sep. 1, 2000
(86) PCT No.: PCT/JP00/05972
§ 371 (c)(1), (2), (4) Date: Apr. 25, 2001
(87) PCT Pub. No.: WO01/19149
PCT Pub. Date: Mar. 15, 2001

(30) Foreign Application Priority Data

| Sep. 2, 1999 | (JP) | ............................................. 11-248311 |
| Dec. 20, 1999 | (JP) | ............................................. 11-360306 |
| Apr. 5, 2000 | (JP) | ..................................... 2000-103730 |
| Apr. 5, 2000 | (JP) | ..................................... 2000-103731 |
| Apr. 5, 2000 | (JP) | ..................................... 2000-103732 |
| Apr. 5, 2000 | (JP) | ..................................... 2000-103733 |
| Jul. 21, 2000 | (JP) | ..................................... 2000-221349 |
| Jul. 21, 2000 | (JP) | ..................................... 2000-221351 |
| Jul. 21, 2000 | (JP) | ..................................... 2000-221352 |
| Jul. 21, 2000 | (JP) | ..................................... 2000-221353 |
| Jul. 21, 2000 | (JP) | ..................................... 2000-221354 |

(51) Int. Cl.[7] .............................................. H05K 1/18
(52) U.S. Cl. ...................................... 361/763; 361/765
(58) Field of Search ................................ 361/760–766, 361/790–795, 306.1–306.2, 321.3; 174/260–266; 257/700–704, 777–778, 691–692, 723–724; 29/851–852; 428/209–210

(56) References Cited

U.S. PATENT DOCUMENTS

| 4,800,459 A | | 1/1989 | Takagi et al. |
| 5,027,253 A | * | 6/1991 | Lauffer et al. ............. 361/321.4 |
| 5,108,825 A | * | 4/1992 | Wojnarowski et al. ....... 428/209 |
| 5,161,093 A | * | 11/1992 | Gorczyca et al. ............ 361/795 |
| 5,250,843 A | * | 10/1993 | Eichelberger ................ 257/692 |
| 5,353,498 A | * | 10/1994 | Fillion et al. .................. 29/840 |
| 5,366,906 A | * | 11/1994 | Wojnarowski et al. ......... 438/17 |
| 5,432,677 A | | 7/1995 | Mowatt et al. |
| 5,565,706 A | * | 10/1996 | Miura et al. ................. 257/723 |
| 5,875,100 A | | 2/1999 | Yamashita |
| 6,002,592 A | * | 12/1999 | Nakamura et al. .......... 361/760 |
| 6,153,290 A | * | 11/2000 | Sunahara ..................... 428/210 |
| 6,274,391 B1 | * | 8/2001 | Wachtler et al. ............... 438/6 |

FOREIGN PATENT DOCUMENTS

| DE | 42 23 371 | | 1/1994 |
| EP | 0 451 541 | | 10/1991 |
| FR | 2 629 667 | | 10/1989 |
| JP | 06-046615 | * | 3/1994 |

OTHER PUBLICATIONS

Patent Abstract of Japan, JP 11–126978, May 11, 1999, A. Fujisaki.
Patent Abstract of Japan, JP 54–157296, Dec. 12, 1979, M. Takatani.

(Continued)

Primary Examiner—Kamand Cuneo
Assistant Examiner—Tuan Dinh
(74) Attorney, Agent, or Firm—Oblon, Spivak, McClelland, Maier & Neustadt, P.C.

(57) ABSTRACT

Chip capacitors 20 are provided in a printed circuit board 10. In this manner, the distance between an IC chip 90 and each chip capacitor 20 is shortened, and the loop inductance is reduced. In addition, the chip capacitors 20 are accommodated in a core substrate 30 having a large thickness. Therefore, the thickness of the printed circuit board does not become large.

4 Claims, 73 Drawing Sheets

OTHER PUBLICATIONS

Patent Abstracts of Japan, JP 8–241827, Sep. 17, 1996, K. Kubota.

Patent Abstracts of Japan, JP 10–13024, Jan. 16, 1998, S. Nakamura.

Patent Abstracts of Japan, JP 4–283987, Oct. 8, 1992, H. Nakamura.

Patent Abstracts of Japan, JP 11–214819, Aug. 6, 1999, M. sasaki.

* cited by examiner

Fig. 6
(A)
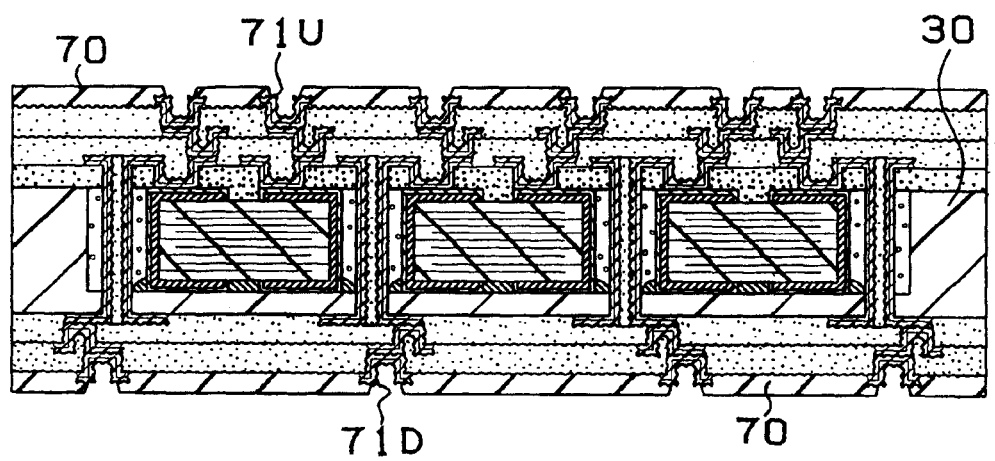
(B)
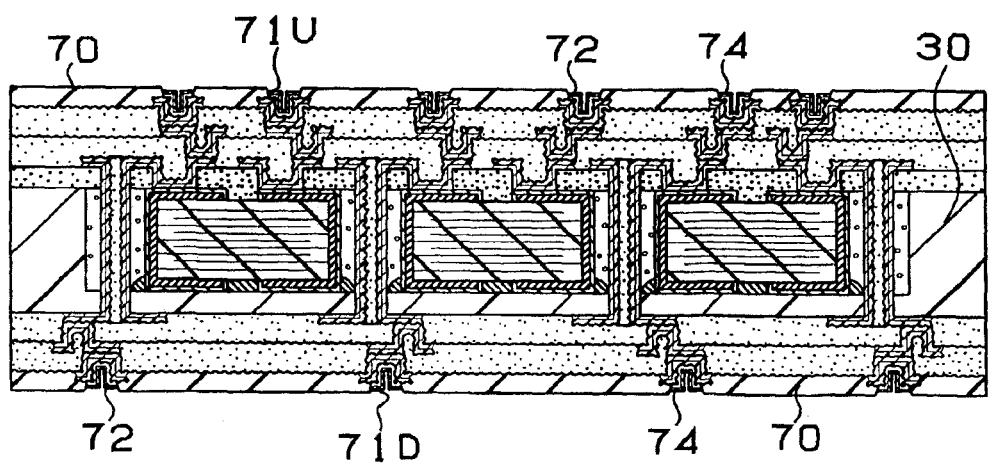

Fig. 14
(A)
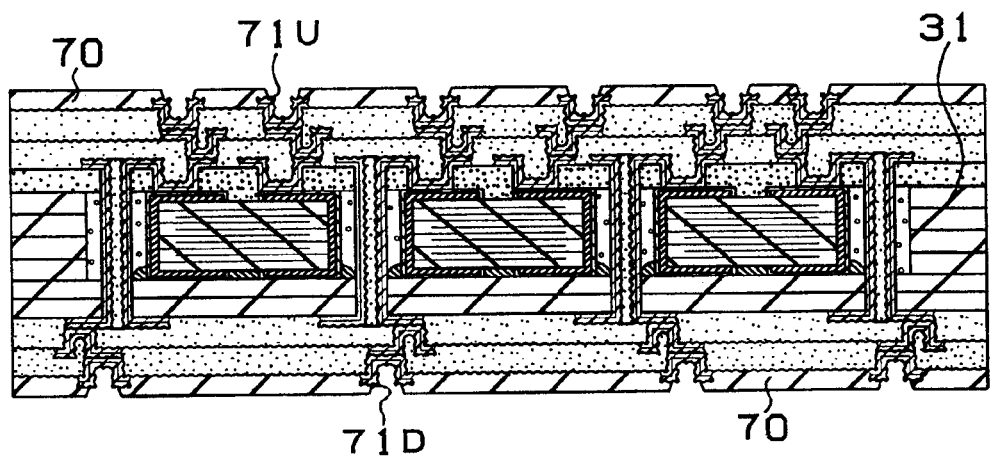
(B)
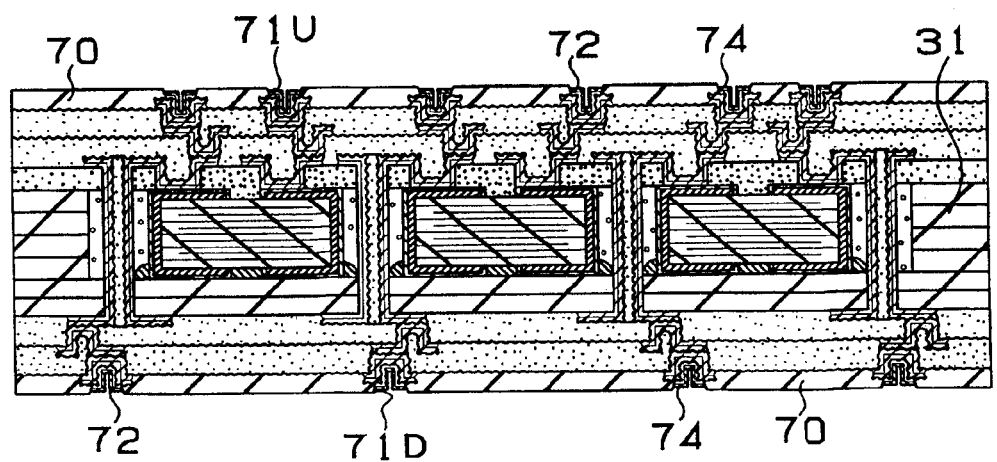

Fig. 17
(A)
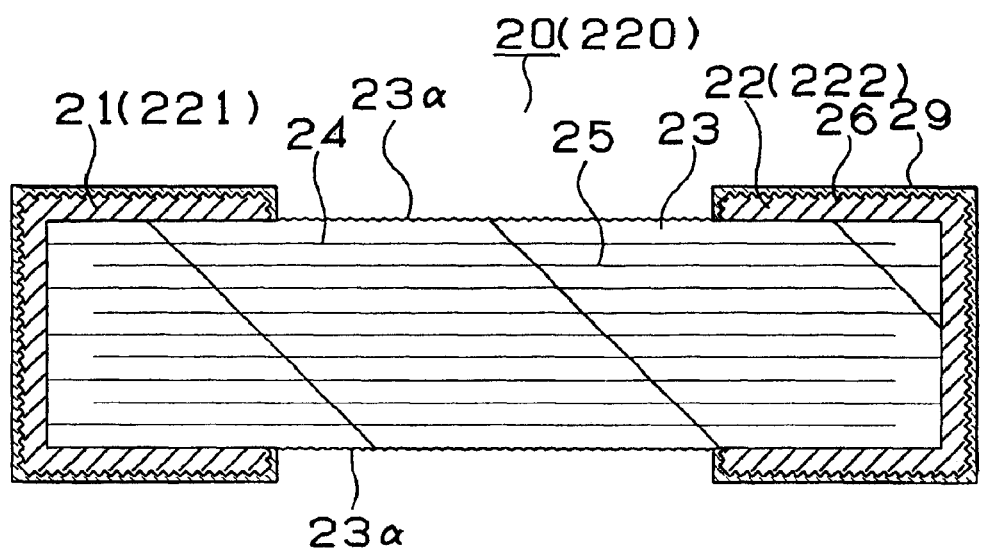
(B)
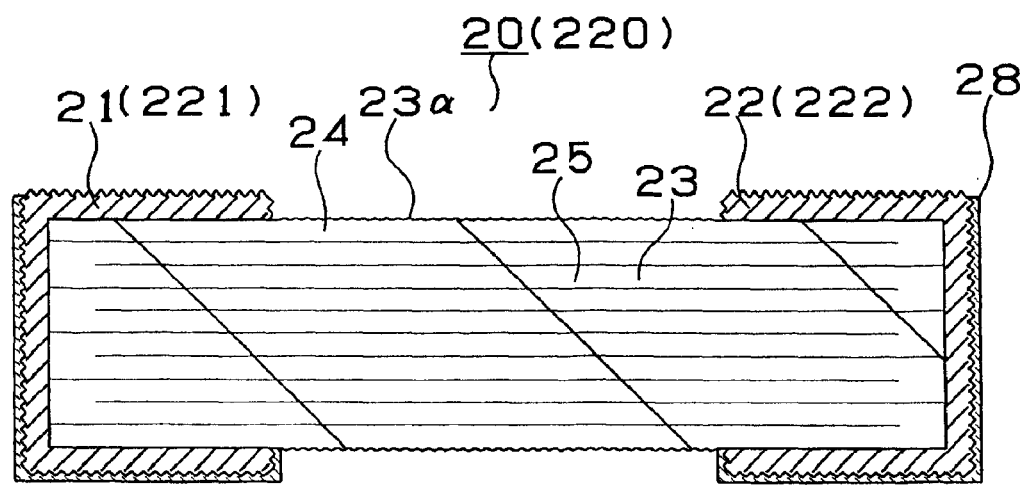

Fig. 18
(A)
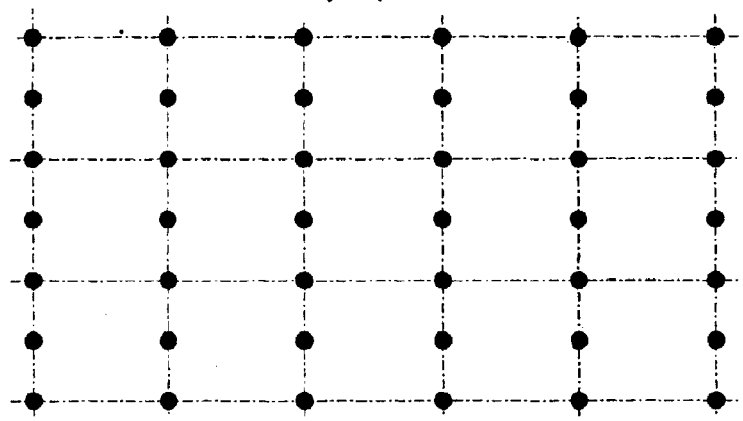
(B)
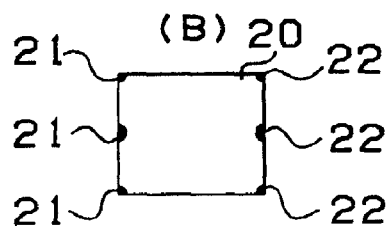
(C)
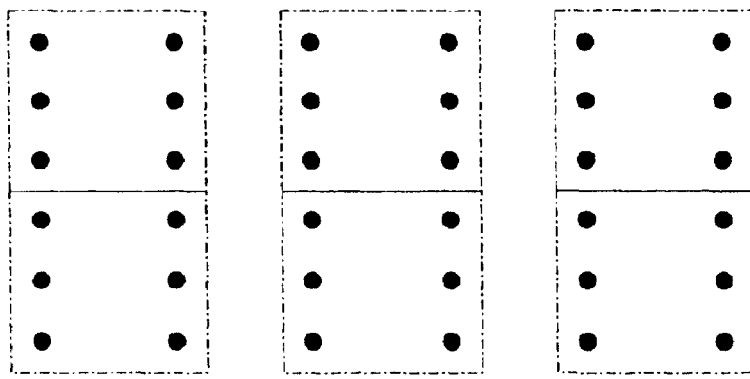
(D)
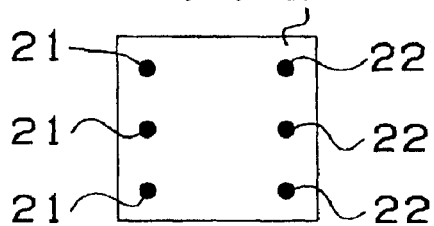

Fig. 20
(A)
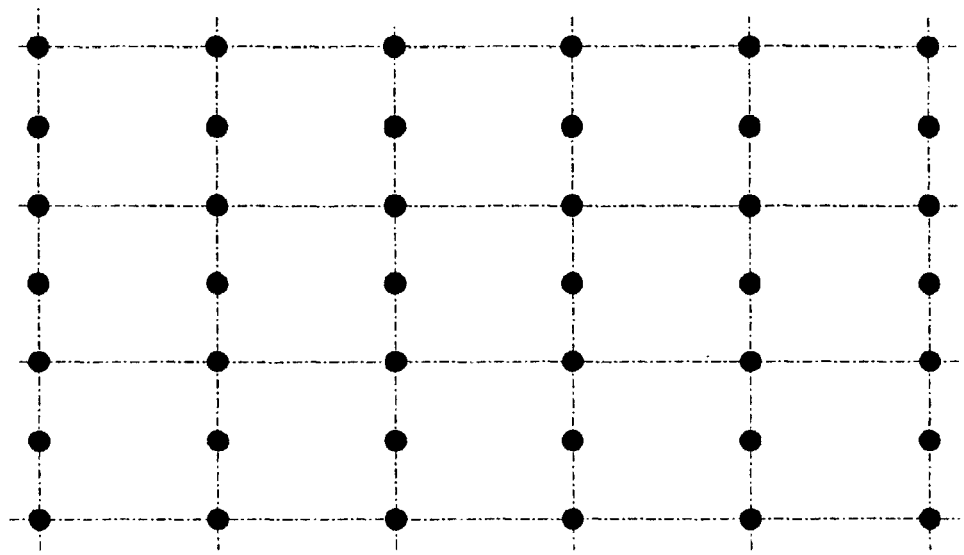
(B)
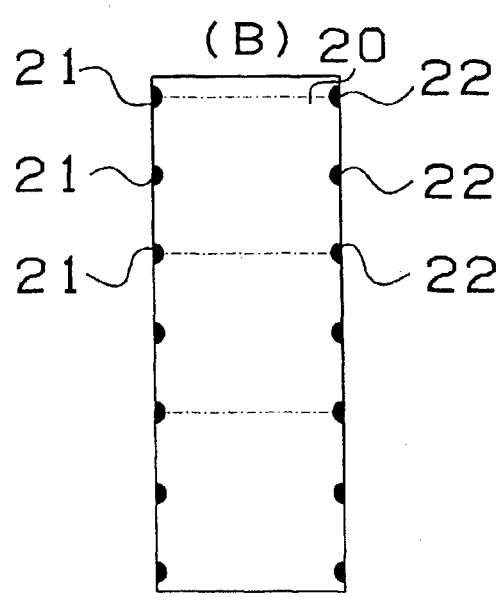

Fig. 43

Fig. 45
(A)
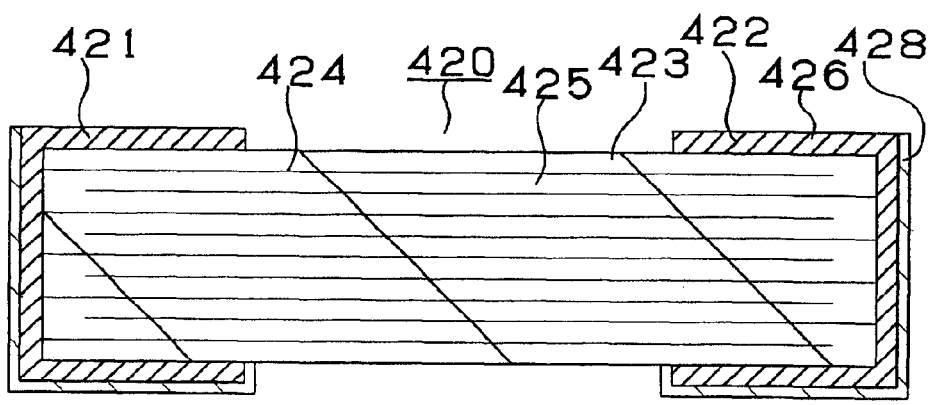
(B)
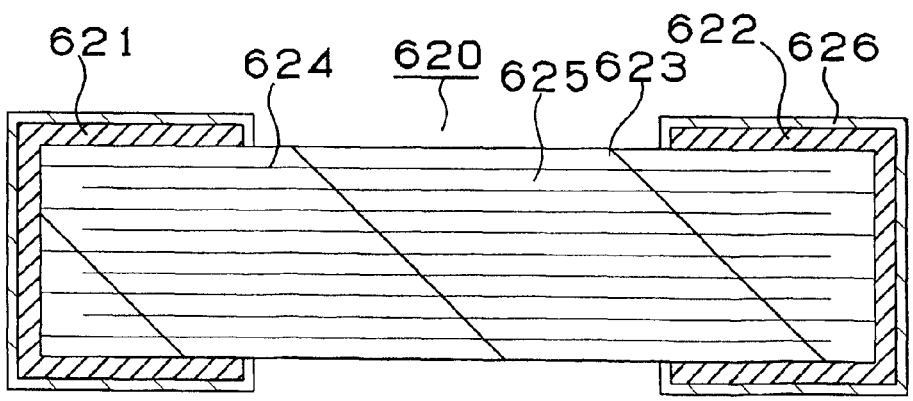

Fig. 68
(A)
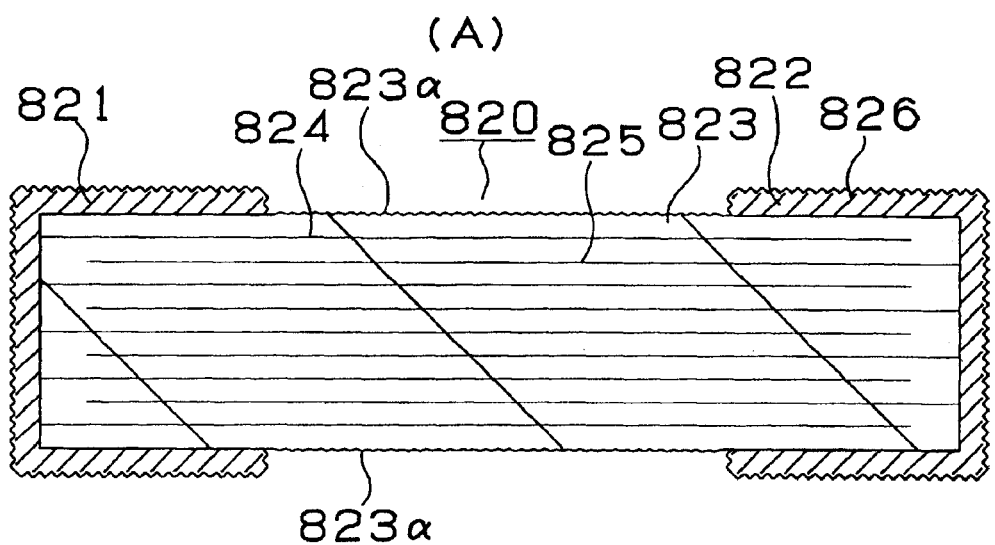
(B)
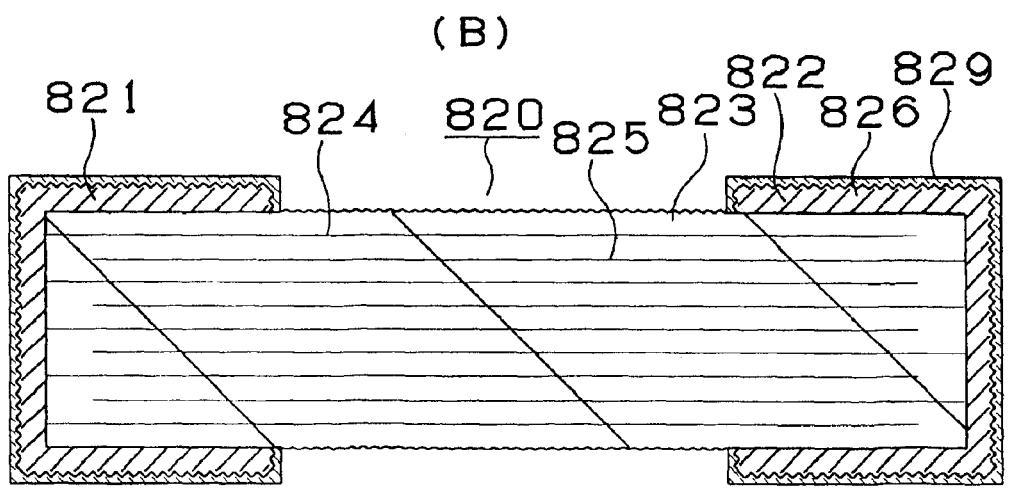

Fig. 73
(A)
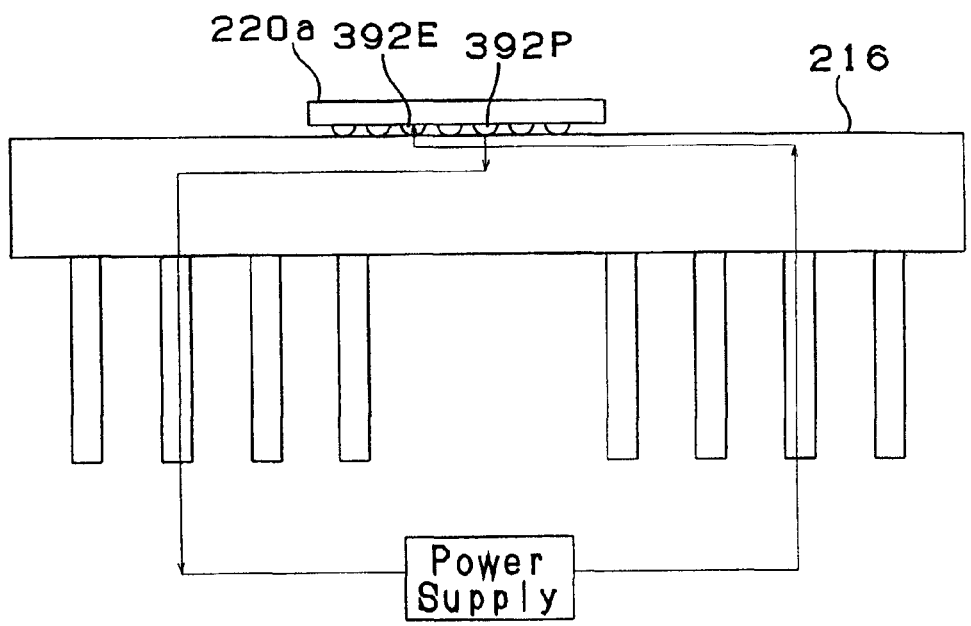
(B)
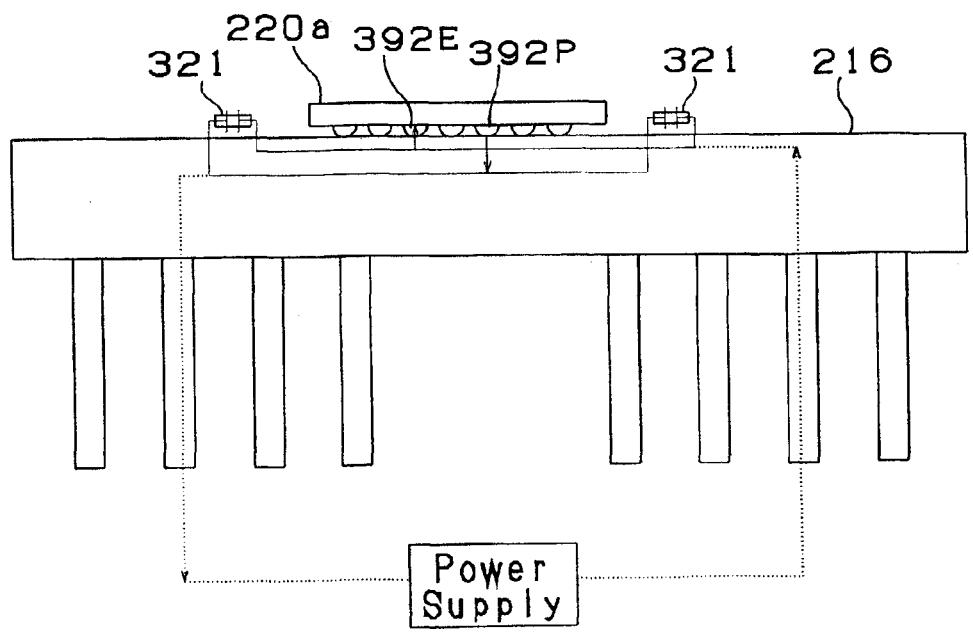

US 6,876,554 B1

PRINTING WIRING BOARD AND METHOD OF PRODUCING THE SAME AND CAPACITOR TO BE CONTAINED IN PRINTED WIRING BOARD

This application is the National Phase of International Application PCT/JP00/05972 filed Sep. 1, 2000 which designated the U.S. and that International Application was not published under PCT Article 21(2) in English.

TECHNICAL FIELD

The present invention relates to a printed circuit board on which electric elements, such as IC chips, are mounted. More specifically, the present invention relates to a printed circuit board incorporating capacitors therein, and a method for manufacturing the same.

BACKGROUND ART

In a computer, the length of electric wiring between the power supply and the IC chip is usually long, and therefore, the loop inductance at this electric wiring is extremely large. The variation in the voltage at which the IC is driven in high-speed operation mode becomes very large accordingly, possibly causing malfunction of the IC. In addition, it becomes difficult to stabilize the voltage of the power supply. In an attempt to avoid these troubles, a capacitor is mounted on the surface of the printed circuit board as an auxiliary device for assisting the power supply operation.

Specifically, the loop inductance which causes the variation in voltage depends on the length of electric wire from a power supply shown in FIG. 72(A) to a power supply terminal 272P of an IC chip 270 through a power supply line in a printed circuit board 300, and the length of electric wire from a ground terminal 272E in the IC chip 270 to the power supply through a ground line in the printed circuit board 300 from the power supply. The loop inductance can be reduced by narrowing the distance between the electric wires through which a current in a reverse direction to each other flows, for example, the distance between the power supply line and the ground line.

Therefore, as shown in FIG. 72(B), a chip capacitor 298 is mounted on the surface of the printed circuit board 300, thereby shortening the length of electric wire between the power supply line and the ground line in the printed circuit board 300 which connects the IC chip 270 to the chip capacitor 292 to be the power supply source, as well as narrowing the distance between the electric wires.

However, the degree of the voltage drop, which causes the variation in the IC driving voltage, depends Ad on the frequency at which the IC chip is driven. As the frequency at which the IC chip is driven increases, it becomes impossible to reduce the loop inductance even if the chip capacitor is mounted on the surface of the printed circuit board 300 as is conducted in the case shown in FIG. 72(B). As a result, it becomes difficult to sufficiently suppress the variation in the IC driving voltage.

In this situation, the present inventors have conceived to mount a chip capacitor inside the printed circuit board. As a method for embedding a capacitor into a substrate, techniques described in Japanese Unexamined patent Publications Nos. 6-326472, 7-263619, 10-256429, 11-45955, 11-126978, 11-312868 and the like may be employed.

Japanese Unexamined Patent Publication 6-326472 discloses a technique in which a capacitor is embedded in a substrate made of resin such as glass epoxy. This structure reduces the noise in the power supply, and eliminates the need of the space for mounting the chip capacitor, thereby reducing the size of insulating substrate. Japanese Unexamined Patent Publication No. 7-263619 discloses a technique in which a capacitor is embedded into to a substrate made of ceramics or alumina. The capacitor is connected between the power supply layer and the-ground layer. This structure shortens the length of electric wire and reduces the inductance of the electric wire.

However, these prior art techniques described above cannot satisfactorily shorten the distance between the IC chip and the capacitor, and also cannot reduce the inductance at the higher frequency domain of the IC chip to a level required at present. In particularly, a buildup multi-layer printed circuit board made of resin has problems such as disconnection between the terminal of the chip capacitor and the via hole, the peeling of the chip capacitor from the interlayer resin insulating layer, and the generation of cracks in the interlayer resin insulating layer, resulted from the difference in thermal expansion coefficients between the capacitor made of ceramics, and the core substrate and the interlayer resin insulating layer made of resin. These problems hinder the printed circuit board from having high reliability over a long period of time.

The present invention has been made to solve the above-described problems of the prior arts, and the objective thereof is to provide a printed circuit board capable of reducing a loop inductance and having high reliability, and a method for manufacturing the same.

DISCLOSURE OF THE INVENTION

In order to achieve the above purpose, according to aspects of the present invention, a printed circuit board is characterized by comprising a core substrate, and a resin insulating layer and a conductor circuit laminated on the core substrate, wherein a cavity is formed in the core substrate, and a plurality of capacitors are accommodated in the cavity.

In accordance with aspects of the invention, a large cavity is formed in a core substrate, and a plurality of capacitors are accommodated in the cavity. With this arrangement, a plurality of capacitors can be reliably provided within the core substrate. The capacitors can be provided at places close to each other in the cavity, the package density of the capacitors can be increased. Since a plurality of capacitors are mounted within the cavity, the plurality of capacitors are aligned to the same heights with each other. A resin layer can be formed on the core substrate into a uniform thickness, and via holes can be stably formed. Since the cavity is formed in such a manner as to have a large area, the capacitors can be provided at accurate positions. As a result, an interlayer resin insulating layer and a conductor circuit can be properly formed on the core substrate, thereby lowering the rate of generating defective printed circuit boards.

The cavity is preferably filled with a resin. The resin eliminates a space between the capacitors and the core substrate. As a result, the behavior of the capacitors incorporated in the core substrate becomes small. In addition, even if the stress is generated caused by the capacitors, the stress can be alleviated by the resin charged in the space. The resin also has an effect of adhering the capacitors to the core substrate, and lowering a migration between the capacitors and the core substrate.

In accordance with additional aspects of the invention, a resin is charged between the capacitors in the cavity. With this arrangement, the capacitors can be fixed in the cavity after deciding their positions in the capacitors. The thermal expansion coefficient of the resin is made to be smaller than a thermal expansion coefficient of the core substrate, that is, is set to the value close to that of the chip capacitor made of ceramics. In this manner, even if internal stress is generated between the core substrate and the capacitors caused by the difference in the thermal expansion coefficients therebetween, cracks and peelings do not easily occur in the core substrate. As a result, high reliability can be attained. In addition, no migration is generated, and the connection with the capacitors is stabilized.

In accordance with additional aspects of the invention, a through hole is formed between the capacitors in the resin layer, and a signal line does not pass through the chip capacitors. This structure eliminates the problems that the impedance becomes discontinuous by the high dielectric body to generate a reflection, and that the transmission is delayed by passing through the high dielectric body.

The through holes enable the establishment of an electric connection between the front surface and the back surface of the printed circuit board. In addition, a wire can be provided below the capacitors through the buildup layer, and pins and BGAs for the capacitors can be provided.

In accordance with additional aspects of the invention, an electric connection for electrodes formed with a metal film of the capacitors is established by via holes formed by plating. The electrodes of the chip capacitor are made by metallizing, and have pits and projections on their surfaces. However, the surfaces become smooth by formation of the metal film, and the via holes are then formed on the smooth surfaces. In this manner, when penetrating openings are formed in the resin coating the electrodes, no resin remains, and a reliability of the connection between the via holes and the electrodes can be increased. Furthermore, since the via holes are made by plating into the electrodes formed with the copper plated film, the electrodes are firmly connected to the via holes. No disconnection occurs between the electrodes and via holes even when a heat cycle test is conducted.

The metal film formed on the electrodes of the capacitors preferably includes any one of metals selected from the group consisting of copper, nickel, and noble metals. Tins and zinc are not preferable, because if the capacitors incorporated in the printed circuit board have a film including these metals formed on their electrodes, a migration is easily generated at a connection with the via holes.

The surfaces of the chip capacitors may be roughened. The rough surface contributes to an increased adhesion between the chip capacitors made of ceramic, and a connection layer and a resin insulating layer made of resin, thereby avoiding the resin insulating layer from peeling from the interface with the chip capacitors even when a heat cycle test is conducted.

In accordance with aspects of the invention, the chip capacitors are accommodated in the printed circuit board in the state where at least a part of the electrodes of each capacitor is uncoated with a coating layer and exposed to the outside. An electric connection for the electrode exposed from the coating layer is established. The metal exposed from the coating layer includes copper as a main component, because the connection resistance can be lowered.

In accordance with additional aspects of the invention, a chip capacitor in which electrodes are formed along an inside of the outer edge thereof is used. With this arrangement, a large space can be used for external electrodes even if a conduction is established through the via holes, and therefore, the broadened range of alignment is allowed. As a result, a problem of disconnection is eliminated.

In accordance with additional aspects of the invention, a chip capacitor in which electrodes are formed in matrix is used. It becomes easy to accommodate a large chip capacitor in a core substrate. Therefore, it becomes possible to increase an electrostatic capacity, and a problem concerning electricity can be solved. In addition, warpage is hard to generate in the printed circuit board even if the printed circuit board undergoes various thermal histories.

A plurality of chip capacitors from each of which a plurality of pieces are to be obtained may be coupled into one piece unit and used. In this manner, an electrostatic capacity can be properly adjusted and the IC chip can be properly operated.

In accordance with additional aspects of the invention, a capacitor is mounted on the surface of the printed circuit board on top of the capacitors accommodated in the substrate. Since the capacitors are accommodated within the printed circuit board, the distance between the IC chip and each capacitor is, shortened. In addition, the loop inductance can be lowered, and electric power can be instantaneously provided. On the other hand, since a capacitor is provided on the surface of the printed circuit board as well, a capacitor having a large capacity can be mounted. In this manner, large electric power can be easily supplied to the IC chip.

A method for manufacturing a printed circuit board according to an aspect of the present invention is characterized by comprising at least the following steps (a) to (c):

(a) forming a cavity in a core substrate;

(b) mounting a plurality of capacitors in the cavity; and (c) charging a resin between the capacitors.

A large cavity is formed in a core substrate. With this arrangement, a plurality of capacitors can be reliably provided in the core substrate. In addition, since a plurality of capacitors are mounted in the cavity, the plurality of capacitors are aligned to the same heights with each other. As a result, the surface of the core substrate becomes flat and smooth. In addition, the cavity is formed in such a manner as to have a large area, the capacitors can be located at accurate positions. The interlayer resin insulating layer and the conductor circuit can be properly formed on the core substrate without impairing the flatness and smoothness of the core substrate. Therefore, the rate of generating defective printed circuit boards can be lowered. In addition, a resin is charged between the capacitors, the capacitors can be fixed in the cavity after the positions of capacitors are determined within the cavity.

In accordance with aspects of the invention, a pressure is applied to the upper surfaces of the plurality of capacitors in the cavity, or tapped to align the chip capacitors into the same heights with each other. By this process, even if chip capacitors having largely different sizes from each other are provided in the cavity, they are aligned into the completely same heights with each other. As a result, the core substrate can has a flat and smooth surface. The interlayer resin insulating layer and the conductor circuit as upper layers can be properly formed on the core substrate without impairing the flatness and smoothness of the core substrate, and therefore, the rate of generating defective printed circuit boards can be lowered.

In accordance with aspects of the invention, a through hole is formed between the capacitors in the resin layer. A signal line does not pass through the chip capacitors. This structure eliminates the problems that the impedance becomes discontinuous by the high dielectric body to generate a reflection, and that the transmission is delayed bypassing through the high dielectric body. The through holes enable the establishment of the electric connection between the top and bottom surfaces of the printed circuit board. It is possible to provide wires under the capacitors through the buildup layer, and therefore, pins and BGAs of the capacitors can be provided.

A method for manufacturing a printed circuit board according to an aspect of the present invention is characterized by comprising at least the following steps (a) to (c):

(a) forming penetrating openings in a resin material having a core material impregnated with a resin;

(b) attaching a resin material to the resin material formed with the penetrating openings to form a core substrate having a cavity;

(c) mounting a plurality of capacitors in the cavity of the core substrate; and (d) charging a resin between the capacitors.

A large cavity is formed in a core substrate. With this arrangement, a plurality of capacitors can be reliably provided in the core substrate. In addition, since a plurality of capacitors are mounted in the cavity, the plurality of capacitors are aligned to the same heights with each other. As a result, the surface of the core substrate becomes flat and smooth. In addition, the cavity is formed in such a manner as to have a large area, the capacitors can be located at accurate positions. The interlayer resin insulating layer and the conductor circuit can be properly formed on the core substrate without impairing the flatness and smoothness of the core substrate. Therefore, the rate of generating defective printed circuit boards can be lowered. In addition, a resin is charged between the capacitors, the capacitors can be fixed in the cavity after the positions of capacitors are determined within the cavity.

In accordance with another aspect of the invention, a pressure is applied to the upper surfaces of the plurality of capacitors in the cavity, or tapped to align the chip capacitors into the same heights with each other. By this process, even if chip capacitors having largely different sizes from each other are provided in the cavity, they are aligned into the completely same heights with each other. As a result, the core substrate can has a flat and smooth surface. The interlayer resin insulating layer and the conductor circuit can be properly formed on the core substrate without impairing the flatness and smoothness of the core substrate, and therefore, the rate of generating defective printed circuit boards can be lowered.

In accordance with aspects of the invention, since through holes are formed between the capacitors in the resin layer, a signal line does not pass through the chip capacitors. This structure eliminates the problems that the impedance becomes discontinuous by the high dielectric body to generate a reflection, and that the transmission is delayed by passing through the high dielectric body. The through holes enables the establishment of the electric connection between the top and bottom surfaces of the printed circuit board. It is possible to provide wires under the capacitors through the buildup layer, and therefore, pins and BGAs of the capacitors can be provided.

In order to solve the above problem, a printed circuit board in accordance with aspects of the invention is characterized by comprising a core substrate, and a resin insulating layer and a conductor circuit laminated on the core substrate, wherein the core substrate incorporates a connection layer formed by an insulating resin layer including at least one or more layer, and an accommodation layer accommodating a capacitor in its spot-faced section.

wherein the core substrate incorporates a connection layer formed by an insulating resin layer including at least one or more layer, and an accommodation layer accommodating a capacitor in its spot-faced section.

It means the circuit formed by buildup method where an interlayer resin insulating layer is formed on the core substrate, and via holes or through holes are formed in the interlayer resin insulating layer to form a conductor circuit as a conductive layer. As the buildup layer, a semi-additive method or a fully-additive method may be employed.

In accordance with aspects of the invention, capacitors are mounted within the printed circuit board. In this manner, the distance between the IC chip and each capacitor is shortened, and the loop inductance can be lowered. The core substrate incorporates one or more connection layers and an accommodation layer for accommodating the capacitors. Since the capacitors are accommodated within the accommodation layer having large thickness, the thickness of the core substrate does not become large. The thickness of the printed circuit board does not become large even if the interlayer resin insulating layer and the conductor circuit are laminated on the core substrate.

It is desirable to fill the cavity with a resin. As a result, the behavior of the capacitors incorporated in the core substrate becomes small. In addition, even if the stress is generated caused by the capacitors, the stress can be alleviated by the resin. The resin also has an effect of adhering the capacitors to the core substrate, and lowering a migration between the capacitors and the core substrate.

In accordance with aspects of the invention, an accommodation layer is constituted by a resin substrate having a core material impregnated with a resin. As a result, sufficiently high strength can be given to the core substrate.

In accordance with aspects of the invention, the connection layer and the capacitors accommodated in the accommodation layer are connected to each other through a conductive adhesive. In this manner, the electrical connection with the capacitors and the adhesion between the capacitors and the connection layer can be assured. The conductive adhesive may be a material having both conductivity and adhesiveness such as a solder (Sn/Pb, Sn/Sb, Sn/Ag, Sn/Ag/Cu), conductive pastes, and resins impregnated with metal particles.

The space created between the conductive adhesive and the capacitor is preferably filled with a resin, because, in this manner, the behavior derived from the capacitors can be alleviated and the migration of the conductive adhesive can be prevented.

In accordance with aspects of the invention, a circuit which is connected to the conductive adhesive is provided between the connection layer and the accommodation layer. In this manner, a connection with the capacitors can be reliably established through the circuit. By providing a circuit constituted by a metal layer between the connection layer and the accommodation layer, the warpage of the core substrate can be prevented.

In accordance with aspects of the invention, an external substrate (i.e. daughter board, mother board) to be connected to the back surface of the printed circuit board is connected to the terminals of the capacitor through the via holes formed in the connection layer and the through holes formed in the core substrate. That is, although the accommodation layer having a core material is hard to process, though holes are formed in the accommodation layer so that the terminals of the capacitors are not directly connected to the outside surface. As a result, the reliability of the connection can be increased.

In accordance with aspects of the invention, a wiring for connecting an IC chip and an external substrate is provided between capacitors, and a signal line does not pass through the chip capacitors. This structure eliminates the problems that the impedance becomes discontinuous by the high dielectric body to generate a reflection, and that the transmission is delayed by passing through the high dielectric body. By mounting a capacitor for power supply, large electric power can be easily supplied to the IC chip. Furthermore, noise generated when a signal is transmitted in the printed circuit board can be reduced.

In addition, by providing a wiring for connection, it becomes possible to provide a wiring below the capacitors. In this manner, a wiring has an increased degree of freedom, thereby attaining high density and small size.

In accordance with aspects of the invention, a chip capacitor in which electrodes are formed along an inside of the outer edge thereof is used. With this arrangement, a large space can be used for external electrodes even if a conduction is established through the via holes, and therefore, the broadened range of alignment is allowed. As a result, a problem of disconnection is eliminated.

In accordance with aspects of the invention, a chip capacitor in which electrodes are formed in matrix is used. It becomes easy to accommodate a large chip capacitor in a core substrate. Therefore, it becomes possible to increase an electrostatic capacity, and a problem concerning electricity can be solved. In addition, warpage is hard to generate in the printed circuit board even if the printed circuit board undergoes various thermal histories.

A plurality of chip capacitors from each of which a plurality of pieces are to be obtained may be coupled to each other into one piece unit and used. In this manner, an electrostatic capacity can be properly adjusted and the IC chip can be properly operated.

In accordance with aspects of the invention, a capacitor is mounted on the surface of the printed circuit board on top of the capacitors accommodated in the substrate. Since the capacitors are accommodated within the printed circuit board, the distance between the IC chip and each capacitor is shortened. In addition, the loop inductance can be lowered, and electric power can be instantaneously provided. On the other hand, since a capacitor is provided on the surface of the printed circuit board as well, a capacitor having a large capacity can be mounted. In this manner, large electric power can be easily supplied to the IC chip.

In accordance with aspects of the invention, the chip capacitor mounted on the surface of the printed circuit board has an electrostatic capacity same or larger than the electrostatic capacity of the chip capacitor incorporated in the printed circuit board. In this manner, there is no shortage of power supply at a high frequency domain, and the IC chip reliably exhibits a desired operation.

In accordance with aspects of the invention, the chip capacitor mounted on the surface of the printed circuit board has an inductance same or smaller than the inductance of the chip capacitor incorporated in the printed circuit board. In this manner, there is no shortage of power supply at a high frequency domain, and the IC chip reliably exhibits a desired operation.

The surface of the chip capacitor may be subjected to roughening treatment. The rough surface contributes to an increased adhesion between the chip capacitor made of ceramic and a connection layer and a resin insulating layer made of resin, thereby avoiding the connection layer and the interlayer resin insulating layer from peeling from the interface with the chip capacitors even when a heat cycle test is conducted.

In accordance with aspects of the invention, copper is provided around the respective chip capacitors. In this manner, no migration is generated in the capacitors incorporated in the printed circuit board. In addition, the capacitors never peel from the resin charged between the capacitors, and no cracks are created. The accommodation characteristic is enhanced, and as a result, there is no deterioration in electric characteristics.

In accordance with aspects of the invention, a resin is charged between the spot-faced section of the core substrate and the capacitor. The thermal expansion coefficient of the resin is set to the value lower than the thermal expansion coefficient of the core substrate, that is, is set to the value close to that of the chip capacitor made of ceramics. In this manner, even if internal stress is generated between the core substrate and the resin insulating layer, and the chip capacitor caused by the difference in the thermal expansion coefficients therebetween, cracks and peelings do not easily occur. As a result, high reliability can be attained. In addition, the generation of migration can be prevented.

A method for manufacturing a printed circuit board according to aspects of the present invention is characterized by comprising at least the following steps (a) to (c):

(a) forming a circuit pattern on a resin plate on its one side or both sides, and connecting a capacitor to the circuit pattern through an adhesive material;

(b) attaching a resin substrate formed with a cavity for accommodating the capacitor to the resin plate to form a core substrate; and (c) forming openings extending to electrodes of the capacitor in the resin plate to form via holes.

In the method for manufacturing a printed circuit board according to aspects of the invention, it becomes possible to accommodate chip capacitors in a core substrate. As a result, a printed circuit board having a lowered loop inductance can be provided.

In the method for manufacturing a printed circuit board according to aspects of the invention, a resin substrate accommodating capacitors and a resin plate are attached to each other by applying a pressure from both sides to form a core substrate. Thus-formed core substrate has a flat surface. As a result, an interlayer resin insulating layer and a conductor circuit having high reliability can be laminated on the core substrate.

In the method for manufacturing a printed circuit board according to aspects of the invention, a through hole for an IC chip and an external substrate is provided between capacitors. A signal line does not pass through the chip capacitors 20 made of ceramics. This structure eliminates the problems that the impedance becomes discontinuous by the high dielectric body to generate a reflection, and that the transmission is delayed by passing through the high dielectric body. By mounting a capacitor for power supply, it becomes possible to easily provide large electric power to the IC chip.

In order to solve the above-described problems, in the invention, a printed circuit board incorporates a core substrate, and a resin insulating layer and a conductor circuit laminated to a core substrate. The core substrate incorporates a connection layer formed by an insulating resin layer including at least one or more layer, and an accommodation layer formed by a resin layer accommodating capacitors and including two or more layers.

It means the circuit formed by buildup method where an interlayer resin insulating layer is formed on the core substrate, and via holes or through holes are formed in the interlayer resin insulating layer to form a conductor circuit as a conductive layer. As the buildup layer, a semi-additive method or a fully-additive method may be employed.

In the invention, capacitors are mounted within the printed circuit board. In this manner, the distance between the IC chip and each capacitor is shortened, and the loop inductance can be lowered. The core substrate incorporates one or more connection layers and an accommodation layer for accommodating the capacitors. Since the capacitors are accommodated within the accommodation layer having large thickness, the thickness of the core substrate does not become thick. The thickness of the printed circuit board does not become thick even if the interlayer resin insulating layer and the conductor circuit are laminated on the core substrate.

It is desirable to fill the cavity with a resin. As a result, the behavior of the capacitors incorporated in the core substrate becomes small. In addition, even if the stress is generated caused by the capacitors, the stress can be alleviated by the resin. The resin also has an effect of adhering the capacitors to the core substrate, and lowering a migration between the capacitors and the core substrate.

A printed circuit board according to aspects of the invention is characterized by comprising a resin insulating layer and a conductor circuit laminated to the core substrate, wherein the core substrate incorporates a connection layer formed by an insulating resin layer including at least one or more layer, and an accommodation layer formed by a resin layer accommodating a capacitor and including two or more layers, and vias for establishing a connection with the capacitor are formed on both sides of the core substrate.

In accordance with aspects of the invention, capacitors are mounted within the printed circuit board. In this manner, the distance between the IC chip and each capacitor is shortened, and the loop inductance can be lowered. The core substrate is constituted by at least one or more connection layer and an accommodation layer for accommodating the capacitors. Since the capacitors are accommodated within the accommodation layer having large thickness, the thickness of the core substrate does not become large. The thickness of the printed circuit board does not become large even if the interlayer resin insulating layer and the conductor circuit are laminated on the core substrate. Furthermore, since vias to be connected to the capacitors are formed on both sides, the wire length from the capacitors to the IC chip and the external substrate is shortened.

In accordance with aspects of the invention, a wiring for connecting an IC chip and an external substrate is provided between capacitors, and a signal, line does not pass through the chip capacitors. This structure eliminates the problems that the impedance becomes discontinuous by the high dielectric body to generate a reflection, and that the transmission is delayed by passing through the high dielectric body. By mounting a capacitor for power supply, large electric power can be easily supplied to the IC chip. Furthermore, by providing a capacitor for ground, noise generated when a signal is transmitted in the printed circuit board can be reduced.

In addition, by providing a wiring for connection, it becomes possible to provide a wiring below the capacitors. In this manner, a wiring has an increased degree of freedom, thereby attaining high density and small size.

In accordance with aspects of the invention, a chip capacitor in which electrodes are formed along an inside of the outer edge thereof is used. With this arrangement, a large space can be used for external electrodes even if a conduction is established through the via holes, and therefore, the broadened range of alignment is allowed. As a result, a problem of disconnection is eliminated.

In accordance with aspects of the invention a chip capacitor in which electrodes are formed in matrix is used. It becomes easy to accommodate a large chip capacitor in a core substrate. Therefore, it becomes possible to increase an electrostatic capacity, and a problem concerning electricity can be solved. In addition, warpage is hard to generate in the printed circuit board even if the printed circuit board undergoes various thermal histories.

A plurality of chip capacitors from each of which a plurality of pieces are to be obtained may be coupled to each other into one piece unit and used. In this manner, an electrostatic capacity can be properly adjusted and the IC chip can be properly operated.

In accordance with aspects of the invention, a capacitor is mounted on the surface of the printed circuit board on top of the capacitors accommodated in the substrate. Since the capacitors are accommodated within the printed circuit board, the distance between the IC chip and each capacitor is shortened. In addition, the loop inductance can be lowered, and electric power can be instantaneously provided. On the other hand, since a capacitor is provided on the surface of the printed circuit board as well, a capacitor having a large capacity can be mounted. In this manner, large electric power can be easily supplied to the IC chip.

In accordance with aspects of the invention, the chip capacitor mounted on the surface of the printed circuit board has an electrostatic capacity same or larger than the electrostatic capacity of the chip capacitor incorporated in the printed circuit board. In this manner, there is no shortage of power supply at a high frequency domain, and the IC chip reliably exhibits a desired operation.

In accordance with aspects of the invention, the chip capacitor mounted on the surface of the printed circuit board has an inductance same or larger than the inductance of the chip capacitor incorporated in the printed circuit board. In this manner, there is no shortage of power supply at a high frequency domain, and the IC chip reliably exhibits a desired operation.

In accordance with aspects of the invention, an electric connection for electrodes formed with a metal film of the capacitors is established by via holes formed by plating. The electrodes of the chip capacitor are made by metallizing, and have pits and projections on their surfaces. However, the surfaces become smooth by formation of the metal film, and the via holes are then formed on the smooth surfaces. In this manner, when penetrating openings are formed in the resin coating the electrodes, no resin remains, and a reliability of the connection between the via holes and the electrodes can be increased. Furthermore, since the via holes are made by plating into the electrodes formed with the copper plated film, the electrodes are firmly connected to the via holes. No disconnection occurs between the electrodes and via holes even when a heat cycle test is conducted.

The metal film formed on the electrodes of the capacitors preferably includes any one of metals selected from the group consisting of copper, nickel, and noble metals. Tins and zinc are not preferable, because if the capacitors incorporated in the printed circuit board have a film including these metals formed on their electrodes, a migration is easily generated at a connection with the via holes.

The surfaces of the chip capacitors may be. roughened. The rough surface contributes to an increased adhesion between the chip capacitor made of ceramic, and a connection layer and a resin insulating layer made of resin, thereby avoiding the resin insulating layer from peeling from the interface with the chip capacitor even when a heat cycle test is conducted.

In accordance with aspects of the invention, the chip capacitors are accommodated in the printed circuit board in the state where at least a part of the electrodes of each capacitor is uncoated with a coating layer and exposed to the outside. An electric connection for the electrode exposed from the coating layer is established. The metal exposed from the coating layer preferably includes copper as a main component, because the connection resistance can be lowered.

In accordance with aspects of the invention, the thermal expansion coefficient of the insulating adhesive is set to the value lower than the thermal expansion coefficient of the accommodating layer, that is, is set to the value close to that of the chip capacitor made of ceramics. In this manner, even if internal stress is generated between the core substrate and the resin insulating layer, and the chip capacitor caused by the difference in the thermal expansion coefficients therebetween, cracks and peelings do not easily occur when a heat cycle test is conducted. As a result, high reliability can be attained.

A method for manufacturing a printed circuit board according to another aspect of the invention is characterized by comprising at least the following steps (a) to (e):

(a) forming penetrating openings for accommodating a capacitor in a first resin material having a core material impregnated with a resin;

(b) attaching a second resin material to the first resin material formed with the penetrating openings to form an accommodation layer having a section for accommodating a capacitor, (c) accommodating the capacitor in the accommodation layer;

(d) attaching a third insulating resin layer to the accommodation layer formed in the step (c) to form a core substrate; and (e) forming openings extending to electrodes of the capacitor in the third insulating resin layer to form via holes.

A method for manufacturing a printed circuit board according to another aspect of the invention is characterized by comprising at least the following steps (a) to (e):

(a) forming penetrating openings for accommodating a capacitor in a first resin material having a core material impregnated with a resin;

(b) providing a capacitor to the second resin material at a position corresponding to a section for accommodating a capacitor in the resin material;

(c) attaching the first resin material subjected to the step (a) and the second resin material subjected to the step (b) to each other to form an accommodation layer accommodating the capacitor;

(d) attaching a third insulating resin layer to the accommodation layer to form a core substrate; and (e) forming openings in the third insulating resin layer extending to electrodes of the capacitor to form via holes.

A method for manufacturing a printed circuit board according to yet another aspect of the invention is characterized by comprising at least the following steps (a) to (f):

(a) forming penetrating openings for accommodating a capacitor in a first resin material having a core material impregnated with a resin;

(b) providing a capacitor to the second resin material at a position corresponding to a section for accommodating a capacitor in the resin material;

(c) attaching the first resin material subjected to the step (a) and the second resin material subjected to the step (b) to each other to form an accommodation layer accommodating the capacitor;

(d) attaching a third insulating resin layer to the accommodation layer to form a core substrate;

(e) forming openings in the third insulating resin layer extending to electrodes of the capacitor to form via holes; and (f) forming a conductive film in the penetrating openings of the first resin material and the openings of the third resin material to form via holes.

In the method for manufacturing a printed circuit board according to another aspect of the invention, it becomes possible to accommodate chip capacitors in a core substrate. As a result, a printed circuit board having a lowered loop inductance can be provided.

In the method for manufacturing a printed circuit board according to another aspect of the invention, it becomes possible to accommodate chip capacitors in a core substrate. As a result, a printed circuit board having a lowered loop inductance can be provided. Since via holes are formed on both surfaces of the core substrate, the wire length from the capacitors to the IC chip and the external substrate is shortened.

In the method for manufacturing a printed circuit board according to another aspect of the invention, a resin substrate accommodating capacitors and a resin plate are attached to each other by applying a pressure from both sides to form a core substrate. Thus-formed core substrate has a flat surface. As a result, an interlayer resin insulating layer and a conductor circuit having high reliability can be laminated on the core substrate.

A printed circuit board according to another aspect of the present invention is characterized by comprising a core substrate, and a resin insulating layer and a conductor circuit laminated to the core substrate, wherein the core substrate incorporates an accommodating layer having penetrating openings in each of which a capacitor is accommodated, and connection layers each made of an insulating resin layer and provided on the front surface and the back surface of the accommodation layer.

It means the circuit formed by buildup method where an interlayer resin insulating layer is formed on the core substrate, and via holes or through holes are formed in the interlayer resin insulating layer to form a conductor circuit as a conductive layer. As the buildup layer, a semi-additive method or a fully-additive method may be employed.

Capacitors are mounted within the printed circuit board. In this manner, the distance between the IC chip and each capacitor is shortened, and the loop inductance can be lowered. The core substrate incorporates at least one or more connection layers and an accommodation layer for accommodating the capacitors. Since the capacitors are accommodated within the accommodation layer having large thickness, the thickness of the core substrate does not become large. The thickness of the printed circuit board does not become large even if the interlayer resin insulating layer and the conductor circuit are laminated on the core substrate.

Since via holes are formed on both surfaces of the core substrate, the power supply located on the substrate connected to the outside and the capacitors accommodated in the substrate can be connected to each other in a shortest distance. With this arrangement, a voltage can be instantaneously supplied from the power supply to the IC chip, and the voltage for driving the IC can be promptly stabilized.

The cavity is preferably filled with a resin. The resin eliminates a space between the capacitors and the core substrate. As a result, the behavior of the capacitors incorporated in the core substrate becomes small. In addition, even if the stress is generated caused by the capacitors, the stress can be alleviated by the resin. The resin also has an effect of adhering the capacitors to the core substrate, and lowering a migration between the capacitors and the core substrate.

In accordance with aspects of the invention, an accommodation layer is constituted by a resin substrate having a core material impregnated with a resin. As a result, sufficiently high strength can be given to the core substrate.

In accordance with aspects of the invention, the capacitors are fixed in the penetrating openings of the accommodation layer through an insulating adhesive. In this manner, the capacitors can be fixed to proper positions.

In accordance with aspects of the invention, the IC chip mounted on the front surface of the printed circuit board, the external substrate mounted on the back surface of the printed circuit board (i.e. daughter board, mother board) are connected to the terminals of the capacitors through the via holes formed in the connection layer. That is, the terminals of the capacitors, the IC chip, and the external substrate are directly connected to each other. As a result, the length of electric wire can be shortened.

In accordance with aspects of the invention, a wiring for connecting an IC chip and an external substrate is provided between capacitors, and a signal line does not pass through the chip capacitors. This structure eliminates the problems that the impedance becomes discontinuous by the high dielectric body to generate a reflection, and that the transmission is delayed by passing through the high dielectric body. By mounting a capacitor for power supply, large electric power can be easily supplied to the IC chip.

In accordance with aspects of the invention, a capacitor is mounted on the surface of the printed circuit board on top of the capacitors accommodated in the substrate. Since the capacitors are accommodated within the printed circuit board, the distance between the IC chip and each capacitor is shortened. In addition, the loop inductance can be lowered, and electric power can be instantaneously provided. On the other hand, since a capacitor is provided on the surface of the printed circuit board as well, a capacitor having a large capacity can be mounted. In this manner, large electric power can be easily supplied to the IC chip.

In accordance with aspects of the invention, the chip capacitor mounted on the surface of the printed circuit board has an electrostatic capacity same or larger than the electrostatic capacity of the chip capacitor incorporated in the printed circuit board. In this manner, there is no shortage of power supply at a high frequency domain, and the IC chip reliably exhibits a desired operation.

In accordance with aspects of the invention, the chip capacitor mounted on the surface of the printed circuit board has an inductance same or larger than the inductance of the chip capacitor incorporated in the printed circuit board. In this manner, there is no shortage of power supply at a high frequency domain, and the IC chip reliably exhibits a desired operation.

In accordance with aspects of the invention, a chip capacitor in which electrodes are formed along an inside of the outer edge thereof is used. With this arrangement, a large space can be used for external electrodes even if a conduction is established through the via holes, and therefore, the broadened range of alignment is allowed. As a result, a problem of disconnection is eliminated.

In accordance with aspects of the invention, a chip capacitor in which electrodes are formed in matrix is used. It becomes easy to accommodate a large chip capacitor in a core substrate. Therefore, it becomes possible to increase an electrostatic capacity, and a problem concerning electricity can be solved. In addition, warpage is hard to generate in the printed circuit board even if the printed circuit board undergoes various thermal history.

A plurality of chip capacitors which are coupled to each other into one piece unit and from each of which a plurality of pieces are to be obtained may be used. In this manner, an electrostatic capacity can be properly adjusted and the IC chip can be properly operated.

In accordance with aspects of the invention, an electric connection for electrodes formed with a metal film of the capacitors is established by via holes formed by plating. The electrodes of the chip capacitor are made by metallizing, and have pits and projections on their surfaces. However, the surfaces become smooth by formation of the metal film, and the via holes are then formed on the smooth surfaces. In this manner, when penetrating openings are formed in the resin coating the electrodes, no resin remains, and a reliability of the connection between the via holes and the electrodes can be increased. Furthermore, since the via holes are made by plating into the electrodes formed with the copper plated film, the electrodes are firmly connected to the via holes. No disconnection occurs between the electrodes and via holes even when a heat cycle test is conducted.

The metal film formed on the electrodes of the capacitors preferably includes any one of metals selected from the group consisting of copper, nickel, and noble metals. Tins and zinc are not preferable, because if the capacitors incorporated in the printed circuit board has a film including these metals formed on their electrodes, a migration is easily generated at a connection with the via holes.

The surfaces of the chip capacitors may be roughened. The rough surface contributes to an increased adhesion between the chip capacitor made of ceramic and a resin insulating layer made of resin, thereby avoiding the resin insulating layer from peeling from the interface with the chip capacitor even when a heat cycle test is conducted.

In accordance with aspects of the invention, the chip capacitors are accommodated in the printed circuit board in the state where at least a part of the electrodes of each capacitor is uncoated with a coating layer and exposed to the outside. An electric connection for the electrode exposed from the coating layer is established. The metal exposed from the coating layer preferably includes copper as a main component, because the connection resistance can be lowered.

In accordance with aspects of the invention, the thermal expansion coefficient of the resin is set to the value lower than the thermal expansion coefficient of the core substrate, that is, is set to the value close to that of the chip capacitor made of ceramics. In this manner, even if internal stress is generated between the core substrate and the resin insulating layer, and the chip capacitor caused by the difference in the thermal expansion coefficients therebetween, cracks and peelings do not easily occur when a heat cycle test is conducted. As a result, high reliability can be attained. In addition, the generation of migration can be prevented.

A method for manufacturing a printed circuit board according to an aspect of the present invention is characterized by comprising at least the following steps (a) to (d):

(a) forming penetrating openings for accommodating a capacitor in a first resin material having a core material impregnated with a resin;

(b) accommodating a capacitor in each of the penetrating openings of the first resin material;

(c) attaching a second resin material to the first resin material to form a core substrate; and (d) forming openings extending to electrodes of the capacitor in the second resin material of the core substrate to form via holes.

In the method for manufacturing a printed circuit board according to additional aspects of the invention, it becomes possible to accommodate chip capacitors in a core substrate.

As a result, a printed circuit board having a lowered loop inductance can be provided.

In accordance with aspects of the invention, a wiring for connecting an IC chip and an external substrate is provided between capacitors, and a signal line does not pass through the chip capacitors. This structure eliminates the problems that the impedance becomes discontinuous by the high dielectric body to generate a reflection, and that the transmission is delayed by passing through the high dielectric body. By mounting a capacitor for power supply, large electric power can be easily supplied to the IC chip.

In the method for manufacturing a printed circuit board according to additional aspects of the invention, a resin substrate accommodating capacitors and a resin plate are attached to each other by applying a pressure from both sides to form a core substrate. Thus-formed core substrate has a flat surface. As a result, an interlayer resin insulating layer and a conductor circuit having high reliability can be laminated on the core substrate.

In order to solve the above-described problems, in the invention, a printed circuit board incorporates a core substrate, and a resin insulating layer and a conductor circuit laminated to a core substrate. The capacitors are accommodated in the core substrate.

It means the circuit formed by buildup method where an interlayer resin insulating layer is formed on the core substrate, and via holes or through holes are formed in the interlayer resin insulating layer to form a conductor circuit as a conductive layer. As the buildup layer, a semi-additive method or a fully-additive method may be employed.

In accordance with aspects of the invention, capacitors are mounted within the printed circuit board. In this manner, the distance between the, IC chip and each capacitor is shortened, and the loop inductance can be lowered. Since the capacitors are accommodated within the accommodation layer having large thickness, the thickness of the core substrate does not become thick. The thickness of the printed circuit board does not become thick even if the interlayer resin insulating layer and the conductor circuit are laminated on the core substrate.

It is desirable to fill the cavity with a resin. As a result, the behavior of the capacitors incorporated in the core substrate becomes small. In addition, even if the stress is generated caused by the capacitors, the stress can be alleviated by the resin. The resin also has an effect of adhering the capacitors to the core substrate, and lowering a migration between the capacitors and the core substrate.

A printed circuit board according to an aspect of the present invention is characterized by comprising a core substrate, and a resin insulating layer and a conductor circuit laminated to the core substrate, wherein the chip capacitor is accommodated in the printed circuit board in the state where at least a part of electrodes of each capacitor is uncoated with a coating layer and exposed to the outside, and an electric connection for the electrode exposed from the coating layer is established by plating.

In accordance with aspects of the invention, the chip capacitors are accommodated in the printed circuit board in the state where at least a part of the electrodes of each capacitor is uncoated with a coating layer and exposed to the outside. An electric connection for the electrode exposed from the coating layer is established. The metal exposed from the coating layer includes preferably copper as a main component. This is because the connection to the exposed metal provided with plating is increased, and as a result, the difference in electric characteristics is cancelled and the connection resistance can be lowered.

A printed circuit board according to an aspect of the present invention is characterized by comprising a core substrate, and a resin insulating layer and a conductor circuit laminated to the core substrate, wherein the chip capacitor is accommodated in the state where a metal film is formed on electrodes of the capacitor, and an electric connection for the electrodes formed with the metal film is established by plating.

In accordance with aspects of the invention, an electric connection for electrodes formed with a metal film of the capacitors is established by via holes formed by plating. The electrodes of the chip capacitor are made by metallizing, and have pits and projections on their surfaces. However, the surfaces become smooth by formation of the metal film, and the via holes are then formed on the smooth surfaces. In this manner, when penetrating openings are formed in the resin coating the electrodes, no resin remains, and a reliability of the connection between the via holes and the electrodes can be increased. Furthermore, since the via holes are made by plating into the electrodes formed with the copper plated film, the electrodes are firmly connected to the via holes. No disconnection occurs between the electrodes and via holes even when a heat cycle test is conducted.

The metal film formed on the electrodes of the capacitors preferably includes any one of metals selected from the group consisting of copper, nickel, and noble metals. Tins and zinc are not preferable, because if the capacitors incorporated in the printed circuit board has a film including these metals formed on their electrodes, a migration is easily generated at a connection with the via holes. Since tins and zinc are not used in the present invention, the generation of migration can be prevented.

In accordance with aspects of the invention, a chip capacitor in which electrodes are formed along an inside of the outer edge thereof is used. With this arrangement, a large space can be used for external electrodes even if a conduction is established through the via holes, and therefore, the broadened range of alignment is allowed. As a result, a problem of disconnection is eliminated.

In accordance with aspects of the invention, a chip capacitor in which electrodes are formed in matrix is used. It becomes easy to accommodate a large chip capacitor in a core substrate. In addition, warpage is hard to generate in the printed circuit board even if the printed circuit board undergoes various thermal histories.

In accordance with aspects of the invention, a plurality of chip capacitors from each of which a plurality of pieces are to be obtained may be coupled to each other into one piece unit and used. In this manner, an electrostatic capacity can be properly adjusted and the IC chip can be properly operated.

A printed circuit board according to an aspect of the present invention is characterized by comprising a core substrate, and a resin insulating layer and a conductor circuit laminated to the core substrate, wherein a capacitor is accommodated in the core substrate, and a capacitor is mounted on the surface of the printed circuit board.

A capacitor is mounted on the surface of the printed circuit board on top of the capacitors accommodated in the substrate. Since the capacitors are accommodated within the printed circuit board, the distance between the IC chip and each capacitor is shortened. In addition, the loop inductance can be lowered, and electric power can be instantaneously provided. On the other hand, since a capacitor is provided on the surface of the printed circuit board as well, a capacitor having a large capacity can be mounted. In this manner, large electric power can be easily supplied to the IC chip.

In accordance with aspects of the invention, the chip capacitor mounted on the surface of the printed circuit board has an electrostatic capacity same or larger than the electrostatic capacity of the chip capacitor incorporated in the printed circuit board. In this manner, there is no shortage of power supply at a high frequency domain, and the IC chip reliably exhibits a desired operation.

In accordance with aspects of the invention, the chip capacitor mounted on the surface of the printed circuit board has an inductance same or larger than the inductance of the chip capacitor incorporated in the printed circuit board. In this manner, there is no shortage of power supply at a high frequency domain, and the IC chip reliably exhibits a desired operation.

The surface of the chip capacitor may be subjected to roughening treatment. The rough surface contributes to an increased adhesion between the chip capacitor made of ceramic, and a connection layer and a resin insulating layer made of resin, thereby avoiding the connection layer and the interlayer resin insulating layer from peeling from the interface with the chip capacitor even when a heat cycle test is conducted.

In accordance with aspects of the invention, a copper plated film is coated on the surface of a metallized electrodes of a chip capacitor.

In accordance with aspects of the invention, a metal film is formed on the electrodes of the chip capacitors. As a result, the chip capacitor have a flat surface. When the chip capacitors are accommodated in the printed circuit board, and penetrating openings are formed in the resin which covers the electrodes, no resin is left. In this manner, the connection between the via holes and the electrodes has increased reliability.

BRIEF DESCRIPTION OF DRAWINGS

FIG. 6 is a diagram showing a process for manufacturing a printed circuit board according to a first embodiment.

FIG. 14 is a diagram showing a process for manufacturing a printed circuit board according to a first modification of the first embodiment.

FIG. 17 is a diagram showing a cross section of the chip capacitor according to the first embodiment.

FIG. 18 is a plan view showing a chip capacitor according to a third modification of the first embodiment.

FIG. 20 is a plan view showing a chip capacitor according to a third modification of the first embodiment.

FIG. 43 is a diagram showing a process for manufacturing a printed circuit board according to third modification of the third embodiment.

FIG. 45 is a diagram showing a cross section of is the chip capacitor.

FIG. 68 is a diagram showing a cross section of the chip capacitor according to the second modification.

FIG. 73 is a diagram illustrating a loop inductance of a printed circuit board according to a conventional technique.

BEST MODE FOR CARRYING OUT THE INVENTION

First Embodiment

Hereinafter, embodiments of the present invention will be described with reference to the drawings.

Figure 1:
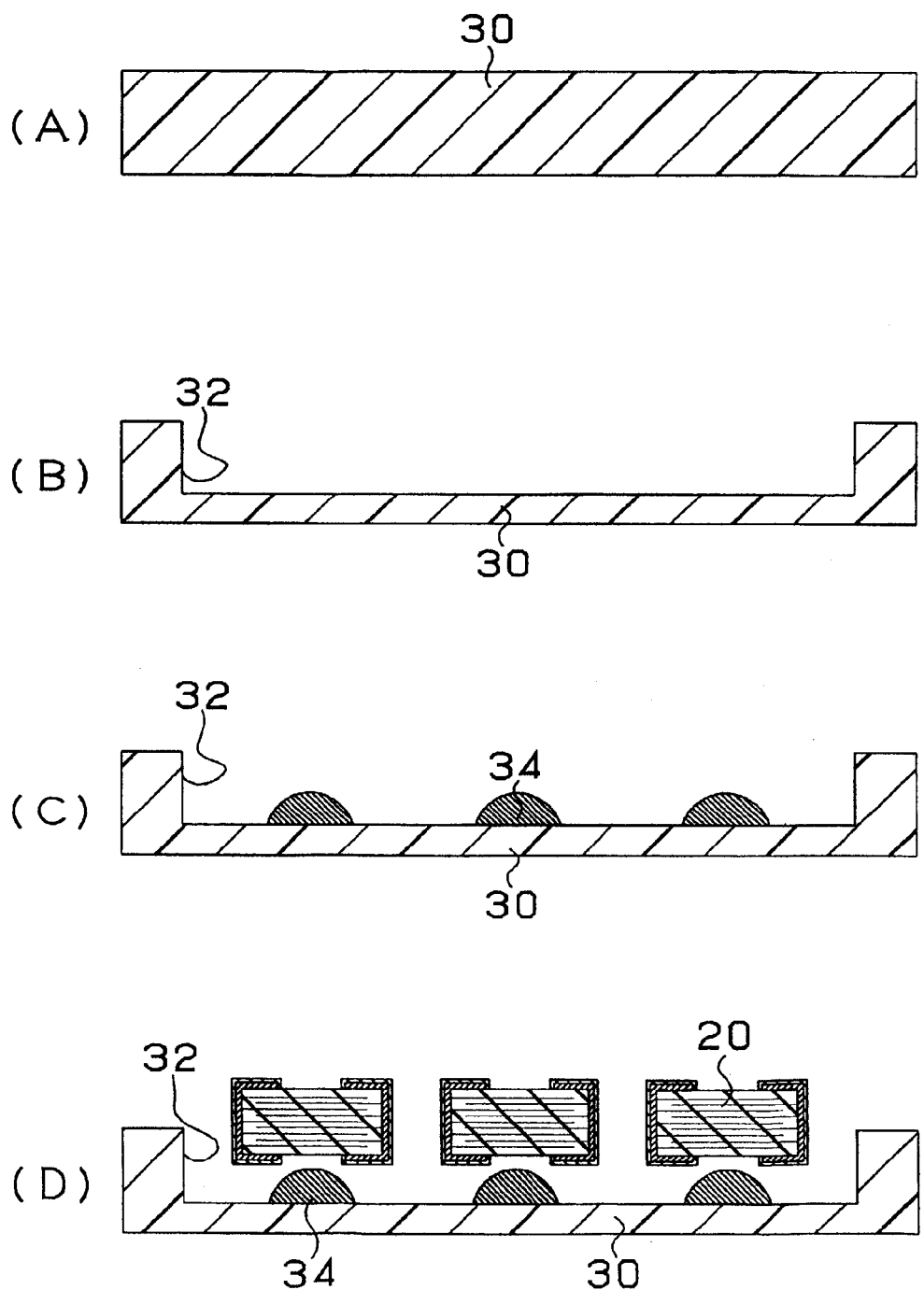
FIG. 1 is a diagram showing a process for manufacturing a printed circuit board according to a first embodiment of the present invention.
Figure 2:
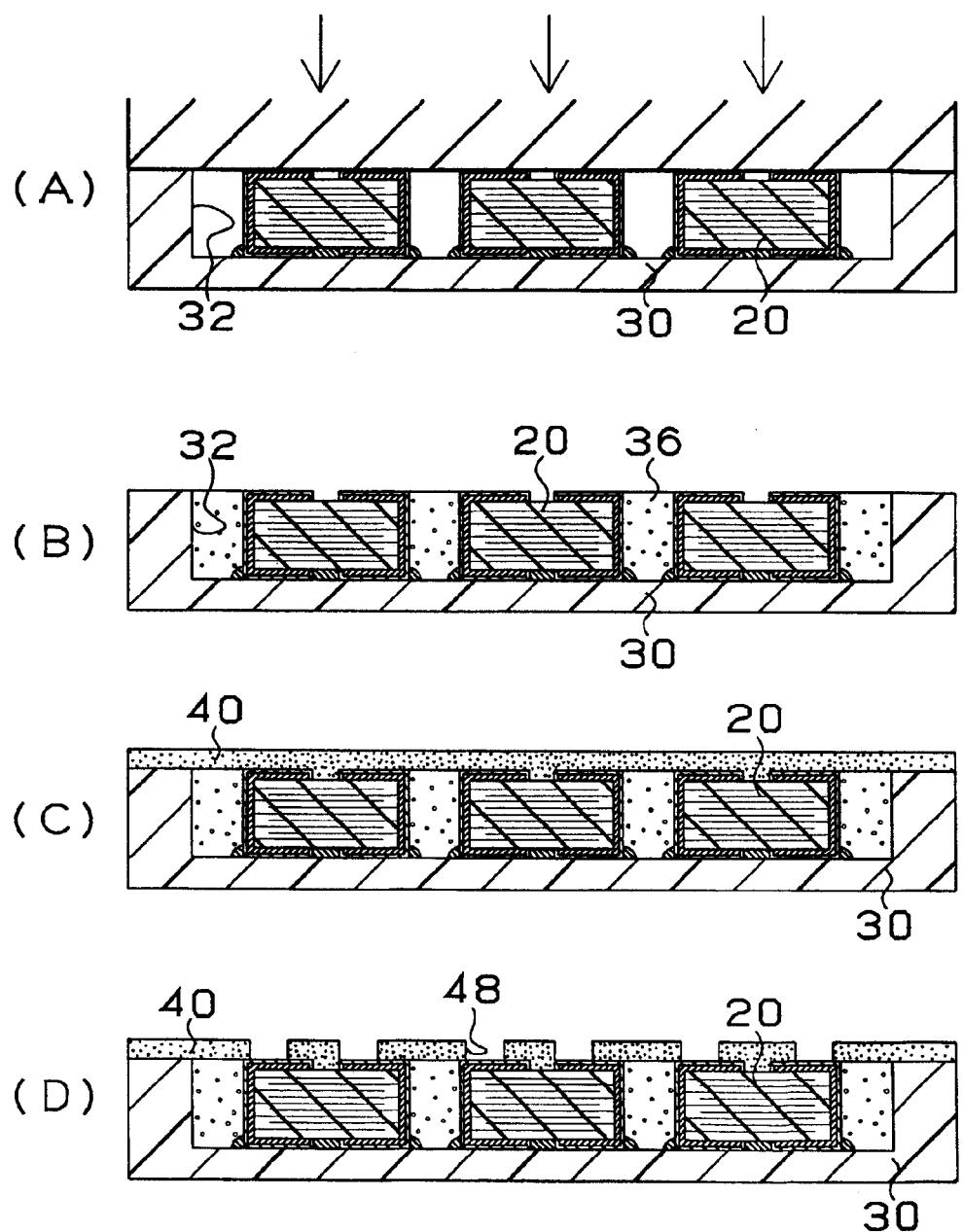
FIG. 2 is a diagram showing a process for manufacturing a printed circuit board according to a first embodiment.
Figure 3:
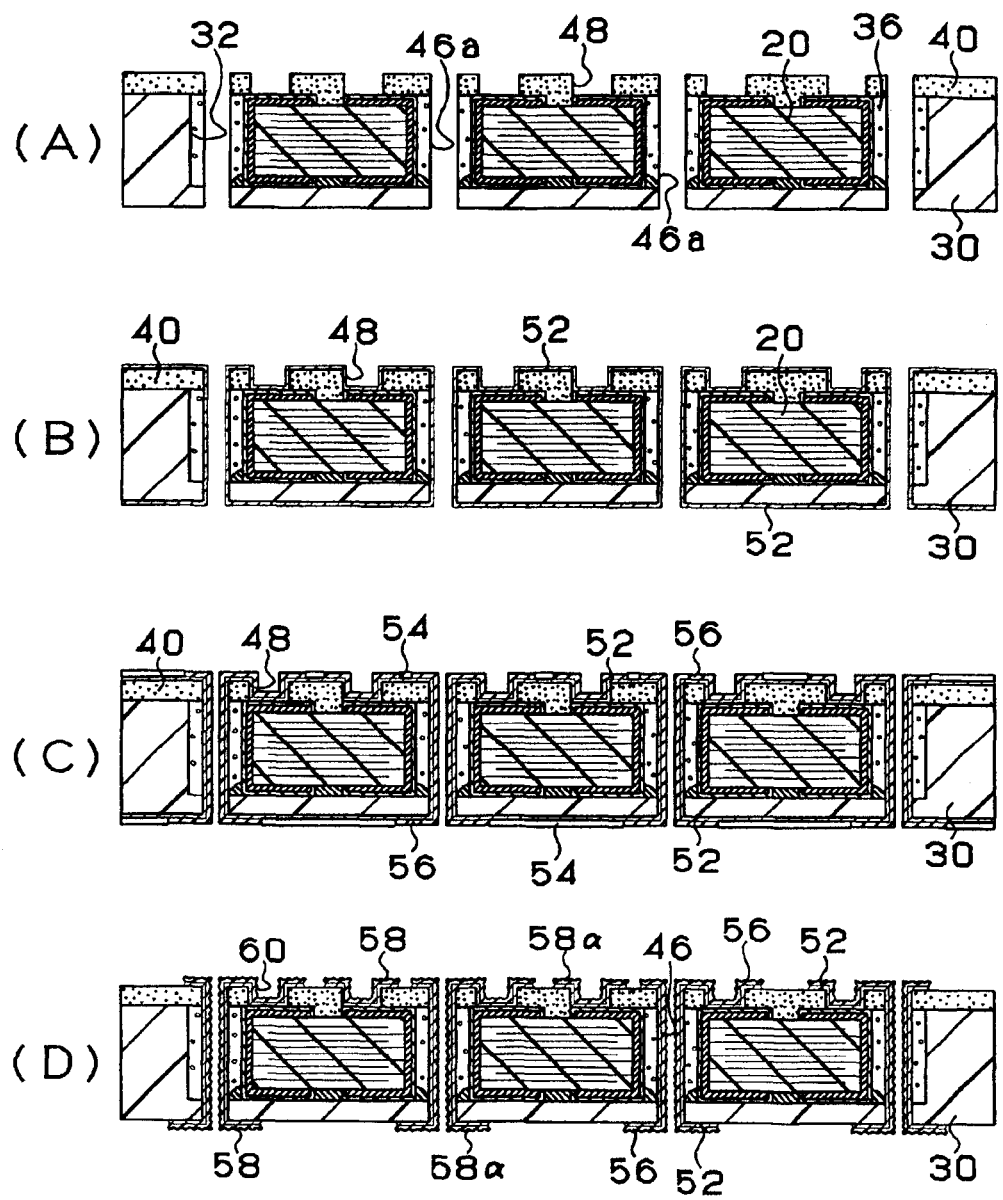
FIG. 3 is a diagram showing a process for manufacturing a printed circuit board according to a first embodiment.
Figure 4:
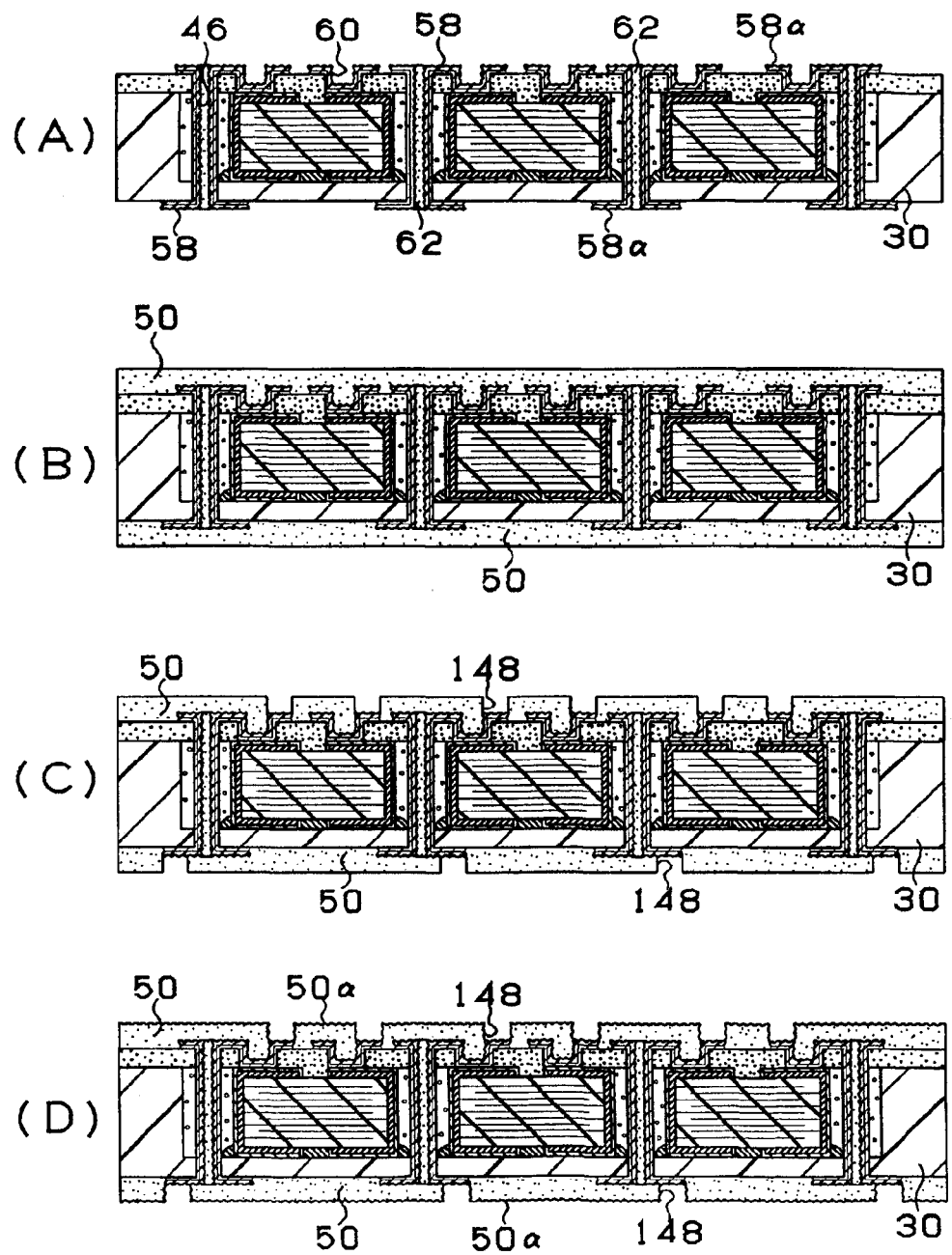
FIG. 4 is a diagram showing a process for manufacturing a printed circuit board according to a first embodiment.
Figure 5:
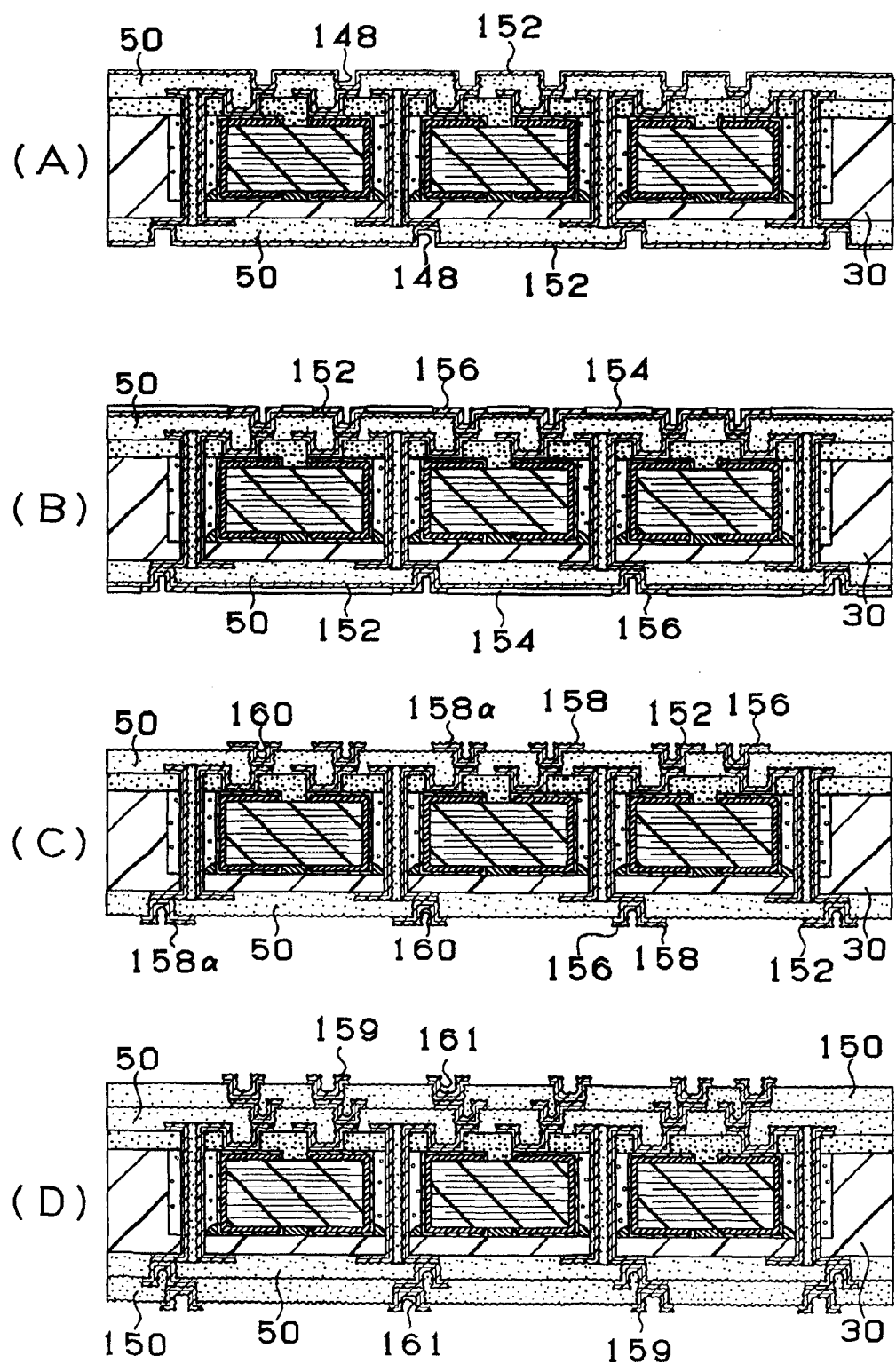
FIG. 5 is a diagram showing a process for manufacturing a printed circuit board according to a first embodiment.
Figure 7:
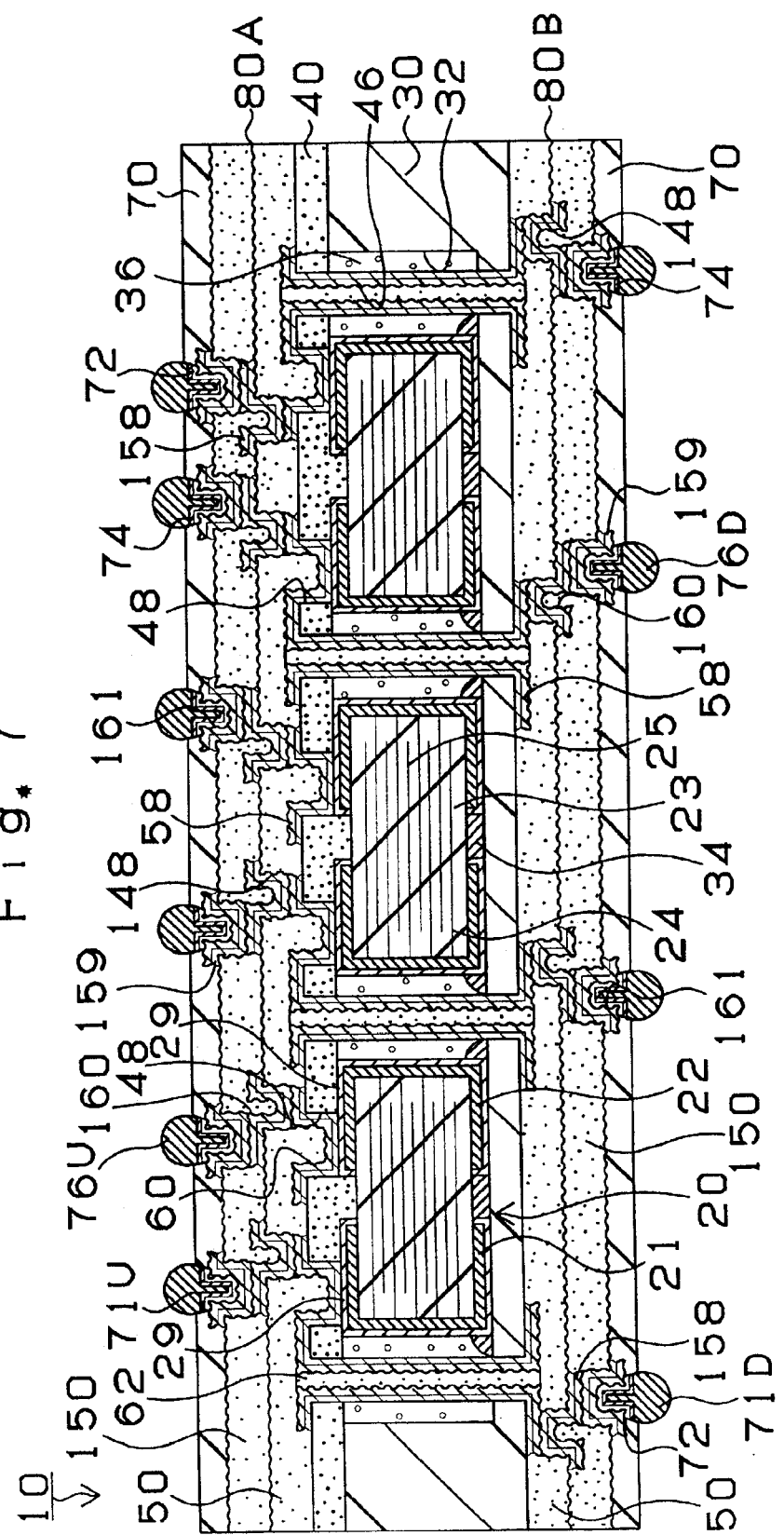
FIG. 7 is a diagram showing a cross section of the printed circuit board according to a first embodiment.
Figure 8:
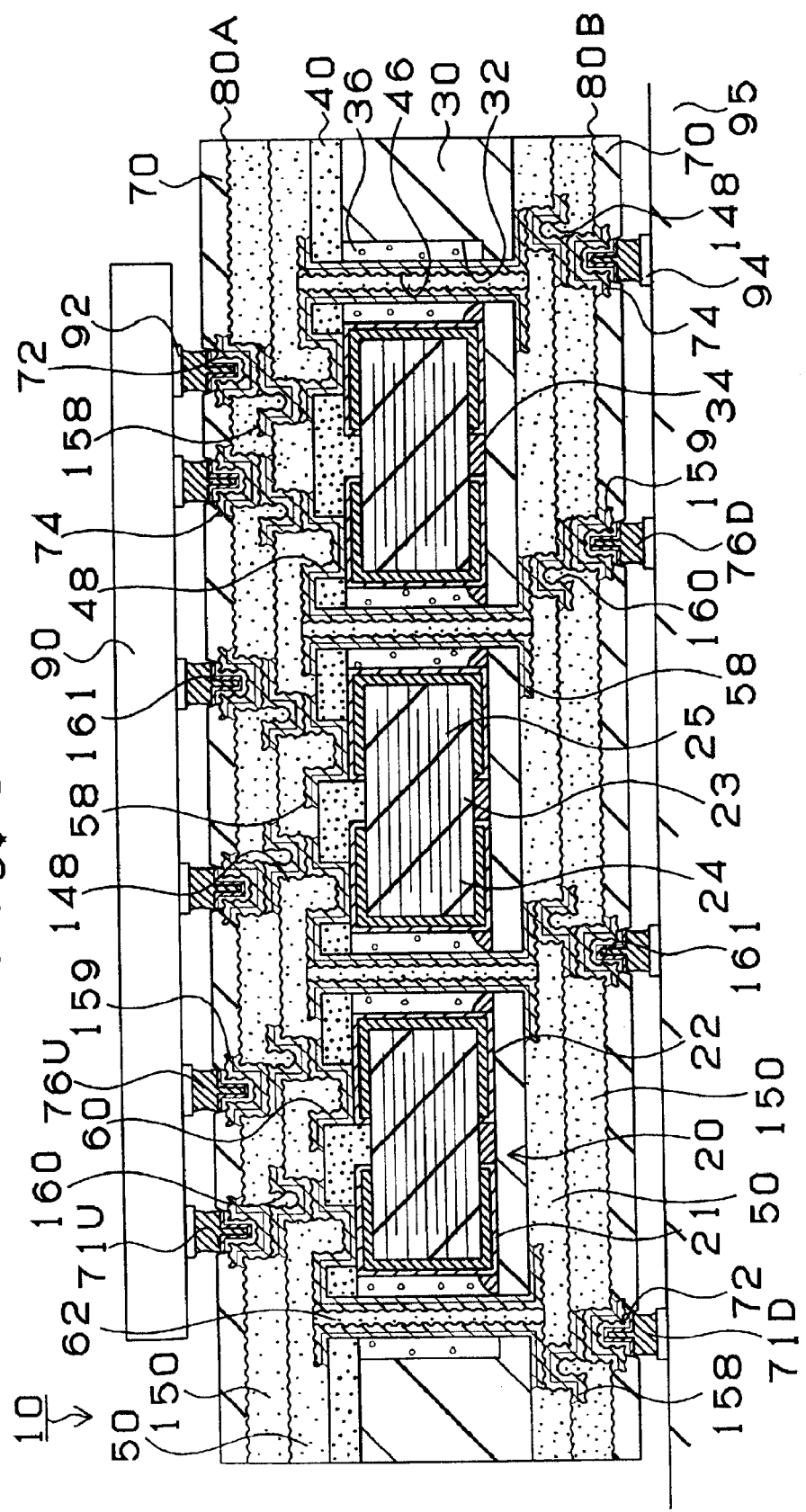
FIG. 8 is a diagram showing a cross section of the state where an IC chip is mounted on the printed circuit board according to the first embodiment.
Figure 9:
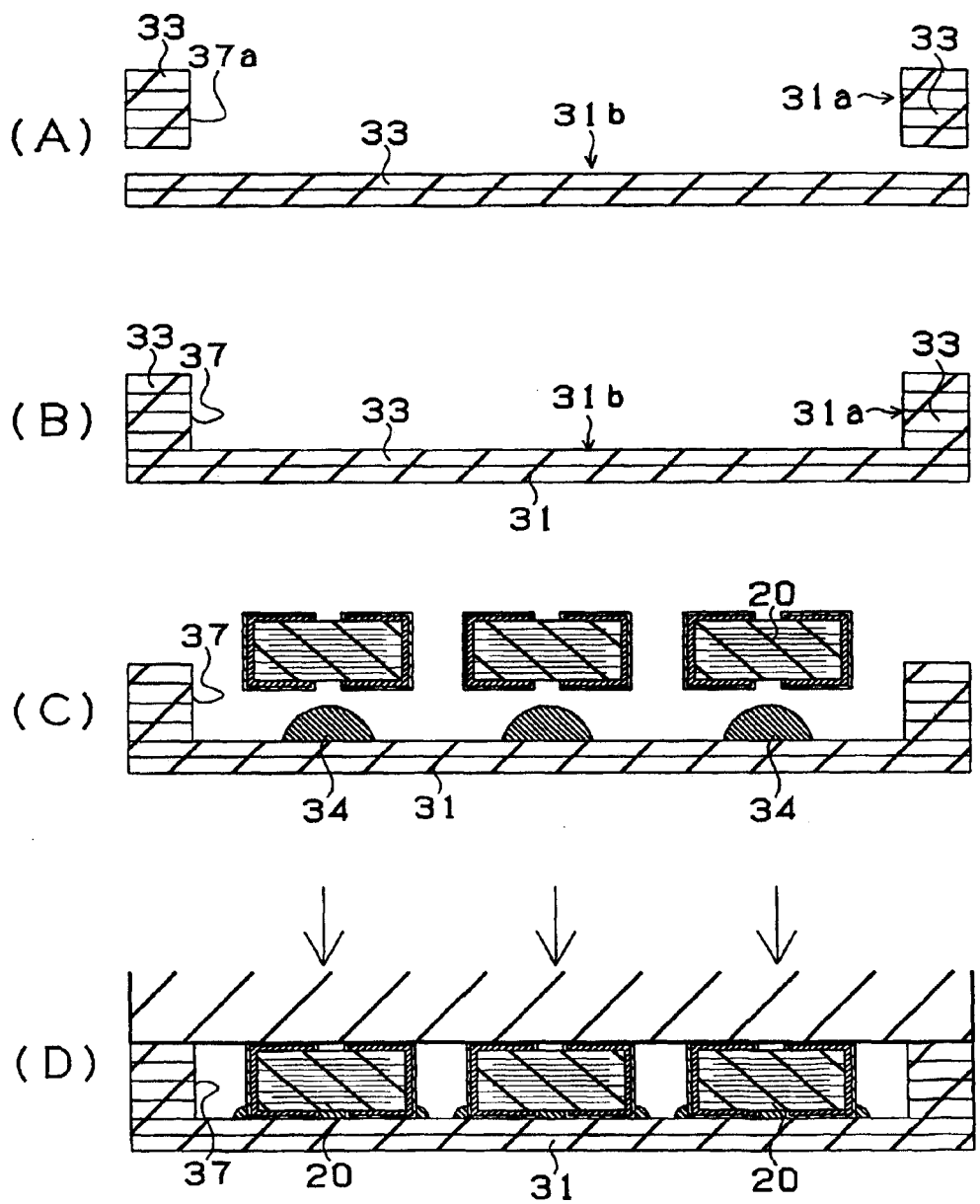
FIG. 9 is a diagram showing a process for manufacturing a printed circuit board according to a first modification of the first embodiment.
Figure 10:
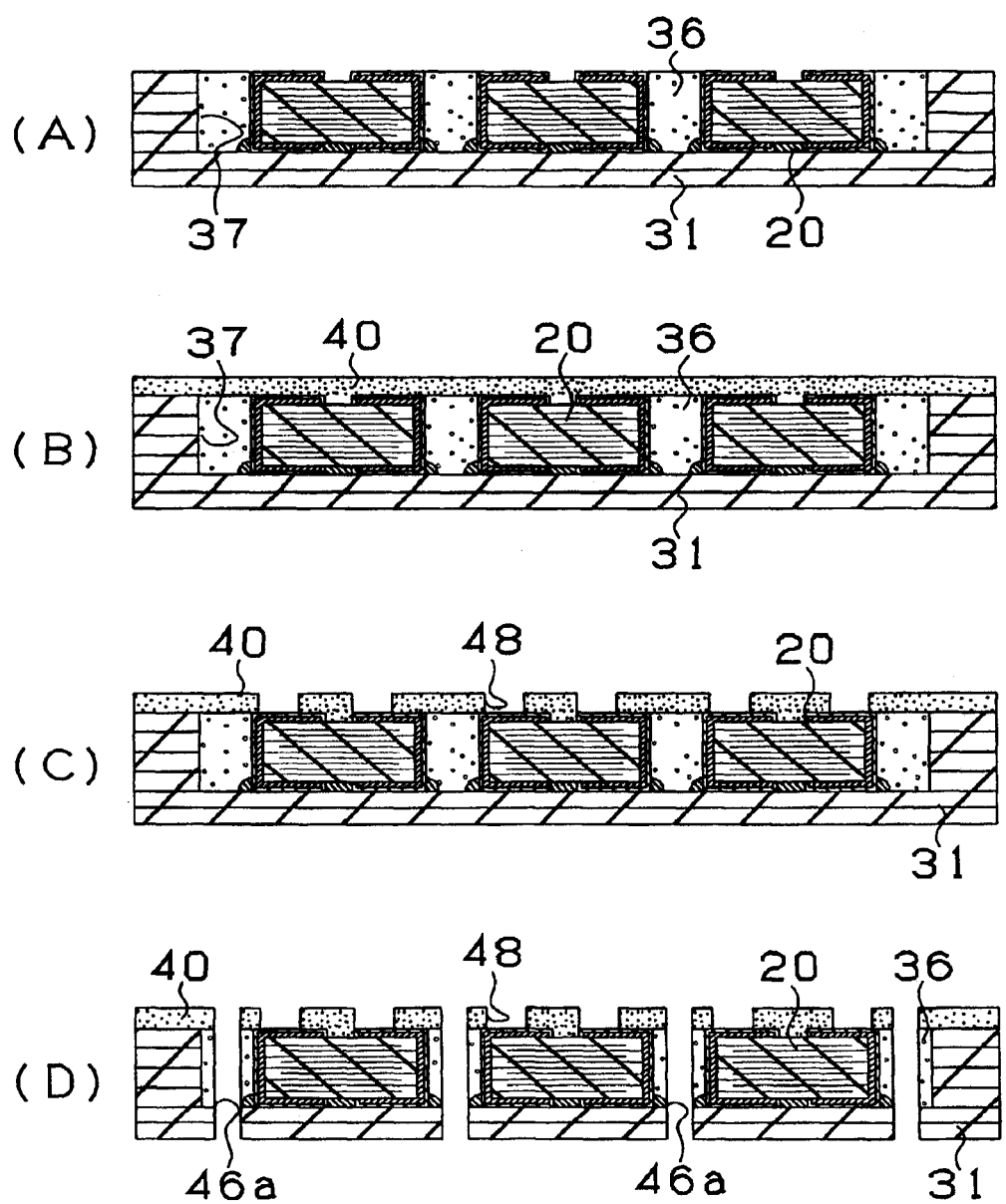
FIG. 10 is a diagram showing a process for manufacturing a printed circuit board according to a first modification of the first embodiment.
Figure 11:
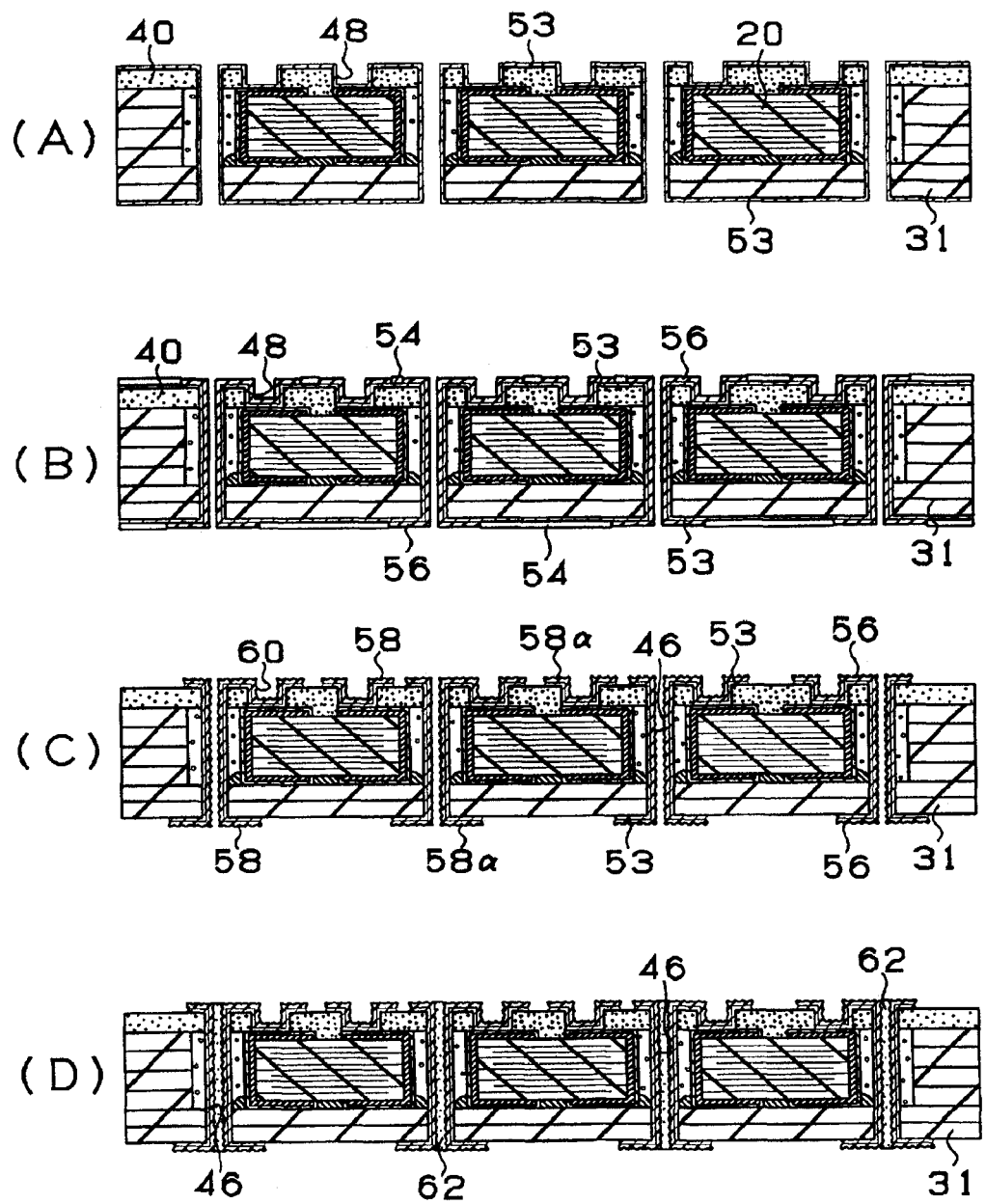
FIG. 11 is a diagram showing a process for manufacturing a printed circuit board according to a first modification of the first embodiment.
Figure 12:
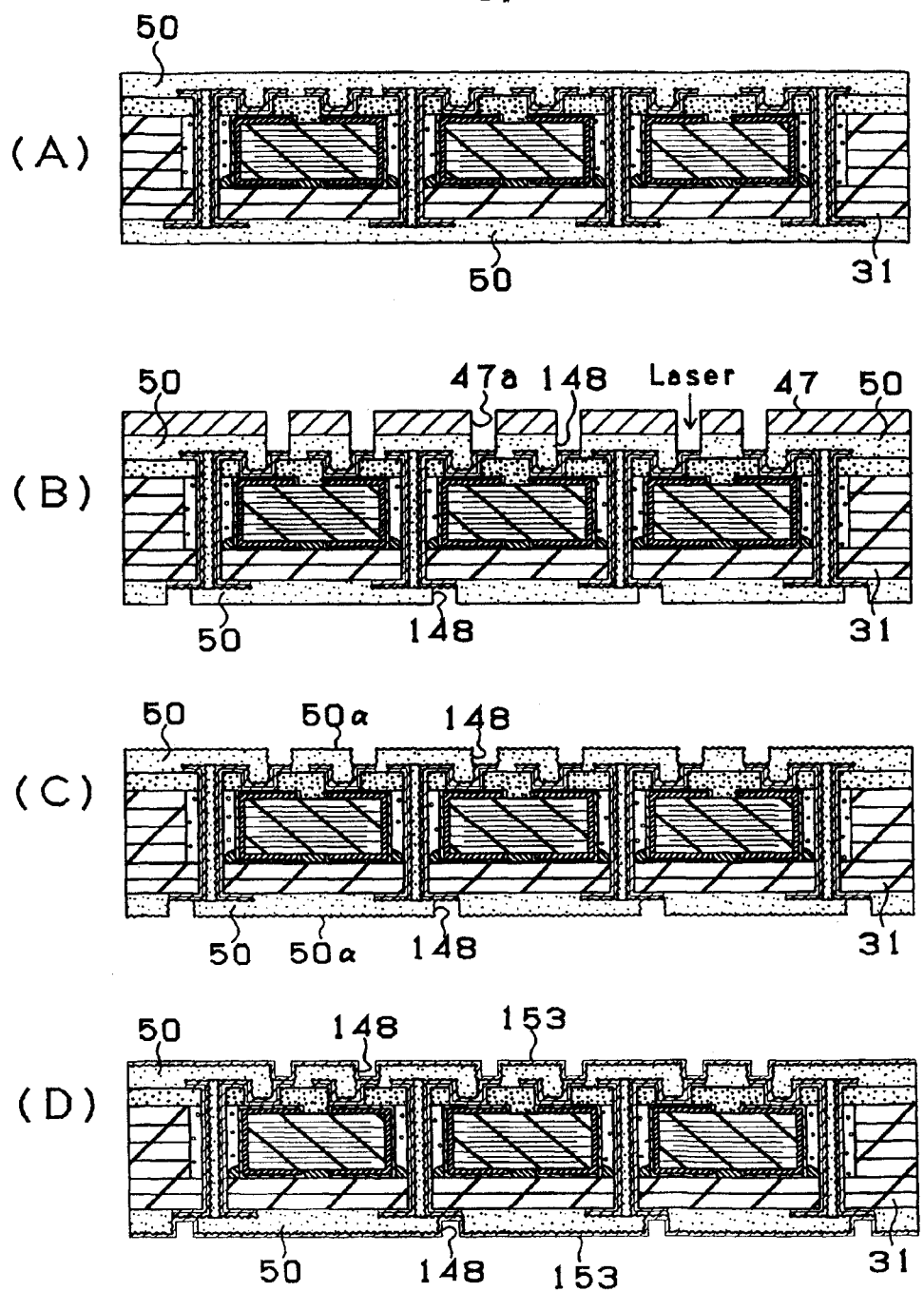
FIG. 12 is a diagram showing a process for manufacturing a printed circuit board according to a first modification of the first embodiment.
Figure 13:
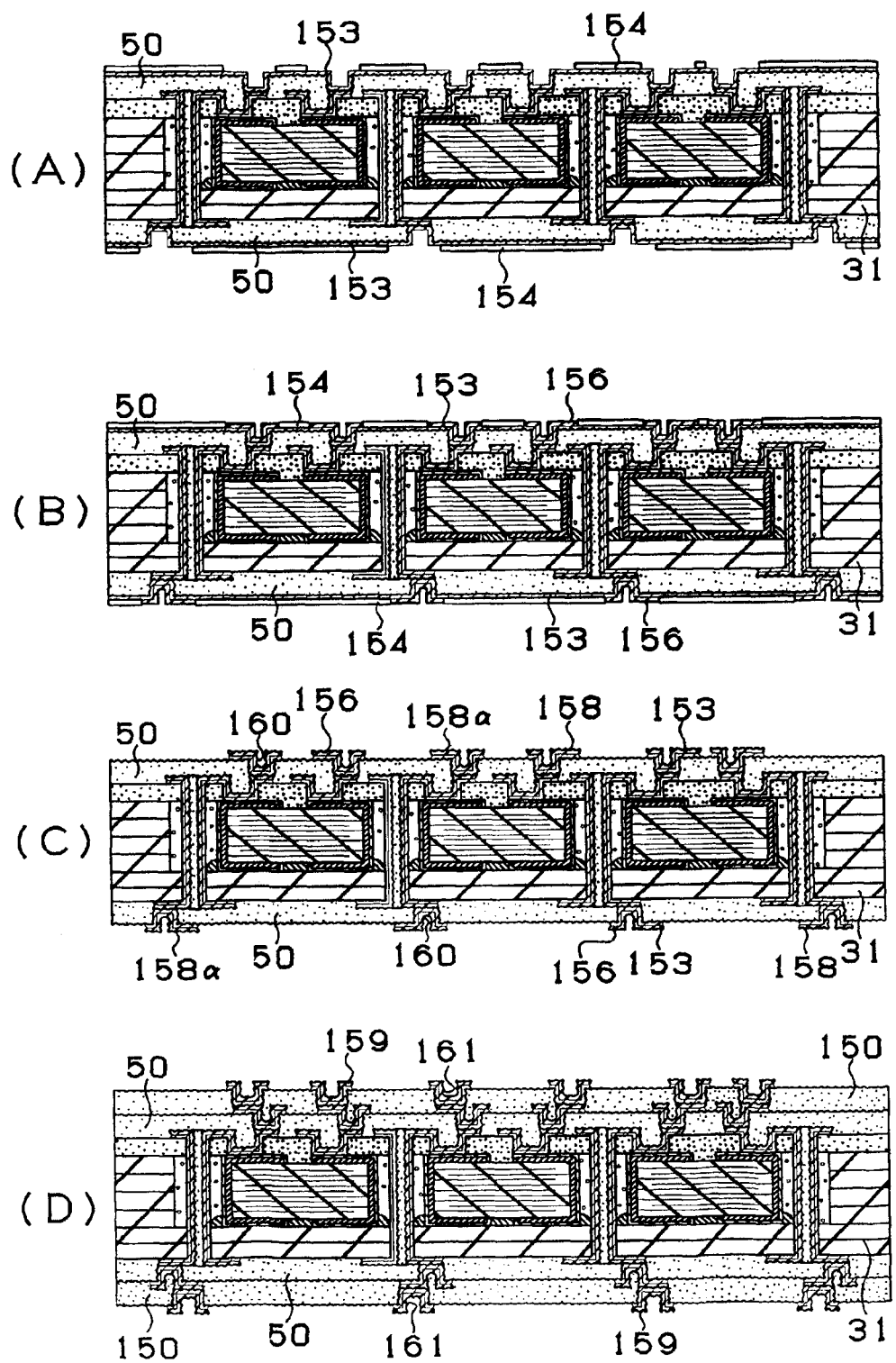
FIG. 13 is a diagram showing a process for manufacturing a printed circuit board according to a first modification of the first embodiment.

First, the structure of a printed circuit board according to a first embodiment of the present invention will be described with reference to FIGS. 7 and 8. FIG. 7 is a diagram showing across section of a printed circuit board 10. FIG. 8 is a diagram showing a state where an IC chip 90 is mounted on the printed circuit board 10 shown in FIG. 7, and the printed circuit board 10 is attached onto a daughter board 95.

As shown in FIG. 7, the printed circuit board 10 is constituted by a core substrate 30 accommodating a plurality of chip capacitors 20, and a buildup circuit layers 80A, BOB. The buildup circuit layers 80A and 80B are constituted by an interlayer resin insulating layer 50 and 150. The interlayer resin insulating layer 50 has via holes 160 and conductor circuits 158. The interlayer resin insulating layer 150 has via holes 161 and conductor circuits 159. A solder resist layer 70 is formed on the interlayer resin insulating layer 150.

As shown in FIG. 17(A), the chip capacitor 20 is constituted by a first electrode 21, a second electrode 22, and a dielectric body 23 interposed between the first and second electrodes 21, 22. The dielectric body 23 includes a plurality of first conductive films 24 connected to the first electrode 21 and a plurality of second conductive films 25 connected to the second electrode 22 in an opposed relation to each other.

As shown in FIG. 8, a solder bump 76U is formed in each via hole 161 on the upper buildup circuit layer 80A to connect the buildup circuit layer 80A to each pad 92 of the IC chip 90. On the other hand, a solder bump 76D is formed in each via hole 161 on the lower buildup circuit layer 80B to connect the lower buildup circuit layer 80B to each pad 94 of the daughter board 95. Through holes 46 are formed in the core substrate 30.

In this embodiment, the printed circuit board 10 is formed with a large cavity 32. Due to this structure, a plurality of chip capacitors 20 can reliably be arranged on the substrate even if the accuracy of spot-facing process is low. The chip capacitors 20 can be arranged in positions close to each other in the cavity 32, thereby increasing the packaging density of the capacitors. In addition, the plurality of chip capacitors 20 are arranged at identical heights to each other in the cavity 32, and therefore, as will be described later, the resin layer can be formed on the core substrate into a uniform thickness, and the via holes can be stably formed. Since the interlayer resin insulating layers 50, 150, and the conductor circuits 158, 159 can be appropriately formed on the core substrate 30, the rate of generating defective printed circuit boards 10 can be lowered.

As the material of the core substrate, a resin material is used. For example, resin materials used for general printed circuit boards, such as base materials impregnated with glass epoxy resin and base materials impregnated with phenolic resin. It is impossible to use substrates made of ceramic and AlN as the core substrate. These substrates are poor in outer shape processing characteristics, and cannot accommodate capacitors in some cases. In addition, a void is created inside the substrate even if it is filled with a resin.

Since a resin layer 36 is charged into the space between the chip capacitors 20, the chip capacitors 20 can be located and firmly fixed at accurate positions in the cavity 32. In addition, the migration at the connection between the capacitors and the via holes can be prevented.

The thermal expansion coefficients of the resin layer 36 and the adhesive material 34 provided on the bottom surface of the chip capacitor 20 are set to the values lower than those of the core substrate 30 and the resin insulating layer 40, that is, are set to the values close to that of the chip capacitor 20 made of ceramics. In this manner, even if internal stress is generated between the core substrate 30 and the resin insulating layer 40, and the chip capacitors 20 caused by the difference in the thermal expansion coefficients therebetween, cracks and peelings on the core substrate 30 and the resin insulating layer 40 do not easily occur. As a result, high reliability can be attained.

Since the resin layer 36 provided between the chip capacitors 20 has the through holes 46, a signal line does not pass through the chip capacitors 20 made of ceramics. This structure eliminates the problems that the impedance becomes discontinuous by the high dielectric body to generate a reflection, and that the transmission is delayed by passing through the high dielectric body. It is possible to provide wires under the capacitors, and external terminals such as wires and pins have an increased degree of freedom, thereby attaining high density and small size.

As shown in FIG. 17(A), in the chip capacitor 20, the first electrode 21 and second electrode 22 respectively include a metal layer 26 and a copper plated film 29 coating the metal layer 26. The plated film is formed by electrolytic plating, electroless plating, and the like. As shown in FIG. 7, an electric connection for the first and second electrodes 21, 22 coated with the copper plated film 29 is established by the via hole 60 made of copper plating. The electrodes 21, 22 of the chip capacitor are metallized and has pits and projections on their surfaces. If the metal layer 26 is left uncoated and exposed to the outside, the resin may be left in the pits and projections in the step of forming openings 48 in the resin insulating layer 40 which will be described later. The resin left in the pits and projections may cause a disconnection between the first and second electrodes 21, 22 and the via hole 60. Contrary to this, in the embodiment of the present invention, the surfaces of the first and second electrodes 21, 22 coated with the copper plated film 29 are flat and smooth. When the openings 48 are formed in the resin insulating layer 40 formed on the electrodes 21, 22, no resin is left on the surfaces of the electrodes 21,22. When the via holes 60 are formed, the connection between the via holes 60 and the electrodes 21, 22 has increased reliability.

Since the via holes 60 are made by plating into the electrodes 21, 22 formed with the copper plated film 29, the electrodes 21, 22 are firmly connected to the via holes 60. No disconnection occurs between the electrodes 21, 22 and via holes 60 even when a heat cycle test is conducted.

The copper plated film 29 is formed after a nickel/tin layer provided onto the surface of the metal layer 26 in the step of manufacturing the chip capacitor is peeled off at the time of mounting the chip capacitor onto the printed circuit board. Alternatively, the copper plated film 29 may be directly provided onto the surface of the metal layer 26 in the step of manufacturing the chip capacitor 20. In this embodiment, openings which extend to the copper plated film 29 of the electrodes is formed by a laser, and then a desmear process is performed to form via holes by copper plating. Therefore, even if an oxide film is formed on the surface of the copper plated film 29, the oxide film can be removed in the laser or desmear process. In this manner, the first and second electrodes 21, 22 can be properly connected to the via holes 60.

As shown in FIG. 17(B), the first and second electrodes 21, 22 of the capacitor 20 may be partially uncoated with the coating 28. When partially uncoated and exposed to the outside, the connection of the first and second electrodes 21, 22 to the via holes 60 can be enhanced.

On the surface of the dielectric body 23 made of ceramic of the chip capacitor 20, a rough surface 23α may be formed. The rough surface 23α contributes to an increased adhesion between the chip capacitor 20 made of ceramic and a resin insulating layer 40 made of resin, thereby avoiding the resin insulating layer 40 from peeling from the interface with the chip capacitor 20 even when a heat cycle test is conducted. The rough surface 23α can be formed by polishing the surface of the chip capacitor 20 after the sintering step, or by roughening the surface of the chip capacitor 20 before the sintering step. In this embodiment, the surface of the chip capacitor is roughened to increase its adhesion with the resin insulating layer. Alternatively, the surface of the chip capacitor may be subjected to silane coupling process.

Next, the method for manufacturing the printed circuit board, described above with reference to FIG. 7, will be described with reference to FIGS. 1 to 7.

(1) First, a core substrate 30 which is an insulating resin substrate is used as a starting material (FIG. 1(A)). Then, a cavity 32 for accommodating capacitors is formed on one side of the core substrate 30 by a spot-facing process (FIG. 1(B)). At this time, the cavity 32 is formed to have an area larger than the area in which a plurality of capacitors are to be provided. In this manner, a plurality of capacitors can be provided on the core substrate 30 assuredly.

(2) After that, an adhesive material 34 is applied onto the cavity 32 by a printer (FIG. 1(C)). At this time, potting may be conducted on top of the application of the adhesive material 34. As the adhesive material 34, an adhesive material having a thermal expansion coefficient smaller than those of the core substrate 30 and the resin insulating layer 40 is used. Then, a plurality of chip capacitors 20 (FIG. 17) made of ceramic are placed onto the adhesive material 34 (FIG. 1(D)). By placing a plurality of chip capacitors 20 onto the cavity 32 having a flat and smooth bottom surface, the plurality of chip capacitor 20 are aligned into the same heights with each other. Thus-obtained core substrate 30 has a flat and smooth surface. In addition, since the cavity 32 has a large area, the chip capacitors 20 can be located at accurate positions with high density.

(3) The top surfaces of the chip capacitors 20 are pushed or tapped to align the chip capacitors 20 into the same heights with each other (FIG. 2(A)). By this process, even if chip capacitors 20 having largely different sizes from each other are provided in the cavity 32, they are aligned into the completely same heights with each other. As a result, the core substrate 30 can has a flat and smooth surface.

(4) After that, a thermosetting resin is charged into the space between the chip capacitors 20 in the cavity 32, and then is heated and cured to form a resin layer 36 (FIG. 2(B)). The thermosetting resin is preferably selected from the group consisting of epoxy, phenol, polyimide, and triazine. The resin layer 36 serves to fix the chip capacitors 20 in the cavity 32. For the resin layer 36, a resin having a thermal expansion coefficient smaller than those of the core substrate 30 and the resin insulating layer 40 is used.

Alternatively, the resin layer 36 may be made of other resins such as thermoplastic resin. The resin may be impregnated with a filler for adjusting the thermal expansion coefficient. Examples of the filler include inorganic fillers, ceramic fillers, and metal fillers.

(5) Onto thus-obtained structure, a resin selected from epoxy resins which will be described later is applied with a printer to form a resin insulating layer 40 (FIG. 2(C)). Instead of applying the resin, a resin film may be attached.

Instead of epoxy resins, it is also possible to use one or more resins selected from the group consisting of thermosetting resins, thermoplastic resins, photosensitive resins, complexes of thermosetting resins and thermoplastic resins, and complexes of photosensitive resins and thermoplastic resins. The resin insulating layer may have two-layered structure made of these resins.

(6) After that, openings 48 for via holes are formed in the resin insulating layer 40 by a laser (FIG. 2(D)), and then, a desmear process is conducted. Instead of the process using a laser, exposure to light and development may be employed. Then, penetrating openings 46a for through holes are formed with a drill or laser, and are heated and cured (FIG. 3(A)). Alternatively, a desmear process using a drug solution of permagnetic acid or plasma may be conducted.

(7) A copper plated film 52 is formed on the surface of the resin insulating layer 40 by an electroless copper plating (FIG. 3(B)). Instead of the electroless plating to form the copper plated film 52, it is also possible to conduct sputtering using an Ni—Cu alloy as a target to form an Ni—Cu alloy layer. As the case may be, after the sputtering to form the Ni—Cu alloy layer, an electroless plated film may be formed thereon.

(8) A photosensitive dry film is attached on the surface of the copper plated film 52, and a mask is placed thereon. In this state, exposure to light and in development are conducted to form a resist 54 having a predetermined pattern. The resultant core substrate 30 is immersed into an electrolytic plating solution, and a current is allowed to flow into the core substrate 30 through the copper plated film 52 to precipitate an electrolytic plated film 56 (FIG. 3(C)).

(9) The plated resist 54 is peeled and removed with 5% NaOH, and the copper plated film 52 located under the plated resist 54 is etched with a mixed solution of sulfuric acid and hydrogen peroxide to be dissolved and removed. As a result, a conductor circuit 58 (including via holes 60 ) constituted by the copper plated film 52 and the electrolytic copper plated film 56, and through holes 46 are formed. Since the through holes 46 are formed, no signal line passes through the chip capacitors 20. In this manner, there is no problem that the impedance becomes discontinuous by the high dielectric body to generate a reflection, and that the transmission is delayed by passing through the high dielectric body. An etching solution is sprayed onto both surfaces of the substrate to etch the surface of the conductor circuit 58 and the land surfaces of the through holes 46 to form a rough surface 58α over the entire surface of the conductor circuit 58 (FIG. 3(D)).

(10) A resin filler 62 containing epoxy resin as a main component is charged into the through holes 46, and is dried (FIG. 4(A)). Instead of the resin filler containing epoxy resin as a main component, it is also possible to use thermosetting resins, thermoplastic resins, and UV ray hardening resins. Among them, thermosetting resins are preferable, because they are easy to handle when charged into the through holes.

(11) After the foregoing process is finished, a thermosetting epoxy resin sheet having a thickness of 50 μm is vacuum-seal laminated to both surfaces of the substrate while raising the temperature in a range between 50 and 150° C. under a pressure of 5 kg/cm$^2$ to form an interlayer resin insulating layer 50 made of epoxy resin (FIG. 4(B)). The degree of vacuum when the vacuum sealing process is performed is 10 mmHg. Instead of epoxy resin, olefin resin also may be used.

(12) openings 148 each having a diameter of 80 μm for via holes are formed in the interlayer resin insulating layer 50 with a $CO^2$ gas laser having a wavelength of 10.4 μm under conditions that the beam diameter is 5 mm, the mode is the top-hat mode, the pulse width is 5.0μ second, the hole diameter of mask is 0.5 mm, and three shots are performed (FIG. 4(C)). Then, a desmear process is conducted using an oxygen plasma.

(13) A plasma treatment is conducted using SV-4540 manufactured by Nippon Shinku Gijyutsu Co., Ltd. where the surface of the interlayer resin insulating layer 50 is roughen to form a rough surface 50α (FIG. 4(D)). The plasma treatment is conducted using an argon as an inert gas with an electric power of 200 W under gas pressure of 0.6 Pa at 70° for 2 minutes. Instead of the plasma treatment, roughening process may be conducted using an acid or oxidizer. The rough surface preferably has a thickness of 0.1 to 5 μm.

(14) The argon gas in the SV-4540 is exchanged with new argon gas, and the sputtering is conducted using an Ni—Cu alloy as a target in the same SV-4540 with an electric power of 200 W under a pressure of 0.6 Pa at 80° C. for 5 minutes to form an Ni—Cu alloy layer 152 on the surface of the interlayer resin insulating layer 50. The Ni—Cu alloy layer 152 has a thickness of 0.2 μm (FIG. 5(A)). Alternatively, a plated film such as an electroless plated film may be formed, or a plated film may be formed on the sputtered Ni—Cu alloy layer 152

(15) After the foregoing steps, a commercially available photosensitive dry film is attached on both sides of the substrate 30, and a photo mask film is placed thereon. In this state, the substrate 30 is exposed to light with 100 mJ/cm$^2$. Then, the substrate 30 is developed with 0.8% sodium carbonate to form a plated resist 154 having a thickness of 15 μm. After that, an electrolytic plating is conducted under the following conditions to form an electrolytic plated film 156 having a thickness of 15 μm (FIG. 5((B)). By this process, the electrolytic plated film 156 enlarges the thickness of the portion which will be the conductor circuit 158 in the step described later and fills and plates the portion which will be the via holes 160 in the steps described later. The additive added in the electrolytic plating aqueous solution is Caparaside HL produced by Atotech Japan Co., Ltd.
[Electrolytic Plating Aqueous Solution]
 sulfuric acid: 2.24 mol/l
 copper sulfate: 0.26 mol/l
 additive (Caparaside HL produced by Atotech Japan Co., Ltd.): 19.5 mol/l
[Conditions for Electrolytic Plating]
 current density: 1A/dm$^2$
 time: 65 minutes
 temperature 22±2° C.

(16) The plated resist 154 is peeled and removed in 5% NaOH. After that, the Ni—Cu alloy layer 152 located under the plated resist is dissolved and removed by etching using sulfuric acid and a mixed solution of sulfuric acid and hydrogen peroxide. As a result, a conductor circuit 158 having a thickness of 16 $\mu$m constituted by the Ni—Cu alloy layer 152 and the electrolytic plated film 156, and via holes 160 (FIG. 5(C)).

(17) The foregoing steps (11) to (16) are repeated to further forming an upper interlayer resin insulating layer 150 and a conductor circuit 159 (including via holes 161) (FIG. 5(D)).

(18) Into a vessel, added are 46.67 parts by weigh of oligomer which is obtained by forming 50% of epoxy groups of 60 weight percent cresol novolac epoxy resin (manufactured by Nippon Kayaku) dissolved in diethylene glycol dimethyl ether (DMDG) into an acrylic structure and which imparts photosensitive characteristic, 15 parts by weight of 80 weight percent bisphenol A epoxy resin (Epicoat 1001 manufactured by Yuka Shell) dissolved in methylethyl ketone, 1.6 parts by weight of imidazole hardening agent (2E4MZ-CN manufactured by Shikoku Chemical), 3 parts by weight of polyhydric acryl monomer which is a photosensitive monomer (R604 manufactured by Kyoei Chemical), 1.5 parts by weight of polyhydric acryl monomer (DEP6A manufactured by Kyoei Chemical), and 0.71 parts by weight of dispersing defoaming agent (S-65 manufactured by Sannopuko), and mixed and stirred with one another to prepare a mixed composition. Into the mixed composition, added are 2.0 parts by weight of benzophenone (manufactured by Kanto Chemical) serving as a photoinitiator, and 0.2 parts by weight of Michler's ketone (manufactured fo Kanto Chemical) serving as a photosensitizer. Then, the viscosity is adjusted to 2.0 Pa·s at 25° C. so that a solder resist composition (i.e. an organic resin insulating material) is obtained.

The viscosity is measured by using No. 4 rotor of a B-type visometer (DVL-B manufactured by Tokyo Keiki) when the velocity is 60 rpm and No. 3 rotor of the same when the velocity is 6 rpm.

(19) The solder resist composition is applied to both surfaces of the substrate 30 to have a thickness of 20 $\mu$m, and is dried at 70° C. for 20 minutes and 70° C. for 30 minutes. A photomask having a thickness of 5 mm on which a pattern of the solder resist openings are drawn is made hermetic contact and placed onto the solder resist layer 70, and is exposed to light with 1000 mJ/cm$^2$. Then, the resultant is developed with a DMTG solution to form openings 71U, 71D each having a diameter of 200 $\mu$m (FIG. 6(A)). Alternatively, a commercially available solder resist such as LPSR may be employed.

(20) The substrate formed with the solder resist layer (i.e. organic resin insulating layer) 70 is immersed into an electroless nickel plating solution containing nickel chloride (2.3×10$^{-1}$ mol/l), sodium hypophosphite (2.8×10$^{-1}$ mol/l), sodium citrate(1.6×10$^{-1}$ mol/l) and having pH of 4.5 for 20 minutes to form a nickel plated layer 72 having a thickness of 5 $\mu$m in the openings 71U, 71D. The resultant substrate is immersed into an electroless plating solution containing gold potassium cyanide (7.6×10$^{-3}$ mol/l), ammonia chloride (1.9×10$^{-1}$ mol/l), sodium citrate (1.2×10$^{-1}$ mol/l), and sodium hypophosphite (1.7×10$^{-1}$ mol/l) at 80° C. for 7.5 minutes to form a gold plated layer 74 having a thickness of 0.03 $\mu$L m on the nickel plated layer 72. In this manner, solder pads 75 are formed in the via holes 161 and the conductor circuit 159 (FIG. 6(B)).

(21) A solder paste is printed in the openings 71U, 71D of the solder resist layer 70, and is reflowed at 200° C. to form solder bumps (solder bodies) 76U, 76D. In this manner, the printed circuit board 10 having the solder bumps 76U, 76D is obtained (FIG. 7).

Next, a method for mounting an IC chip onto the printed circuit board 10 obtained in the foregoing steps, and a method for attaching the printed circuit board 10 onto a daughter board will be described with reference to FIG. 8. An IC chip 90 is placed on the printed circuit board 10 in such a manner that the solder pads 92 of the IC chip 90 corresponds to the solder bumps 76U of the printed circuit board 10, and is reflowed. As a result, the IC chip 90 is mounted on the printed circuit board 10. Similarly, the printed circuit board 10 is placed on the daughter board 95 in such a manner that the pads 94 of the daughter board 95 corresponds to the solder bumps 76D of the printed circuit board 10, and is reflowed. As a result, the printed circuit board 10 is attached to the daughter board 95.

The above-described resin film contains a refractory resin, soluble particles, a hardening agent, and other components. Hereinafter, each of them will be described.

The resin film used in the manufacturing method of the present invention has a structure in that particles soluble in acid or an oxidizer (hereinafter, referred to as "soluble particles") are dispersed in resin which is refractory with respect to acid or an oxidizer (hereinafter, referred to as "refractory resins").

The expressions "refractory" and "soluble" will now be described. When materials are immersed in solution composed of the same acid or the same oxidizers for the same time, a material of a type which is dissolved at a relatively high dissolving rate is called a "soluble" material for convenience. A material of a type which is dissolved at a relatively slow dissolving rate is called a "refractory material" for convenience.

The soluble particles are exemplified by resin particles which are soluble in acid or an oxidizer (hereinafter called "soluble resin particles"), inorganic particles which are soluble in acid or an oxidizer (hereinafter called "inorganic soluble particles") and metal particles which are soluble in acid or an oxidizer (hereinafter called "soluble metal particles"). The foregoing soluble particles may be employed solely or two or more particles may be employed.

The shape of each of the soluble particles is not limited. The shape may be a spherical shape or a pulverized shape. It is preferable that the particles have a uniform shape. The reason for this lies in that a rough surface having uniformly rough pits and projections can be formed.

It is preferable that the mean particle size of the soluble particles is 0.1 $\mu$m to 10 $\mu$m. When the particles have the diameters satisfying the foregoing range, particles having two or more particle sizes may be employed. That is, soluble particles having a mean particle size of 0.1 $\mu$m to 0.5 $\mu$m and soluble particles is having a mean particle size of 1 μm to 3 μmm may be mixed. Thus, a more complicated rough surface can be formed. Moreover, the adhesiveness with the conductor circuit can be improved. In the present invention, the particle size of the soluble particles is the length of a longest portion of each of the soluble particles.

The soluble resin particles may be particles constituted by thermosetting resin or thermoplastic resin. When the particles are immersed in solution composed of acid or an oxidizer, the particles must exhibit dissolving rate higher than that of the foregoing refractory resin.

Specifically, the soluble resin particles are exemplified by particles constituted by epoxy resin, phenol resin, polyimide resin, polyphenylene resin, polyolefin resin or fluorine resin. The foregoing material may be employed solely or two or more materials may be mixed.

The soluble resin particles may be resin particles constituted by rubber. Rubber above is exemplified by polybutadiene rubber, a variety of denatured polybutadiene rubber, such as denatured epoxy rubber, denatured urethane rubber or denatured (metha) acrylonitrile rubber, and (metha) acrylonitrile butadiene rubber containing a carboxylic group. When the foregoing rubber material is employed, the soluble resin particles can easily be dissolved in acid or an oxidizer. That is, when the soluble resin particles are dissolved with acid, dissolution is permitted with acid except for strong acid. When the soluble resin particles are dissolved, dissolution is permitted with permanganate which has a relatively weak oxidizing power. When chromic acid is employed, dissolution is permitted even at a low concentration. Therefore, retention of the acid or the oxidizer on the surface of the resin can be prevented. When a catalyst, such as palladium chloride, is supplied after the rough surface has been formed as described later, inhibition of supply of the catalyst and oxidation of the catalyst can be prevented.

The inorganic soluble particles are exemplified by particles made of at least a material selected from a group consisting of an aluminum compound, a calcium compound, a potassium compound, a magnesium compound and a silicon compound.

The aluminum compound is exemplified by alumina and aluminum hydroxide. The calcium compound is exemplified by calcium carbonate and calcium hydroxide. The potassium compound is exemplified by potassium carbonate. The magnesium compound is exemplified by magnesia, dolomite and basic magnesium carbonate. The silicon compound is exemplified by silica and zeolite. The foregoing material may be employed solely or two or more materials may be mixed.

The soluble metal particles are exemplified by particles constituted by at least one material selected from a group consisting of copper, nickel, iron, zinc, lead, gold, silver, aluminum, magnesium, potassium and silicon. The soluble metal particles may have surfaces coated with resin or the like in order to maintain an insulating characteristic.

When two or more types of the soluble particles are mixed, it is preferable that the combination of the two types of soluble particles is combination of resin particles and inorganic particles. Since each of the particles has low conductivity, an insulating characteristic with the resin film can be maintained. Moreover, the thermal expansion can easily be adjusted with the refractory resin. Thus, occurrence of a crack of the interlayer resin insulating layer constituted by the resin film can be prevented. Thus, separation between the interlayer resin insulating layer and the conductor circuit can be prevented.

The refractory resin is not limited when the resin is able to maintain the shape of the rough surface when the rough surface is formed on the interlayer resin insulating layer by using acid or oxidizer. The refractory resin is exemplified by thermosetting resin, thermoplastic resin and their composite material. As an alternative to this, the foregoing photosensitive resin of a type having photosensitive characteristic imparted thereto may be employed. When the photosensitive resin is employed, exposure and development processes of the interlayer resin insulating layers can be performed to form the openings for the via holes.

In particular, it is preferable that the resin containing thermosetting resin is employed. In the foregoing case, the shape of the rough surface can be maintained against plating solution and when a variety of heating processes are performed.

The refractory resin is exemplified by epoxy resin, phenol resin, phenoxy resin, polyimide resin, polyphenylene resin, polyolefin resin and fluorine resin. The foregoing material may be employed solely or two or more types of the materials may be mixed.

It is preferable that epoxy resin having two or more epoxy groups in one molecule thereof is employed. The reason for this lies in that the foregoing rough surface can be formed. Moreover, excellent heat resistance and the like can be obtained. Thus, concentration of stress onto the metal layer can be prevented even under a heat cycle condition. Thus, occurrence of separation of the metal layer can be prevented.

The epoxy resin is exemplified by cresol novolac epoxy resin, bisphenol-A epoxy resin, bisphenol-F epoxy resin, phenol novolac epoxy resin, alkylphenol novolac epoxy resin, biphenol-F epoxy resin, naphthalene epoxy resin, dicyclopentadiene epoxy resin, an epoxy material constituted by a condensation material of phenol and an aromatic aldehyde having a phenol hydroxyl group, triglycidyl isocyanurate and alicyclic epoxy resin. The foregoing material may be employed solely or two or more material may be mixed. Thus, excellent heat resistance can be realized.

It is preferable that the soluble particles in the resin film according to the present invention are substantially uniformly dispersed in the refractory resin. The reason for this lies in that a rough surface having uniform pits and projection scan be formed. When via holes and through holes are formed in the resin film, adhesiveness with the metal layer of the conductor circuit can be maintained. As an alternative to this, a resin film containing soluble particles in only the surface on which the rough surface is formed may be employed. Thus, the portions of the resin film except for the surface is not exposed to acid or the oxidizer. Therefore, the insulating characteristic between conductor circuits through the interlayer resin insulating layer can reliably be maintained.

It is preferable that the amount of the soluble particles which are dispersed in the refractory resin is 3 wt % to 40 wt % with respect to the resin film. When the amount of mixture of the soluble particles is lower than 3 wt %, the rough surface having required pits and projections cannot be formed. When the amount is higher than 40 wt %, deep portions of the resin film are undesirably dissolved when the soluble particles are dissolved by using acid or the oxidizer. Thus, the insulating characteristic between the conductor circuits through the interlayer resin insulating layer constituted by the resin film cannot be maintained. Thus, short circuit is sometimes is caused to occur.

It is preferable that the resin film contains a hardening agent and other components as well as the refractory resin.

The hardening agent is exemplified by an imidazole hardening agent, an amine hardening agent, a guanidine hardening agent, an epoxy adduct of each of the foregoing hardening agents, a microcapsule of each of the foregoing hardening agents and an organic phosphine compound, such as triphenylphosphine or tetraphenyl phosphonium tetraphenyl borate.

It is preferable that the content of the hardening agent is 0.05 wt % to 10 wt % with respect to the resin film. When the content is lower than 0.05 wt %, the resin film cannot sufficiently be hardened. Thus, introduction of acid and the oxidizer into the resin film occurs greatly. In the foregoing case, the insulating characteristic of the resin film sometimes deteriorates. When the content is higher than 10 wt %, an excessively large quantity of the hardening agent component sometimes denatures the composition of the resin. In the foregoing case, the reliability sometimes deteriorates.

The other components are exemplified by an inorganic compound which does not exert an influence on the formation of the rough surface and a filler constituted by resin. The inorganic compound is exemplified by silica, alumina and dolomite. The resin is exemplified by polyimide resin, polyacrylic resin, polyamideimide resin, polyphenylene resin, melanine resin and olefin resin. When any one of the foregoing fillers is contained, conformity of the thermal expansion coefficients can be established. Moreover, heat resistance and chemical resistance can be improved. As a result, the performance of the printed circuit board can be improved.

The resin film may contain solvent. The solvent is exemplified by ketone, such as acetone, methylethylketone or cyclohexane; aromatic hydrocarbon, such as ethyl acetate, butyl acetate, cellosolve acetate, toluene or xylene. The foregoing material may be employed solely or two or more materials may be mixed.

First Modification of First Embodiment

Figure 15:
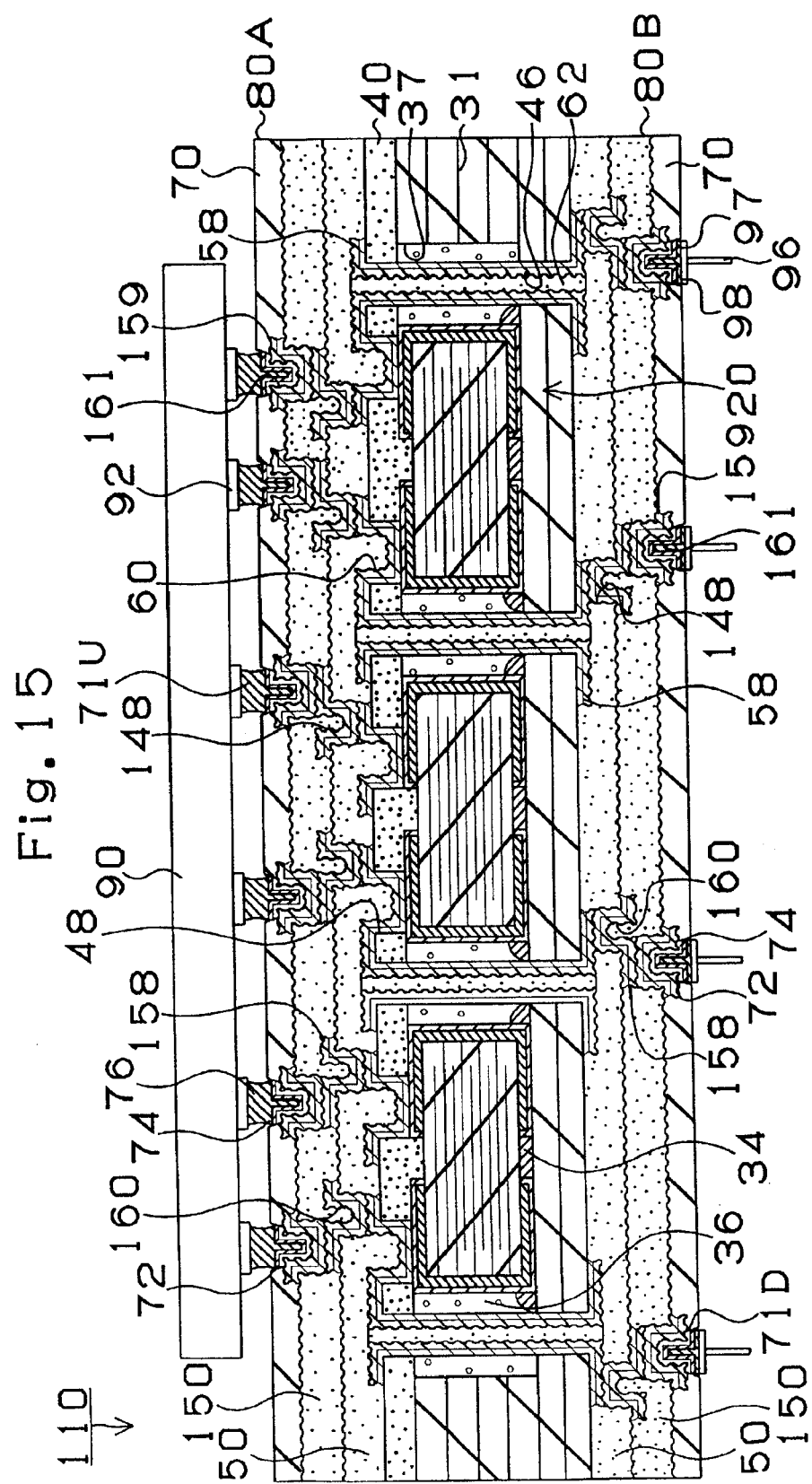
FIG. 15 is a diagram showing a cross section of the state where an IC chip is mounted on the printed circuit board according to the first modification of the first embodiment.

A printed circuit board 110 according to a first modification of the first embodiment of the present invention will be described with reference to FIG. 15. In the foregoing first embodiment, the BGA is provided. The first modification of the first embodiment has a structure similar to that according to the first embodiment, except that a PGA method is employed with which connection is established through conductive connection pins 96 as shown in FIG. 15.

A method for manufacturing the printed circuit board described above with reference to FIG. 15 will be described referring to FIGS. 9 to 15.

(1) Four prepregs 33 impregnated with an epoxy resin are laminated on top of each other to form a laminated plate 31a, and a penetrating opening 37a for accommodating chip capacitors is formed in the laminated plate 31a. On the other hand, two prepregs 33 are laminated on top of each other to form a laminated plate 31b (FIG. 9(A)). The prepreg 33 maybe impregnated with, instead of the epoxy resin, BT, phenolic resin, or reinforcement material such as glass cloth.

By forming the penetrating opening 37a for accommodating chip capacitors in such a manner as to have a large area, a plurality of chip capacitors 20 can be accommodated in a cavity 37 assuredly in the step described later.

(2) The laminated plates 31a and 31b are vacuum-seal laminated to each other, and are heated and cured. As a result, a core substrate 31 formed with the cavity 37 capable of accommodating a plurality capacitors 20 is obtained (FIG. 9(B)).

(3) An adhesive material 34 is applied with a printer to positions on the cavity 37 where the capacitors 20 will be mounted. Then, a plurality of chip capacitors 20 made of ceramic are accommodated in the cavity 37 via the adhesive material 34 (FIG. 9(C)). By placing a plurality of chip capacitors 20 in the cavity 37, the plurality of chip capacitor 20 are aligned into the same heights with each other. Thus-obtained core substrate 31 has a flat and smooth surface. In addition, since the cavity 37 has a large area, the chip capacitors 20 can be located at accurate positions with high density. In this manner, a resin layer can be formed on the core substrate into a uniform thickness, thereby properly forming via holes in the core substrate 31 as will be described later. As a result, the rate of generating defective printed circuit boards can be lowered.

(4) The top surfaces of the chip capacitors 20 are pushed or tapped to align the chip capacitors 20 into the same heights with each other (FIG. 9(D)). By this process, even if chip capacitors 20 having largely different sizes from each other are provided in the cavity 37, they are aligned into the completely same heights with each other. As a result, the core substrate 31 can has a flat and smooth surface.

(5) After that, a thermosetting resin is charged into the space between the chip capacitors 20 in the cavity 37, and then is heated and cured to form a resin layer 36 (FIG. 10(A)). The thermosetting resin is preferably selected from the group consisting of epoxy, phenol, polyimide, and triazine. In this manner, the chip capacitors 20 can be fixed in the cavity 37.

(6) Onto thus-obtained structure, a resin selected from the above-described epoxy resins and polyolefin resins is applied with a printer to form a resin insulating layer 40 (FIG. 10(B)). Instead of applying the resin, a resin film may be attached.

(7) After that, openings 48 for via holes are formed in the resin insulating layer 40 by exposure to light and development or a laser (FIG. 10(C)). Then, penetrating openings 46a for through holes are formed in the resin layer 36 with a drill or a laser, and the resin layer 36 is heated and dried (FIG. 10(D)).

(8) A palladium catalyst is provided to the substrate 31, and then, the core substrate is immersed into an electroless plating-solution to uniformly precipitate an electroless plated film 53 (FIG. 11(A)). In the foregoing case, an electroless plating is employed. As an alternative to this, a metal layer of copper, nickel and the like may be formed by sputtering. As the case may be, an electroless plated film may be formed on the metal layer after the formation of the metal layer by sputtering.

(9) A photosensitive dry film is attached on the surface of the electroless plated film 53, and a mask is placed thereon. In this state, exposure to light and development are conducted to form a resist 54 having a predetermined pattern. The resultant core substrate 31 is immersed into an electrolytic plating solution, and a current is allowed to flow into the core substrate 31 through the electroless plated film 53 to precipitate the electrolytic plated film 56 (FIG. 11(B)).

(10) After the foregoing processes, the resist 54 is peeled and removed with 5% NaOH, and the copper plated film 53 located under the plated resist 54 is etched with a mixed solution of sulfuric acid and hydrogen peroxide to be dissolved and removed. As a result, a conductor circuit 58 (including via holes 60) constituted by the electroless plated film 53 and the electrolytic copper plated film 56, and through holes 46 are formed. Since the through holes 46 are formed, no signal line passes through the chip capacitors 20. In this manner, there is no problem that the impedance becomes discontinuous by the high dielectric body to generate a reflection, and that the transmission is delayed by passing through the high dielectric body.

(11) The substrate 31 is cleaned with water and is degreased with acid, and then, is subjected to soft etching. After that, etching solution is sprayed to both surfaces of the substrate 31 so that the surface of the conductor circuit 58 and the surface of each land of each through hole 46 are etched. Thus, a rough surface 58 α is formed over the entire surface of the conductor circuit 58 (FIG. 11(C)). The etching solution is mixed solution of 10 parts by weight of copper (II) imidazole complex, 7 parts by weight of glycolic acid, and 5 parts by weight of potassium chloride (Mech etch bond, manufactured by Mech Co., Ltd.).

(12) Into a container, added are 100 parts by weight of bisphenol-F epoxy monomer (YL983U having a molecular weight of 310, manufactured by Yuka Shell), 170 parts by weight of $SiO_2$ spherical particles (CRS1101-CE manufactured by Adotech) having surfaces each of which is coated with a silane coupling agent and a mean particle size of 1.6 μm and structured such that the diameter of the largest particle is 15 μm or smaller, and 1.5 parts by weight of leveling agent (Pelenol S4 manufactured by Sannopuko). These materials are stirred and mixed to prepare a resin filler 62 having a viscosity of 45 to 49 Pa·s at 23±1° C. As a hardening agent, 6.5 parts by weight of imidazole hardening agent (2E4MZ-CN manufactured by Shikoku Kasei) is employed.

The resin filler 62 is charged into each through hole 46, and is dried (FIG. 11(D)).

(13) 30 parts by weight of bisphenol-A epoxy resin (Epicoat 1001 having an epoxy equivalent of 469, manufactured by Yuka Shell), 40 parts by weight of cresol novolac epoxy resin (Epichron N-673 having an epoxy equivalent of 215, manufactured by Dainippon Ink & Chemicals), 30 parts by weight of phenol novolac resin containing a triazine structure (Phenolight KA-7052 having a phenol hydroxyl group equivalent of 120, manufactured by Dainippon Ink & Chemicals), are heated and dissolved in 20 parts by weight of ethyldlglycol acetate and 20 parts by weight of solvent naphtha while being stirred. Then, 15 parts by weight of polybutadine rubber having epoxy terminal (Denalex R-45EPT manufactured by Nagase Chemicals), 1.5 parts by weight of pulverized 2-phenyl-4,5-bis(hydroxymethyl) imidazole, 2 parts by weight of particle-seize reduced silica, and 0.5 parts by weight of silicon defoaming agent are added to prepare 0.5 parts by weight of epoxy resin composition.

The obtained epoxy resin composition is applied onto a PET film having a thickness of 38 μm using a roll coater such that the thickness after the PET film is dried is 50 μm. Then, drying is performed at 80 to 120° C. for 10 minutes. Thus, a resin film for the interlayer resin insulating layer is manufactured.

(14) Thus-manufactured resin film for the interlayer resin insulating layer is placed on the substrate 31 manufactured in the above step (13). In this case, the resin film has a size slightly larger than the substrate 31. Then, temporal pressing is performed under conditions that the pressure is 4 kgf/cm², the temperature is 80° C., and the pressing duration is 10 seconds, and then, cutting is performed. After that, a vacuum laminator apparatus is operated to bond the resin film by the following method thereby forming an interlayer resin insulating layer 50 (FIG. 12(A)). That is, main pressing of the resin film for the interlayer resin insulating layer to the surface of the substrate 31 is performed under conditions that the degree of vacuum is 0.5 Torr, the pressure is 4 kgf/cm , the temperature is 80° C., and the pressing duration is 60 seconds. Then, curing with heat is performed at 170° C. for 30 minutes.

(15) A mask 47 incorporating penetrating openings 47a formed therein and having a thickness of 1.2 mm is placed on the inter layer resin insulating layer 50. Then, $Co^2$ gas laser beam having a wavelength of 10.4 μm is used to form openings 148 for the via holes each having a diameter of 80 μm are formed in the interlayer resin insulating layer 50 under conditions that the beam diameter is 4.0 mm, the mode is the top-hat mode, the pulse width is 8.0 μsec, the diameter of each penetrating opening in the mask is 1.0 mm, and one shot is performed (FIG. 12(B)).

(16) The substrate 31 formed with the openings 148 for the via holes is immersed in solution which contains 60 g/l permanganic acid and has a temperature of 80° C. for 10 minutes so as to dissolve and remove the epoxy resin particles present on the surface of the interlayer resin insulating layer 50. As a result, the surface of the interlayer resin insulating layer 50 including the inner wall of each opening 148 for the via hole is roughened to be a rough surface 50α (FIG. 12(C)). Alternatively, the surface of the interlayer resin insulating layer 50 may be roughened with an acid or an oxidizer. The rough surface preferably has a thickness of 0.1 to 5 μm.

(17) The substrate 31 after being subjected to the foregoing process is immersed in neutral solution (manufactured by Siplay), and then cleaned with water. The surface of the substrate 31 subjected to the roughening process (depth of roughness is 3 μm) is supplied with palladium catalyst. Thus, the catalyst cores are adhered to the surface of the interlayer resin insulating layer 50 and the inner wall of each opening 48 for the via hole.

(18) The substrate is immersed into electroless copper plating solution having the following composition to form an electroless copper plated film 153 having a thickness of 0.6 to 3.0 μm over the entire surface of the rough surface 50α (FIG. 12(D)).

$NiSO_4$: 0.003 mol/l
tartaric acid: 0.200 mol/l
copper sulfate: 0.030 mol/l
HCHO: 0.050 mol/l
NaOH: 0.100 mol/l
α'α-bipyridyl: 40 mg/l
polyethylene glycol (PEG): 0.10 mg/l

[Electroless Plating Conditions]
40 minutes in a state where the temperature of the solution is 35° C.

(19) A commercially available photosensitive dry film is bonded to the electroless copper plated film 153, and a mask is placed thereon. The resultant is subjected to exposure to light with 100 mJ/cm², and is developed with 0.8% sodium carbonate to form a plating resist 154 having a thickness of 30 μm (FIG. 13(A)).

(20) The substrate 31 is cleaned with water of 50° C. and is degreased. Then, the substrate 31 is cleaned with water of 25° C., and is further cleaned with sulfuric acid. After that, an electroplating is performed under the following conditions to form an electrolytic copper plated film 156 having a thickness of 20 μm (FIG. 13(B)).

[Electroplating Solution]
sulfuric acid: 2.24 mol/l
copper sulfate: 0.26 mol/l
a additive: 19.5 ml/l
(Kapalacid HL, manufactured by Atotech Japan)

[Electroplating Conditions]
current density: 1A/dm²
duration: 65 minutes
temperature: 22±2° C.

(21) The plating resist 154 is peeled and removed with 5% NaOH, and then the electroless copper plated film 153 located under the plating resist 154 is dissolved and removed by performing etching using mixed solution of sulfuric acid and hydrogen peroxide. Thus, a conductor circuit 158 (including via holes 161) constituted by the electroless copper plated film 153 and the electrolytic copper plated film 156 and having a thickness of 18 μm is formed. After that, the same process as the process (11) is conducted to form a rough surface 158α with an etching solution containing cupric complex and an organic acid (FIG. 13(C)).

(22) The foregoing processes (14) to (21) are repeated to further forming an upper interlayer resin insulating layer 150 and a conductor circuit 159 (including via holes 161) (FIG. 13(D)).

(23) By repeating the process of the first embodiment, a solder resist composition (i.e. an organic resin insulating material) is obtained.

(24) The solder resist composition prepared in the foregoing process (23) is applied on both sides of the multi-layer printed circuit board into a thickness of 20 μm. Then, the resultant is dried and exposed to UV ray, and is developed with a DMTG solution to form openings 71U, 71D each having a diameter of 200 μm.

Then, a heat process is performed to cure the solder resist composition. As a result, a solder resist layer 70 having the openings 71U, 71D and a thickness of 20 μm is formed (FIG. 14(A)). As the solder resist composition, it is also possible to use a commercially available solder resist composition.

(25) The substrate formed with the solder resist layer 70 is immersed into an electroless nickel plating solution of the same type as that used in the first embodiment to form a nickel plated layer 72 having a thickness of 5 μm in the openings 71U, 71D. Thus-formed substrate is immersed into an electroless gold plating solution of the same type as that used in the first embodiment to form a gold plated layer 74 having a thickness of 0.03 μm on the nickel plated layer 72 (FIG. 14(B)).

(26) A solder paste containing tin-lead is printed to each opening 71U in the solder resist layer 70 on the surface of the substrate on which the IC chip is to be mounted. Moreover, a solder paste as a conductive adhesive 97 is printed to each opening 71D on the other surface of the substrate. Conductive connection pins 96 are attached and held to a proper pin holding apparatus so that the fixing section 98 of each conductive connection pin 96 is brought into contact with the conductive adhesive 97 in the opening 71D. Then, reflowing is conducted to fix the fixing section 98 of each conductive connection pin 96 to the conductive adhesive 97. As a method for attaching the conductive connection pins 96, the conductive adhesive 97 is formed into the shape of ball, and is inserted into each opening 71D, or alternatively, the conductive adhesive 97 is bonded to each fixing section 98, and the conductive connection pins 96 are attached thereto. After that, reflowing may be conducted.

An IC chip 90 is mounted in such a manner that the solder pads 92 of the IC chip 90 corresponds to the solder bumps 76U on the side of openings 71U of the printed circuit board 110. Then, reflowing is conducted to attach the IC chip 90 to the printed circuit board 110 (FIG. 15).

Second Modification of First Embodiment

Figure 16:
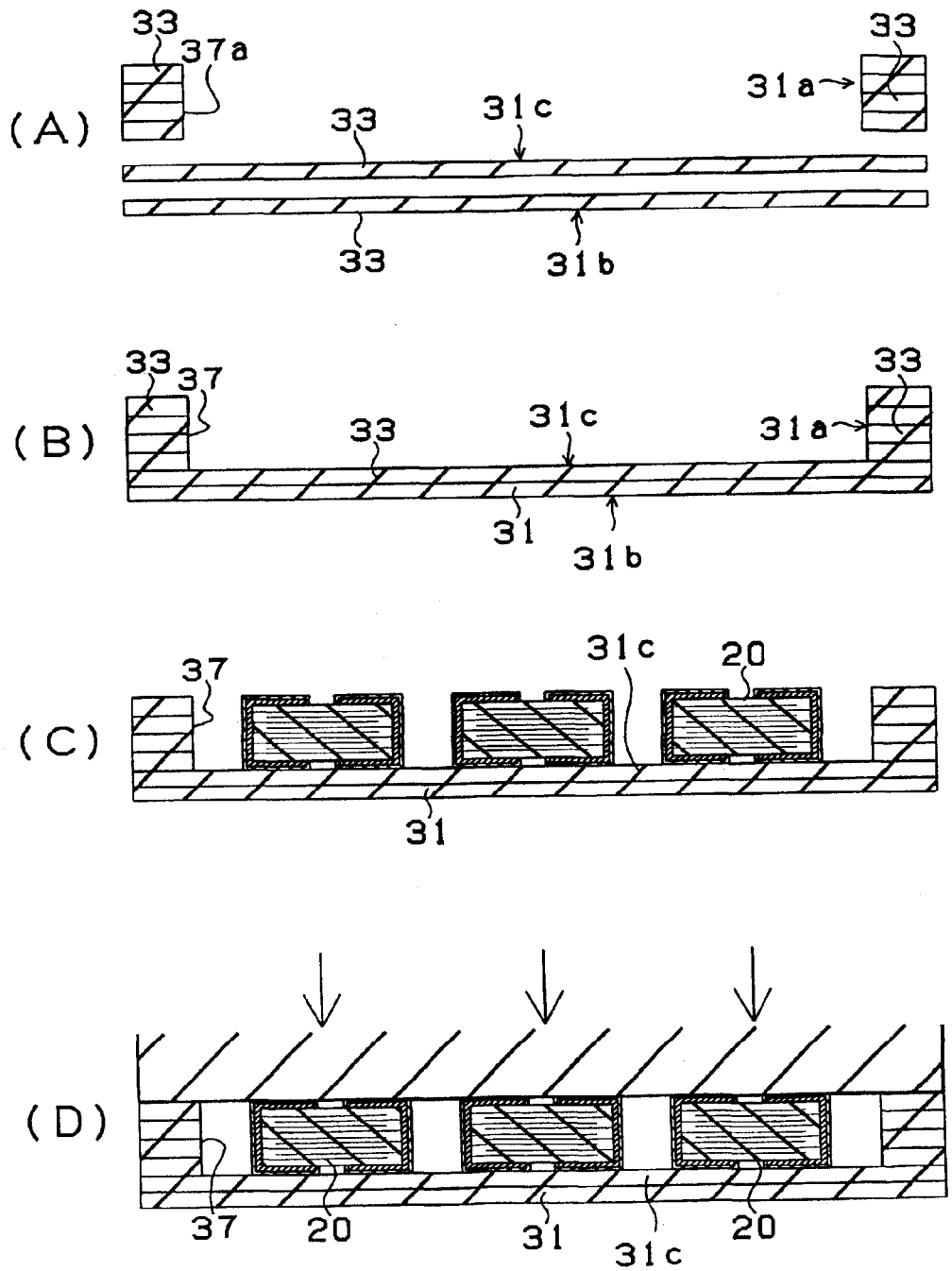
FIG. 16 is a diagram showing a process for manufacturing a printed circuit board according to a second modification of the first embodiment.

A method for manufacturing a printed circuit board according to a second modification of the first embodiment will be described with reference to FIG. 16.

(1) For prepregs 33 each of which is impregnated with epoxy resin are laminated and cured to form a laminated plate 31a. Through openings 37a for accommodating chip capacitors are formed in the laminated plate 31a. On the other hand, a sheet 31c constituted by an uncured prepreg 33 and a plate 31b constituted by a cured prepreg 33 are prepared (FIG. 16(A)).

(2) The laminated plate 31a and the plate 31b are press-laminated to each other to form a substrate 31 having a cavity 37 (FIG. 16(B)).

(3) A plurality of chip capacitors 20 made of ceramic are accommodated onto the sheet 31c constituted by the uncured prepreg 33 (FIG. 16(C)).

(4) The top surfaces of the chip capacitors 20 are pushed or tapped to align the chip capacitors 20 into the same heights with each other (FIG. 16(D)). After that, a heat process is performed to cure the uncured prepreg 33 to form a substrate 31. The subsequent processes are the same as those of the first modification which has been described above with reference to FIGS. 9 to 15, and therefore,their description will be omitted.

Third Modification of First Embodiment

A structure of a printed circuit board according to a third modification of the first embodiment will be described referring to FIG. 18.

The printed circuit board according to the third modification has the structure similar to that of the first embodiment, except for the structure of the chip capacitors 20 accommodated in the core substrate 30. FIG. 18 is a plan view showing the chip capacitors. FIG. 18(A) is a diagram showing a chip capacitor before being cut from which a plurality of pieces are to be obtained by cutting. In FIG. 18(A), a chain line shows the cutting line. In the printed circuit board described in the first embodiment, as shown in the plan view of FIG. 18(B), the first electrodes 21 and the second electrodes 22 are provide along the side ends of the chip capacitor. FIG. 18(C) is a diagram showing a chip capacitor before being cut from which a plurality of pieces are to be obtained by cutting according to the third modification. In FIG. 18(C), a chain line shows the cutting line. In the printed circuit board described in the third modification, as shown in the plan view of FIG. 18(D), the first electrodes 21 and the second electrodes 22 are provide inside the side ends of the chip capacitor.

In the printed circuit board according to the third modification, the chip capacitor 20 in which the electrodes are formed along an inside of the outer edge thereof is used. Therefore, a chip capacitor having a large capacity can be used as the chip capacitor 20.

A printed circuit board according to first alternative example of the third modification will be described referring to FIG. 19.

Figure 19:
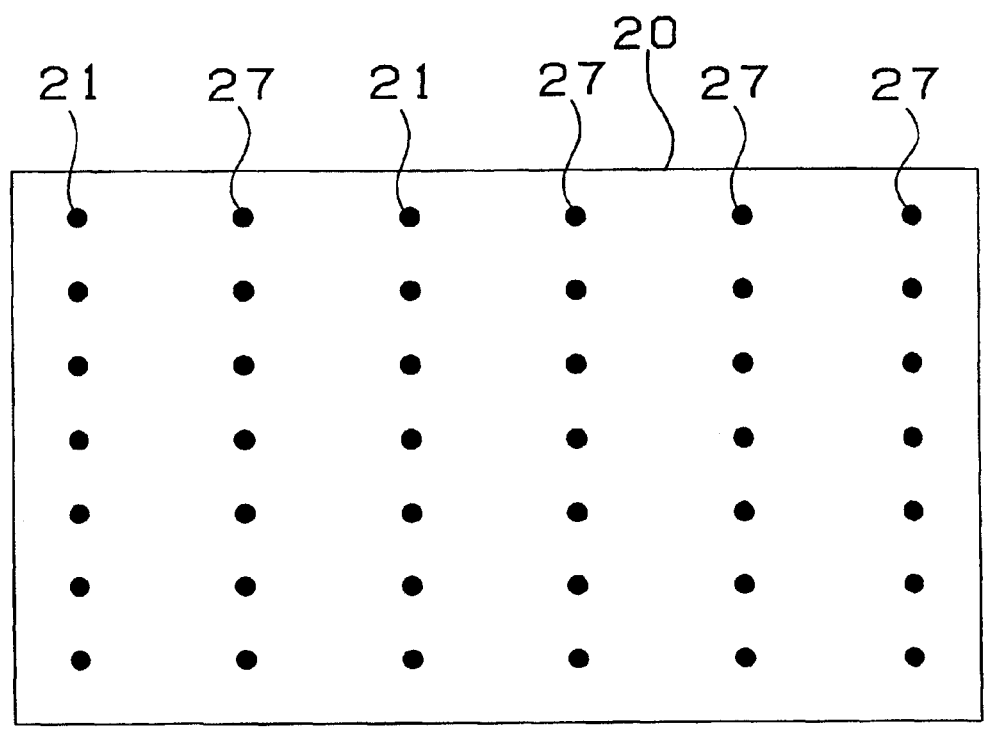
FIG. 19 is a plan view showing a chip capacitor according to a third modification of the first embodiment.

FIG. 19 is a diagram-showing a plan view of the chip capacitor 20 to be accommodated in the core substrate of the printed circuit board according to a first alternative example. In the above-described first embodiment, a plurality of chip capacitors each having a small capacity are accommodated in the core substrate. Contrary to this, in the first alternative example, a large chip capacitor having a large capacity is accommodated in the core substrate. The chip capacitor 20 includes first electrodes 21, second electrodes 22, a dielectric body 23, a first conductive firm 24 connected to the first electrodes 21, a second conductive film 25 connected to the second electrodes 22, and electrodes 27 which are not connected to the first conductive film 24 and the second conductive film 25 and used for connecting the upper and lower surfaces of the chip capacitor. The chip capacitor is connected to the IC chip and the daughter board through the electrodes 27.

In the printed circuit board according to the first alternative example, the chip capacitor 20 having a large size is used. Therefore, a chip capacitor having a large capacity can be employed as the chip capacitor 20. In addition, the use of large-sized chip capacitor 20 prevents the warpage of the printed circuit board even if the printed circuit board is repeatedly subjected to heat cycle.

Next, a printed circuit board according to a second alternative example will be described referring to FIG. 20. FIG. 20(A) is a diagram showing a chip capacitor before being cut from which a plurality of pieces are to be obtained by cutting. In FIG. 20(A), a chain line shows the cutting line. FIG. 20(B) is a diagram showing a plan view of the chip capacitor. In the second alternative example, as shown in FIG. 20(B), a plurality of chip capacitors from each of which a plurality of pieces are to be obtained by cutting (in FIG. 20(B), three pieces) are connected into one piece unit having a large size.

In the second alternative example, the chip capacitor 20 having a large size is used. Therefore, a chip capacitor having a large capacity can be employed as the chip capacitor 20. In addition, the use of large-sized chip capacitor 20 prevents the warpage of the printed circuit board even if the printed circuit board is repeatedly subjected to heat cycle.

In the above-described embodiment, the chip capacitor is incorporated in the printed circuit board. Instead of the chip capacitor, it is also possible to use a plate-like capacitor in which a conductive film is formed on a ceramic plate.

Fourth Modification of First Embodiment

Figure 21:
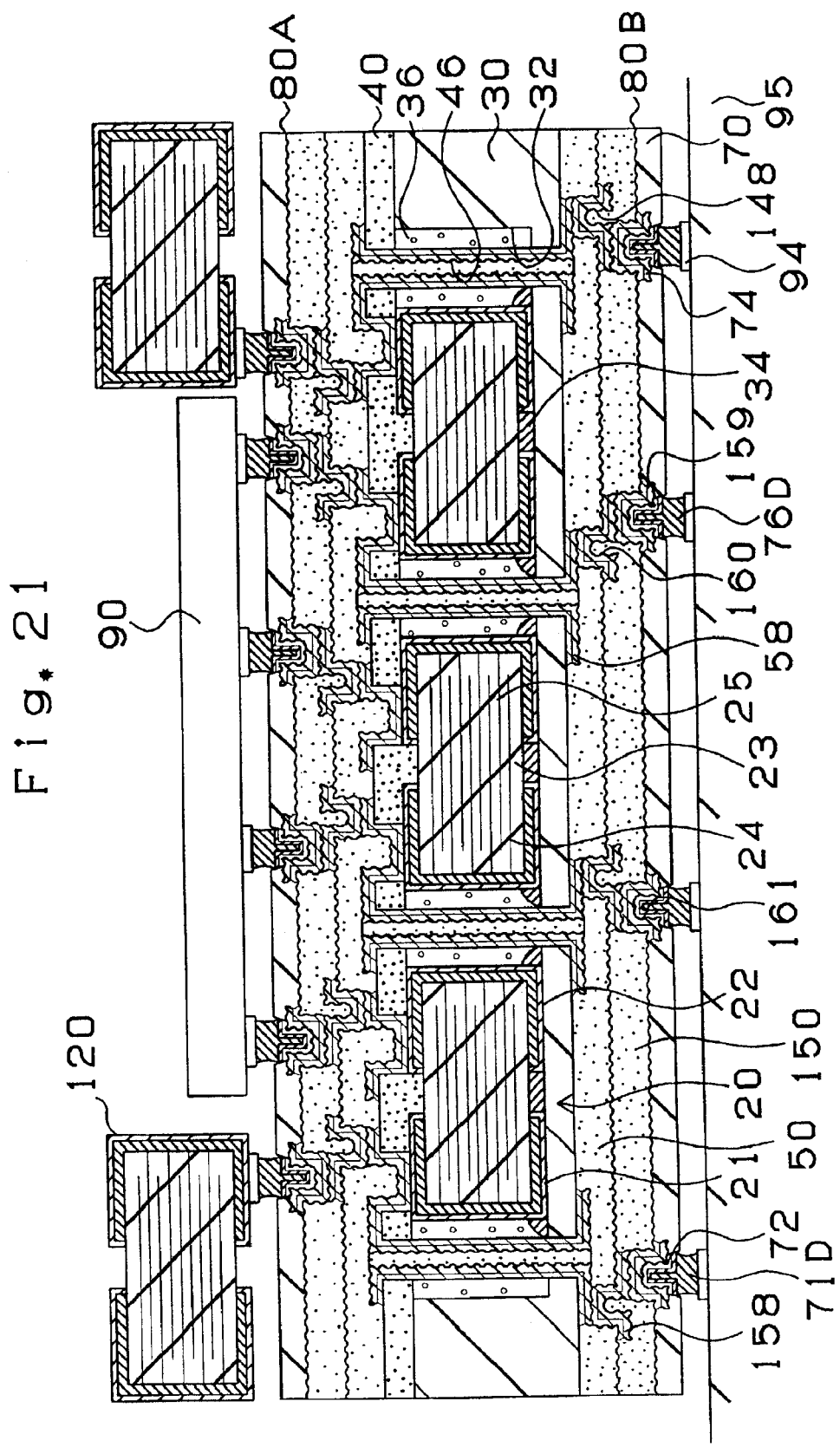
FIG. 21 is a diagram showing a cross section of the printed circuit board according to a fourth modification of the first embodiment.

A printed circuit board according to a fourth modification of the first embodiment will be described with reference to FIG. 21. In the above-described first embodiment, the printed circuit board is provided with the chip capacitors 20 in the core substrate 30 alone. In the fourth modification, chip capacitors 120 having a large capacity are mounted on the surface of the printed circuit board.

The IC chip conducts a complicated calculation, and in the calculation processing, it instantaneously consumes a large electric power. In order to provide a large electric power to the IC chip, in this embodiment, chip capacitor 20 for power supply and chip capacitors 120 are provided to the printed circuit board. The effect of providing the chip capacitors 20 and 120 will be described with reference to FIG. 22.

Figure 22:
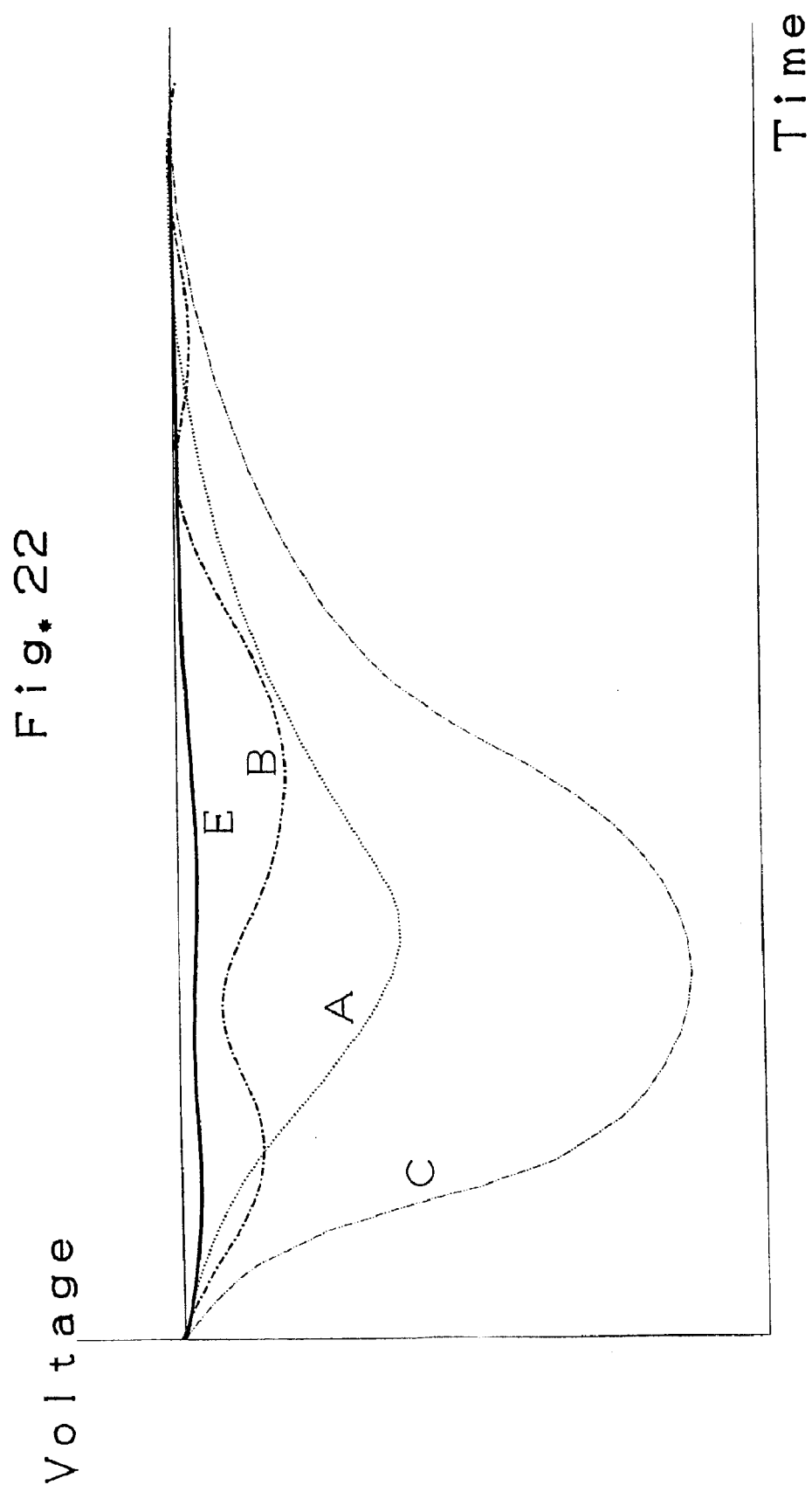
FIG. 22 is a graph showing the changes in the voltage supplied to the IC chip and the time.
Figure 23:
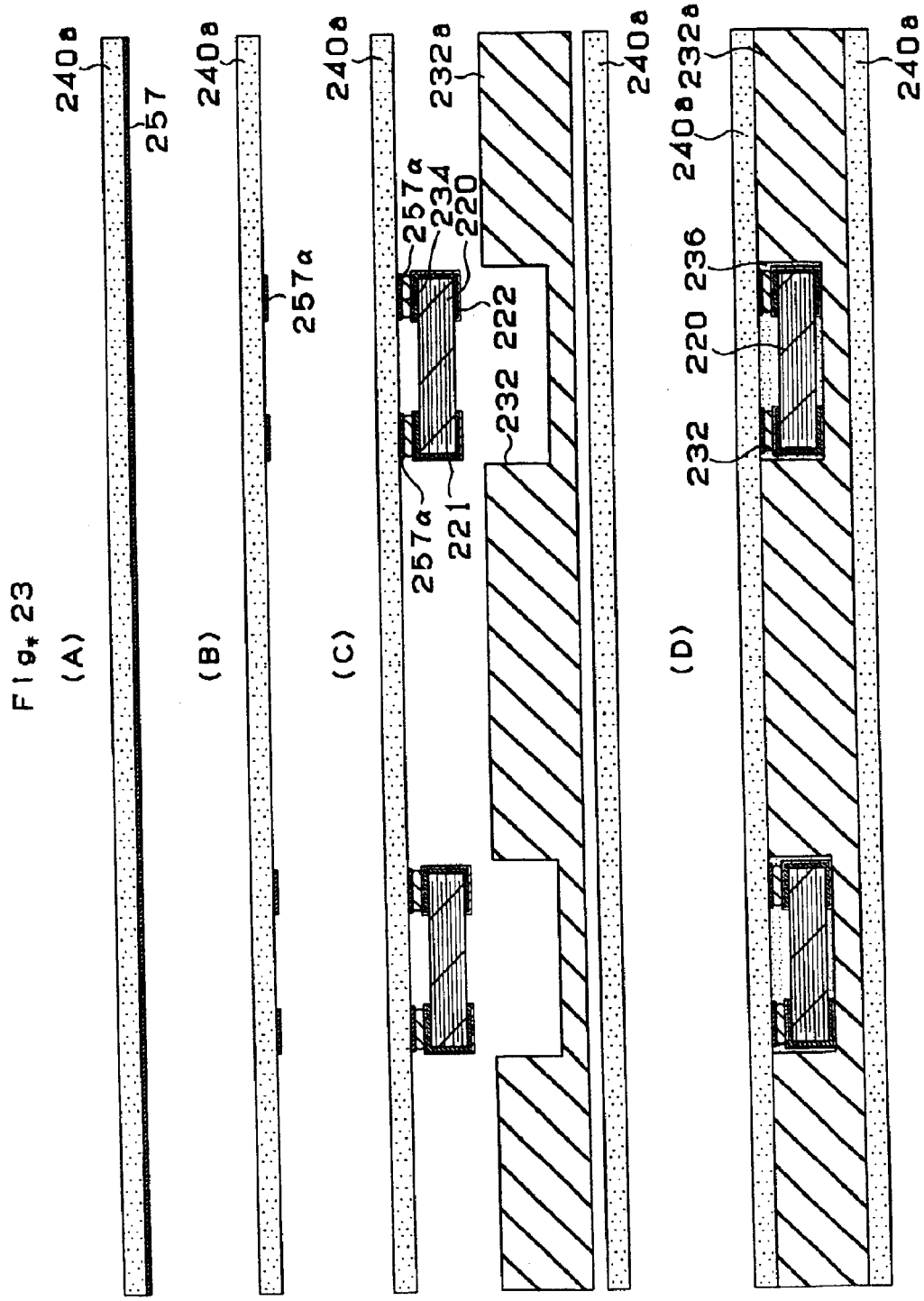
FIG. 23 is a diagram showing a process for manufacturing a printed circuit board according to a second embodiment of the present invention.
Figure 24:
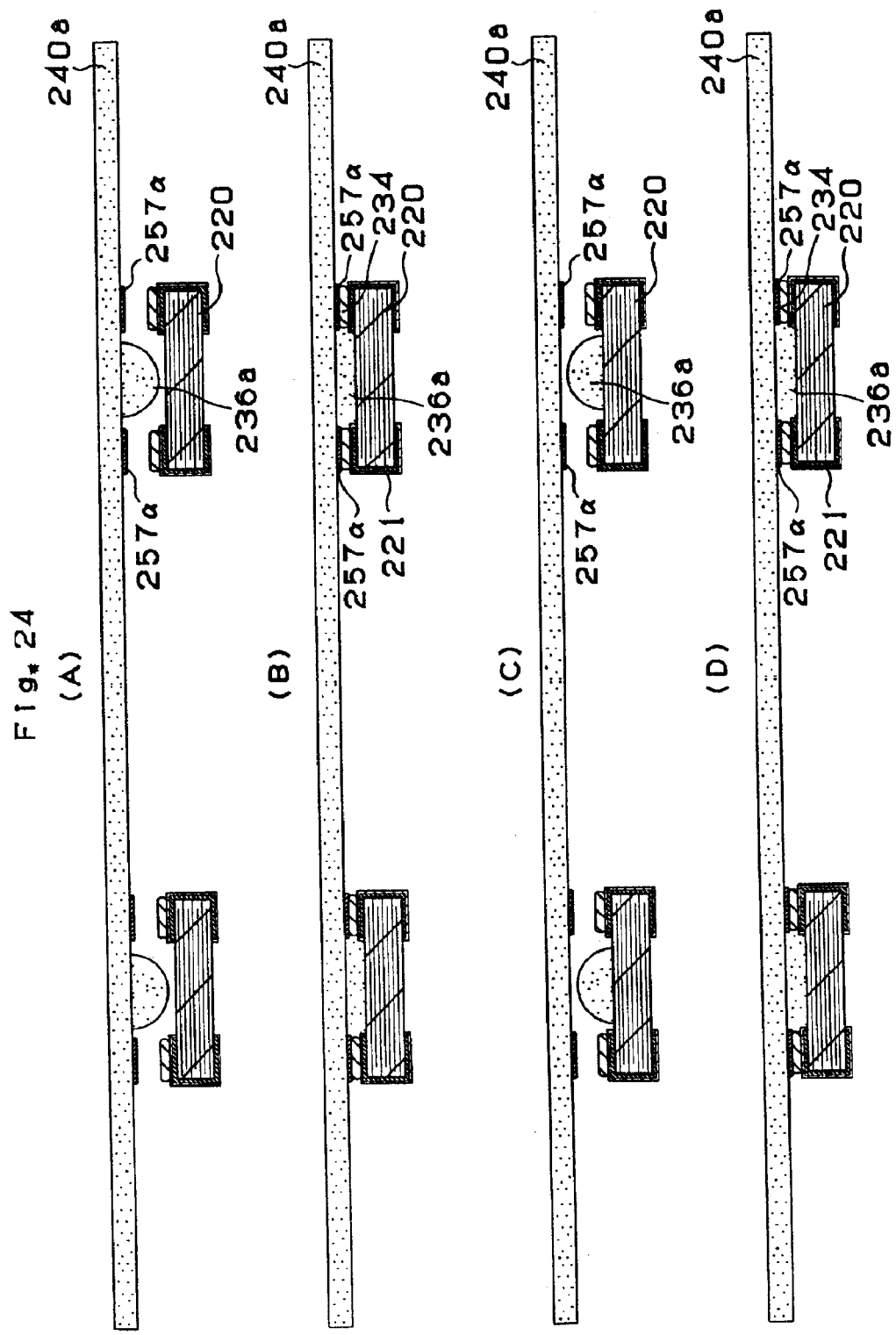
FIG. 24 is a diagram showing a process for manufacturing a printed circuit board according to a second embodiment.
Figure 25:
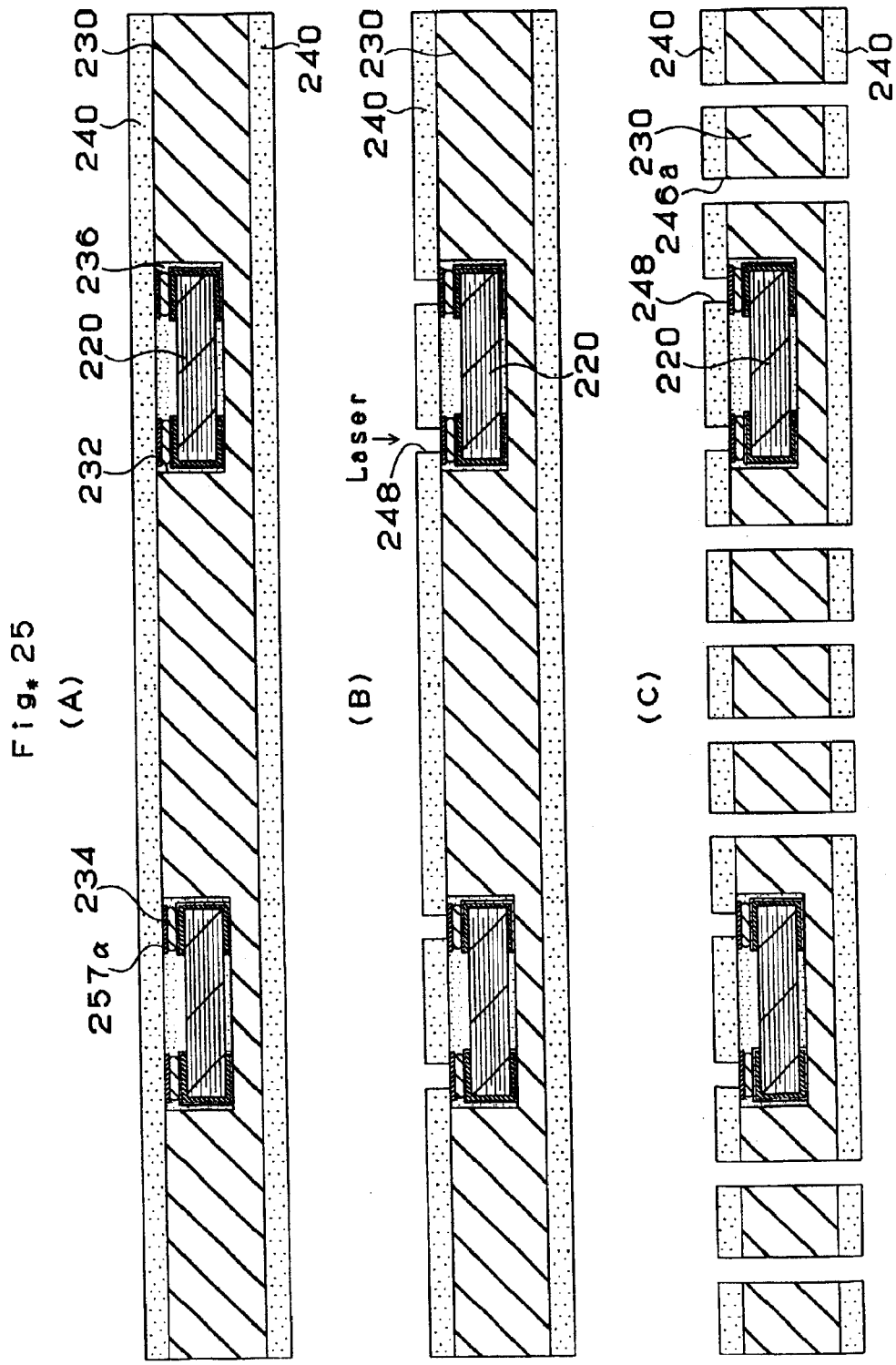
FIG. 25 is a diagram showing a process for manufacturing a printed circuit board according to a second embodiment.
Figure 26:
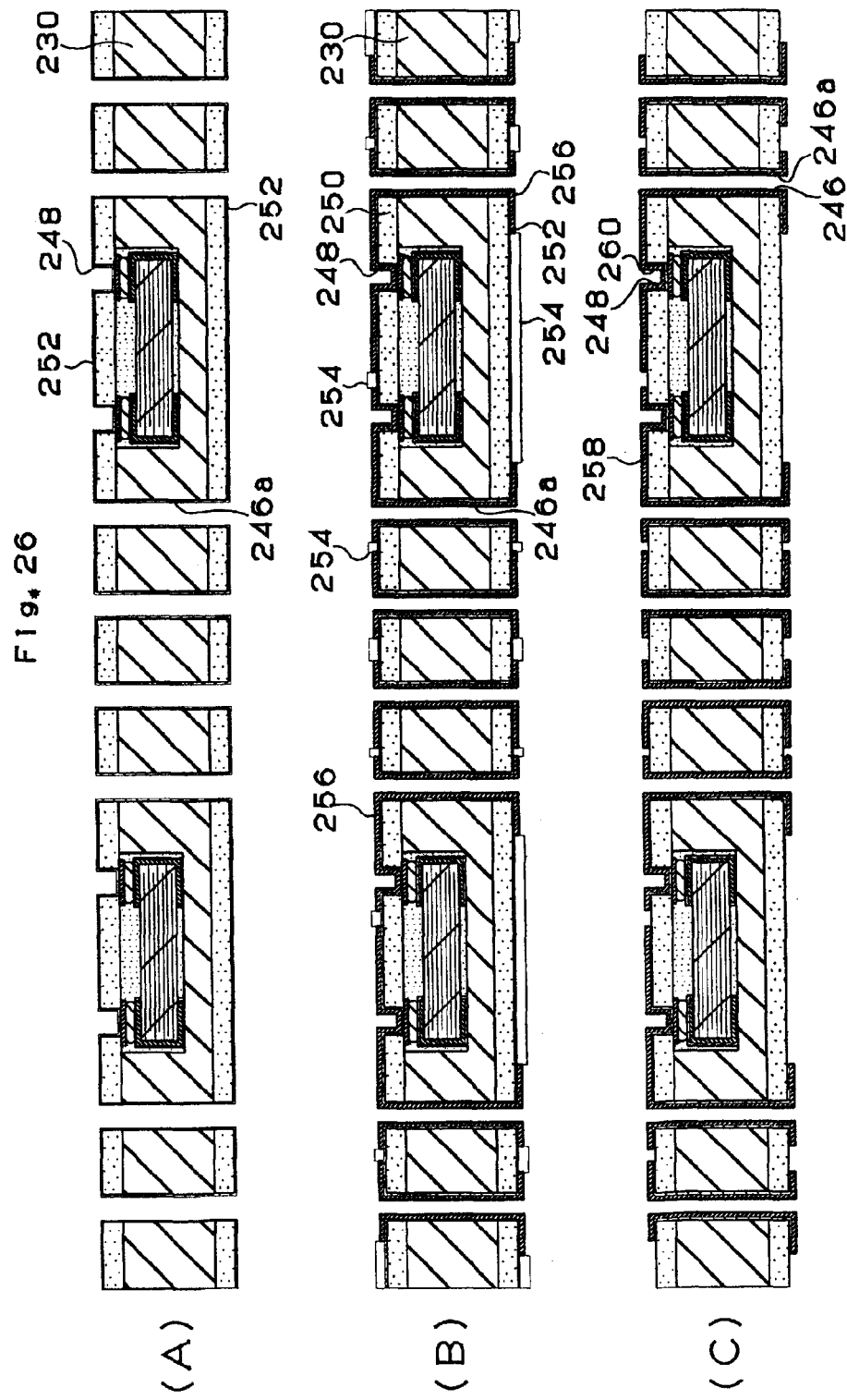
FIG. 26 is a diagram showing a process for manufacturing a printed circuit board according to a second embodiment.
Figure 27:
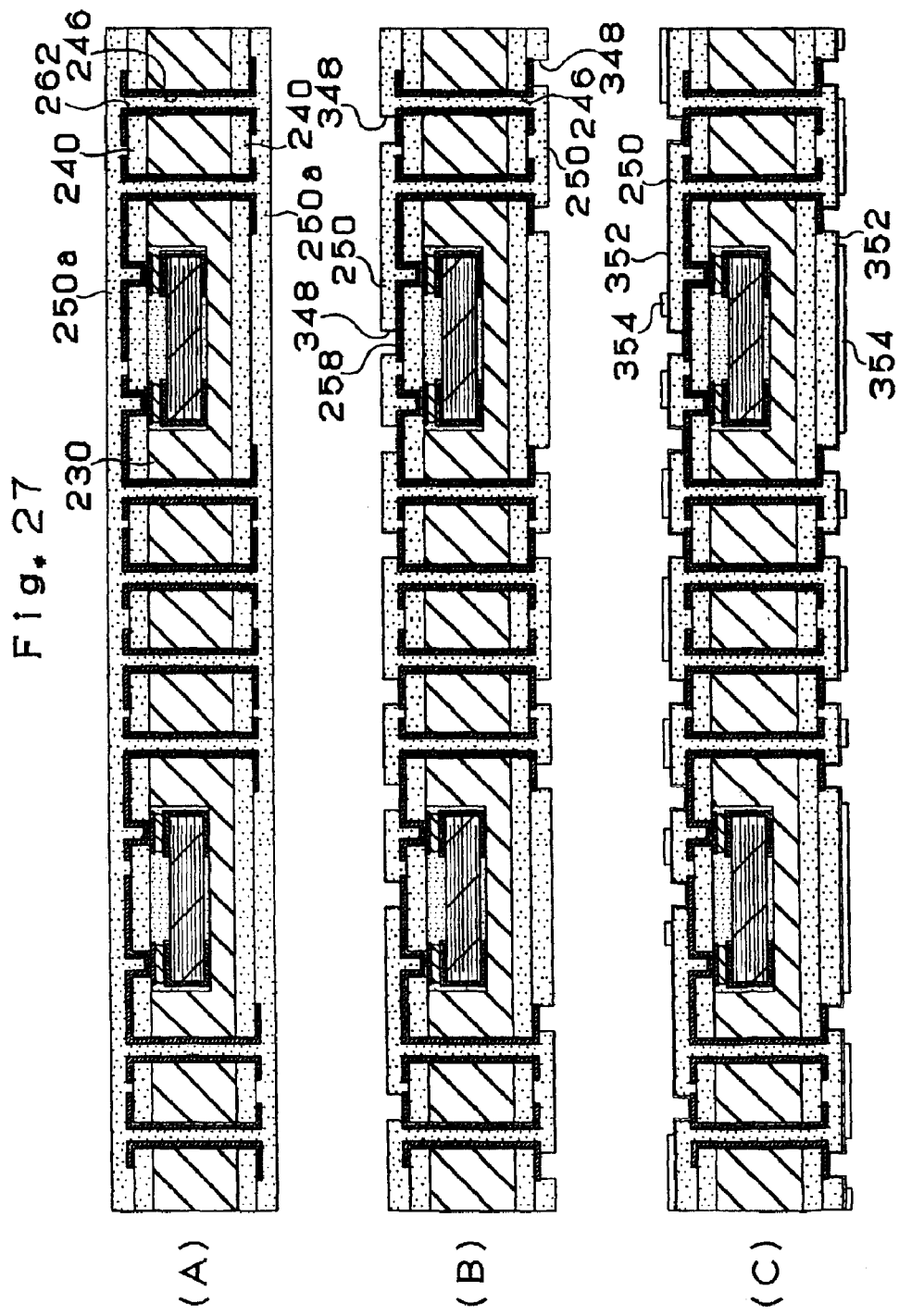
FIG. 27 is a diagram showing a process for manufacturing a printed circuit board according to a second embodiment.
Figure 28:
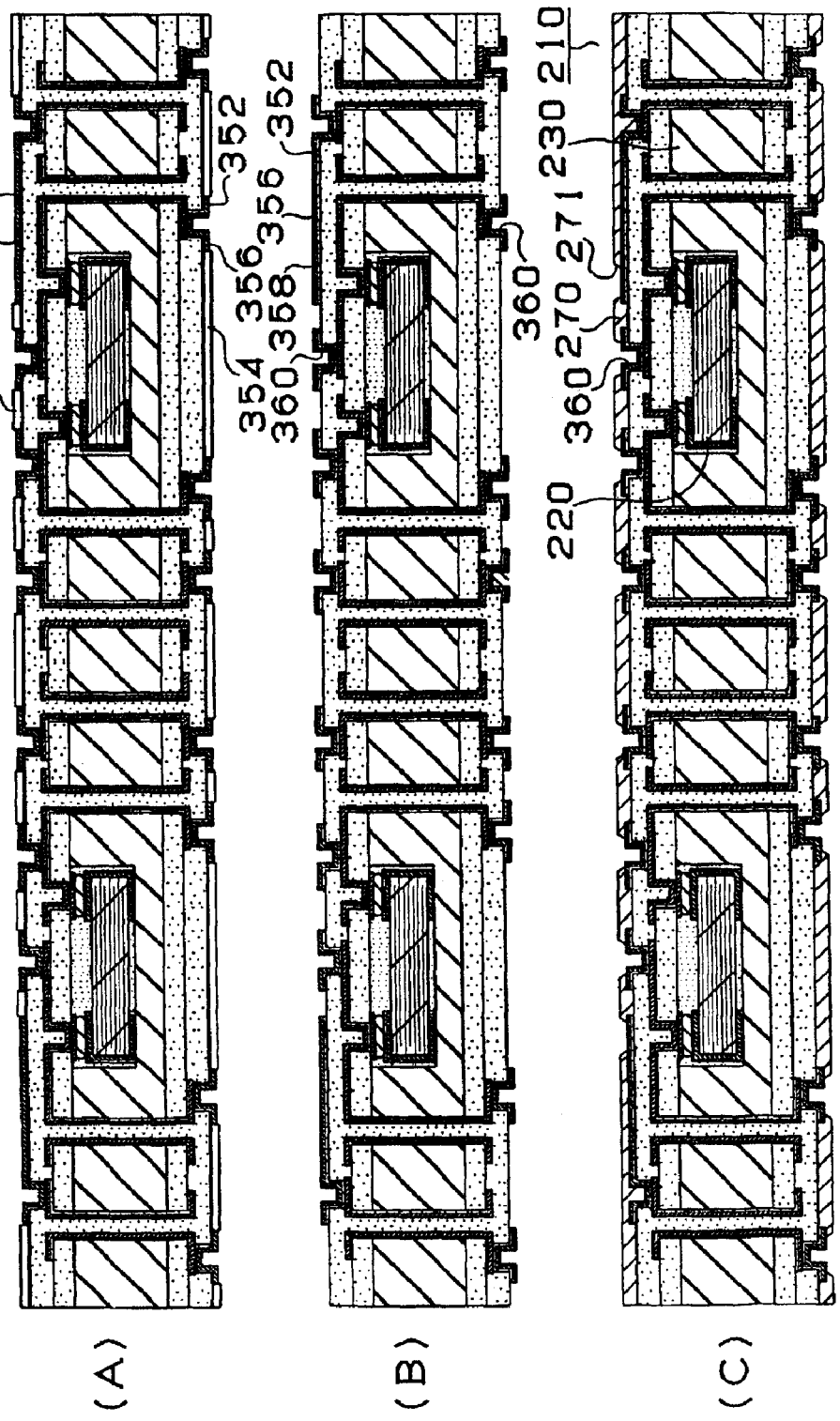
FIG. 28 is a diagram showing a process for manufacturing a printed circuit board according to a second embodiment.

In the graph of FIG. 22, a longitudinal axis indicates a voltage supplied to the IC chip, and a horizontal axis indicates a time. The chain double-dashed line C indicates the variation in the voltage supplied to the printed circuit board having no capacitor for power source. Without capacitor for power supply, the voltage is drastically attenuated. The broken line A indicates the variation in the voltage supplied to the printed circuit board having a chip capacitor on its surface. As compared with the case of the printed circuit board having no capacitor indicated by the chain double-dashed line C, the attenuation of voltage is not large. However, the length of loop becomes large, and sufficient electric power cannot be supplied in the rate determining step. That is, the voltage drastically drops down at the time of starting the supply of electric power. The chain double-dashed line B, referring to FIG. 8, indicates the voltage drop of the printed circuit board incorporating the chip capacitor. Whereas the length of the loop can be shortened, the voltage varies because a chip capacitor having a large capacitor cannot be accommodated on the core substrate 30. The solid line E indicates the variation in the voltage of the printed circuit board according to the fourth modification having chip capacitors 20 in its core substrate described above referring to FIG. 21, and the chip capacitors 120 having a large capacitor on its surface. The printed circuit board is provided with the chip capacitors 20 in the vicinity of the IC chip, and the chip capacitors 120 having a large capacity (and a relatively large inductance), thereby suppressing the variation in voltage to a minimum value.

As to the printed circuit board of the first embodiment, the inductance of the chip capacitors 20 embedded in the core substrate, and the inductance of the chip capacitors mounted on the back surface of the printed circuit board (on the surface at the side of daughter board) are shown as follows.
In the case of a single capacitor:
   A capacitor of embedded type: 137 pH
   A capacitor of back surface mounted type: 287 pH
In the case of eight capacitors connected in parallel;
   Capacitors of embedded type: 60 pH
   Capacitors of back surface mounted type: 72 pH In both cases where a single capacitor is used and where a plurality of capacitors are connected in parallel to obtain an increased capacity, an inductance can be lowered by incorporating the chip capacitor.

Hereinafter, the results of reliability test will be described. In the test, the rate of change in the electrostatic capacity of a single chip capacitor in the printed circuit board of the first embodiment was measured.

Rate of change in electrostatic capacity (measured at a frequency of 100 Hz) (measured at a frequency of 1 kHz)

| | | |
|---|---|---|
| Steam 168 hours: | 0.3% | 0.4% |
| HAST 100 hours: | −0.9% | −0.9% |
| TS 1000 cycles: | 1.1.% | 1.3% |

In the Steamtest, the chip capacitor was subjected to steam to be kept at a moisture of 100%. In the HAST test, the chip capacitor was left for 100 hours at a relative moisture of 100%, an applied voltage of 1.3V, and at a temperature of 121° C. In the TS test, the chip capacitor was left for 30 minutes at −125° C., and 30 minutes for 55° C., and this test was repeated 1000 times.

In the above-described reliability test, it was realized that the printed circuit board incorporating the chip capacitors attains a reliability of the same level as the conventional printed capacitor on which a capacitor is mounted on its surface. As described above, in the TS test, even if an internal stress is generated due to the difference in the thermal expansion coefficients between the capacitor made of ceramic, and the core substrate 30 and the resin insulating layer 40 made of resin, no problems are created such as a disconnection between the first electrode 21, the second electrode 22 of the chip capacitor 20, and the via holes 60, a peeling of the chip capacitors 20 from the resin insulating layer 40, and the cracks in the resin insulating layer 40. In this manner, high reliability can be attained over a long period of time.

In the first embodiment, as described above, a large cavity is formed and a plurality of capacitors are accommodated in the cavity. This structure makes it possible that the plurality of capacitors are reliably aligned at accurate positions on the core substrate with high density even if accuracy of the spot-facing process is low. In addition, the plurality of capacitors are placed in the cavity, the capacitors are aligned into the same heights with each other. Therefore, the insulating layer can be formed on the capacitors into a uniform thickness. The via holes and the conductor circuit can be properly formed, and the rate of generating defective printed circuit boards 10 can be lowered.

Since the resin is charged in the space between the core substrate and the capacitor, even if the stress is generated caused by the capacitors, the stress can be alleviated. In addition, no migration is created. As a result, neither peeling nor dissolution is caused between the electrodes of the capacitors and the connecting sections of the via holes. Due to these arrangements, the desired performance can be maintained in the reliability test. In the case where the capacitors are coated with copper, the generation of migration can be prevented.

Second Embodiment

Figure 29:
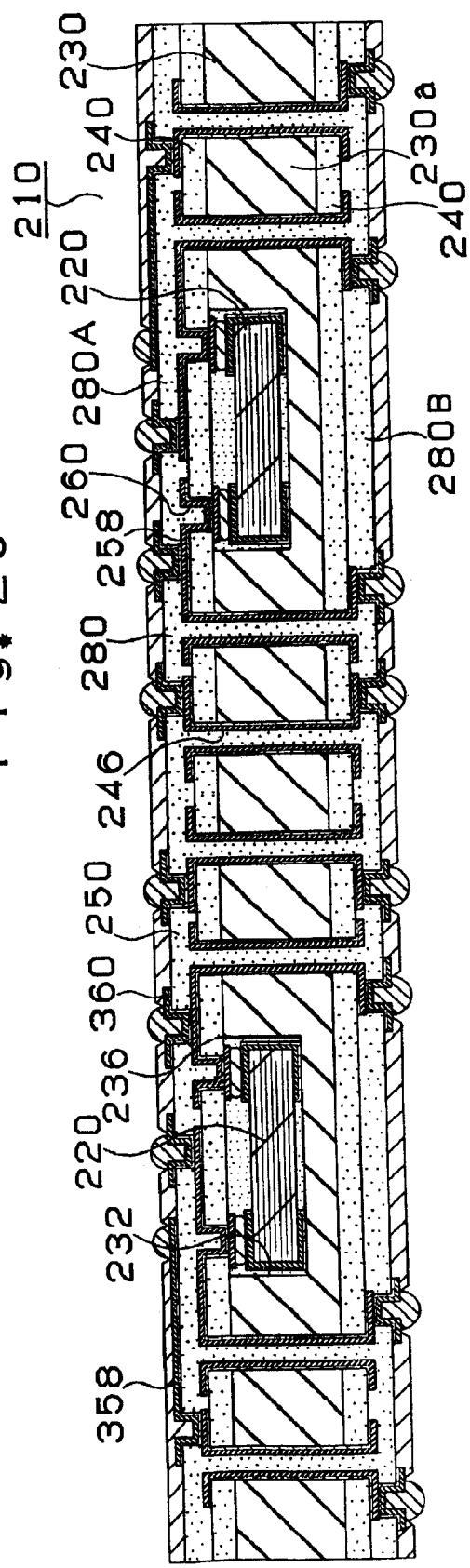
FIG. 29 is a diagram showing a cross section of the printed circuit board according to a second embodiment.
Figure 30:
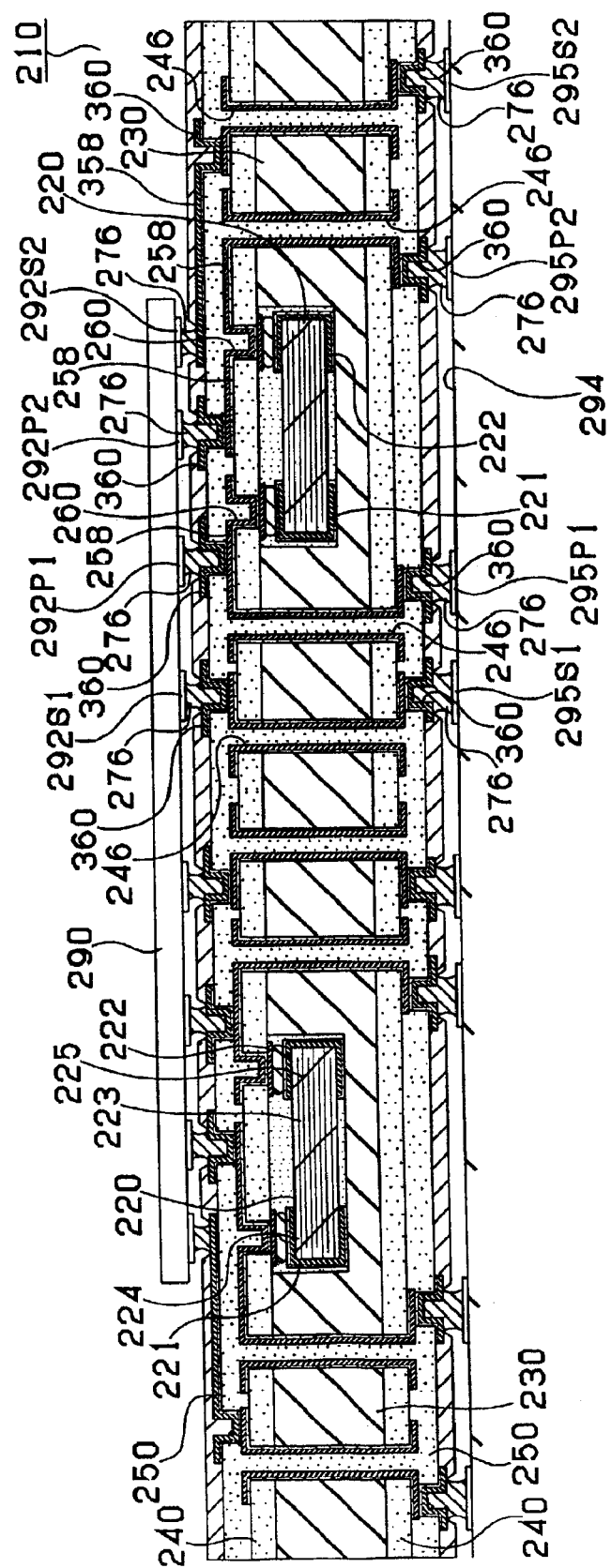
FIG. 30 is a diagram showing a cross section of the printed circuit board according to a second embodiment.

First, the structure of a printed circuit board according to a second embodiment of the present invention will be described with reference to FIGS. 29 and 30. FIG. 29 is a diagram showing a cross section of a printed circuit board 210. FIG. 30 is a diagram showing the state where an IC chip 290 is mounted on the printed circuit board 210 shown in FIG. 29, and the printed circuit board 210 is attached to a daughter board 294.

As shown in FIG. 29, the printed circuit board 210 incorporates chip capacitors 220, a core substrate 230 for accommodating chip capacitors 220, and an interlayer resin insulating layer 250 constituting the buildup layers 280A, 280B. The core substrate 230 is constituted by an accommodating layer 230a for accommodating the capacitors 220, and a connection layer 240. Via holes 260 and a conductor circuit 258 are formed in the connection layer 240. Via holes 360 and a conductor circuit 358 are formed in the interlayer resin insulating layer 250. In this embodiment, the buildup layer is constitute by a single interlayer resin insulating layer 250. As an alternative to this, the buildup layer may be constituted by a plurality of interlayer resin insulating layers.

As shown in FIG. 30, the via holes 360 in the upper buildup layer 280A are formed with bumps 276 to be respectively connected to pads 292S1, 292S2, 292P1, 292P2 of the IC chip 290. On the other hand, the via holes 360 in the lower buildup layer 280B are formed with bumps 276 to be respectively connected to pads 295S1, 295S2, 295P1, 295P2. Through holes 246 are formed in the core substrate 230.

As shown in FIG. 17(A). the chip capacitor 220 is constituted by a first electrode 221, a second electrode, 222, and an dielectric body 23 interposed between the first and second electrodes. The dielectric body 23 includes a plurality of first conductive films 24 connected to the first electrode 221 and a plurality of second conductive films 25 connected to the second electrode 222 in an opposed relation to each other. It is preferable to cover the surfaces of the first electrode 221 and the second electrode 222 with an metallic coating such as copper plating. By coated with the metallic coating, the electric connection with the conductive adhesive 234 is improved, and the generation of migration can be prevented.

As shown in FIG. 30, The pad 292S2 for signal of the IC chip 290 is connected to the pad 295S2 for signal of the daughter board 294 through the bump 276-the conductor circuit 358-the via hole 360-the through hole 246-the via hole 360-the bump 276. On the other hand, the pad 292S1 for signal of the IC chip 290 is connected to the pad 295S1 for signal of the daughter board 294 through the bump 276-the via hole 360-the through hole 246-the via hole 360-the bump 276.

The pad 292P1 for power supply of the IC chip 290 is connected to the first electrode 221 of the chip capacitor 220 through the bump 276-the via hole 360-the conductor circuit 258-the via hole 260. On the other hand, the pad 295P1 for power supply of the daughter board 294 is connected to the first electrode 221 of the chip capacitor 220 through the bump 276-the via hole 360-the through hole 246-the conductor circuit 258-the via hole 260.

The pad 292P2 for power supply of the IC chip 290 is connected to the second electrode 222 of the chip capacitor 220 through the bump 276-the via hole 360-the conductor circuit 258-the via hole 260. On the other hand, the pad 295P2 for power supply of the daughter board 294 is connected to the second electrode 222 of the chip capacitor 220 through the bump 276-the via hole 360-the through hole 246-the conductor circuit 258-the via hole 260.

In the printed circuit board 210 of this embodiment, the chip capacitors 220 are placed immediately below the IC chip 290. The distance from the IC chip to each capacitor is shortened, and therefore, electric power can be instantaneously supplied to the IC chip. That is, the loop length which determines the loop inductance can be shortened.

In addition, the through hole 246 is formed between the chip capacitors 220, and no signal line passes through the chip capacitors 220. In this structure, there is no problem that the impedance becomes discontinuous by the high dielectric body to generate a reflection, and that the transmission is delayed by passing through the high dielectric body.

The external substrate (i.e. daughter board) 294 to be connected to the back surface of the printed circuit board is connected to the first electrode 221 and the second electrode 222 of the capacitor 220 through the via hole 260 formed in the connection layer 240 on the side of IC chip and the through hole 246 formed in the core substrate 230. That is, although the accommodation layer 230a having a core material is hard to process, penetrating openings are formed in the accommodation layer 230a so that the terminal of the capacitor is not directly connected to the outside surface. As a result, the reliability of the connection can be increased.

As shown in FIG. 17(A), in this embodiment, a rough surface 23α is formed on the surface of the dielectric body 23 made of ceramic of the chip capacitor 220. The rough surface 23α contributes to an increased adhesion between the chip capacitor 220 made of ceramic and a resin insulating layer 240 made of resin, thereby avoiding the resin insulating layer 240 from peeling from the interface with the chip capacitors 220 even when a heat cycle test is conducted. The rough surface 23α can be formed by polishing the surface of the chip capacitor 220 after the sintering step, or by roughening the surface of the chip capacitor 220 before the sintering step. In this embodiment, the surface of the chip capacitor is roughened to increase its adhesion with the resin insulating layer. Alternatively, the surface of the chip capacitor may be subjected to silane coupling process.

In this embodiment, a resin layer 236 is interposed between the side surface of the cavity 232 of the core substrate 230 and the chip capacitor 220. The thermal expansion coefficients of the resin layer 236 is set to the value lower than those of the core substrate 230 and the resin insulating layer 240, that is, are set to the value close to that of the chip capacitor 220 made of ceramics. In this manner, even if internal stress is generated between the core substrate 220 and the resin insulating layer 240, and the chip capacitor 20 caused by the difference in the thermal expansion coefficients therebetween, cracks and peelings do not easily occur in the core substrate 230 and the connection layer 240. As a result, high reliability can be attained. In addition, the generation of migration can be prevented.

Next, the method for manufacturing the printed circuit board described above referring to FIG. 29 will be described with reference to FIGS. 23 to 28.

(1) A connection layer, which is a resin layer constituting the core substrate, is formed. On one surface of the connection layer, a circuit pattern constituted by a metallic layer is formed. For this purpose, a resin film 240a having a metal film 257 laminated on its one surface is prepared (FIG. 23(A)). The resin film 240a may be made of, as is the case of the first embodiment, thermosetting resin such as epoxy, BT, polyimide, and olefin, or mixtures of thermosetting resins and thermoplastic resins. In this embodiment, it is preferable to use a film having no core material so that the penetrating openings can be easily formed. The metal film 257 is pattern-etched to form a predetermined circuit pattern 257α (FIG. 23(B)). The chip capacitors 220 are attached to the circuit pattern 257α located on the lower surface of the resin film 240a through the conductive adhesive material 234c FIG. 23(C)) In this manner, the electrical connection with the capacitors 220 and the adhesion between the capacitors 220 and the circuit pattern 257α can be assured. The conductive adhesive material 234 maybe a material having both conductivity and adhesiveness such as a solder (Sn/Pb, Sn/Sb, Sn/Ag, Sn/Ag/Cu), conductive pastes, and resins impregnated with metal particles. The space created between the conductive adhesive and the capacitor is preferably filled with a resin.

(2) On the other hand, a laminated plate 232a for accommodation layer formed with cavities 232 for accommodating chip capacitors is prepared (FIG. 23(C)).

The cavities 232 are formed by spot-facing process. Instead of spot-facing process, the cavities may be formed in the laminated late by bonding a prepreg formed with penetrating openings and a prepreg formed with no penetrating openings, or by injection molding. The laminated plate 232a for accommodation layer may be a laminated plate formed by laminating prepregs each having a core member such as glass cloth impregnated with an epoxy resin. Instead of the laminated plate having a core member impregnated with epoxy resin, it is also possible to use a laminated plate generally used in a printed circuit board, such as those having a core member impregnated with BT, phenolic resins, or a reinforcement member such as glass cloth. It is also possible to use a resin substrate having no core member such as glass cloth. However, it is impossible to use a substrate of ceramic or AlN as the core substrate. The substrate of ceramic or AlN is poor in processability for outer shape, and in some cases, is incapable of accommodating capacitors. In addition, a space is created inside the substrate even if it is filled with a resin. Since a resin substrate has a melting point of 300° C. or lower, it is dissolved or softened when a heat higher than 350° C. is applied.

(3) The resin film 240a to which the chip capacitors 220 are attached, a resin laminated plate 232a for core substrate having sections for accommodating capacitors, and another resin film 240a are laminated to each other, and are pressed from both sides to flatten the surface (FIG. 23(D)). In this embodiment, the accommodation layer 230a which accommodates the capacitors 220 and the connection layer 240 are bonded to each other by application of pressure from both sides to form a core substrate 230. As a result, the core substrate 230 has a flat surface. The interlayer resin insulating layer 250 and the conductor circuit 358 can be laminated in a later step in such a manner that high reliability is attained. At this time, the space between the capacitor 220 and the resin film 240a is filled with a resin exuding from the resin film 240a. If the space cannot sufficiently filled with the resin, as shown in FIG. 24(A), a small-sized filler 236a having a thermal expansion coefficient smaller than that of the core substrate is provided between the circuit patterns 257 α on the side of the resin film 240a, so that the space is filled with the filler 236a as shown in FIG. 24(D). Alternatively, as shown in FIG. 24(C), the filler 236a may be placed on the capacitor 220, so that the space is filled with the filler 236a as shown in FIG. 24(D).

(4) Heating and curing is conducted to form a core substrate 230 constituted by an accommodation layer 230a accommodating the chip capacitors 220 and a connection layer (FIG. 25(A)). It is preferable that a resin layer 236 having a thermal expansion coefficient smaller than that of the core substrate is charged in the cavity 232 of the core substrate to increase the air tightness. In this embodiment, a resin film 240a having no metal layer is laminated. As an alternative to this, a resin film (RCC) having a metal layer on its one side may be used. That is, it is possible to use a both-sided plate, a one-sided plate, a resin plate having no metal film, and a resin film.

(5) In this embodiment, a circuit pattern 257 α to be connected to the conductive adhesive 234 is provided between the connection layer 240 and the accommodating layer 230 which form the core substrate 230 together. With this arrangement, the connection to the capacitors 220 is reliably established through the circuit pattern 257α. In addition, since circuit pattern 257α is provided between the connection layer 240 and the accommodation layer 230a, the warpage of the core substrate 230 can be prevented.

(6) Non-penetrating openings 248 to be via holes are formed in the upper connection layer 240 by $CO_2$ laser, YAG laser, excimer laser, or UV laser (FIG. 25(B)). As the case maybe, an area mask on which penetrating openings are formed at positions corresponding to the positions of the non-penetrating openings are mounted, and an area processing is conducted by a laser. In the case where it is desired to form via holes having different sizes and diameter from each other, the lasers may be used in combination to form the via holes.

(7) If necessary, smear in the via holes may be conducted by a gas plasma treatment using gaseous matter such as oxygen and nitrogen, or dry treatment such as corona treatment, or by immersion into an oxidizer such as permagnetic acid. Subsequently, penetrating openings 246a having a diameter of 50 to 500 μm for through holes are penetrated in the core substrate 230 constituted by the connection layer 240, the accommodation layer 230a, and the connection layer 240 by a drill or a laser (FIG. 25(C)).

(8) A metal film is formed on the surface layer of the connection layer 240, the non-penetrating openings 248 for via holes, and the penetrating openings 246a for through holes of the core substrate 230. For this purpose, a palladium catalyst is provide on the surface of the connection layer 240, and then, the core substrate 230 is immersed in an electroless plating solution to uniformly precipitate an electroless copper plated film 252 (FIG. 26(A)). In this embodiment, an electroless plating is employed. Alternatively, a metal film of copper, nickel and the like may be formed by sputtering. The sputtering is disadvantageous from the viewpoint of cost, but is advantageous in that the adhesion with the resin film can be improved. An electroless plated film may be formed after the metal layer is formed by sputtering. Depending on the kind of resin, there are cases where the catalyst cannot be stably provided thereto. In this case, the electroless plated film is effective in stably providing the catalyst to such a resin. In addition, the electrolytic plating is more stably precipitated in the case of forming the electroless plated film. The metal film 252 is preferably formed into the thickness of 0.1 to 3 mm.

(9) A photosensitive dry film is attached to the surface of the metal film 252, and a mask is placed thereon. Exposure to light and development are performed to form a resist 254 having a predetermined pattern. The core substrate 230 is immersed into an electrolytic plating solution to allow a current to flow in the core substrate 230 through the electroless plated film 252 to precipitate an electrolytic copper plated film 252 (FIG. 26(B)). The resist 254 is peeled by 5% KOH, and then, the electroless plated film 252 located under the resist 254 is etched and removed by a mixed solution of sulfuric acid and hydrogen peroxide. As a result, via holes 260 and a conductor circuit 258 are formed in the connection layer 240, and through holes 246 are formed in the penetrating openings 246*a* of the core substrate 230 (FIG. 26(C)).

(10) A rough surface is formed on the surface of the conductive layer of the conductor circuit 258, the via holes 260, and the through holes 246. The rough surface is formed by oxidizing (i.e. blacking)-reduction treatment, an electroless plated film made of alloys of Cu—Ni—P, or by etching treatment using an etching solution containing cupric complex and an organic acid. The rough surface has Ra (mean roughness height) of 0.01 to 5 $\mu$m, and especially preferable is Ra of 0.5 to 3 $\mu$m. In this embodiment, the rough surface is formed. Alternatively, as will be described later, a resin is directly filled and a resin film may be attached.

(11) The through holes 246 are filled with a resin layer 262. The resin layer may be made of a resin having no conductivity and containing a epoxy resin as a main component, or a resin having conductivity and containing a paste of metal such as copper. In this case, the thermosetting epoxy resin containing a silica for adjusting the thermal expansion coefficient is charged as a resin filler. After the through holes 246 are filled with the resin layer 262, the resin film 250 is attached (FIG. 27(A)). Instead of attaching the resin film 250, a resin may be applied. After the resin film 250 is attached, via holes 348 having an opening diameter of 20 to 250 $\mu$m are formed in the insulating layer 250, and thermosetting is conducted (FIG. 27(B)). Then, a catalyst is provided to the core substrate, and the core substrate is immersed in electroless plating to uniformly precipitate an electroless plated film 352 having a thickness of 0.9 $\mu$m on the surface of the interlayer resin insulating layer 250. After that, a resist 354 having a predetermined pattern is formed (FIG. 27(C)).

(12) The core substrate is immersed in an electrolytic plating solution to allow a current to flow in the core substrate through the electroless plated film 352 to form an electrolytic copper plated film 356 in the portions where no resist 354 is formed (FIG. 28(A)). The resist 354 is peeled and removed, and then, the electroless plated film 352 located under the plated resist is dissolved and removed to obtain a conductor circuit 358 constituted by the electroless plated film 352 and the electrolytic copper plated film 356 and via holes 360 (FIG. 28(B)).

(13) A rough surface (not shown) is formed on the surface of the conductor circuit 358 and the via holes 360 by an etching solution containing cupric complex and an organic acid. It is also possible to further performing. Sn substitution on the rough surface.

(14) Solder bumps are formed on the above-described printed circuit board. On both sides of the substrate, a solder resist composition is applied, and drying is performed. After that, a photomask film (not shown) on which a circular pattern (i.e. mask pattern) is drawn is made hermetic contact and placed onto the solder resist composition, and is exposed to UV ray and then is developed. Furthermore, heating is performed to form a solder resist layer (having a thickness of 20 $\mu$m) having openings 271U, 271D at solder pad portions (including via holes and land portions thereof) (FIG. 28(C)).

(15) The openings 271U, 271D of the solder resist layer 270 are filled with a solder paste (not shown). Then, the solder charged into the openings 271U, 271D is relowed at 200° C. to form solder bumps (i.e. solder bodies) 276 are formed (FIG. 29). In order to increase the corrosion resistance, a layer of metal such as Ni, Au, Ag, Pd and the like may be formed in the opening 271 by plating or sputtering.

The processes of mounting the IC chip on the printed circuit board, and attaching the printed circuit board to the daughter board are the same as those of the first embodiment, and their description will be omitted.

First Modification of Second Embodiment

Figure 31:
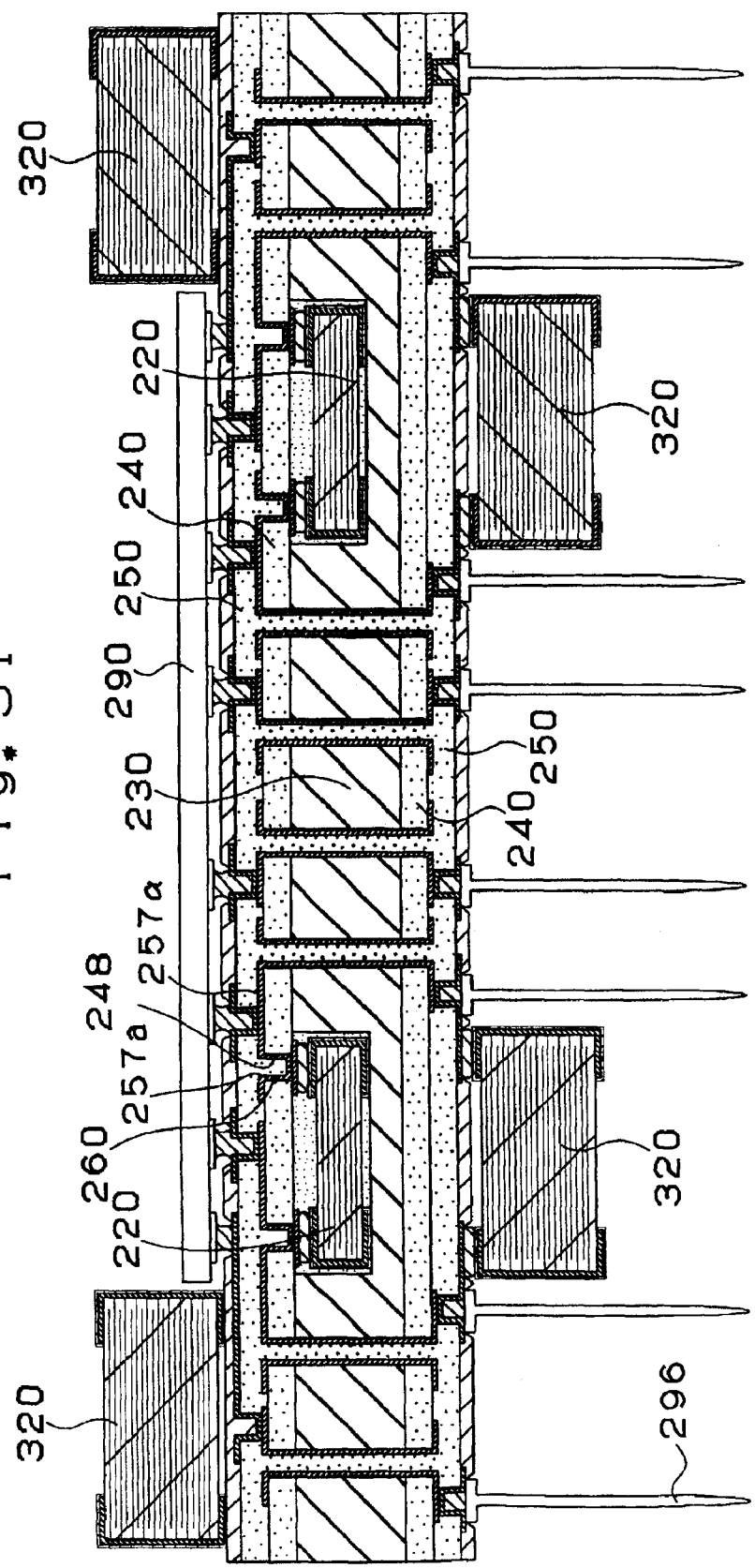
FIG. 31 is a diagram showing a cross section of the printed circuit board according to a first modification of the second embodiment.

A printed circuit board according to a first modification of the second embodiment will be described with reference to FIG. 31. The printed circuit board according to a first modification has a similar structure as of second modification, except for the following points. That is, in the printed circuit board of the first modification, conductive pints 296 are provided, and a connection with the daughter board is established through the conductive pins 296. Whereas the resin film 240*a* having the metal film 257 on its one side is employed in the foregoing embodiment described above referring to FIG. 23(A), in the first modification, a resin film having metal films on its both sides is employed to manufacture an interlayer resin insulating layer 240 on the side of IC chip 290. That is, the upper metal film is pattern-etched to form a circuit pattern 257$\alpha$. Furthermore, non-penetrating openings 248 are formed by a laser to form via holes 260 using openings 257*a* of the circuit pattern 257$\alpha$ as conformal masks.

Whereas in the second embodiment described above, chip capacitors 220 are accommodated in the core substrate 230 alone, in the first modification, chip capacitors 320 each having a large capacity are mounted on the front surface and back surface of the core substrate 230, on top of the chip capacitors 220 accommodated in the core substrate 230.

The IC chip conducts a complicated calculation, and in the calculation processing, it instantaneously consumes a large electric power. In order to provide a large electric power to the IC chip, in this modification, chip capacitors 420 for power supply and chip capacitors 520 are provided to the printed circuit board. The effect of providing the chip capacitors 420 and 520 is the same as that attained in the fourth modification of the first embodiment, and therefore, its description will be omitted.

Second Modification of Second Embodiment

Figure 32:
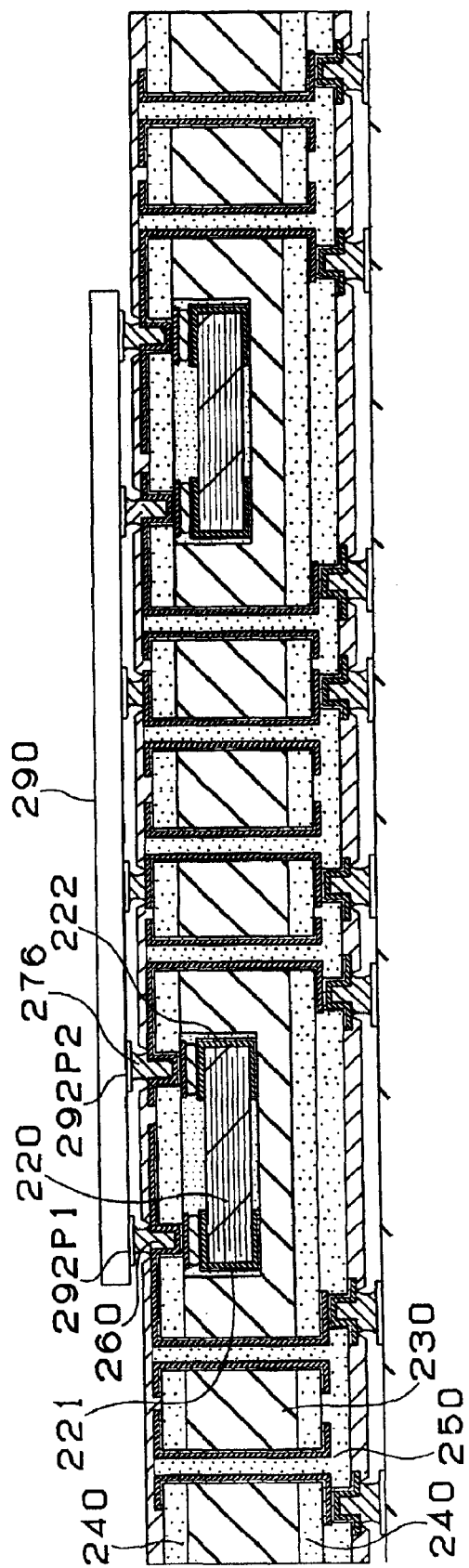
FIG. 32 is a diagram showing a cross section of the printed circuit board according to a second modification of the second embodiment.

A printed circuit board according to a second modification of the second embodiment will be described with reference to FIG. 32. The printed circuit board according to the second modification has the similar structure as of the second embodiment described above, except for the following points. That is in the printed circuit board according to the second modification, the first electrode 221 and the second electrode 222 of the chip capacitor 220 are directly connected to each other through pads 292P1, 292P2 for power supply of the IC chip 290, and a bump 276. In the second modification, the distance between the IC chip and each chip capacitor can be further shortened.

Third Modification of Second Embodiment

Figure 33:
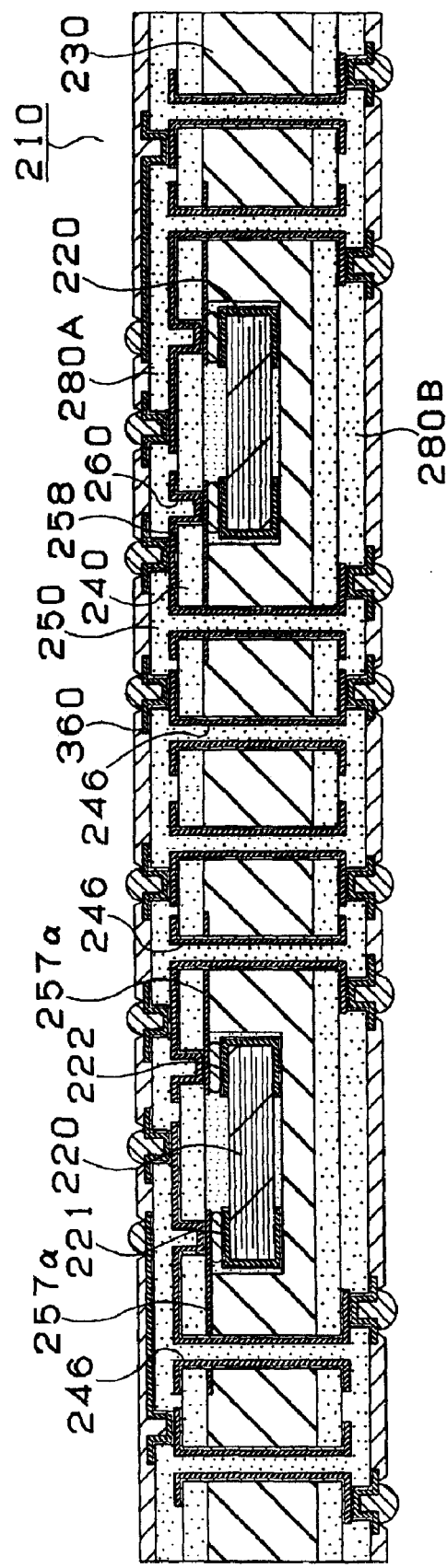
FIG. 33 is a diagram showing a cross section of the printed circuit board according to a third modification of the second embodiment.
Figure 34:
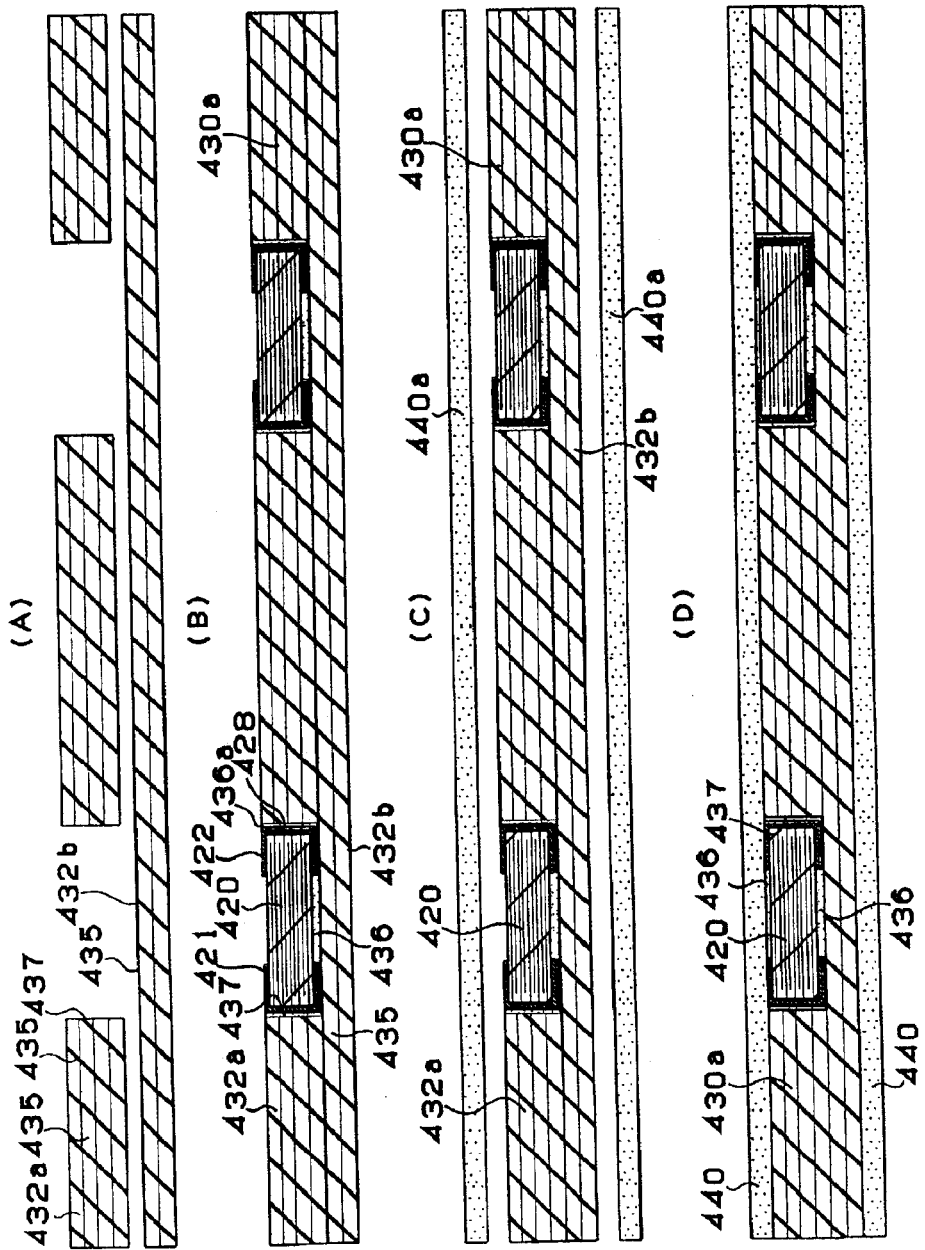
FIG. 34 is a diagram showing a process fort manufacturing a printed circuit board according to a third embodiment of the present invention.
Figure 35:
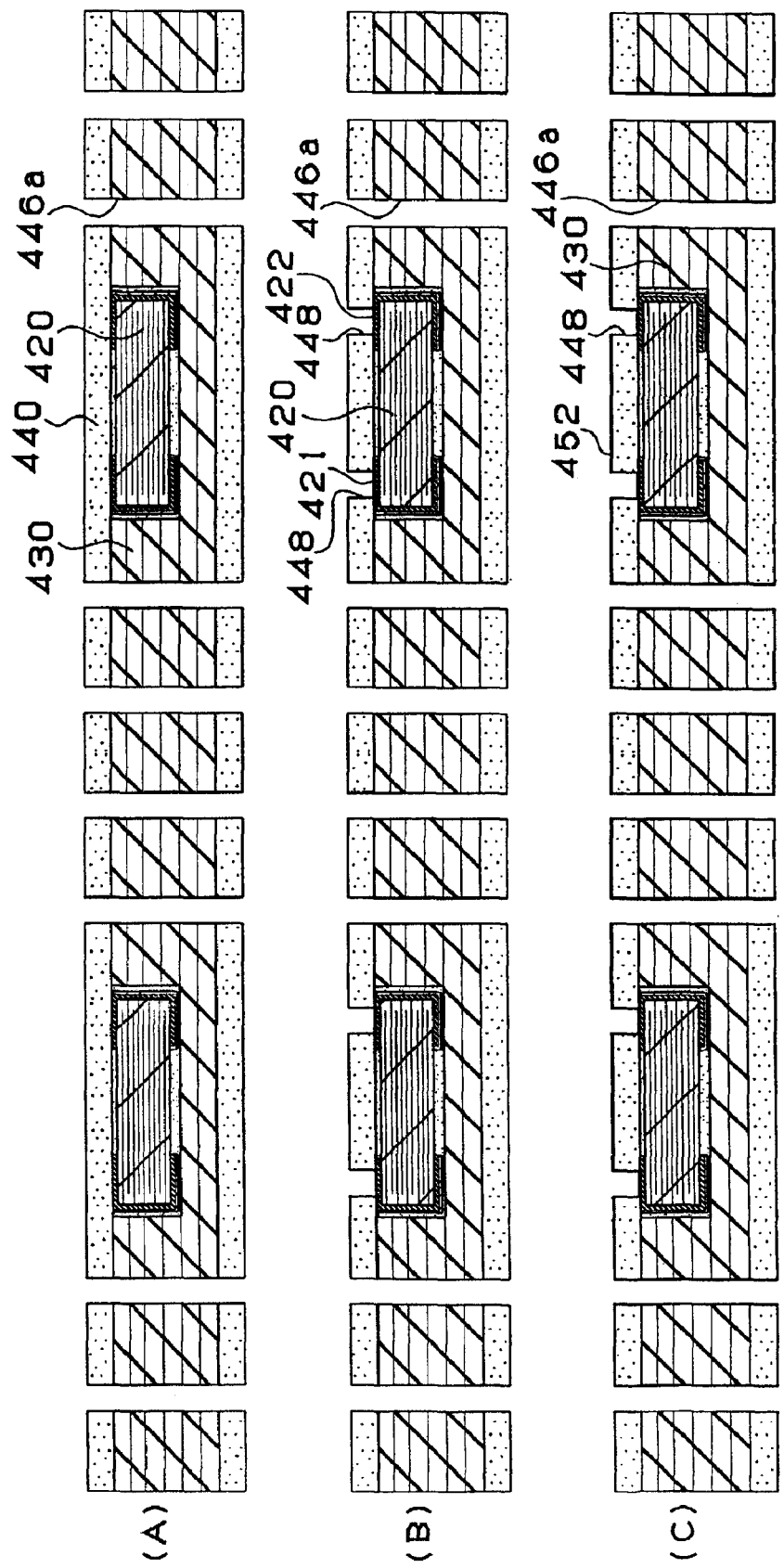
FIG. 35 is a diagram showing a process for manufacturing a printed circuit board according to a third embodiment.
Figure 36:
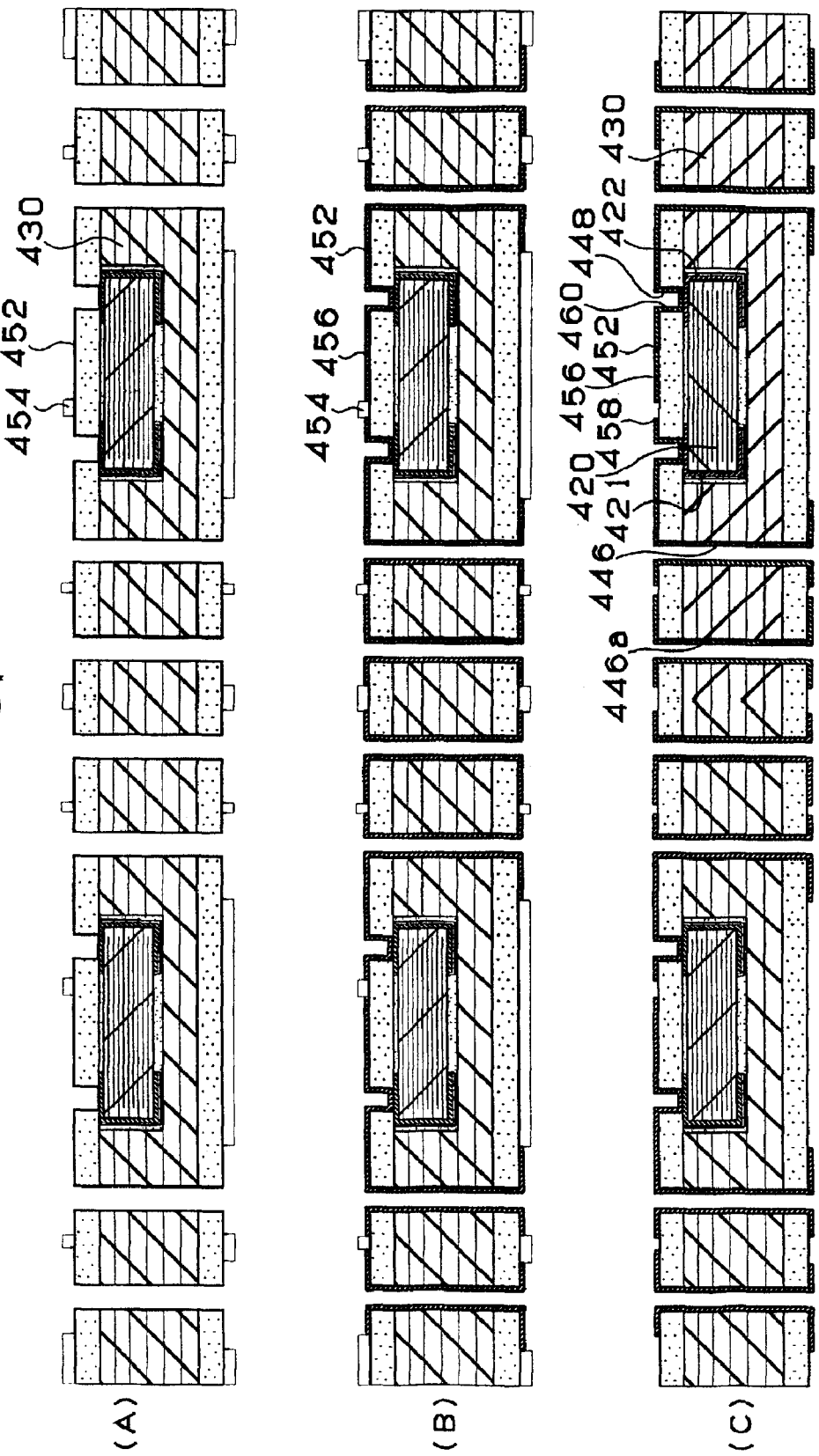
FIG. 36 is a diagram showing a process for manufacturing a printed circuit board according to a third embodiment.

A printed circuit board according to a third modification of the second embodiment will be described with reference to FIG. 33. The printed circuit board according to the third modification has the similar structure as of the second embodiment, except for the following points. That is, in the printed circuit board according to the third modification, the first electrode 221, the second electrode 222 of the capacitor 220 are directly connected to the through hole 246 by a circuit pattern 257α provided-between the accommodation layer 230a and the connection layer 240. In the third modification, the wire length from the first electrode 221 and the second electrode 222 to the daughter board can be shortened.

Fourth Modification of Second Embodiment

A printed circuit board according to a fourth modification of the second embodiment will be described with reference to FIG. 18.

The printed circuit board according to the fourth modification has the similar structure as of the first modification described above, except for the chip capacitors 20 accommodated in the core substrate 30. FIG. 18 is a plan view showing the chip capacitor. FIG. 18(A) is a diagram showing a chip capacitor before being cut from which a plurality of pieces are to be obtained by cutting. In FIG. 18(A), a chain line shows the cutting line. In the printed circuit board described in the first embodiment, as shown in the plan view of FIG. 18(B), the first electrodes 21 and the second electrodes 22 are provide along the side ends of the chip capacitor. FIG. 18(C) is a diagram showing a chip capacitor before being cut from which a plurality of pieces are to be obtained by cutting according to the fourth modification. In FIG. 18(C), a chain line shows the cutting line. In the printed circuit board described in the fourth modification, as shown in the plan view of FIG. 18(D), the first electrodes 21 and the second electrodes 22 are provided inside the side ends of the chip capacitor.

In printed circuit board of the fourth modification, the chip capacitor 20 in which the electrodes are formed along an inside of the outer edge thereof is used. Therefore, a chip capacitor having a large capacity can be used as the chip capacitor 20.

A printed circuit board according to first alternative example of the fourth modification will be described referring to FIG. 19.

FIG. 19 is a diagram showing a plan view of the chip capacitor 20 to be accommodated in the core substrate of the printed circuit board according to a first alternative example. In the above-described first embodiment, a plurality of chip capacitors each having a small capacity are accommodated in the core substrate. Contrary to this, in the first alternative example, a large chip capacitor 20 having a large capacity is accommodated in the core substrate. The chip capacitor 20 includes first electrodes 21, second electrodes 22, a dielectric body 23, a first conductive firm 24 connected to the first electrodes 21, a second conductive film 25 connected to the second electrodes 22, and electrodes 27 which are not connected to the first conductive film 24 and the second conductive film 25 and used for connecting the upper and lower surfaces of the chip capacitor. The chip capacitor is connected to the IC chip and the daughter board through the electrodes 27.

In the printed circuit board according to the first alternative example, the chip capacitor 20 having a large size is used. Therefore, a chip capacitor having a large capacity can be employed as the chip capacitor 20. In addition, the use of large-sized chip capacitor 20 prevents the warpage of the printed circuit board even if the printed circuit board is repeatedly subjected to heat cycle.

Next, a printed circuit board according to a second alternative example will be described referring to FIG. 20. FIG. 20(A) is a diagram showing a chip capacitor before being cut from which a plurality of pieces are to be obtained by cutting. In FIG. 20(A), a chain line shows the cutting line. FIG. 20 (B) is a diagram showing a plan view of the chip capacitor. In the second alternative example, as shown in FIG. 20(B), a plurality of chip capacitors from each of which a plurality of pieces are to be obtained by cutting (in FIG. 20(B), three pieces) are connected into one piece unit having a large size.

In the second alternative example, the chip capacitor 20 having a large size is used. Therefore, a chip capacitor having a large capacity can be employed as the chip capacitor 20. In addition, the use of large-sized chip capacitor 20 prevents the warpage of the printed circuit board even if the printed circuit board is repeatedly subjected to heat cycle.

In the above-described embodiment, the chip capacitors are incorporated in the printed circuit board. Instead of the chip capacitor, it is also possible to use a plate-like capacitor in which a conductive film is formed on a ceramic plate.

As to the printed circuit board of the second embodiment, the inductance of the chip capacitor 220 embedded in the core substrate, and the inductance of the chip capacitor mounted on the back surface of the printed circuit board (on the surface at the side of daughter board) are shown as follows.

In the case of a single capacitor:
   A capacitor of embedded type: 137 pH
   A capacitor of back surface mounted type: 287 pH
In the case of eight capacitors connected in parallel:
   Capacitors of embedded type: 60 pH
   Capacitors of back surface mounted type: 72 pH In both cases where a single capacitor is used and where a plurality of capacitors are connected in parallel to obtain an increased capacity, an inductance can be lowered by incorporating the chip capacitor.

Hereinafter, the results of reliability test will be described. In the test, the rate of change in the electrostatic capacity of a single chip capacitor in the printed circuit board of the second embodiment was measured.

Rate of change in electrostatic capacity (measured at a frequency of 100 Hz) (measured at a frequency of 1 kHz)

| | | |
|---|---:|---:|
| Steam 168 hours: | 0.3% | 0.4% |
| HAST 100 hours: | −0.9% | −0.9% |
| TS 1000 cycles: | 1.1% | 1.3% |

In the Steam test, the chip capacitor was subjected to steam to be kept at a moisture of 100%. In the HAST test, the chip capacitor was left for 100 hours at a relative moisture of 100%, an applied voltage of 1.3V, and at a temperature of 121° C. In the TS test, the chip capacitor was lest for 30 minutes at −125° C., and 30 minutes for 55° C., and this test was repeated 1000 times.

In the above-described reliability test, it was realized that the printed circuit board incorporating the chip capacitor attains a reliability of the same level as the conventional printed capacitor on which a capacitor is mounted on its surface. As described above, in the TS test, even if an internal stress is generated due to the difference in the thermal expansion coefficients between the capacitor 220 made of ceramic, and the core substrate 230 and the connection layer 240 made of resin, no problems are created such as a peeling of the chip capacitor 220 from the connection layer 240, and the cracks in the core substrate 230 and the connection layer 240. In this manner, high reliability can be attained over a long period of time.

According to the structure of the second embodiment, there is no problem of lowering the electric characteristics caused by inductance.

Since the resin is charged in the space between the core substrate and the capacitor, even if the stress is generated caused by the capacitors, the stress can be alleviated. In addition, no migration is created. As a result, neither peeling nor dissolution is caused between the electrodes of the capacitor and the connecting sections of the via holes. Due to these arrangements, the desired performance can be maintained in the reliability test.

In the case where the capacitors are coated with copper, the generation of migration can be prevented.

Third Embodiment

Figure 37:
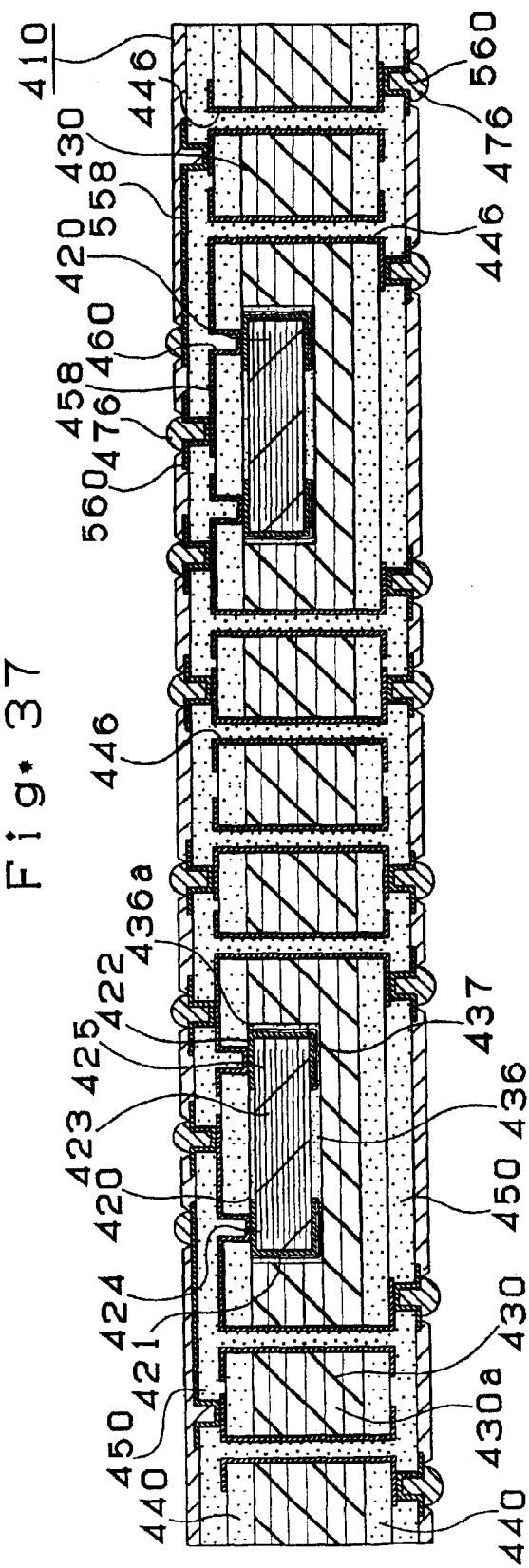
FIG. 37 is a diagram showing a cross section of the printed circuit board according to a third embodiment.
Figure 38:
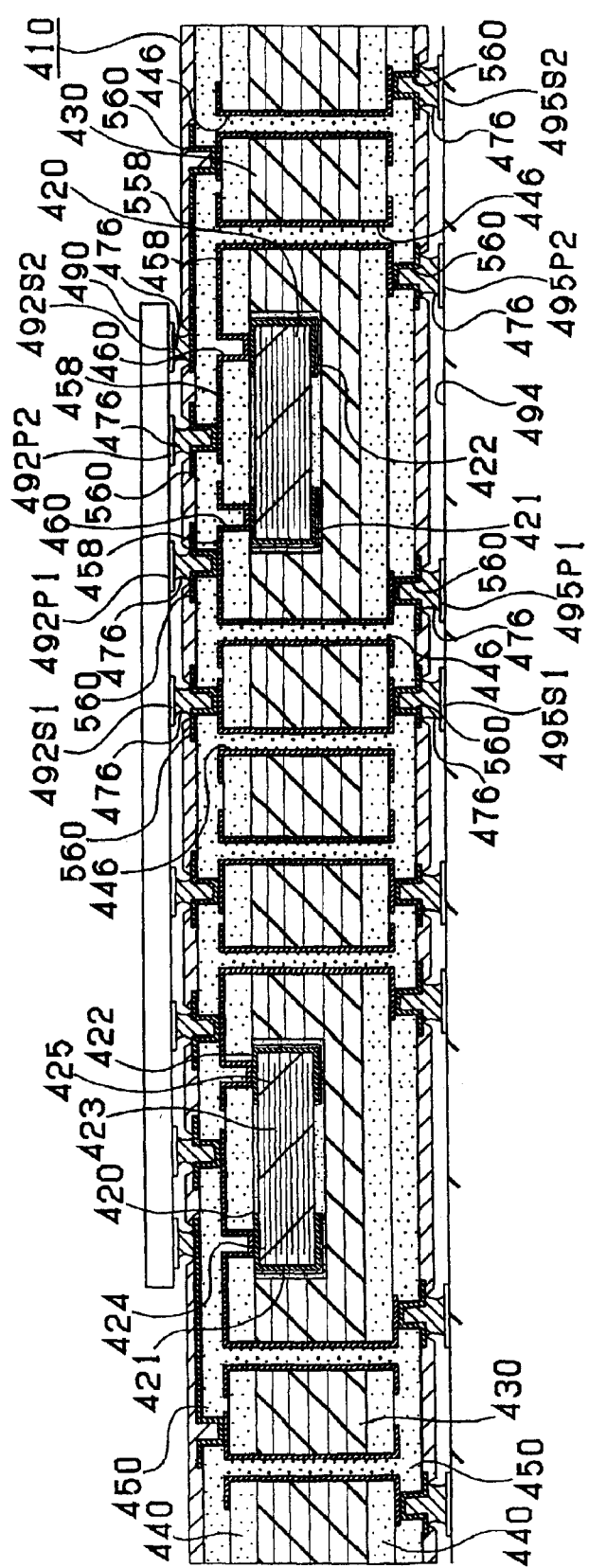
FIG. 38 is a diagram showing a cross section of the printed circuit board according to a third embodiment.

First, the structure of a printed circuit board according to a third embodiment of the present invention will be described with reference to FIGS. 37 and 38. FIG. 37 is a diagram showing across section of a printed circuit board 410. FIG. 38 is a diagram showing the state where an IC chip 490 is mounted on the printed circuit board 410 shown in FIG. 37, and the printed circuit board 410 is attached to a daughter board 494.

As shown in FIG. 37, the printed circuit board 410 incorporates chip capacitors 420, a core substrate 430 for accommodating chip capacitors 420, and an interlayer resin insulating layer 450 constituting the buildup layers 480A, 480B. The core substrate 430 is constituted by an accommodating layer 430a for accommodating the capacitors 420, and a connection layer 440. Via holes 460 and a conductor circuit 458 are formed in the connection layer 440. Via holes 560 and a conductor circuit 558 are formed in the interlayer resin insulating layer 450. In this embodiment, the buildup layer is constitute by a single interlayer resin insulating layer 450. As an alternative to this, the buildup layer may be constituted by a plurality of interlayer resin insulating layers.

As shown in FIG. 45, the chip capacitor 420 is constituted by a first electrode 421, a second electrode 422, and an dielectric body 423 interposed between the first and second electrodes. The dielectric body 423 includes a plurality of first conductive film 424 connected to the first electrode 421 and a plurality of second conductive film 425 connected to the second electrode 422 in an opposed relation to each other. In this embodiment, a connection for the first electrode 421 and the second electrode 422 is established by forming via holes 460 made of plating. As shown in FIG. 45, a metal (i.e. copper) layer 426 is exposed from the upper coating layer 428 formed on the first electrode 421 and the second electrode 422. With this arrangement, as shown in FIG. 37, the connection with the via holes 460 made of copper plating is enhanced, and the connection resistance can be lowered.

As shown in FIG. 38, the via holes 560 in the upper buildup layer 480A are formed with bumps 476 to be respectively connected to pads 492S1, 492S2, 492P1, 492P2 of the IC chip 490. On the other hand, the via holes 560 in the lower buildup layer 480B are formed with bump 476 to be respectively connected to pads 495S1, 495S2, 495P1, 495P2. Through holes 446 are formed in the core substrate 430.

The pad 492S2 for signal of the IC chip 490 is connected to the pad 495S2 for signal of the daughter board 494 through the bump 476-the conductor circuit 558-the via hole 560-the through hole 446-the via hole 560-the bump 476. On the other hand, the pad 492S1 for signal of the IC chip 490 is connected to the pad 495S1 for signal of the daughter board 494 through the bump 476-the via hole 560-the through hole 446-the via hole 560-the bump 476.

The pad 492P1 for power supply of the IC chip 490 is connected to the first electrode 421 of the chip capacitor 420 through the bump 476-via hole 560-the conductor circuit 458-the via hole 460. On the other hand, the pad 495P1 for power supply of the daughter board 494 is connected to the first electrode 421 of the chip capacitor 42D through the bump 476-the via hole 560-the through hole 446-the conductor circuit 458-the via hole 460.

The pad 492P2 for power supply of the IC chip 490 is connected to the second electrode 422 of the chip capacitor 420 through the bump 476-the via hole 560-the conductor circuit 458-the via hole 460. On the other hand, the pad 495P2 for power supply of the daughter board 494 is connected to the second electrode 422 of the chip capacitor 420 through the bump 476-the via hole 560-the through hole 446-the conductor circuit 458-the via hole 460.

In the printed circuit board 410 of the third embodiment, the chip capacitors 420 are placed immediately below the IC chip 490. The distance from the IC chip to each capacitor is shortened, and therefore, electric power can be instantaneously supplied to the IC chip. That is, the loop length which determines the loop inductance can be shortened.

In addition, the through hole 446 is formed between the chip capacitors 420, and no signal line passes through the chip capacitors 420. In this structure, there is no problem that the impedance becomes discontinuous by the high dielectric body to generate a reflection, and that the transmission is delayed by passing through the high dielectric body.

The external substrate (i.e. daughter board) 494 to be connected to the back surface of the printed circuit board is connected to the first electrode 421 and the second electrode 422 of the capacitor 420 through the via holes 460 formed in the connection layer 440 on the side of IC chip and the through holes 446 formed in the core substrate 430. That is, although the accommodation layer 430a having a core material is hard to process, penetrating openings are formed in the accommodation layer 430a so that the terminal of the capacitor is not directly connected to the external substrate. As a result, the reliability of the connection can be increased.

In this embodiment, as shown in FIG. 37, an adhesive 436 is interposed between the lower surface of the penetrating opening 437 of the core substrate 430 and the chip capacitor 420. In addition, a resin filling agent 436a is charged in a space between the side surface of the penetrating opening 437 and the chip capacitor 420. The thermal expansion coefficients of the resin layer 436 and the adhesive material 436a provided on the bottom surface of the chip capacitor 420 are set to the values lower than those of the core substrate 430 and the connection layer 440, that is, are set to the values close to that of the chip capacitor 420 made of ceramics. In this manner, even if internal stress is generated between the core substrate 430 and the connection layer 440, and the chip capacitor 420 caused by the difference in the thermal expansion coefficients therebetween, cracks and peelings do not easily occur in the core substrate and the connection layer 440. As a result, high reliability can be attained. In addition, the generation of migration can be prevented.

The process of manufacturing the printed circuit board of the third embodiment will be described with reference to FIGS. 34 to 37.

(1) Four prepregs 435 each having a core material impregnated with an epoxy resin are laminated on top of each other to form a laminated plate 432a, and penetrating openings 437 for accommodating chip capacitors are formed in the laminated plate 432a. On the other hand, two prepregs 435 are laminated on top of each other to form a laminated plate 432b (FIG. 34(A)). Instead of the epoxy resin, the prepreg 435 may be impregnated with BT, phenolic resin, or reinforcement material such as glass cloth. The laminated plate 432a and the laminated plate 432b are laminated to each other to form an accommodation layer 430a. Then, as described above referring to FIG. 45(A), chip capacitors 420 in which a coating layer 428 is peeled from the first and second electrodes 421, 422 are accommodated in the penetrating opening 437 (FIG. 34(B)). It is preferable that an adhesive 436 is interposed between the penetrating opening 437 and the chip capacitor 420. The resin and interlayer resin insulating layer used in this invention has melting points of 300° C. or lower. Therefore, when heat higher than 350° C. is applied, the resin and interlayer resin insulating layer may be dissolved, softened, or carbonized. As the adhesive 436, it is preferable to use an adhesive having a thermal expansion coefficient smaller than that of the core substrate.

It is impossible to use substrates made of ceramic and AlN as the core substrate. These substrates are poor in outer shape processing characteristics, and cannot accommodate capacitors in some cases, because a space is created inside the substrate even if it is filled with a resin.

(2) The resin film 440a (i.e. a connection layer) is laminated on both sides of the accommodating layer constituted by the laminated plate 432a and the laminated plate 432b and accommodating the chip capacitors 420 (FIG. 34(C)), and are pressed from both sides to flatten the surface. Then, the resultant is heated and cured to form a core substrate 430 constituted by the accommodating layer 430a accommodating the chip capacitors 420 and the connection layer 440 (FIG. 34(D)). In this embodiment, the accommodation layer 430a which accommodates the capacitors 420 and the connection layer 440 are bonded to each other by application of pressure from both sides to form the core substrate 430. As a result, the core substrate 430 has a flat surface. The interlayer resin insulating layer 450 and the conductor circuit 458 can be laminated in a later step in such a manner that high reliability is attained.

It is preferable that a resin filler 436a is charged in the side surface of the penetrating openings 437 of the core substrate to increase the air tightness. As the resin filler 436a, it is preferable to use a filler having a thermal expansion coefficient smaller than that of the core substrate. In this embodiment, the resin film 440a may be a resin film of the same type as that used in the first embodiment which has no metal layer. As an alternative to this, a resin film (RCC) having a metal layer on its one side may be used. That is, it is possible to use a both sided plate, a one sided plate, a resin plate having no metal film, and a resin film.

(3) Penetrating openings 446 each having a diameter of 300 to 500 μm for through holes are formed in the core substrate and the interlayer resin insulating layer 450 with a drill (FIG. 35(A)). Non-penetrating openings 448 extending to the first electrode 421 and the second electrode 422 of the chip capacitor 420 are formed in the upper interlayer resin insulating layer 450 by $CO_2$ laser, YAG laser, excimer laser, or UV laser (FIG. 35(B)). As the case may be, an area mask on which penetrating openings are formed at positions corresponding to the positions of the non-penetrating openings is mounted, and an area processing is conducted by a laser. In the case where it is desired to form via holes having different sizes and diameter from each other, the lasers may be used in combination to form the via holes.

(4) A desmear process is performed.

Subsequently, a palladium catalyst is provided to the surface of the substrate 430, and then, the core substrate 430 is immersed into an electroless plating solution to uniformly precipitate the electroless plated film 452 (FIG. 35(C)). As a result of this, a rough layer can be formed on the surface of the electroless copper plated film 452. The rough surface has Ra (mean roughness height) of 0.01 to 5 μm, and especially preferable is Ra of 0.5 to 3 μm.

(6) A photosensitive dry film is attached on the surface of the electroless plated film 452, and a mask is mounted thereon. Exposure to light and development are performed to form a resist 454 having a predetermied pattern (FIG. 36(A)). In this embodiment, an electroless plating is employed. Alternatively, a metal film of copper, nickel and the like may be formed by sputtering. The sputtering is disadvantageous from the viewpoint of cost, but is advantageous in that the adhesion with the resin can be improved. The core substrate 430 is immersed in an electrolytic plating solution, and a current is allowed to flow in the core substrate 430 through the electroless plated film 452 to precipitate an electrolytic copper plated film 456 (FIG. 36(B)). The resist 454 is peeled by 5% KOH, and the electroless plated film 452 located under the resist 454 is etched and removed with a mixed solution of sulfuric acid and hydrogen peroxide. As a result, via holes 460 are formed in the non-penetrating openings 448 of the connection layer 440, a conductor circuit 458 is formed on the surface of the connection layer 440, and through holes 446 are formed in the penetrating openings 446a of the core substrate 430 (FIG. 36(C)). The subsequent processes are the same as the steps (10) to (15) of the second embodiment which has been described above, and therefore, their description will be omitted.

The processes of mounting the IC chip on the printed circuit board, and attaching the printed circuit board to the daughter board are the same as those of the first embodiment, and their description will be omitted.

First Modification of Third Embodiment

Figure 39:
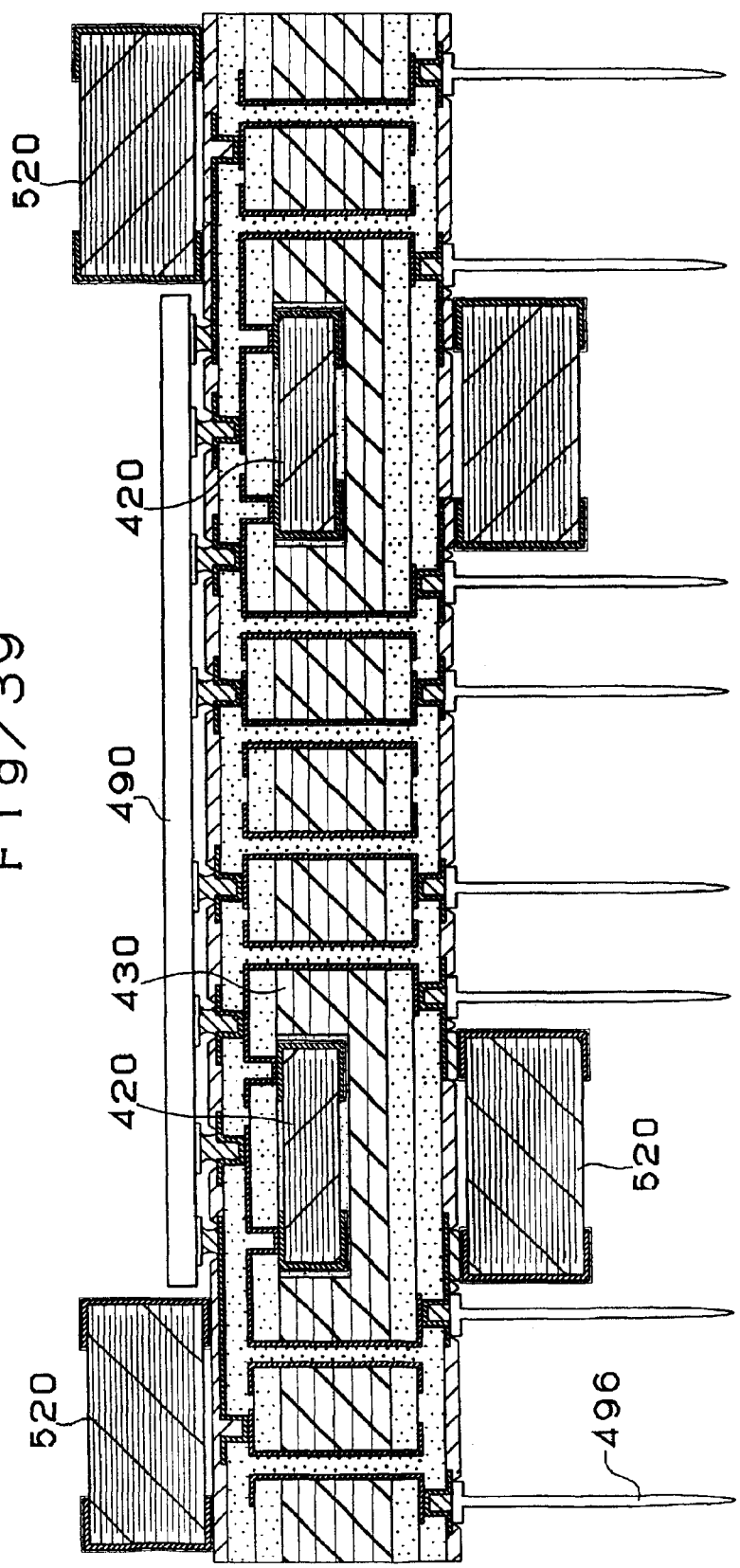
FIG. 39 is a diagram showing a cross section of the printed circuit board according to a first modification of the third embodiment.

A printed circuit board according to a first modification of the third embodiment will be described with reference to FIG. 39. The printed circuit board according to the first modification has the similar structure as of the first modification described above, except for the following points. That is, in the printed circuit board of the first modification, conductive pins 496 are provided, and a connection with the daughter board is established through the conductive pins 496.

Whereas in the third embodiment described above, chip capacitors 420 are accommodated in the core substrate 430 alone, in the first modification, chip capacitors 520 each having a large capacity are mounted on the front surface and back surface of the core substrate 430, on top of the chip capacitors 420 accommodated in the core substrate 430.

The IC chip conducts a complicated calculation, and in the calculation processing, it instantaneously consumes a large electric power. In order to provide a large electric power to the IC chip, in the first modification, chip capacitors 420 for power supply and chip capacitors 520 are provided to the printed circuit board. The effect of providing the chip capacitors 420 and 520 is the same as that attained in the fourth modification of the first embodiment, and therefore, its description will be omitted.

Second Modification of Third Embodiment

Figure 42:
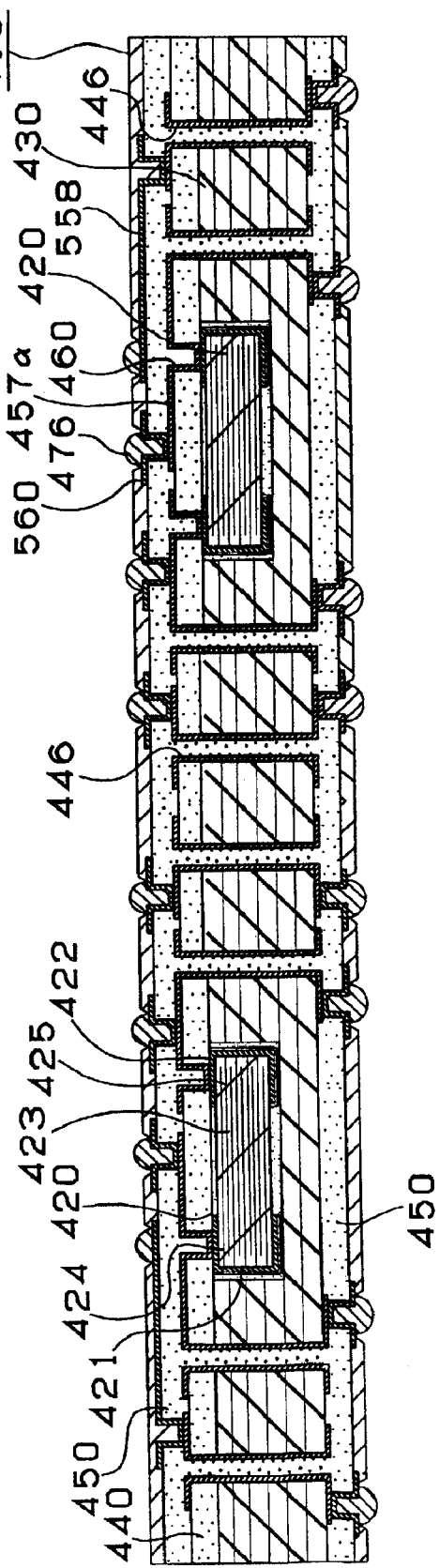
FIG. 42 is a diagram showing a cross section of the printed circuit board according to a second modification of the third embodiment.

A printed circuit board according to a second modification of the third embodiment will be described with reference to FIG. 42. The printed circuit board according to the second modification has the similar structure as of the third modification described above, except for the following points. In the third embodiment, the core substrate 430 is constituted by the accommodation layer 430a having connection layers 440 on its both sides. Contrary to this, in the second embodiment, the connection layer 440 is formed only on the upper surface of the accommodation layer 430a.

Figure 40:
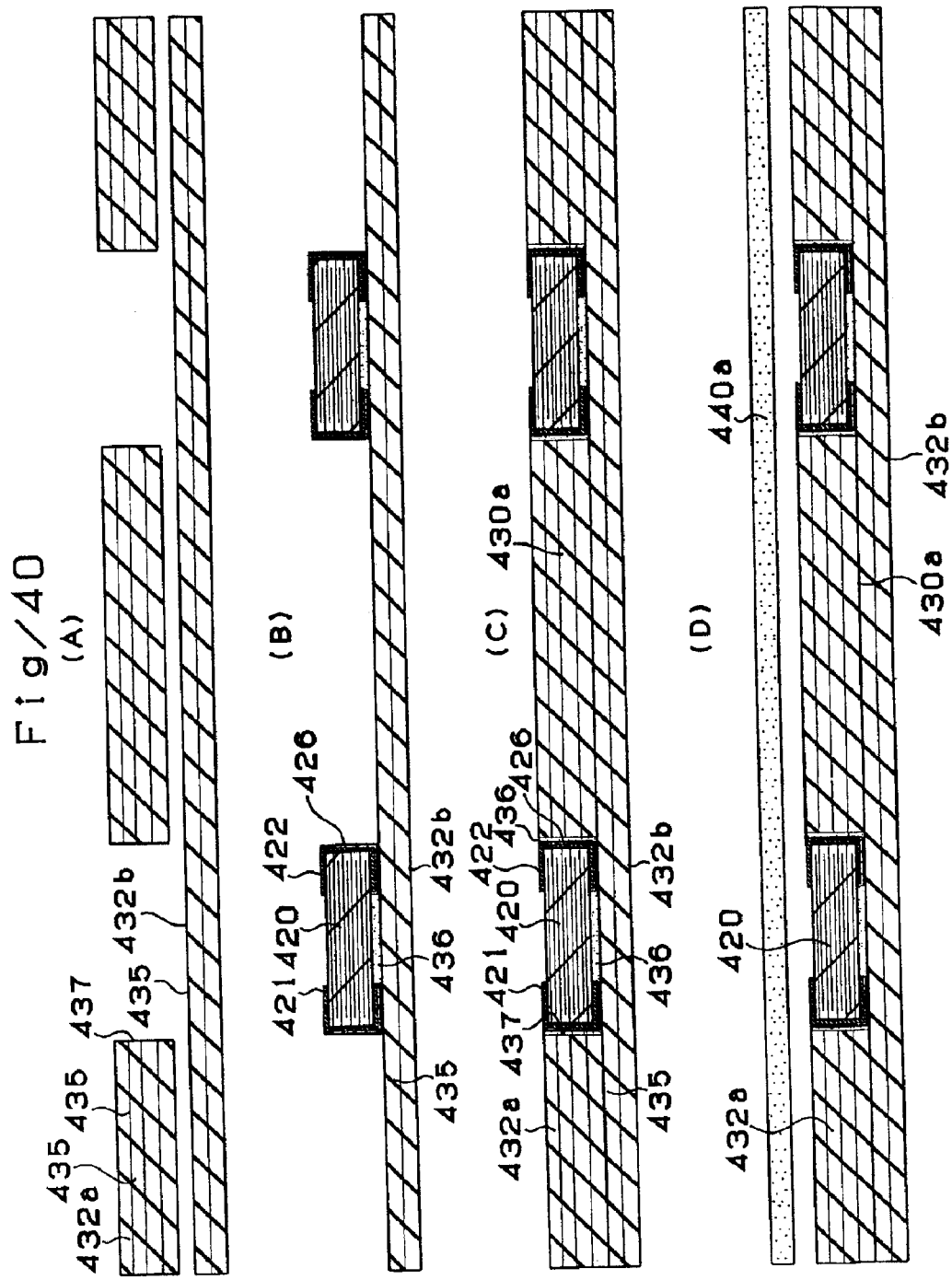
FIG. 40 is a diagram showing a process for manufacturing a printed circuit board according to a second modification of the third embodiment.
Figure 41:
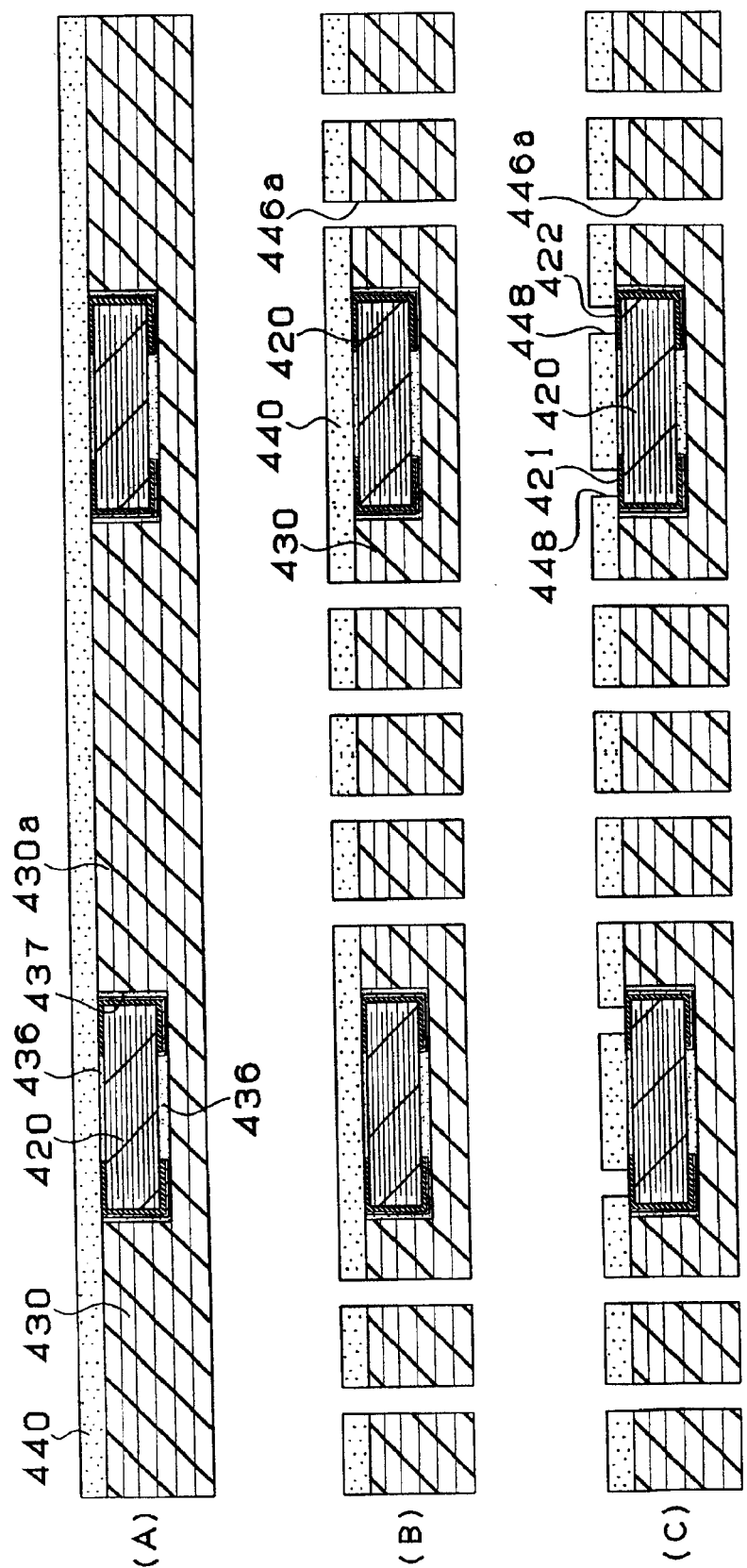
FIG. 41 is a diagram showing a process for manufacturing a printed circuit board according to a second modification of the third embodiment.

The processes of manufacturing the printed circuit board according to the second modification of the third embodiment will be described with reference to FIGS. 39 to 41.

(1) Four prepregs 435 impregnated with an epoxy resin are laminated on top of each other to form a laminated plate 432a, and penetrating openings 437 for accommodating chip capacitors are formed in the laminated plate 432a. On the other hand, two prepregs 435 are laminated on top of each other to form a laminated plate 432b (FIG. 40(A)). Chip capacitors 420 are mounted through the adhesives 436 on the laminated plate 432b at positions corresponding to the penetrating openings of the laminated plate 432a (FIG. 40(B)). The laminated plate 432a and the laminated plate 432b are laminated to each other to form an accommodating layer 430a accommodating the chip capacitors 420 (FIG. 40(C)).

(2) The resin film 440a (i.e. a connection layer) is laminated on the accommodating layer constituted by the laminated plate 432a and the laminated plate 432b, and accommodating the chip capacitors 420 (FIG. 40(D)), and the resultant is pressed from both sides to flatten the surface. Then, heating and curing is conducted to form a core substrate 430 constituted by the accommodating layer 430a accommodating the chip capacitors 420 and the connection layer 440 (FIG. 41(A)). In this embodiment, the accommodation layer 430a which accommodates the capacitors 420 and the connection layer 440 are bonded to each other by application of pressure from both sides to form the core substrate 430. As a result, the core substrate 430 has a flat surface. The interlayer resin insulating layer 450 and the conductor circuit 558 can be laminated in such a manner that high reliability is attained.

(3) Penetrating openings 446 each having a diameter of 300 to 500 μm for through holes are formed in the core substrate and the interlayer resin insulating layer 450 with a drill (FIG. 41(B)). Non-penetrating openings 448 extending to the first electrode 421 and the second electrode 422 are formed in the upper interlayer resin insulating layer 450 by $CO_2$ laser, YAG laser, excimer laser, or UV laser (FIG. 41(C)). The subsequent processes are the same as the steps (3) and after of the third embodiment, and therefore, their description will be omitted.

Third Modification of Third Embodiment

Figure 44:
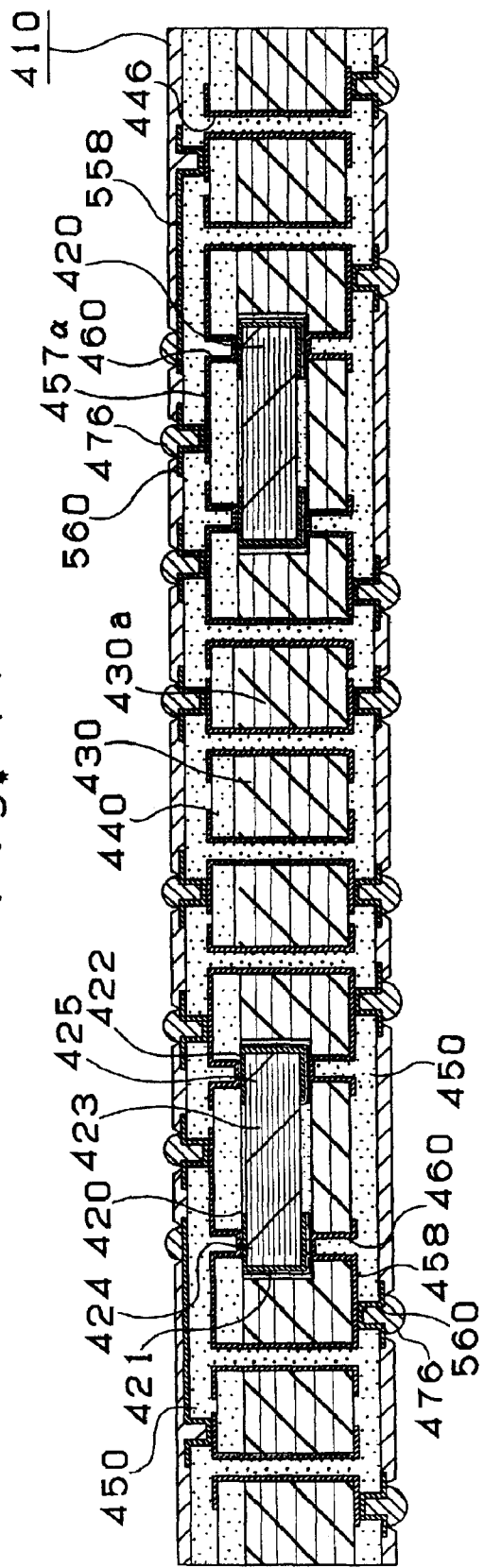
FIG. 44 is a diagram showing a cross section of the printed circuit board according to a third modification of the third embodiment.

A printed circuit board according to third modification of the third embodiment will be described with reference to FIG. 44. The printed circuit board according to the third modification has the similar structure as of the second modification of the third embodiment described above, except for the following points. That is, in the printed circuit board according to the second modification, via holes 460 are formed on only one surface of the core substrate 430 on the IC chip side. Contrary to this, in the third modification, via holes 460 are formed on both surfaces of the core substrate on the sides of IC chip and daughter board.

In the third modification, the via holes 460 are formed not only on the front surface but also on the back surface. In this manner, the wire length between the chip capacitors 420 and the daughter board can be shortened.

Figure 43:
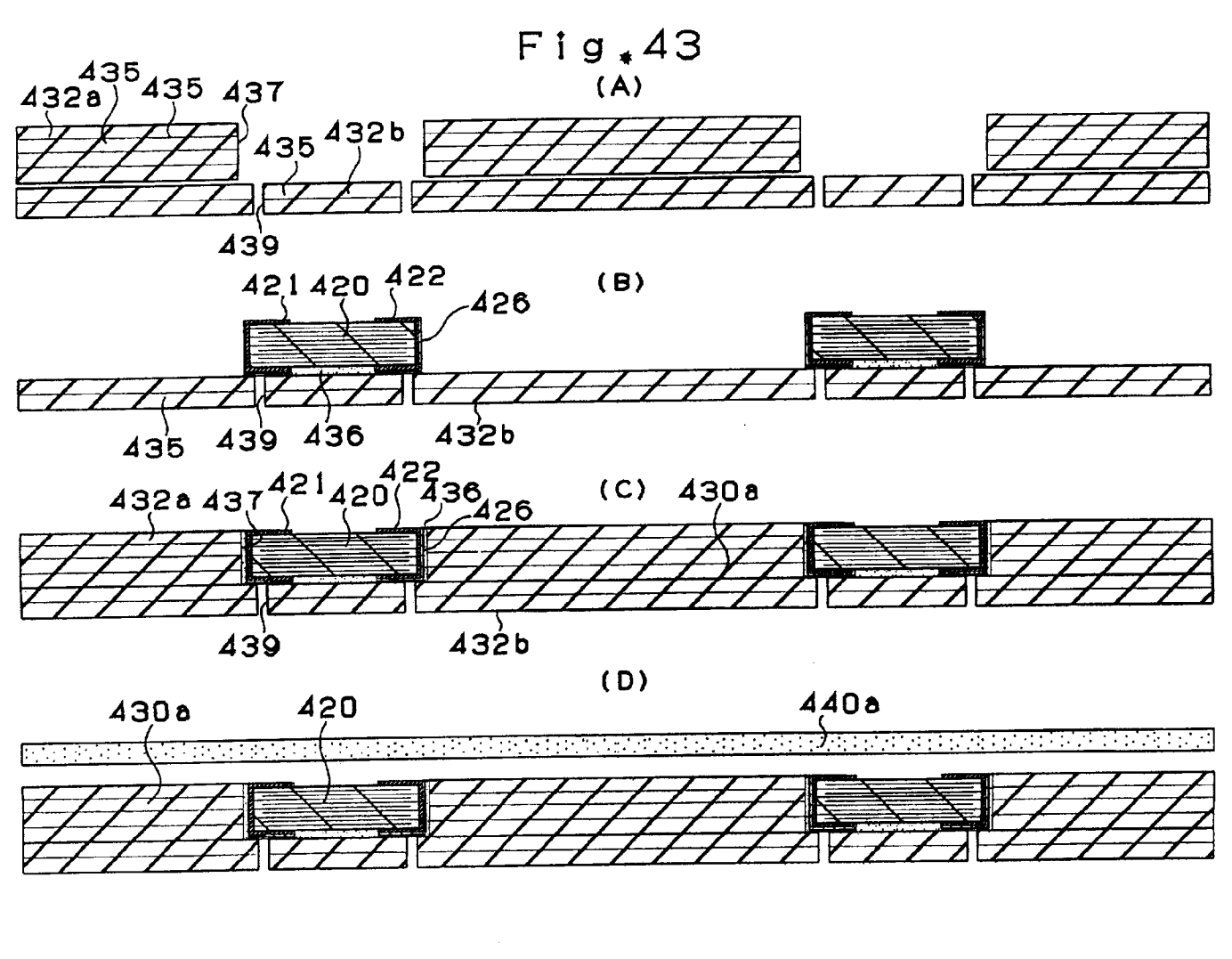

The processes of manufacturing the printed circuit board according to the third modification of the third embodiment will be described with reference to FIG. 43.

(1) Four prepregs 435 impregnated with an epoxy resin are laminated on top of each other to form a laminated plate 432a, and penetrating openings 437 for accommodating chip capacitors are formed in the laminated plate 432a. On the other hand, two prepregs 435 are laminated on top of each other to form a laminated plate 432b, and penetrating openings 439 extending to the electrodes are formed at positions where the chip capacitors are to be mounted (FIG. 43(A)). Chip capacitors 420 are mounted on the laminated plate 432b through the adhesive material 436 at positions corresponding to the penetrating openings formed in the laminated plate 432a (FIG. 43(B)). The laminated plate 432a and the laminated plate 432b are laminated to each other to form an accommodating layer 430a (FIG. 43(C)).

(2) The resin film 440a (i.e. a connection layer) is laminated on the upper surface of the accommodating layer 430a (FIG. 43(D)), and are pressed from both sides to flatten the surface. Then, the resultant is heated and cured to form a core substrate 430 constituted by the accommodating layer 430a accommodating the chip capacitors 420 and the connection layer 440 (FIG. 44). The subsequent processes are the same as the steps (3) and after of the third embodiment, and therefore, their description will be omitted.

Fourth Modification of Third Embodiment

Figure 46:
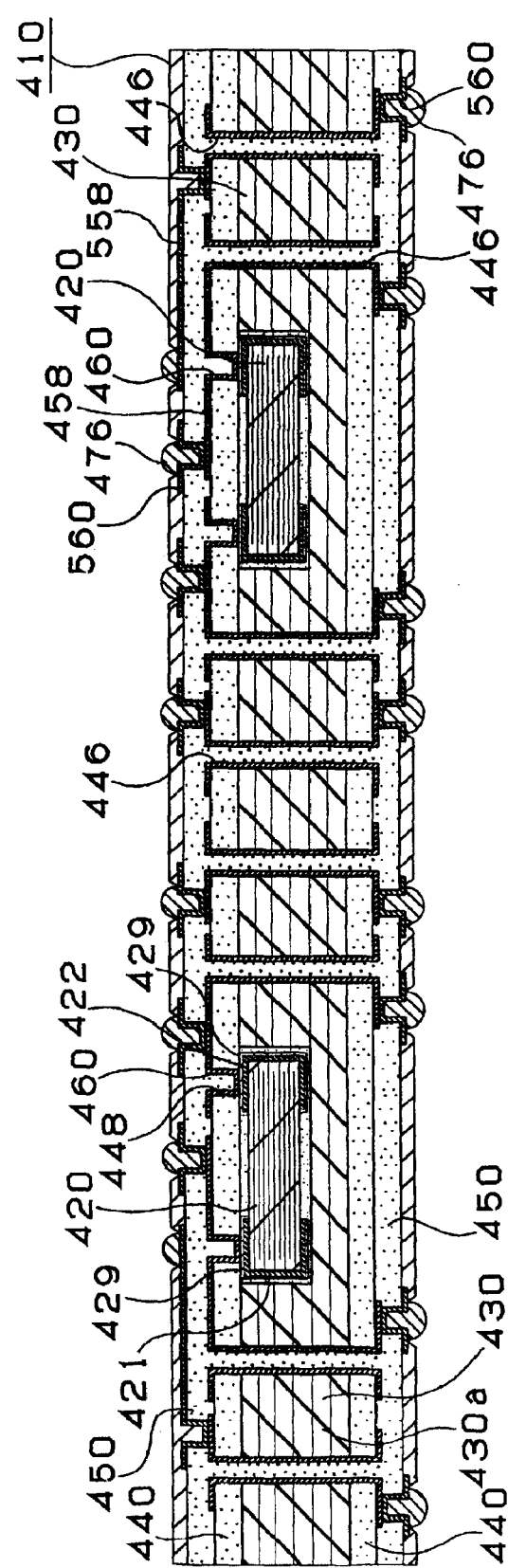
FIG. 46 is a diagram showing a cross section according to a fourth modification of the third embodiment.
Figure 47:
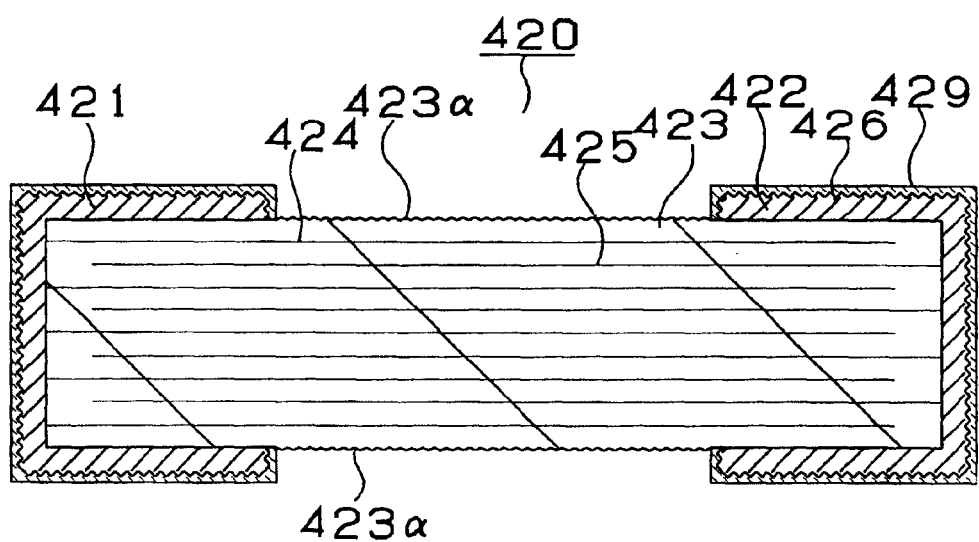
FIG. 47 is a diagram showing a cross section of the chip capacitor according to the fourth modification.

A printed circuit according to fourth modification of the third embodiment will be described referring to FIGS. 46 and 47.

The printed circuit board according to the fourth modification has the similar structure as of the third embodiment described above referring to FIG. 37, except for the following points. That is, in the printed circuit board according to the fourth modification, as shown in FIG. 47, in the chip capacitor 420, the coating layer 428 (FIG. 45(A)) is completely peeled from the first and second electrodes 421, 422, and then, the first and second electrodes are coated with a copper plated film 429. An electric connection for the first and second electrodes 421, 422 coated with the copper plated film 429 is established through via holes 460 constituted by a copper plating. The electrodes 421, 422 of the chip capacitor are metallized and has pits and projections on their surfaces. If the metal layer 426 is left uncoated and exposed to the outside, the resin may be left in the pits and projections in the step of forming non-penetrating openings 448 in the connection layer 440. The resin left in the pits and projections may cause a disconnection between the first and second electrodes 421, 422 and the via hole 460. Contrary to this, in the fourth modification, the surfaces of the first and second electrodes 421, 422 coated with the copper plated film 429 are flat and smooth. When the non-penetrating openings 448 are formed in the connection layer 440 formed on the electrodes, no resin is left on the surfaces of the electrodes. When the via holes 460 are formed, the connection between the via holes 460 and the electrodes 421, 422 has increased reliability.

Since the via holes 460 are made by plating into the electrodes 421, 422 formed with the copper plated film 429, the electrodes 421, 422 are firmly connected to the via holes 460. No disconnection occurs between the electrodes 421, 422 and via holes 460 even when a heat cycle test is conducted. No migration is generated, and in addition, no problem arises at the connection in the via holes of the capacitor.

The copper plated film 429 is formed after a nickel/tin layer (i.e. coating layer) provided onto the surface of the metal layer 426 in the step of manufacturing the chip capacitor is peeled off at the time of mounting the chip capacitor onto the printed circuit board. Alternatively, the copper plated film 429 may be directly provided onto the surface of the metal layer 426 in the step of manufacturing the chip capacitor 420. In the fourth modification, as is the case of the third embodiment, openings which extend to the copper plated film 429 of the electrodes are formed by a laser, and then a desmear process is performed to form via holes by copper plating. Therefore, even if an oxide film is formed on the surface of the copper plated film 429, the oxide film can be removed in the laser or desmear process.

On the surface of the dielectric body 423 made of ceramic of the chip capacitor 420, a rough surface 423α is formed. The rough surface 423α contributes to an increased adhesion between the chip capacitor 420 made of ceramic and the connection layer 440 made of resin, thereby avoiding the connection layer 440 from peeling from the interface with the chip capacitor 420 even when a heat cycle test is conducted. The rough surface 423 α can be formed by polishing the surface of the chip capacitor 420 after the sintering step, or by roughening the surface of the chip capacitor 420 before the sintering step. In the fourth modification, the surface of the chip capacitor is roughened to increase its adhesion with the resin. Alternatively, the surface of the chip capacitor may be subjected to silane coupling process.

In the above-described embodiment, the chip capacitors are incorporated in the printed circuit board. Instead of the chip capacitor, it is also possible to use a plate-like capacitor in which a conductive film is formed on a ceramic plate. Needless to say, the structure in which the copper plating is provided and the structure in which the surface of the chip capacitor is roughened as employed in the fourth modification may be applicable to the third embodiment, the first, second, and third modifications of the third embodiment.

Fifth Modification of Third Embodiment

The structure of a printed circuit board according to a fifth modification of the third embodiment will be described with reference to FIG. 18.

The printed circuit board according to the fifth modification has the similar structure as of the first modification described above, except for the chip capacitors 20 accommodated in the core substrate 30. FIG. 18 is a plan view showing the chip capacitor. FIG. 18(A) is a diagram showing a chip capacitor before being cut from which a plurality of pieces are to be obtained by cutting. In FIG. 18(A), a chain line shows the cutting line. In the printed circuit board described in the first embodiment, as shown in the plan view of FIG. 18(B), the first electrodes 21 and the second electrodes 22 are provide along the side ends of the chip capacitor. FIG. 18(C) is a diagram showing a chip capacitor before being cut from which a plurality of pieces are to be obtained by cutting according to the fifth modification. In FIG. 18(C), a chain line shows the cutting line. In the printed circuit board described in the fifth modification, as shown in the plan view of FIG. 18(D), the first electrodes 21 and the second electrodes 22 are provided inside the side ends of the chip capacitor.

In the fifth modification, the printed circuit board has a chip capacitor 20 in which the electrodes are formed inside the side ends thereof. Therefore, a chip capacitor having a large capacity can be used as the chip capacitor 20.

A printed circuit board according to first alternative example of the fifth modification will be described referring to FIG. 19.

FIG. 19 is a diagram showing a plan view of the chip capacitor 20 to be accommodated in the core substrate of the printed circuit board according to a first alternative example. In the above-described first embodiment, a plurality of chip capacitors each having a small capacity are accommodated in the core substrate. Contrary to this, in the first alternative example, a large chip capacitor 20 having a large capacity is accommodated in the core substrate. The chip capacitor 20 includes first electrodes 21, second electrodes 22, a dielectric body 23, a first conductive firm 24 connected to the first electrodes 21, a second conductive film 25 connected to the second electrodes 22, and electrodes 27 which are not connected to the first conductive film 24 and the second conductive film 25 and used for connecting the upper and lower surfaces of the chip capacitor. The chip capacitor is connected to the IC chip and the daughter board through the electrodes 27.

In the printed circuit board according to the first alternative example, the chip capacitor 20 having a large size is used. Therefore, a chip capacitor having a large capacity can be employed as the chip capacitor 20. In addition, the use of large-sized chip capacitor 20 prevents the warpage of the printed circuit board even if the printed circuit board is repeatedly subjected to heat cycle.

Next, a printed circuit board according to a second alternative example will be described referring to FIG. 20. FIG. 20(A) is a diagram showing a chip capacitor before being cut from which a plurality of pieces are to be obtained by cutting. In FIG. 20(A), a chain line shows the cutting line. FIG. 20(B) is a diagram showing a plan view of the chip capacitor. In the second alternative example, as shown in FIG. 20(B), a plurality of chip capacitors from each of which a plurality of pieces are to be obtained by cutting (in FIG. 20(B), three pieces) are connected into one piece unit having a large size.

In the second alternative example, the chip capacitor 20 having a large size is used. Therefore, a chip capacitor having a large capacity can be employed as the chip capacitor 20. In addition, the use of large-sized chip capacitor 20 prevents the warpage of the printed circuit board even if the printed circuit board is repeatedly subjected to heat cycle.

In the above-described embodiment, the chip capacitors are incorporated in the printed circuit board. Instead of the chip capacitor, it is also possible to use a plate-like capacitor in which a conductive film is formed on a ceramic plate.

As to the printed circuit board of the fourth modification of the third embodiment, the inductance of the chip capacitor 420 embedded in the core substrate, and the inductance of the chip capacitor mounted on the back surface of the printed circuit board (on the surface at the side of daughter board) are shown as follows.

In the case of a single capacitor:
A capacitor of embedded type: 137 pH
A capacitor of back surface mounted type: 287 pH
In the case of eight capacitors connected in parallel:
Capacitors of embedded type: 60 pH
Capacitors of back surface mounted type: 72 pH In both cases where a single capacitor is used and where a plurality of capacitors are connected in parallel to obtain an increased capacity, an inductance can be lowered by incorporating the chip capacitor.

Hereinafter, the results of reliability test will be described. In the test, the rate of change in the electrostatic capacity of a single chip capacitor in the printed circuit board of the first embodiment was measured.

Rate of change in electrostatic capacity (measured at a frequency of 100 Hz) (measured at a frequency of 1 kHz)

| | | |
|---|---|---|
| Steam 168 hours: | 0.3% | 0.4% |
| HAST 100 hours: | −0.9% | −0.9% |
| TS 1000 cycles: | 1.1% | 1.3% |

In the Steam test, the chip capacitor was subjected to steam to be kept at a moisture of 100%. In the HAST test, the chip capacitor was left for 100 hours at a relative moisture of 100%, an applied voltage of 1.3V, and at a temperature of 121° C. In the TS test, the chip capacitor was lest for 30 minutes at −125° C., and 30 minutes for 55° C., and this test was repeated 1000 times.

In the above-described reliability test, it was realized that the printed circuit board incorporating the chip capacitor attains a reliability of the same level as the conventional printed capacitor on which a capacitor is mounted on its surface. As described above, in the TS test, even if an internal stress is generated due to the difference in the thermal expansion coefficients between the capacitor made of ceramic, and the core substrate and the resin insulating layer made of resin, no problems are created such as a disconnection between the terminal of the chip capacitor and the via holes, a peeling of the chip capacitors from the resin insulating layer, and the cracks in the resin insulating layer. In this manner, high reliability can be attained over a long period of time.

According to the structure of the third embodiment, there is no problem of lowering the electric characteristics caused by inductance.

Since the resin is charged in the space between the core substrate and the capacitors, even if the stress is generated caused by the capacitors, the stress can be alleviated. In addition, no migration is created. As a result, neither peeling nor dissolution is caused between the electrodes of the capacitors and the connecting sections of the via holes. Due to these arrangements, the desired performance can be maintained in the reliability test.

In the case where the electrodes of the capacitors are coated with copper, the generation of migration can be prevented.

Fourth Embodiment

Figure 51:
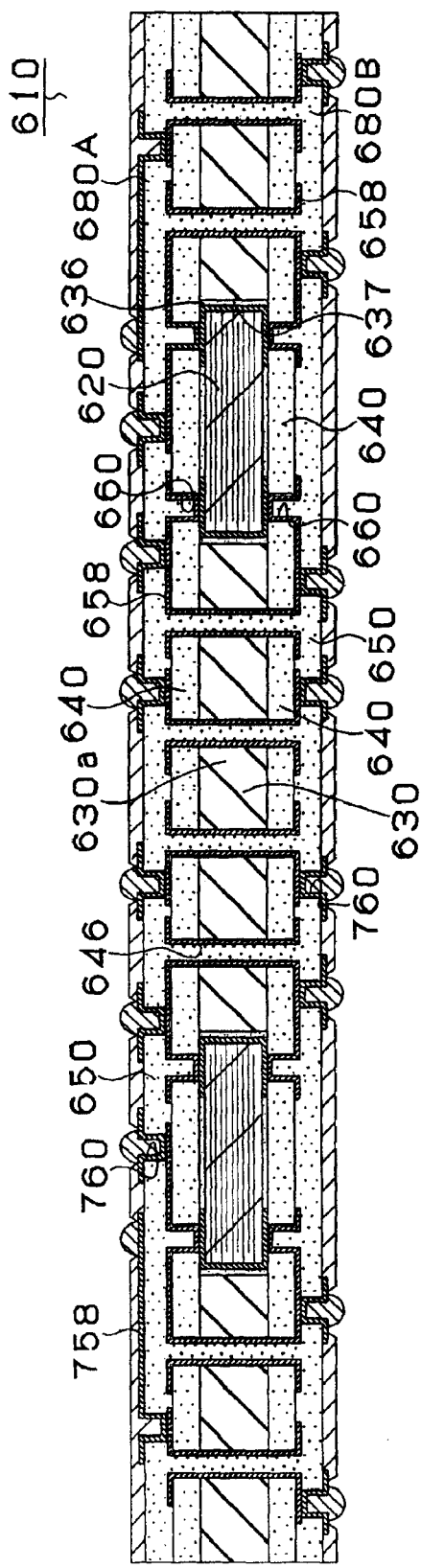
FIG. 51 is a diagram showing a cross section of the printed circuit board according to a fourth embodiment.
Figure 52:
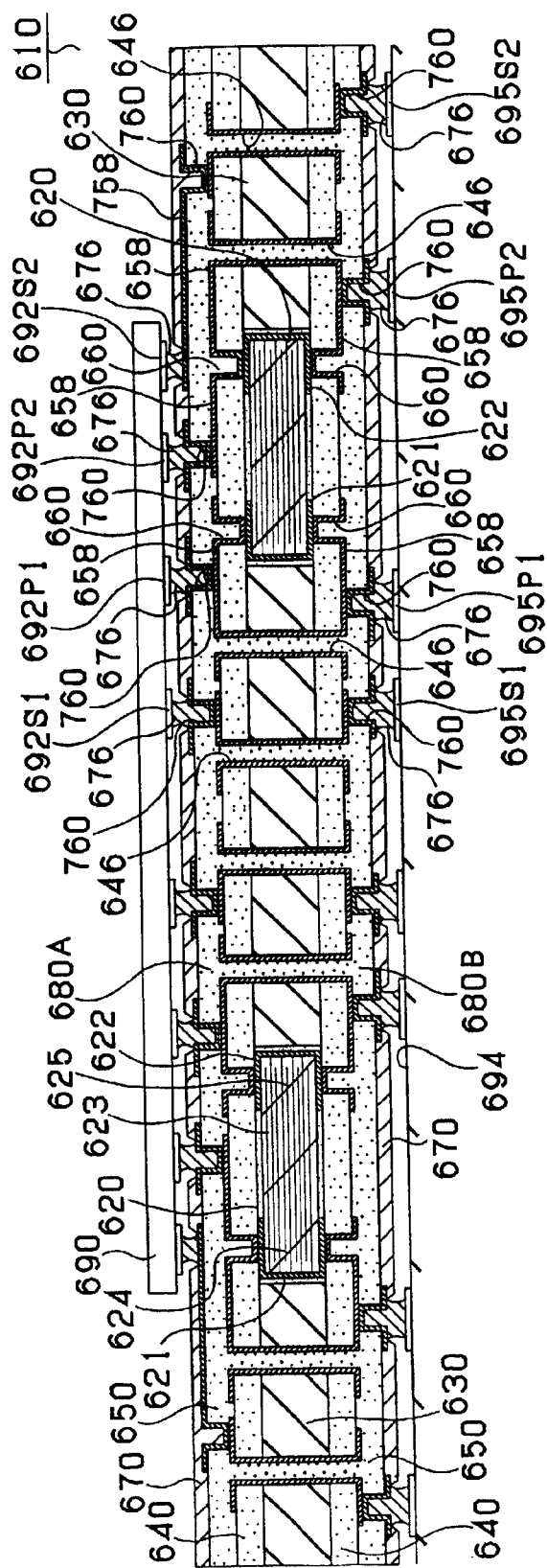
FIG. 52 is a diagram showing a cross section of the printed circuit board according to a fourth embodiment.

The structure of a printed circuit board according to a fourth embodiment of the present invention will be described with reference to FIGS. 51 and 52. FIG. 51 is a diagram showing a cross section of a printed circuit board 610. FIG. 52 is a diagram showing the state where an IC chip 690 is mounted on the printed circuit board 610 shown in FIG. 51, and the printed circuit board 610 is attached to a daughter board 694.

As shown in FIG. 51, the printed circuit board 610 incorporates chip capacitors 620, a core substrate 630 for accommodating chip capacitors 620, and an interlayer resin insulating layer 650 constituting the buildup layers 680A, 680B. The core substrate 630 is constituted by an accommodating layer 630a for accommodating the capacitors 620, and a connection layer 640. Via holes 660 and a conductor circuit 658 are formed in the connection layer 640. Via holes 760 and a conductor circuit 758 are formed in the interlayer resin insulating layer 650. In this embodiment, the buildup layer is constitute by a single interlayer resin insulating layer 650. As an alternative to this, the buildup layer may be constituted by a plurality of interlayer resin insulating layers.

As shown in FIG. 45, the chip capacitor 620 is constituted by a first electrode 621, a second electrode 622, and a dielectric body 623 interposed between the first and second electrodes 621, 622. The dielectric body 623 includes a plurality of first conductive film 624 connected to the first electrode 621 and a plurality of second conductive film 625 connected to the second electrode 622 in an opposed relation to each other.

As shown in FIG. 52, the via holes 760 in the upper buildup layer 680A are formed with bumps 676 to be respectively connected to pads 692S1, 692S2, 692P1, 692P2 of the IC chip 690. On the other hand, the via holes 760 In the lower buildup layer 680B are formed with bumps 676 to be respectively connected to pads 695S1, 695S2, 695P1, 695P2. Through holes 646 are formed in the core substrate 630.

The pad 692S2 for signal of the IC chip 690 Is connected to the pad 695S2 for signal of the daughter board 694 through the bump 676-the conductor circuit 758-the via hole 760-the through hole 646-and via hole 760-the bump 676. On the other hand, the pad 692S1 for signal of the IC chip 690 is connected to the pad 695S1 for signal of the daughter board 694 through the bump 676-the via hole 760-the through hole 646-via hole 760-bump 676.

The pad 692P1 for power supply of the IC chip 690 is connected to the first electrode 621 of the chip capacitor 620 through the bump 676-via hole 760-the conductor circuit 658-the via hole 660. On the other hand, the pad 695P1 for power supply of the daughter board 694 is connected to the first electrode 621 of the chip capacitor 620 through the bump 676-the via hole 760 the conductor circuit 658 the via hole 660.

The pad 692P2 for power supply of the IC chip 690 is connected to the second electrode 622 of the chip capacitor 620 through the bump 676-the via hole 760-the conductor circuit 658-the via hole 660. On the other hand, the pad 695P2 for power supply of the daughter board 694 is connected to the second electrode 622 of the chip capacitor 620 through the bump 676-the via hole 760-the conductor circuit 658-the via hole 660.

In the printed circuit board 610 of the fourth embodiment, the chip capacitors 620 are placed immediately below the IC chip 690. The distance from the IC chip to each capacitor is shortened, and therefore, electric power can be instantaneously supplied to the IC chip. That is, the loop length which determines the loop inductance can be shortened.

In addition, the through hole 646 is formed between the chip capacitors 620, and no signal line passes through the chip capacitors 620. In this structure, there is no problem that the impedance becomes discontinuous by the high dielectric body to generate a reflection, and that the transmission is delayed by passing through the high dielectric body.

The external substrate (i.e. daughter board) 694 to be connected to the back surface of the printed circuit board is connected to the first electrode 621 and the second electrode 622 of the capacitor 620 through the via holes 660 formed in the connection layer 640 on the side of IC chip and the via holes 660 formed in the connection layer 640 on the side of daughter board. That is, since the terminals 621, 622 are directly connected to the IC chips 690, and the daughter board 694, the wire length therebetween can be shortened.

In the fourth embodiment, an adhesive 636 is interposed between the side surface of the through opening 637 of the core substrate 630 and the chip capacitor 620. The thermal expansion coefficient of the adhesive 636 is set to the value lower than those of the core substrate 630 and the connection layer 640, that is, are set to the value close to that of the chip capacitor 620 made of ceramics. In this manner, even if internal stress is generated between the core substrate 630 and the connection layer 640, and the chip capacitor 620 caused by the difference in the thermal expansion coefficients therebetween, cracks and peelings do not easily occur in the core substrate and the connection layer 640. As a result, high reliability can be attained. In addition, the generation of migration can be prevented.

Figure 48:
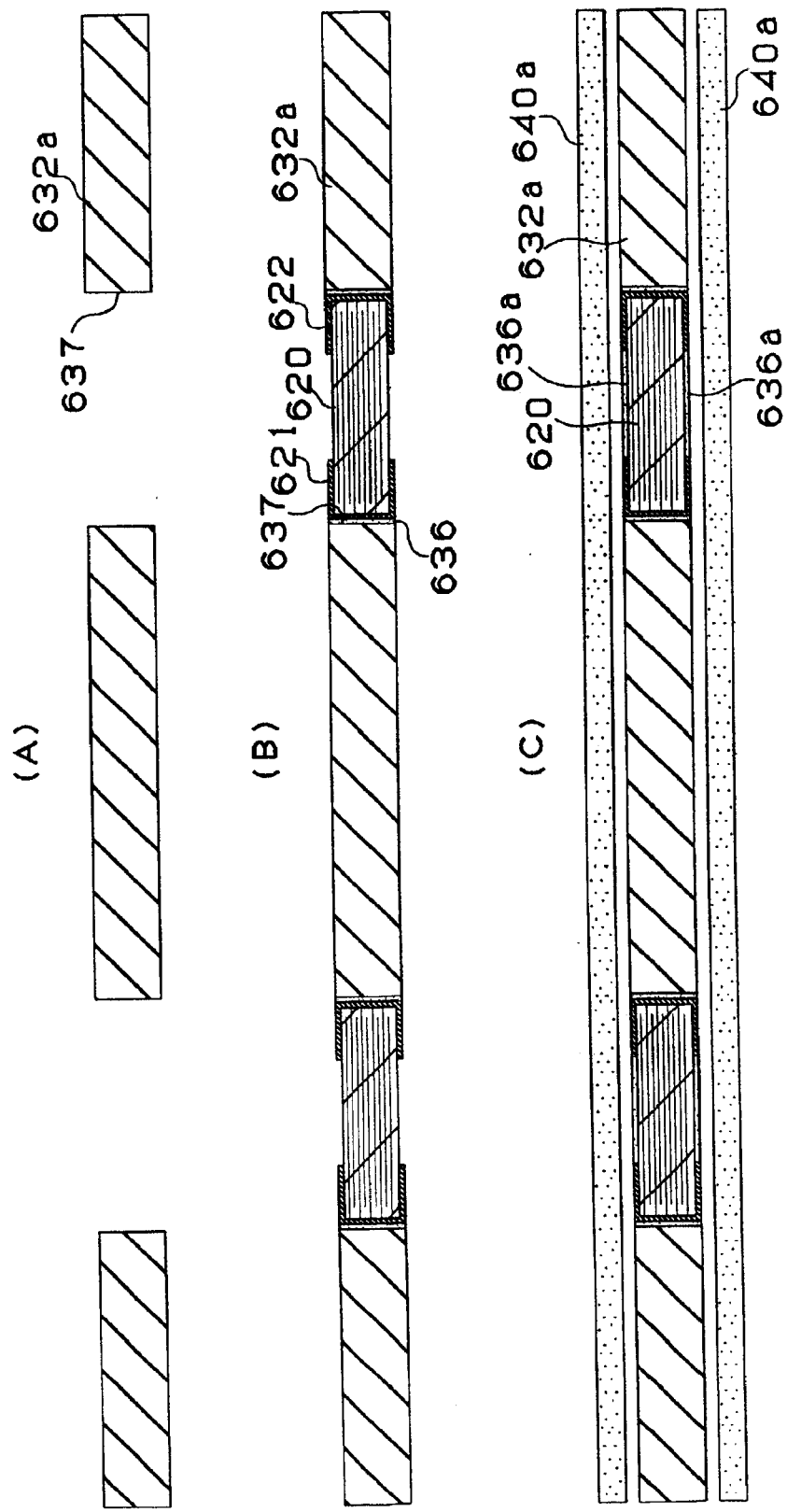
FIG. 48 is a diagram showing a process for manufacturing a printed circuit board according to a fourth embodiment of the present invention.
Figure 49:
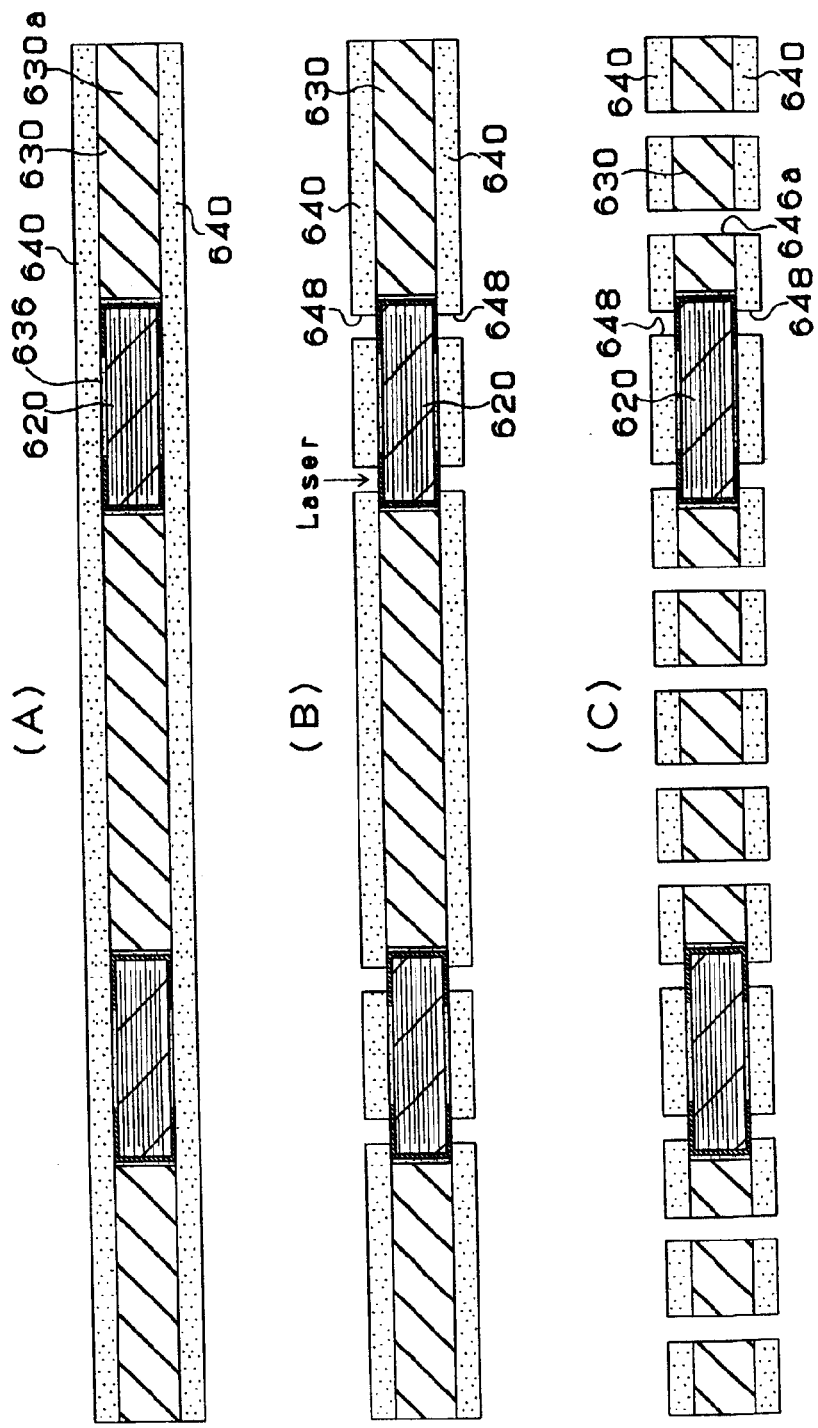
FIG. 49 is a diagram showing a process for manufacturing a printed circuit board according to a fourth embodiment.

Next, the method for manufacturing the printed circuit board described above referring to FIG. 51 will be described with reference to FIGS. 48 to 49.

(1) Prepregs each having a core material impregnated with an epoxy resin are laminated on top of each other to form a laminated plate (i.e. an accommodation layer) 632a, and penetrating openings 637 for accommodating chip capacitors are formed in the laminated plate 632a (FIG. 48(A)). The prepreg 435 may be those generally used in printed circuit board such as prepreg impregnated with, instead of the epoxy resin, BT, phenolic resin, or reinforcement material such as glass cloth. It is also possible to use a resin substrate having no core material such as glass cloth.

It is impossible, however, to use substrates made of ceramic and AlN as the core substrate. These substrates are poor in outer shape processing characteristics, and cannot accommodate capacitors in some cases. In addition, a space is created inside the substrate even if it is filled with a resin.

(2) The chip capacitors 620 are accommodated in the penetrating openings 637 of the accommodation layer 632a (FIG. 48(B)). In this case, it is desirable to peel off the coating 626 from the surface of the first and second electrodes 621, 622 of the chip capacitors 620 in order to increase the connection with the via holes 660 to be formed on the upper layer. It is preferable to interpose an adhesive 636 between the through openings 637 and the chip capacitors 620. As the adhesive 636, it is desirable to use an adhesive having a thermal expansion coefficient smaller than those of the core substrate and connection layer.

(3) A resin film 640a, the accommodation layer 632a accommodating the chip capacitors 620, and another resin film 640a are laminated on top of one another (FIG. 48(C)). The resin film 640a may be made of, as is the case of the first embodiment, thermosetting resin such as epoxy, BT, polyimide, and olefin, or mixtures of thermosetting resins and thermoplastic resins. In this embodiment, it is preferable to use a film having no core material so that the penetrating openings can be easily formed. In this embodiment, a resin film 640a having no metal layer is laminated. As an alternative to this, a resin film (RCC) having a metal layer on its one side maybe used. That is, it is possible to use a both-sided plate, a one-sided plate, a resin plate having no metal film, and a resin film. It is preferable that a resin filler 636a is charged in the upper and lower surfaces of the chip capacitors 620 to increase the air tightness. The resin and interlayer resin insulating layer used in this invention have melting points of 300° C. or lower. Therefore, when heat higher than 350° C. is applied, the resin and interlayer resin insulating layer may be dissolved, softened, or carbonized.

(4) The accommodation layer 632a and the resin films 640a laminated on top of one another are pressed from both sides to flatten the surface. Then, heating and curing is performed to form a core substrate 630 constituted by an accommodation layer 630a accommodating the chip capacitors 620 and a connection layer 640 (FIG. 49(A)). In this embodiment, the accommodation layer 630a which accommodates the capacitors 620 and the connection layer 640 are bonded to each other by application of pressure from both sides to form a core substrate 630. As a result, the core substrate 630 has a flat surface. The interlayer resin insulating layer 650 and the conductor circuit 758 can be laminated in a later step in such a manner that high reliability is attained.

(5) Non-penetrating openings 648 to be via holes are formed in the upper connection layer 640 by $CO_2$ laser, YAG laser, excimer laser, or UV laser (FIG. 49(B)). As the case may be, an area mask on which penetrating openings are formed at positions-corresponding to the positions of the non-penetrating openings is mounted, and an area processing is conducted by a laser. In the case where it is desired to form via holes having different sizes and diameter from each other, the lasers may be used in combination to form the via holes.

(6) If necessary, smear in the via holes may be conducted by a gas plasma treatment using a gaseous matter such as oxygen and nitrogen, or dry treatment such as corona treatment, or by immersion into an oxidizer such as permagnetic acid. Subsequently, penetrating openings 646a each having a diameter of 50 to 500 μm for through holes are penetrated in the core substrate 630 constituted by the connection layer 640, the accommodation layer 630a, and the connection layer 640 by a drill or a laser (FIG. 49(C)).

Figure 50:
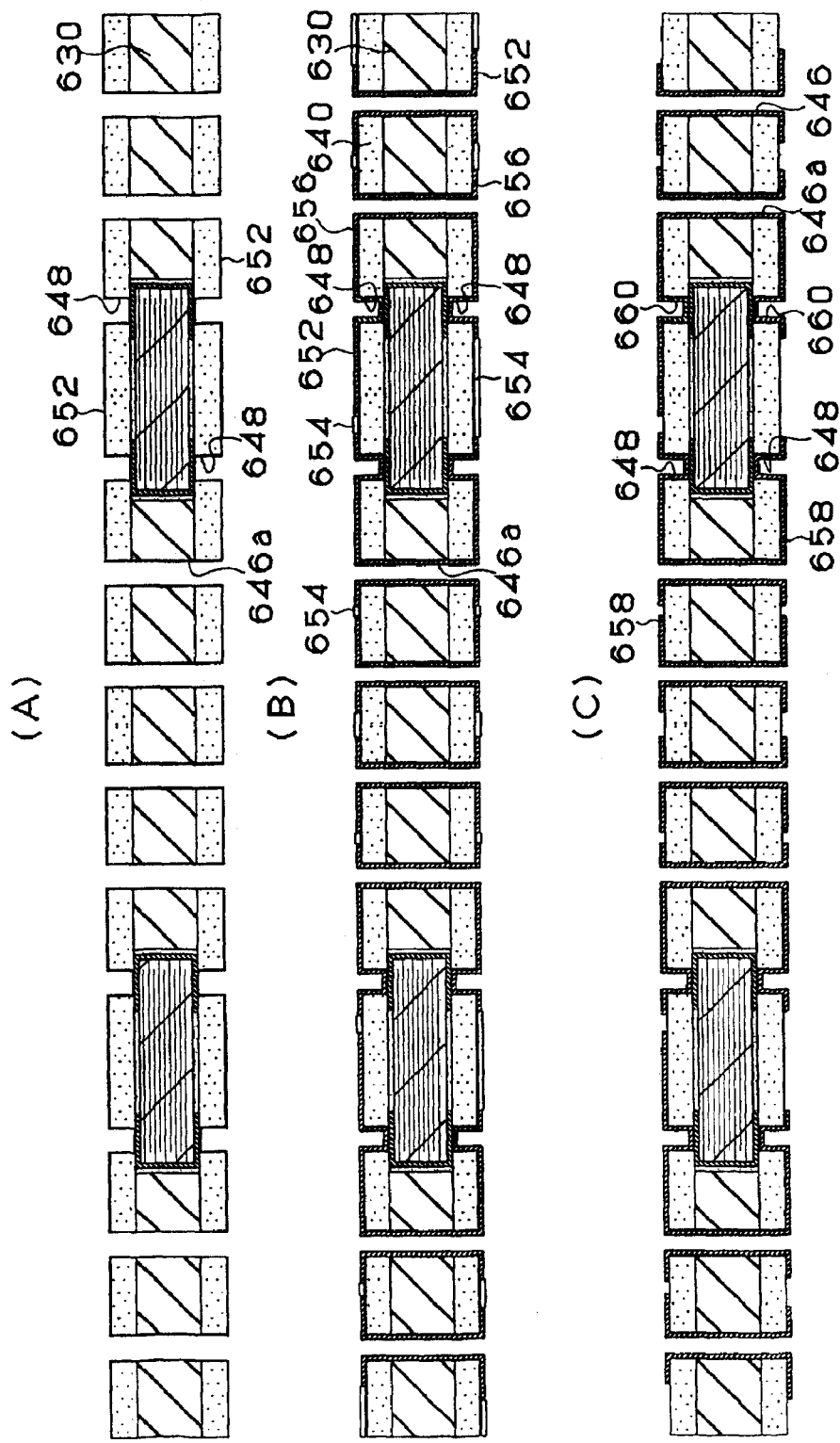
FIG. 50 is a diagram showing a process for manufacturing a printed circuit board according to a fourth embodiment.

(7) A metal film is formed on the surface layer of the connection layer 640, the non-penetrating openings 648 for via holes, and the penetrating openings 646a for through holes of the core substrate 630. For this purpose, a palladium catalyst is provided on the surface of the connection layer 640, and then, the core substrate 630 is immersed in an electroless plating solution to uniformly precipitate an electroless copper plated film 652 (FIG. 50(A)). In this embodiment, an electroless plating is employed. Alternatively, a metal film of copper, nickel and the like may be formed by sputtering. The sputtering is disadvantageous from the viewpoint of cost, but is advantageous in that the adhesion with the resin film can be improved. As the case may be an electroless plated film may be formed after the metal layer is formed by sputtering. Depending on the kind of resin, there are cases where the catalyst cannot be stably provided thereto. In this case, the electroless plated film is effective in stably providing the catalyst to such a resin. In addition, the electrolytic plating is more stably precipitated in the case of forming the electroless plated film. The metal film 652 is preferably formed into the thickness of 0.1 to 3 mm.

(8) A photosensitive dry film is attached to the surface of the metal film 652, and a mask is placed thereon. Exposure to light and development are performed to form a resist 654 having a predetermined pattern. The core substrate 630 is immersed into an electrolytic plating solution to allow a current to flow in the core substrate 630 through the electroless plated film 652 to precipitate an electrolytic copper plated film 656 (FIG. 50(B)). The resist 654 is peeled by 5% KOH, and then, the electroless plated film 652 below the resist 654 is etched and removed by a mixed solution of sulfuric acid and hydrogen peroxide. As a result, via holes 660 and a conductor circuit 658 are formed in the connection layer 640, and through holes 646 are formed in the penetrating openings 646*a* of the core substrate 630 (FIG. 50(C)). The subsequent processes are the same as the steps (10) to (15) of the second embodiment, and therefore, their description will be omitted.

The processes of mounting the IC chip on the printed circuit board, and attaching the printed circuit board to the daughter board are the same as those of the first embodiment, and their description will be omitted.

First Modification of Fourth Embodiment

Figure 53:
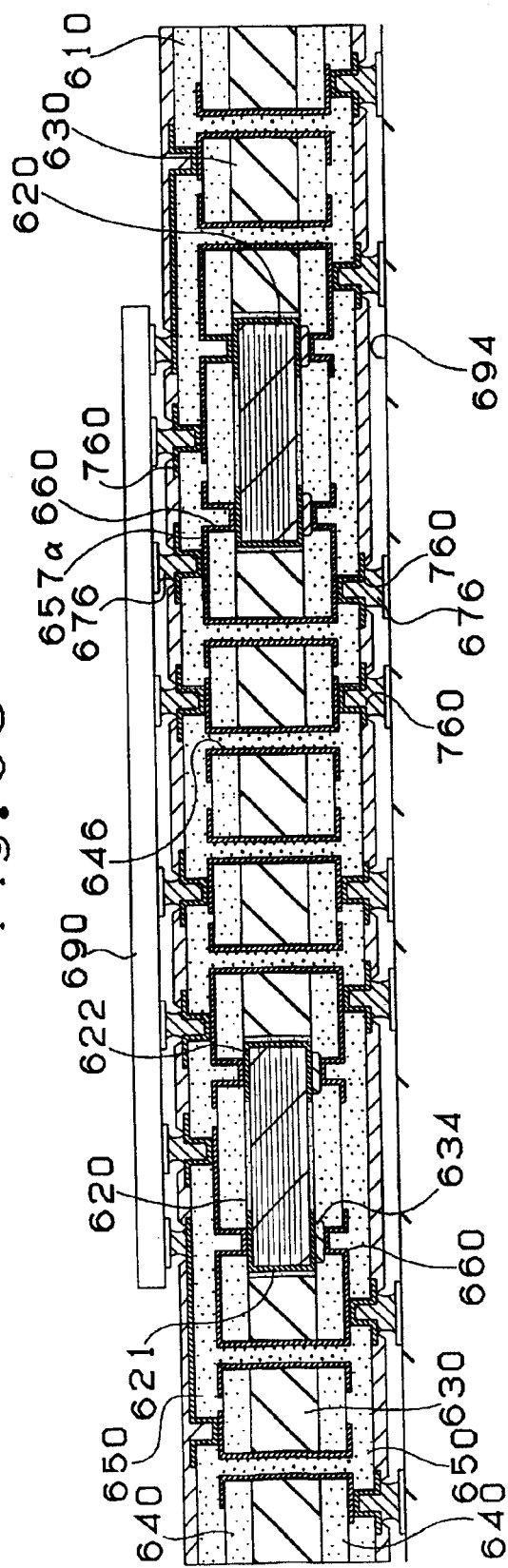
FIG. 53 is a diagram showing a cross section of the printed circuit board according to a first modification of the fourth embodiment.

FIG. 53 is a diagram showing a printed circuit board according to a first modification of the fourth embodiment. It is also possible, as is the case of the first modification shown in FIG. 53, the first electrode 621 and the second electrode 622 may be connected to the via holes 660 via the adhesive material 634. The conductive adhesive material 634 maybe a material having both conductivity and adhesiveness such as a solder (Sn/Pb, Sn/Sb, Sn/Ag), conductive pastes, and resins impregnated with metal particles.

Second Modification of Fourth Embodiment

Figure 54:
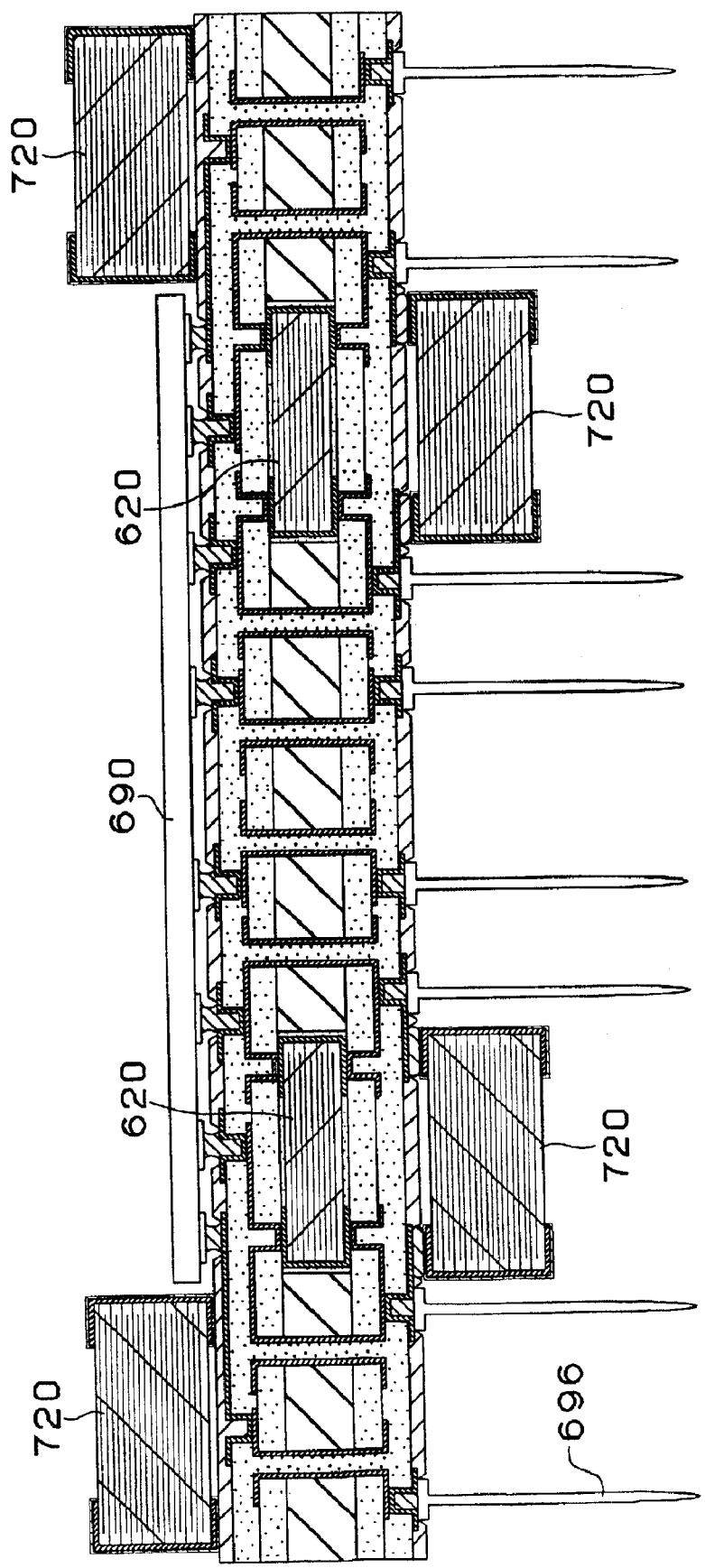
FIG. 54 is a diagram showing a cross section of the printed circuit board according to a second modification of the fourth embodiment.

A printed circuit board according to a second modification of the fourth embodiment will be described with reference to FIG. 54. The printed circuit board according to a second modification has a similar structure as of the fourth embodiment, except for the following points. That is, in the printed circuit board of the second modification, conductive pints 696 are provided, and a connection with the daughter board is established through the conductive pins 696.

Whereas in the fourth embodiment described above, chip capacitors 220 are accommodated In the core substrate 630 alone, in the first modification, chip capacitors 720 each having a large capacity are mounted on the front surface and back surface of the core substrate 630, on top of the chip capacitors 620 accommodated in the core substrate 630.

The IC chip conducts a complicated calculation, and in the calculation processing, it instantaneously consumes a large electric power. In order to provide a large electric power to the IC chip, in this modification, a chip capacitor 620 for power supply and a chip capacitor 720 are provided to the printed circuit board. The effect of providing the chip capacitors 620 and 720 is the same as that attained in the fourth modification of the first embodiment, and therefore, its description will be omitted.

Third Modification of Fourth Embodiment

Figure 55:
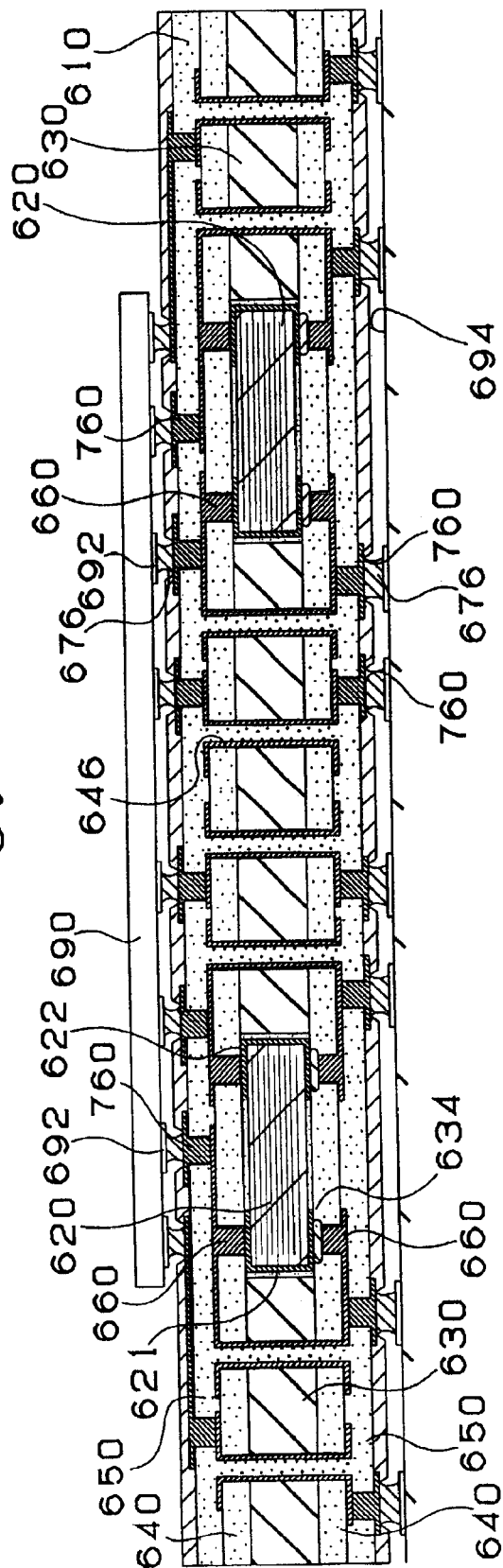
FIG. 55 is a diagram showing a cross section of the printed circuit board according to a third modification of the fourth embodiment.

A printed circuit board according to a third modification of the present invention will be described with reference to FIG. 55. A printed circuit board 610 to the third modification has the similar structure as of the fourth embodiment described above, except for the following points. That is, in the printed circuit board 610 according to the third modification, filled vias 660 are formed on a first electrode 621 and a second electrode 622 of chip capacitors 620. The chip capacitors 620 are connected to the bumps 692 of the IC chips 690 through the filled vias 760.

Fourth Modification of Fourth Embodiment

Figure 56:
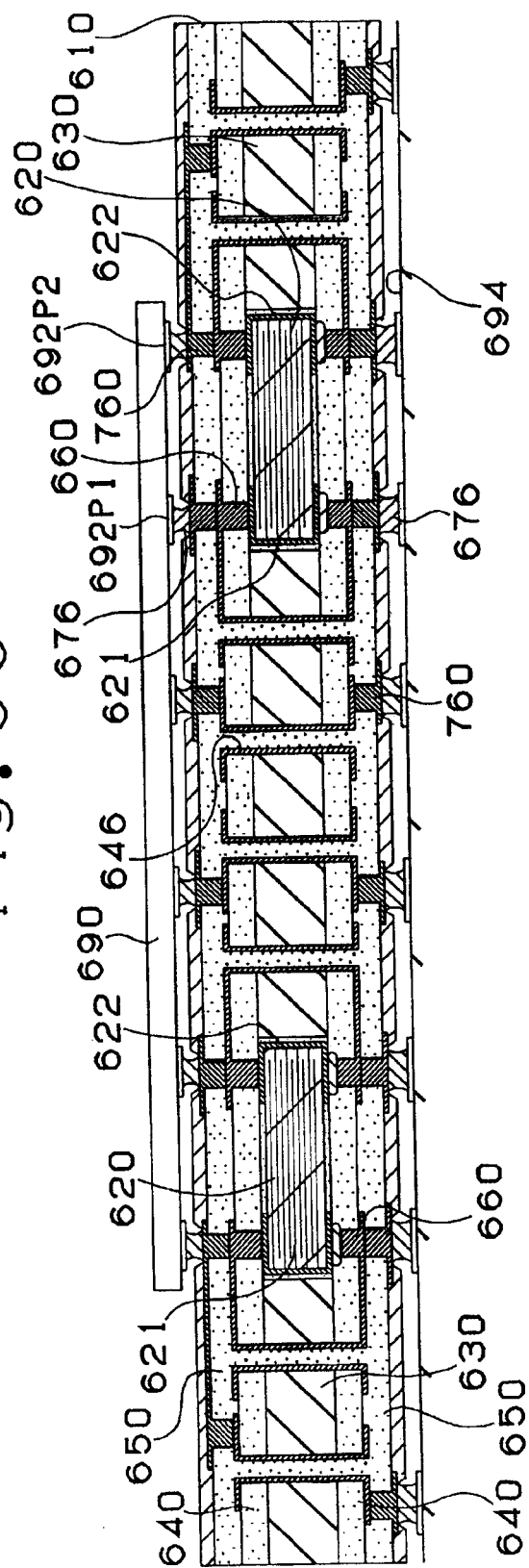
FIG. 56 is a diagram showing a cross section of the printed circuit board according to a fourth modification of the fourth embodiment.

A printed circuit board according to a fourth modification of the fourth embodiment will be described with reference to FIG. 56. A printed circuit board 610 according to the fourth modification has the similar structure as of the fourth embodiment described above, except for the following points. That is, in the printed circuit board according to the fourth modification, filled vias 660 are formed on a first electrode 621 and a second electrode 622 of chip capacitors 620. The chip capacitors 620 are connected to the bumps 692P1, 692P2 of the IC chips 690 through the filled vias 760 formed immediately above the filled vias 660. With this arrangement of the fourth modification, the distance between the IC chip and each chip capacitor can be shortened to the minimum value.

Fifth Modification of Fourth Embodiment

Figure 57:
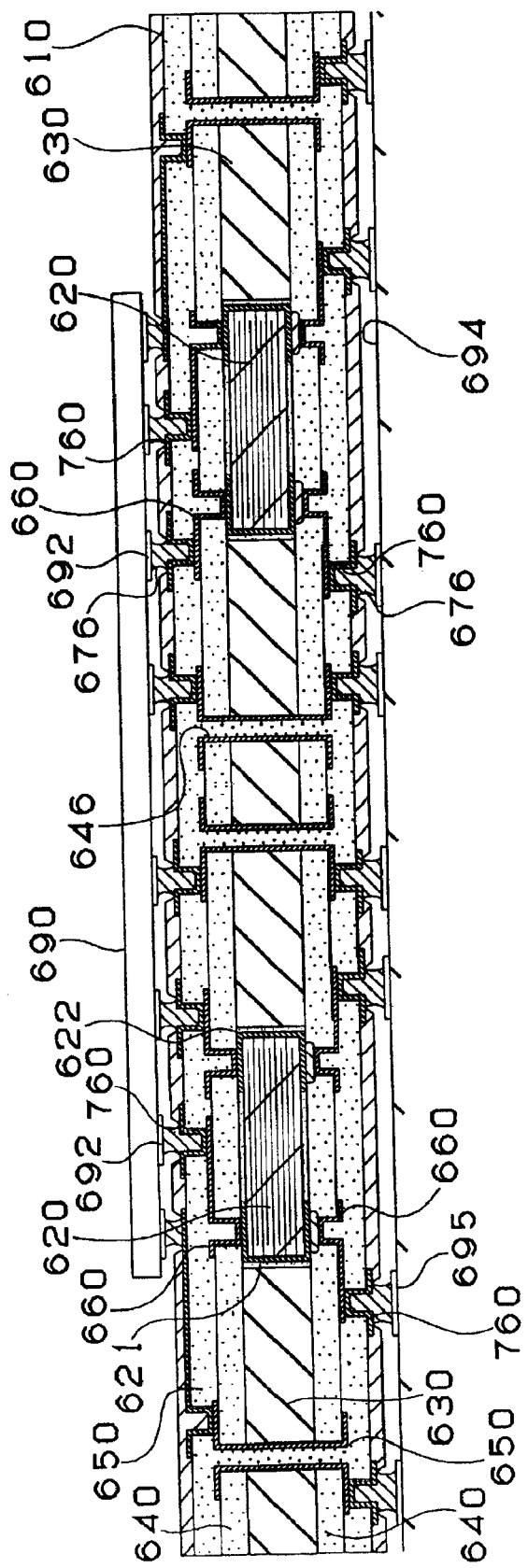
FIG. 57 is a diagram showing a cross section of the printed circuit board according to a fifth modification of the fourth embodiment.

A printed circuit board according to a fifth modification of the present invention will be described with reference to FIG. 57. A printed circuit board 610 according to the fifth modification has the similar structure as of the fourth embodiment described above, except for the following points. That is, in the printed circuit board according to the fifth modification, pads on the side of IC chip 690 and the pads 695 on the side of daughter board 694 are connected through a first electrode 621, and a first electrode 622 of the chip capacitors 620. In other words, through holes for power supply and through holes for ground of the IC chip and daughter board are omitted. With this arrangement of the fifth modification, the wiring density can be increased as compared with the case of fourth embodiment.

Sixth Modification of Fourth Embodiment

Figure 58:
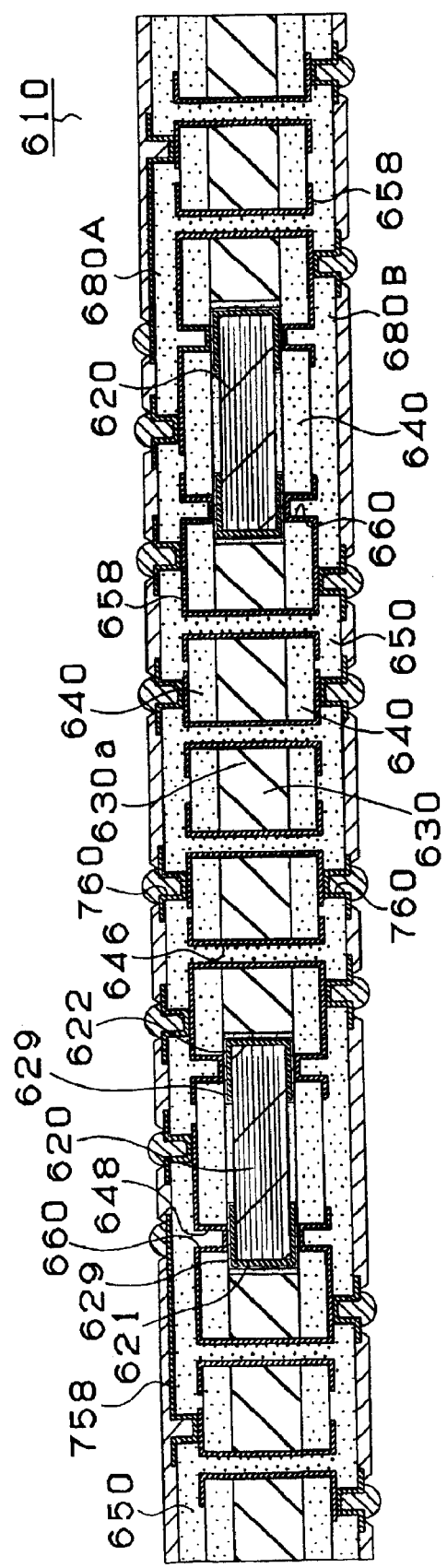
FIG. 58 is a diagram showing a cross section of the printed circuit board according to a sixth modification of the fourth embodiment.
Figure 59:
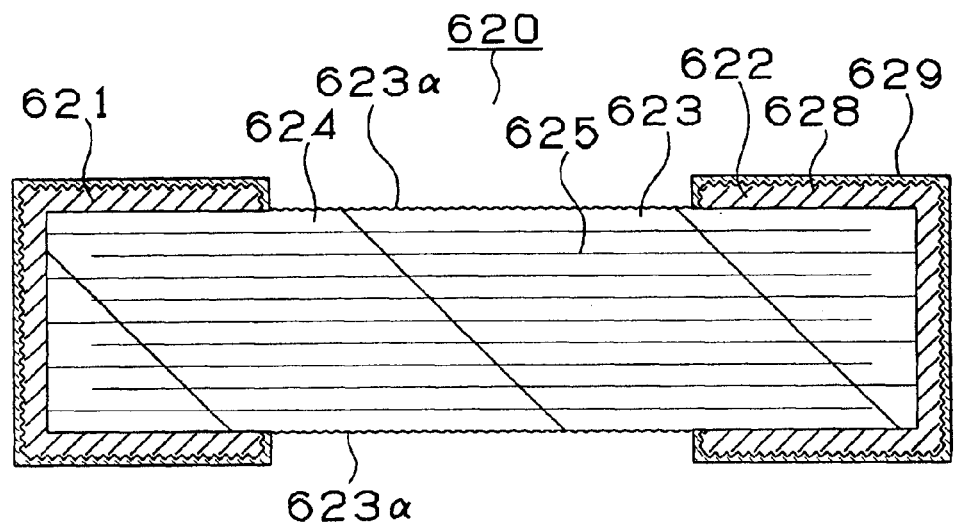
FIG. 59 is a diagram showing a cross section of the chip capacitor according to the sixth modification.
Figure 60:
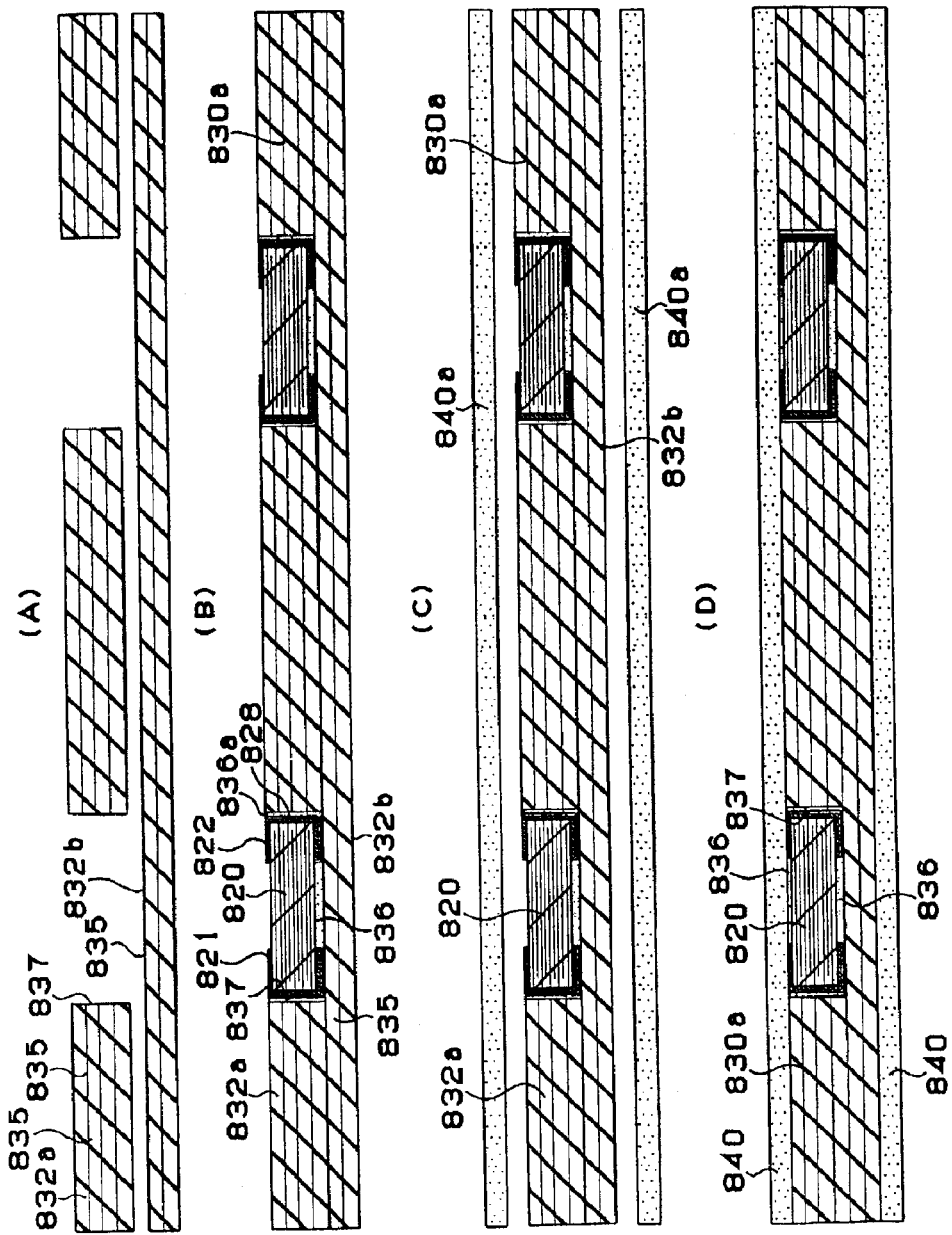
FIG. 60 is a diagrams showing a process for manufacturing a printed circuit board according to a fifth embodiment of the present invention.
Figure 61:
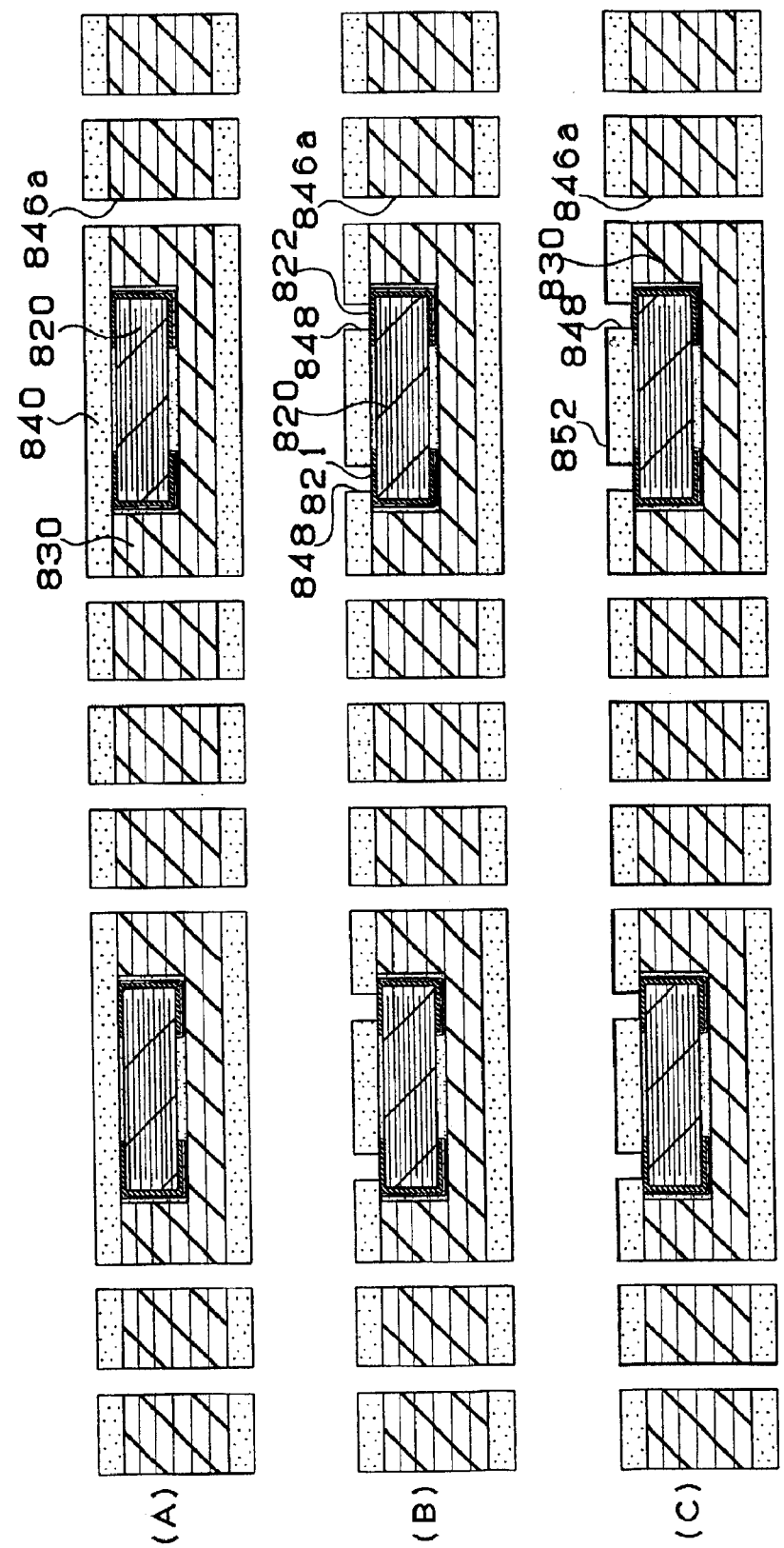
FIG. 61 is a diagram showing a process for manufacturing a printed circuit board according to a fifth embodiment.
Figure 62:
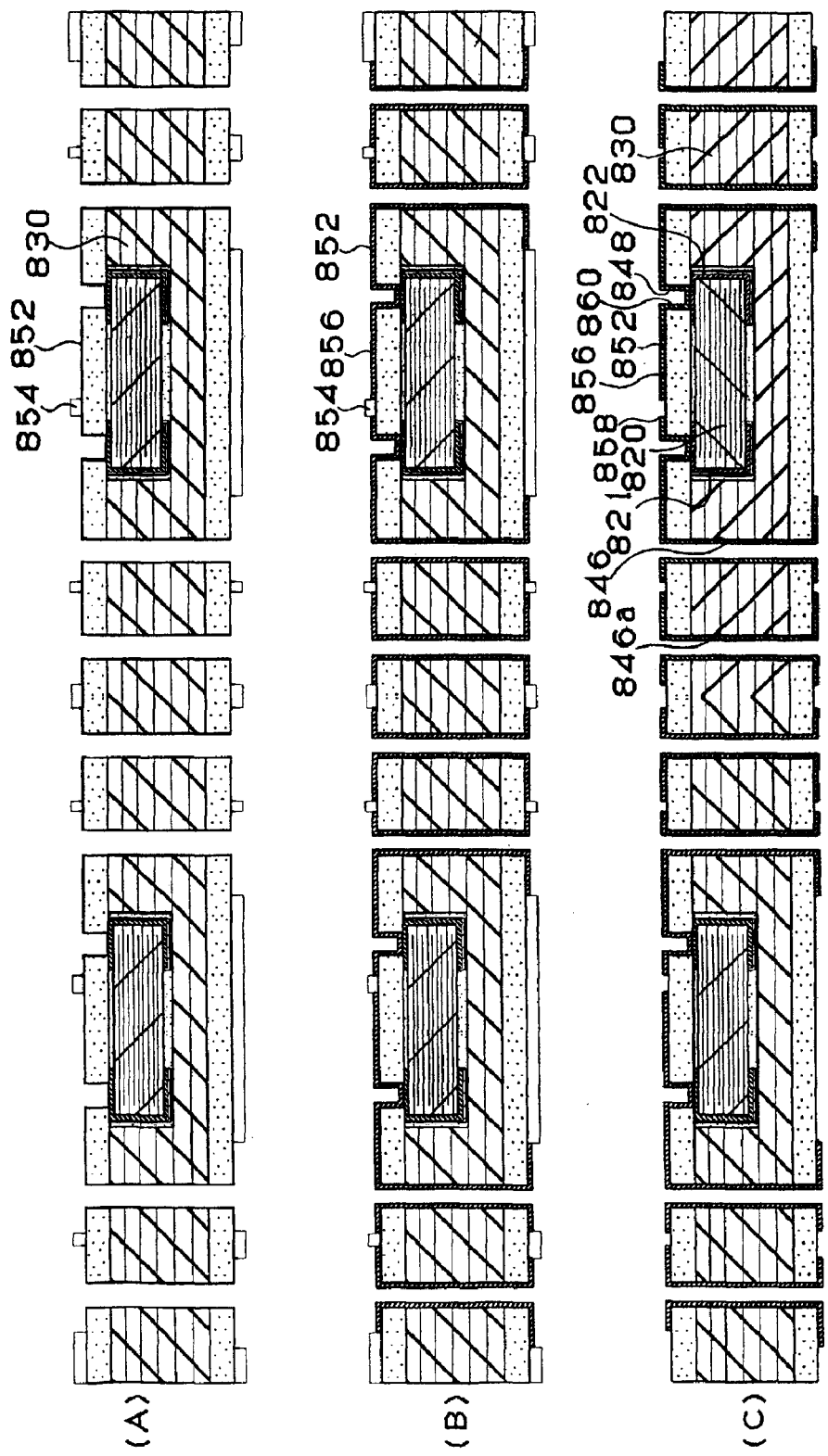
FIG. 62 is a diagram showing a process for manufacturing a printed circuit board according to a fifth embodiment.

A printed circuit board according to a sixth modification of the fourth embodiment will be described with reference to FIGS. 58 and 59.

A printed circuit board according to the sixth modification has the similar structure as of the fourth embodiment described above referring to FIG. 51, except for the following points. That is, in the printed circuit board according to the sixth modification, as shown in FIG. 59, in the chip capacitor 620, the coating layer 626 (see FIG. 45) is completely peeled from the first and second electrodes 621, 622, and then, the first and second electrodes are coated with a copper plated film 629. An electric connection for the first and second electrodes 621, 622 coated with the copper plated film 629 is established through via holes 660 constituted by copper plating. The electrodes 621, 622 of the chip capacitor are metallized and has pits and projections on their surfaces. If the metal layer is left uncoated and exposed to the outside, the resin may be left in the pits and projections in the step of forming non-penetrating openings 648 in the connection layer 640. The resin left in the pits and projections may cause a disconnection between the first and second electrodes 621, 622 and the via holes 660. Contrary to this, in the sixth modification, the surfaces of the first and second electrodes 621, 622 coated with the copper plated film 629 are flat and smooth. When the non-penetrating By, openings 648 are formed in the connection layer 640 formed on the electrodes, no resin is left on the surfaces of the electrodes 621, 622. When the via holes 660 are formed, the connection between the via holes 660 and the electrodes 621, 622 has increased reliability.

Since the via holes 660 are made by plating into the electrodes 621. 622 formed with the copper plated film 629, the electrodes 621, 622 are firmly connected to the via holes 660. No disconnection occurs between the electrodes 621. 622 and via holes 660 even when a heat cycle test is conducted.

The copper plated film 629 is formed after a nickel/tin layer (i.e. a coating layer) provided onto the surface of the metal layer 628 constituting the first and first electrodes in the step of manufacturing the chip capacitor is peeled off at the time of mounting the chip capacitor onto the printed circuit board. Alternatively, the copper plated film 629 maybe directly provided onto the surface of the metal layer 629 in the step of manufacturing the chip capacitor 620. In the sixth modification, as is the case of the fourth embodiment, openings which extend to the copper plated film 629 of the electrodes are formed by a laser, and then a desmear process is performed to form via holes by copper plating. Therefore, even if an oxide film is formed on the surface of the copper plated film 629, the oxide film can be removed in the laser or desmear process. In this manner, the first and second electrodes 621, 622 can be properly connected to the via holes 660.

As is the case of the first embodiment, as shown in FIG. 17(B), the first electrodes 21, 22 of the capacitor 20 may be partially uncoated with the coating 28. When partially uncoated and exposed to the outside, the connection of the first and second electrodes 21, 22 to the via holes 660 can be enhanced.

On the surface of the dielectric body 623 made of ceramic of the chip capacitor 620, a rough surface 623α is formed. The rough surface 623α contributes to an increased adhesion between the chip capacitor 620 made of ceramic and the connection layer 640 made of resin, thereby avoiding the connection layer 640 from peeling from the interface with the chip capacitor 620 even when a heat cycle test is conducted. The rough surface 623 α can be formed by polishing the surface of the chip capacitor 620 after the sintering step, or by roughening the surface of the chip capacitor 620 before the sintering step. In the sixth modification, the surface of the chip capacitor is roughened to increase its adhesion with the resin. Alternatively, the surface of the chip capacitor may be subjected to silane coupling process.

Seventh Modification of Fourth Embodiment

A structure of a printed circuit board according to a seventh modification of the fourth embodiment will be described referring to FIG. 18.

The printed circuit board according to the seventh modification has the structure similar to that of the first embodiment, except for the structure of the chip capacitors 20 accommodated in the core substrate 30. FIG. 18 a plan view showing the chip capacitors. FIG. 18(A) is a diagram showing a chip capacitor before being cut from which a plurality of pieces are to be obtained by cutting. In FIG. 18(A), a chain line shows the cutting line. In the printed circuit board described in the first embodiment, as shown in the plan view of FIG. 18(B), the first electrodes 21 and the second electrodes 22 are provide along the side ends of the chip capacitor. FIG. 18(C) is a diagram showing a chip capacitor before being cut from which a plurality of pieces are to be obtained by cutting according to the seventh modification. In FIG. 18(C), a chain line shows the cutting line. In the printed circuit board described in the seventh modification, as shown in the plan view of FIG. 18(D), the first electrodes 21 and the second electrodes 22 are provide inside the side ends of the chip capacitor.

In the printed circuit board of the seventh modification, a chip capacitor 20 in which the electrodes are formed inside the side ends thereof is used. Therefore, a chip capacitor having a large capacity can be used as the chip capacitor 20.

A printed circuit board according to a first alternative example of the seventh modification will be described referring to FIG. 19.

FIG. 19 is a diagram showing a plan view of the chip capacitor 20 to be accommodated in the core substrate of the printed circuit board according to the first alternative example. In the above-described first embodiment, a plurality of chip capacitors each having a small capacity are accommodated in the core substrate. Contrary to this, in the first alternative example, a large chip capacitor having a large capacity is accommodated in the core substrate. The chip capacitor 20 includes first electrodes 21, second electrodes 22, a dielectric body 23, a first conductive firm 24 connected to the first electrodes 21, a second conductive film 25 connected to the second electrodes 22, and electrodes 27 which are not connected to the first conductive film 24 and the second conductive film 25 and used for connecting the upper and lower surfaces of the chip capacitor. The chip capacitor is connected to the IC chip and the daughter board through the electrodes 27.

In the printed circuit board according to the first alternative example, the chip capacitor 20 having a large size is used. Therefore, a chip capacitor having a large capacity can be employed as the chip capacitor 20. In addition, the use of large-sized chip capacitor 20 prevents the warpage of the printed circuit board even if the printed circuit board is repeatedly subjected to heat cycle.

Next, a printed circuit board according to a second alternative example will be described referring to FIG. 20. FIG. 20(A) is a diagram showing a chip capacitor before being cut from which a plurality of pieces are to be obtained by cutting. In FIG. 20(A), a chain line shows the cutting line. FIG. 20 (B) is a diagram showing a plan view of the chip capacitor. In the second alternative example, as shown in FIG. 20(B), a plurality of chip capacitors from each of which a plurality of pieces are to be obtained by cutting (in FIG. 20(B), three pieces) are connected into one piece unit having a large size.

In the second alternative example, the chip capacitor 20 has a large size. Therefore, a chip capacitor having a large capacity can be employed as the chip capacitor 20. In addition, the use of large-sized chip capacitor 20 prevents the warpage of the printed circuit board even if the printed circuit board is repeatedly subjected to heat cycle.

In the above-described embodiment, the chip capacitors are incorporated in the printed circuit board. Instead of the chip capacitor, it is also possible to use a plate-like capacitor in which a conductive film is formed on a ceramic plate. Needless to say, the structure in which the copper plating is provided and the structure in which the surface of the chip capacitor is roughened as employed in the sixth modification may be applicable to the fourth embodiment, the first, second, third, fourth, fifth, and sixth modifications.

As to the printed circuit board according to the sixth modification of the fourth embodiment, the inductance of the chip capacitor 620 embedded in the core substrate, and the inductance of the chip capacitor mounted on the back surface of the printed circuit board (on the surface at the side of daughter board) are shown as follows.

In the case of a single capacitor:
   A capacitor of embedded type: 137 pH
   A capacitor of back surface mounted type: 287 pH
In the case of eight capacitors connected in parallel:
   Capacitors of embedded type: 60 pH
   Capacitors of back surface mounted type: 72 pH In both cases where a single capacitor is used and where a plurality of capacitors are connected in parallel to obtain an increased capacity, an inductance can be lowered by incorporating the chip capacitor.

Hereinafter, the results of reliability test will be described. In the test, the rate of change in the electrostatic capacity of a single chip capacitor in the printed circuit board of the sixth modification was measured.

Rate of change in electrostatic capacity (measured at a frequency of 100 Hz) (measured at a frequency of 1 kHz)

| | | |
|---|---|---|
| Steam 168 hours: | 0.3% | 0.4% |
| HAST 100 hours: | −0.9% | −0.9% |
| TS 1000 cycles: | 1.1% | 1.3% |

In the Steamtest, the chip capacitor was subjected to steam to be kept at a humidity of 100%. In the HAST test, the chip capacitor was left for 100 hours at a relative humidity of 100%, an applied voltage of 1.3V, and at a temperature of 121° C. In the TS test, the chip capacitor was lest for 30 minutes at 125° C. and 30 minutes at 55° C., and this test was repeated 1000 times.

In the above-described reliability test, it was realized that the printed circuit board incorporating the chip capacitor attains a reliability of the same level as the conventional printed capacitor on which a capacitor is mounted on its surface. As described above, in the TS test, even if an internal stress is generated due to the difference in the thermal expansion coefficients between the capacitor made of ceramic, and the core substrate and the resin interlayer insulating layer made of resin, no problems are created such as a disconnection between the terminals of the chip capacitors and the via holes, and peeling of the chip capacitors from the interlayer resin insulating layer, and creation of cracks in the interlayer resin insulating layer. In this manner, high reliability can be attained over a long period of time.

According to the structure of the fourth embodiment, there Is no problem of lowering the electric characteristics caused by inductance.

The connection to the capacitors can be established from their bottom surfaces. It can be said that this-structure contributes to a shortened loop inductance and an increased degree of freedom.

Since the resin is charged in the space between the core substrate and the capacitor, even if the stress caused by the capacitors is generated, the stress can be alleviated. In addition, no migration is created. As a result, neither peeling nor dissolution is caused between the electrodes of the capacitors and the connecting sections of the via holes. Due to these arrangements, the desired performance can be maintained in the reliability test. In the case where the capacitor is coated with copper, the generation of migration can be prevented.

Fifth Embodiment

Figure 63:
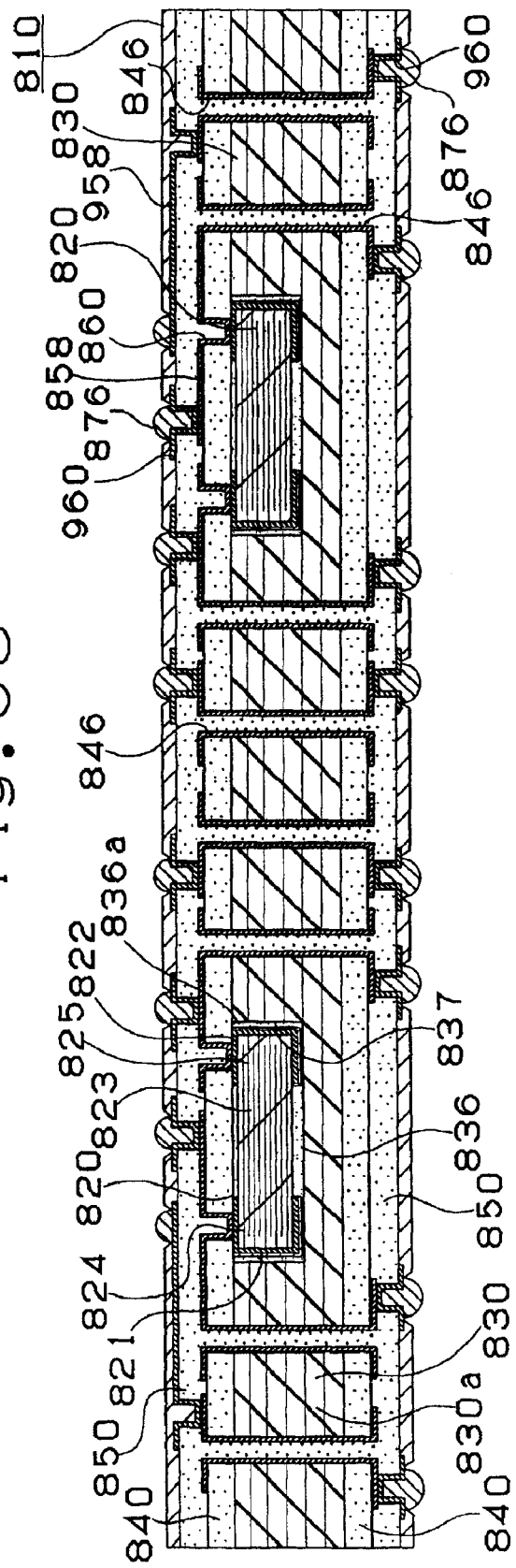
FIG. 63 is a diagram showing a cross section of the printed circuit board according to a fifth embodiment.
Figure 64:
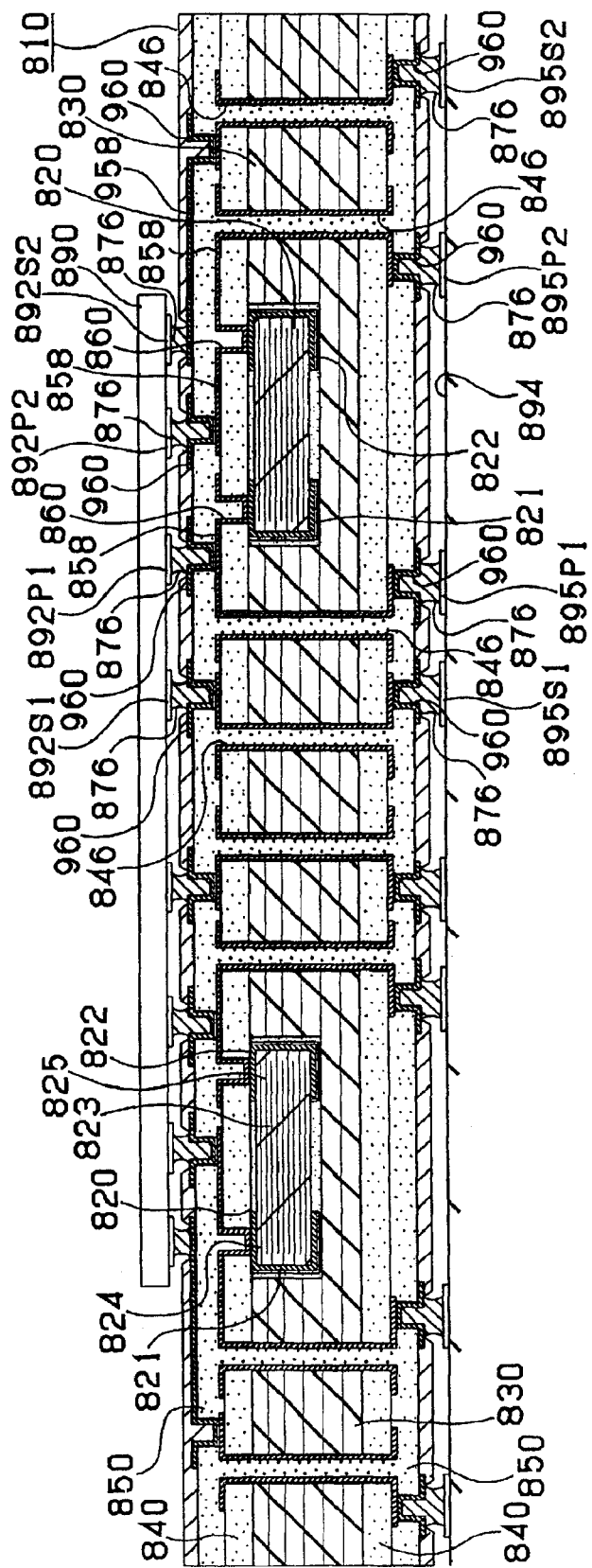
FIG. 64 is a diagram showing a cross section of the printed circuit board according to a fifth embodiment.

First, the structure of a printed circuit board according to a fifth embodiment of the present invention will be described with reference to FIGS. 63 and 64. FIG. 63 is a diagram showing a crosssection of a printed circuit board 810. FIG. 64 is a diagram showing the state where an IC chip 890 is mounted on the printed circuit board 810 shown in FIG. 63, and the printed circuit board 810 is attached to a daughter board 894.

As shown in FIG. 63, the printed circuit board 810 incorporates chip capacitors 820, a core substrate 830 for accommodating the chip capacitors 820, and an interlayer resin insulating layer 850 constituting the buildup layers 880A, 880B. The core substrate 830 is constituted by an accommodating layer 830a for accommodating the capacitor 820, and a connection layer 840. Via holes 860 and a conductor circuit 858 are formed in the connection layer 840. Via holes 960 and a conductor circuit 958 are formed in the interlayer resin insulating layer 850. In this embodiment, the buildup layer is constituted by a single interlayer resin insulating layer 850. As an alternative to this, the buildup layer may be constituted by a plurality of interlayer resin insulating layers.

Figure 66:
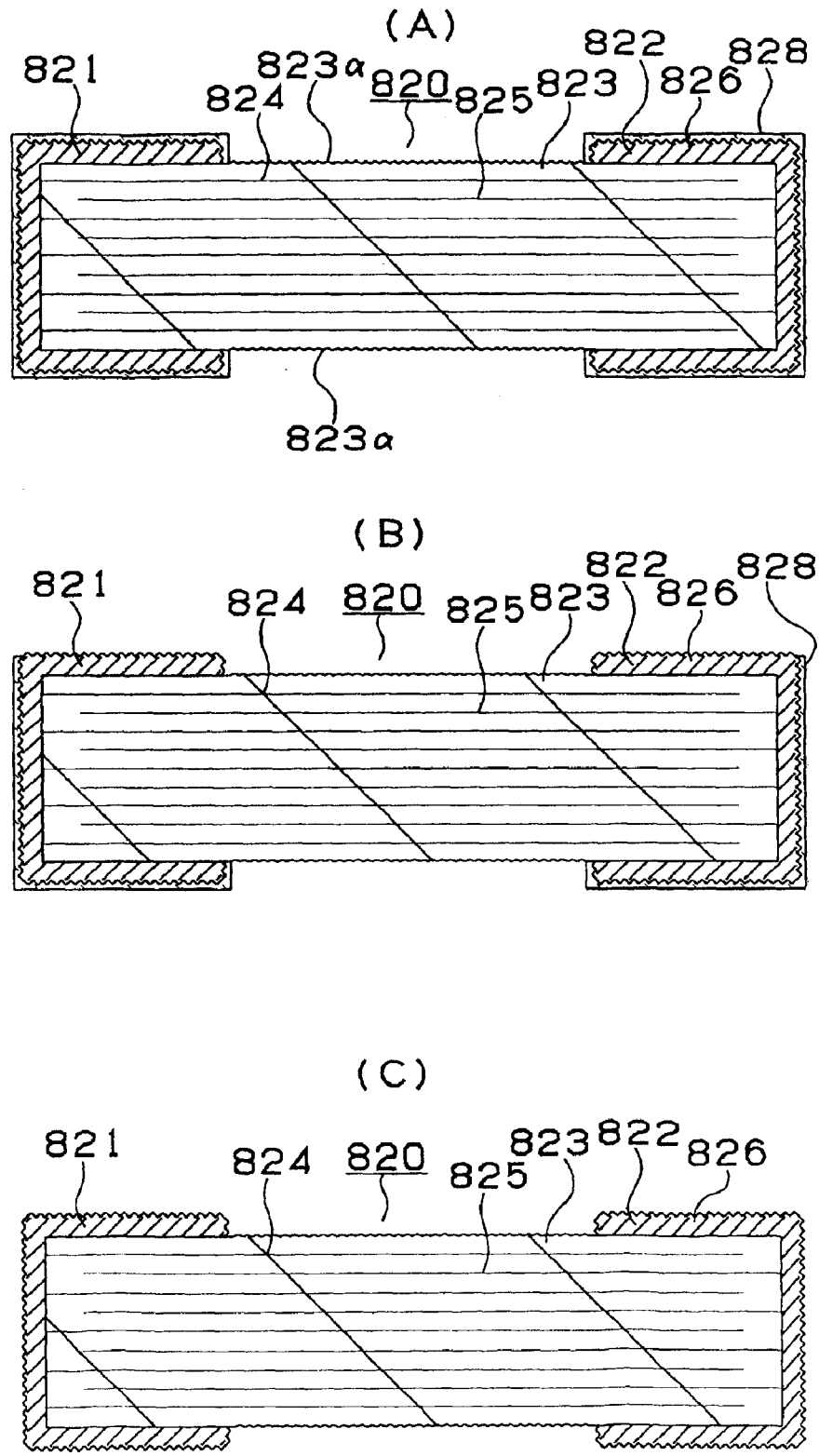
FIG. 66 is a diagram showing a cross section of the chip capacitor according to the first modification.

As shown in FIG. 66(A). the chip capacitor 820 is constituted by a first electrode 821, a second electrode 822, and a dielectric body 823 interposed between the first and second electrodes. The dielectric body 823 includes a plurality of first conductive films 824 connected to the first electrode 821 and a plurality of second conductive films 825 connected to the second electrode 822 in an opposed relation to each other. The first electrode 821 and the second electrode 822 are respectively coated with a metal layer 826 metallized with copper, and further coated with a coating layer 828 such as solder on the metal layer 826. In this embodiment, a connection for the first electrode 821 and the second electrode 822 is established by via holes 860 made of plating. In the printed circuit board according to the fifth embodiment, as shown in FIG. 66(B), the metal layer 826 is exposed from the coating layer 828 formed on the first and second electrodes 821, 822. With this arrangement, as shown in FIG. 63, the connection between the first and second electrodes 821, 822 and the via holes 860 is increased, and the connection resistance therebetween can be lowered.

On the surface of the dielectric body 823 made of ceramic of the chip capacitor 820, a rough surface 823α is formed. The rough surface 823α contributes to an increased adhesion between the chip capacitor 820 made of ceramic and the connection layer 840 made of resin, thereby avoiding the connection layer 840 from peeling from the interface with the chip capacitor 820 even when a heat cycle test is conducted. The rough surface 823 α can be formed by polishing the surface of the chip capacitor 820 after the sintering step, or by roughening the surface of the chip capacitor 20 before the sintering step.

As shown in FIG. 64, the via holes 960 in the upper buildup layer 880A are formed with bumps 876 to be respectively connected to pads 892S1, 892S2, 892P1, 892P2 of the IC chip 890. On the other hand, the via holes 960 in the lower buildup layer 880B are formed with bumps 876 to be respectively connected to pads 895S1, 895S2, 895P1, 895P2. Through holes 846 are formed in the core substrate 830.

The pad 892S2 for signal of the IC chip 890 is connected to the pad 895S2 for signal of the daughter board 894 through he bump 876-the conductor circuit 958-the via hole 960-the through hole 846-the via hole 960-the bump 876. On the other hand, the pad 892S1 for signal of the IC chip 890 is connected to the pad 895S1 for signal of the daughter board 894 through the bump 876-the via hole 960-the through hole 846-the via hole 960-the bump 876.

The pad 892P1 for power supply of the IC chip 890 is connected to the first electrode 821 of the chip capacitor 820 through the bump 876-the via hole 960-the conductor circuit 858-the via hole 860. On the other hand, the pad 895P1 for power supply of the daughter board 894 is connected to the first electrode 821 of the chip capacitor 820 through the bump 876-the via hole 960-the through hole 846-the conductor circuit 858-the via hole 860.

The pad 892P2 for power supply of the IC chip 890 is connected to the second electrode 822 of the chip capacitor 820 through the bump 876-the via hole 960-the An conductor circuit 858-the via hole 860. On the other hand, the pad 895P2 for power supply of the daughter board 894 is connected to the second electrode 822 of the chip capacitor 820 through the bump 876-the via hole 960-the through hole 846-the conductor circuit 858-the via hole 860.

In the printed circuit board 810 of this embodiment, the chip capacitors 820 are placed immediately below the IC chip 890. The distance from the IC chip to each capacitor is shortened, and therefore, electric power can be instantaneously supplied to the IC chip. That is, the loop length which determines the loop inductance can be shortened.

In addition, the through hole 846 is formed between the chip capacitors 820, and no signal line passes through the chip capacitors 820. In this structure, there is no problem that the impedance becomes discontinuous by the high dielectric body to generate a reflection, and that the transmission is delayed by passing through the high dielectric body.

The external substrate (i.e. daughter board) 894 to be connected to the back surface of the printed circuit board is connected to the first electrode 821 and the second electrode 822 of the capacitor 820 through the via holes 860 formed in the connection layer 840 on the side of IC chip and the through holes 846 formed in the core substrate 830. That is, although the accommodation layer 830a having a core material is hard to process, though holes are formed in the accommodation layer 830a so that the terminals of the capacitors are not directly connected to the outside surface. As a result, the reliability of the connection can be increased.

In this embodiment, as shown in FIG. 63, an adhesive 836 is interposed between the lower surface of the penetrating openings 837 of the core substrate 830 and the chip capacitor 820. In addition, a resin filling agent 836a is charged in a space between the side surface of the penetrating openings 837 and the chip capacitor 820. The thermal expansion coefficients of the resin layer 836 and the resin filling agent 836a provided on the bottom surface of the chip capacitor 820 are set to the values lower than those of the core substrate 830 and the connection layer 840, that is, are set to the values close to that of the chip capacitor 820 made of ceramics. In this manner, even if internal stress is generated between the core substrate 830 and the connection layer 840, and the chip capacitor 820 caused by the difference in the thermal expansion coefficients therebetween, cracks and peelings do not easily occur in the core substrate and the connection layer 840. As a result, high reliability can be attained. In addition, the generation of migration can be prevented.

The process of manufacturing the printed circuit board of the fifth embodiment will be described with reference to FIGS. 60 to 63.

(1) Four prepregs 835 impregnated with an epoxy resin are laminated on top of each other to form a laminated plate 832a, and a penetrating opening 837 for accommodating a chip capacitor is formed in the laminated plate 832a. On the other hand, two prepregs 835 are laminated on top of each other to form a laminated plate 832b (FIG. 60(A)). The prepreg 835 may be impregnated with, instead of the epoxy resin, BT, phenolic resin, or reinforcement material such as glass cloth. It is impossible, however, to use substrates made of ceramic and AlN as the core substrate. These substrates are poor in outer shape processing characteristics, and cannot accommodate capacitors in some cases. In addition, a space is created inside the substrate even if it is filled with a resin. The laminated plate 832a and the laminated plate 832b are laminated to each other to form an accommodation layer 830a. Then, as described above referring to FIG. 66(B), chip capacitors 820 from which a coating layer 828 on the first and second electrodes 821, 822 is peeled are accommodated (FIG. 60(B)). It is preferable that an adhesive 836 is interposed between the penetrating openings 837 and the chip capacitor 820. The resin and interlayer resin insulating layer used in this invention has melting points of 300° C. or lower. Therefore, when heat higher than 350° C. is applied, the resin and interlayer resin insulating layer may be dissolved, softened, or carbonized.

(2) The resin film 840a (i.e. a connection layer) is laminated on both sides of the accommodating layer constituted by the laminated plate 832a and the laminated plate 832b and accommodating the chip capacitors 820 (FIG. 60(C)), and are pressed from both sides to flatten the surface. Then, heating and curing is conducted to form a core substrate 830 constituted by the accommodating layer 830a accommodating the chip capacitors 820 and the connection layer 840 (FIG. 60(D)). In this embodiment, the accommodating layer 830a which accommodates the capacitors 820 and the connection layer 840 are bonded to each other by application of pressure from both sides to form the core substrate 830. As a result, the core substrate 830 has a flat surface. The interlayer resin insulating layer 850 and the conductor circuit 958 can be laminated in a later step in such a manner that high reliability is attained.

(3) It is preferable that a resin filling agent 836a is charged in the side surface of the penetrating openings 837 of the core substrate to increase the air tightness. In this embodiment, the resin film 840a may be a resin film of the same type as that used in the first embodiment which has no metal layer. As an alternative to this, a resin film (RCC) having a metal layer on its one side may be used. That is, it is possible to use a both-sided plate, a one-sided plate, a resing plate having no metal film, and a resin film.

(4) Penetrating openings 846a each having a diameter of 300 to 500 $\mu$m for through hole are formed in the core substrate and the interlayer resin insulating layer 850 with a drill (FIG. 61(A)). Non-penetrating openings 848 extending to the first and second electrodes 821, 822 are formed in the upper interlayer resin insulating layer 850 by CO2 laser, YAG laser, excimer laser, or UV laser (FIG. 61(B)). As the case may be, an area mask on which through holes are penetrated at positions corresponding to the positions of the non-penetrating openings is mounted, and an area processing is conducted by a laser. In the case where it is desired to form via holes having different sizes and diameter from each other, the lasers may be used to form the via holes.

(5) A desmear process is performed. Subsequently, a palladium catalyst is provided to the substrate 830, and then, the core substrate 830 is immersed into an electroless plating solution to cause the electroless plated film to uniformly precipitate an electroless plated film 852 (FIG. 61(C)). As a result of this, a rough in layer can be formed on the surface of the electroless copper plated film 852. The rough surface has Ra (mean roughness height) of 0.01 to 5 $\mu$m, and especially preferable is Ra of 0.5 to 3 $\mu$m.

(6) A photosensitive dry film is attached on the surface of the electroless plated film 852, and a mask is mounted thereon. Exposure to light and development are performed to form a resist 854 having a predetermied pattern (FIG. 62(A)). In this embodiment, an electroless plating is employed. Alternatively, a metal film of copper, nickel and the like may be formed by sputtering. The sputtering is disadvantageous from the viewpoint of cost, but is advantageous in that the adhesion with the resin film can be improved. The core substrate 830 is immersed in an electrolytic plating solution, and a current is allowed to flow in the core substrate 830 through the electroless plated film 852 to precipitate an electrolytic copper plated film 856 (FIG. 62(B)). The resist 854 is peeled by 5% KOH, and the electroless plated film 852 below the resist 854 is etched with a mixed solution of sulfuric acid and hydrogen peroxide to be dissolved and removed. As a result, via holes 860 are formed in the non-penetrating openings 848 of the connection layer 840, a conductor circuit 858 is formed on the surface of the connection layer 840, and through holes 846 are formed in the penetrating openings 846a of the core substrate 830 (FIG. 62(C)). The subsequent processes are the same as the steps (10) to (15) of the second embodiment which has been described above, and therefore, their description will be omitted.

The processes of mounting the IC chip on the printed circuit board, and attaching the printed circuit board to the daughter board are the same as those of the first embodiment, and their description will be omitted.

First Modification of Fifth Embodiment

Figure 65:
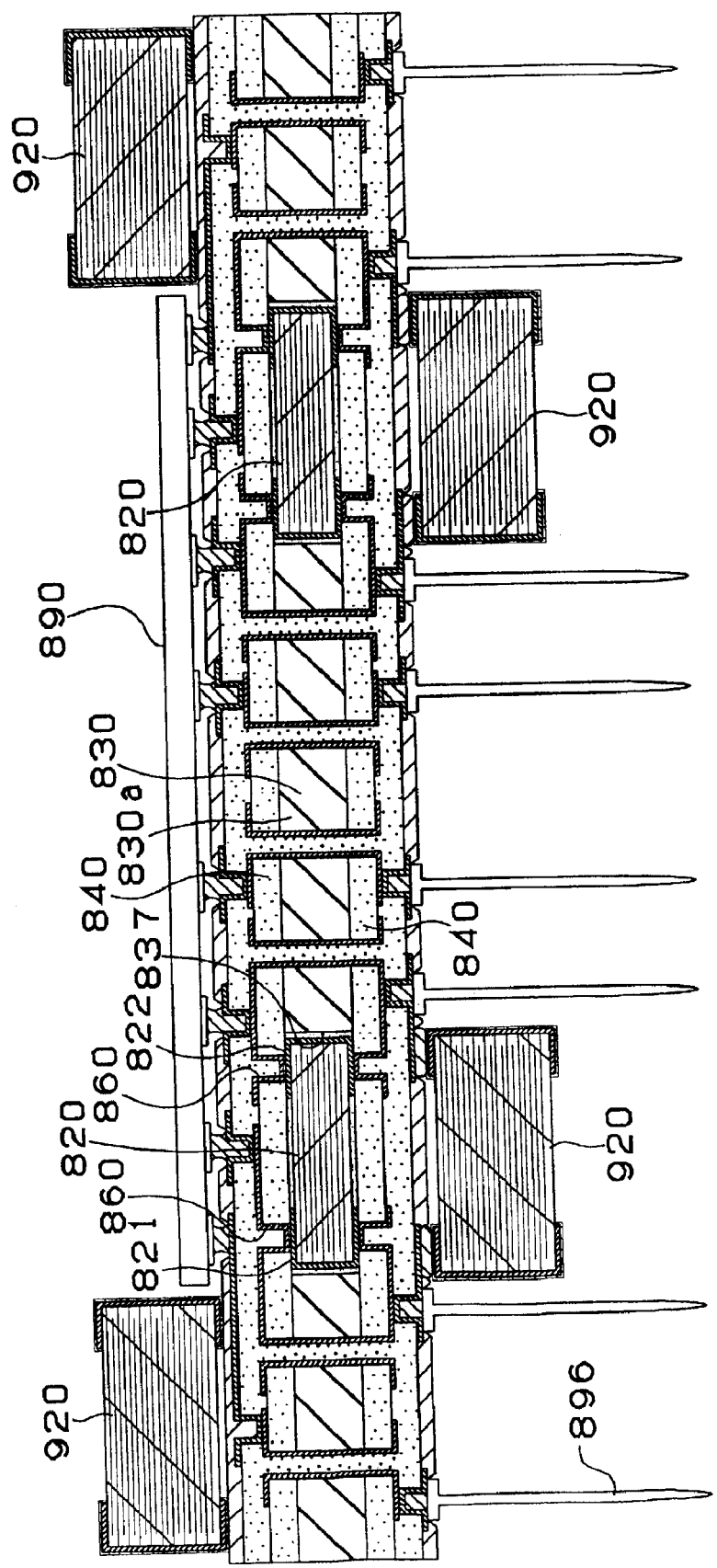
FIG. 65 is a diagram showing a cross section of the printed circuit board according to a first modification of the fifth embodiment.

A printed circuit board according to a first modification of the fifth embodiment of this invention will be described with reference to FIG. 65. In the printed circuit board of the first modification, conductive pins 896α are provided, and a connection with the daughter board is established through the conductive pins 896. A core substrate 830 is constituted by an accommodation layer 830a having penetrating opening 837, and connection layers 840 provided on both sides of the accommodation layer 830a. Via holes 860 for establishing connection between the electrodes 821, 822 of the chip capacitors 820 and the IC chip 890 and the conductive pins 896 are formed in the connection layers 840 provided on both sides of the accommodation layer 830a. In this first modification, as shown in FIG. 66(C), the coating of the electrodes 821, 822 of the chip capacitors 820 is completely removed.

Whereas in the fifth embodiment described above, chip capacitors 820 are accommodated in the core substrate 830 alone, in the first modification, chip capacitors 920 each having a large capacity are mounted on the front surface and back surface of the core substrate 830.

The IC chip conducts a complicated calculation, and in the calculation processing, it instantaneously consumes a large electric power. In order to provide a large electric power to the IC chip, in the first modification, chip capacitors 820 for power supply and chip capacitors 920 are provided to the printed circuit board. The effect of providing the chip capacitors 820 and 920 is the same as that attained in the fourth modification of the first embodiment, and therefore, its description will be omitted.

Second Modification of Fifth Embodiment

Figure 67:
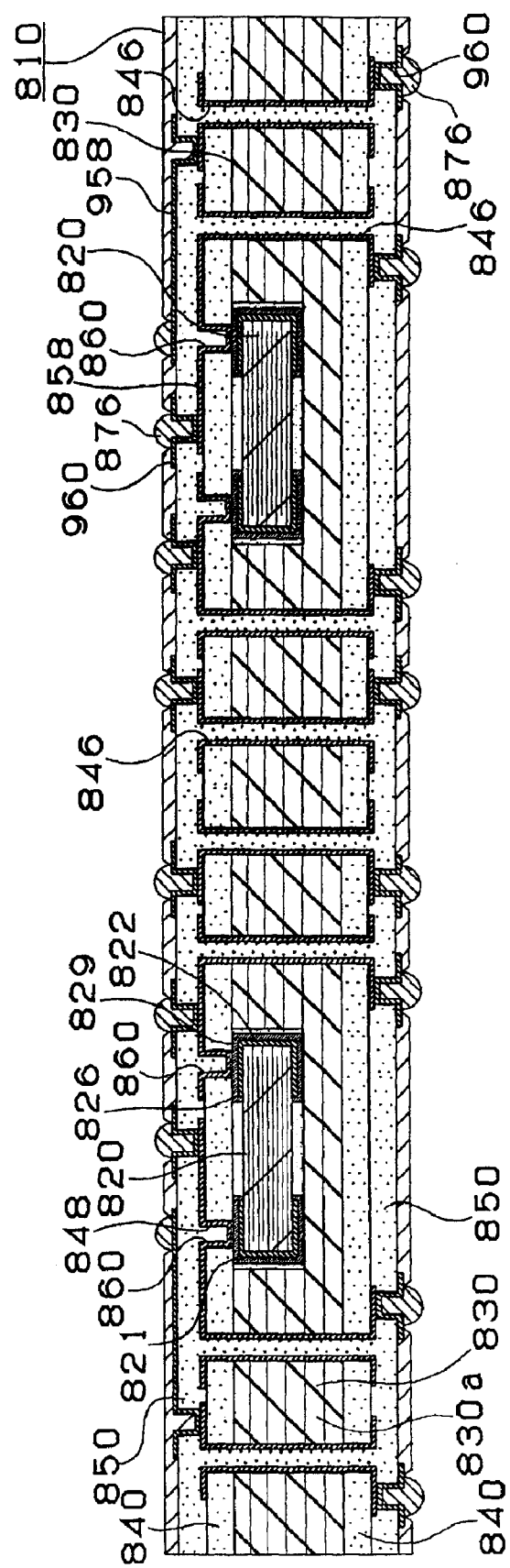
FIG. 67 is a diagram showing a cross section of the printed circuit board according to a second modification of the fifth embodiment.

A printed circuit board according to a second modification of the fifth embodiment will be described referring to FIGS. 67 and 68.

The printed circuit board according to the second modification has the similar structure as of the fifth embodiment described above, except for the following points. That is, in the fifth embodiment, the coating of the electrodes 821, B22 of the chip capacitors 820 is partially peeled off to cause the surface of the metal layer 826 to be uncoated and exposed to the outside. Contrary to this, in the printed circuit board according to the second modification, in the chip capacitor 820, as shown in FIG. 68(A), the coating of the metal layer 826 is completely peeled, and then as shown in FIG. 68(B), a copper plated film 829 is coated on the surface of the metal layer 826. The coating of the plated film may be made of plating such as electrolytic plating and electroless plating. An electric connection for the first and second electrodes 821, 822 coated with the copper plated film 829 is established through via holes 860 constituted by a copper plating. The electrodes 821, 822 of the chip capacitor are metallized and has pits and projections on their surfaces. Therefore, the resin may be left in the pits and projections in the step of forming non-penetrating openings 848 in the connection layer 840 of the fifth embodiment shown in FIG. 61(B). The resin left in the pits and projections may cause a disconnection between the first and second electrodes 821, 822 and the via holes 860. Contrary to this, in the second modification, the surfaces of the first and second electrodes 821, 822 coated with the copper plated film 829 are flat and smooth. When the penetrating openings 848 are formed in the connection layer 840 formed on the electrodes, no resin is left on the surfaces of the electrodes 821, 822. When the via holes 860 are formed, the connection between the via holes 860 and the electrodes 821, 822 has increased reliability.

Since the via holes 860 are made by plating into the electrodes 821, 822 formed with the copper plated film 829, the electrodes 821, 822 are firmly connected to the via holes 860. No disconnection occurs between the electrodes 821, B22 and via holes 860 even when a heat cycle test is conducted.

The copper plated film 829 is formed after removing the coating layer 828 in the step of accommodating the chip capacitors in the printed circuit board. Alternatively, the copper plated film 829 may be directly provided onto the surface of the metal layer 826 in the step of manufacturing the chip capacitor 820. In the second modification, openings which extend to the copper plated film 829 of the electrodes are formed by a laser, and then a desmear process is performed to form via holes by copper plating. Therefore, even if an oxide film is formed on the surface of the copper plated film 829, the oxide film can be removed in the laser or desmear process. In this manner, the first and second electrodes 821, 822 can be properly connected to the via holes 860.

On the surface of the dielectric body 823 made of ceramic of the chip capacitor 820, a rough surface 823α may be formed. The rough surface 823α contributes to an increased adhesion between the chip capacitor 820 made of ceramic and the connection layer 840 made of resin, thereby avoiding the connection layer 840 from peeling from the interface with the chip capacitor 820 even when a heat cycle test is conducted.

Third Modification of Fifth Embodiment

Figure 69:
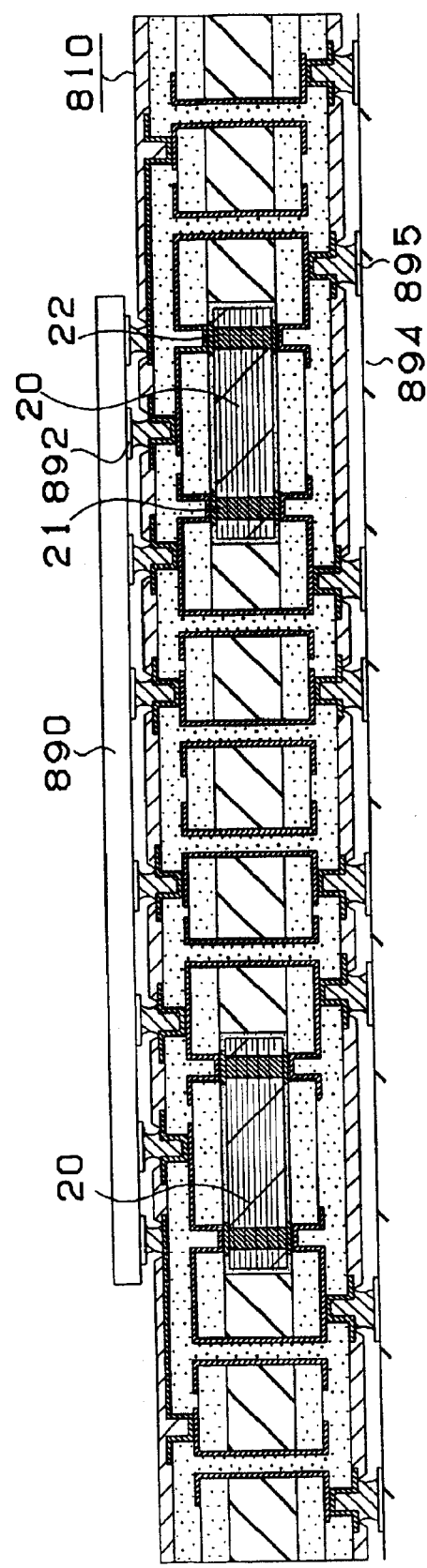
FIG. 69 is a diagram showing a cross section of the printed circuit board according to a third modification of the fifth embodiment.

A structure of a printed circuit board according to a third modification of the fifth embodiment will be described referring to FIGS. 69 and 18.

The printed circuit board 810 according to the third modification has the structure similar to that of the fifth embodiment, except for the structure of the chip capacitors 20 accommodated in the core substrate 830. FIG. 18 is a plan view showing the chip capacitors. FIG. 18(A) is a diagram showing a chip capacitor before being cut from which a plurality of pieces are to be obtained by cutting. In FIG. 18(A), a chain line shows the cutting line. In the printed circuit board described in the third modification, as shown in the plan view of FIG. 18(B). the first electrodes 21 and the second electrodes 22 are provide along the side ends of the chip capacitor. FIG. 18(C) is a diagram showing a chip capacitor before being cut from which a plurality of pieces are to be obtained by cutting according to the third modification. In FIG. 18(C), a chain line shows the cutting line. In the printed circuit board described in the third modification, as shown in the plan view of FIG. 18(D), the first electrodes 21 and the second electrodes 22 are provide inside the side ends of the chip capacitor.

In the third modification, the printed circuit board has a chip capacitor 20 in which the electrodes are formed along an inside of the outer edge thereof. Therefore, a chip capacitor having a large capacity can be used as the chip capacitor 20. In the third modification, the surface of the chip capacitors are subjected to roughening process.

Fourth Modification of Fifth Embodiment

A printed circuit board according to a fourth modification of the present invention will be described referring to FIGS. 70 and 19.

Figure 70:
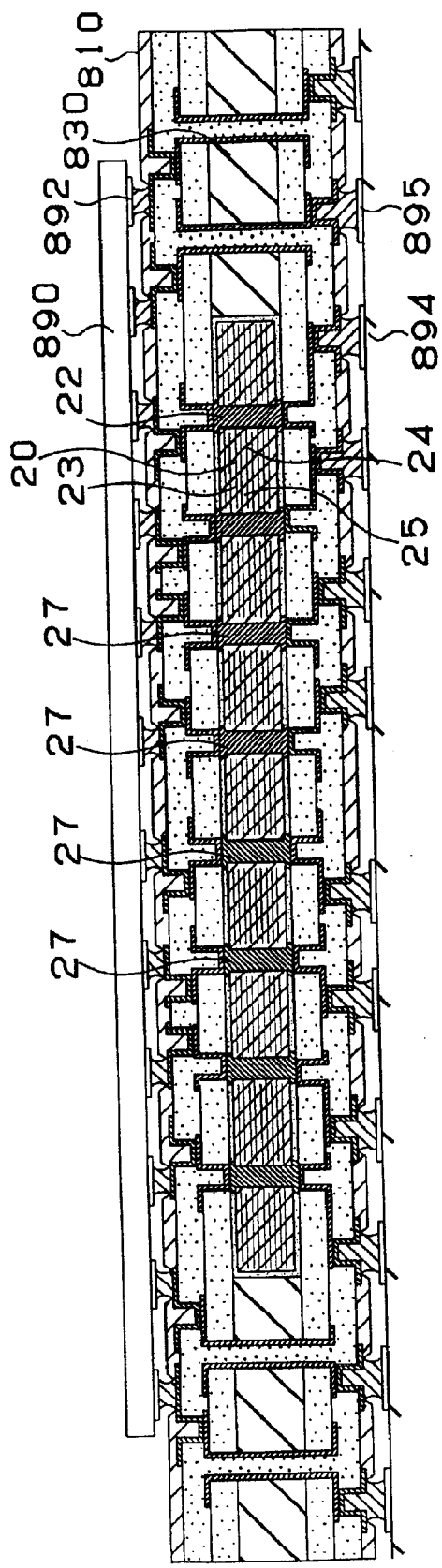
FIG. 70 is a diagram showing a cross section of the printed circuit board according to a fourth modification of the present invention.

FIG. 70 is a diagram showing a cross section of a printed circuit board 810 according to the fourth modification. FIG. 68 is a diagram showing a plan view of the chip capacitor 20 to be accommodated in the core substrate 830 of the printed circuit board 810. In the above-described fifth embodiment, a plurality of chip capacitors each having a small capacity are accommodated in the core substrate. Contrary to this, in the fourth modification, a large chip capacitor 20 having a large capacity and having electrodes formed in matrix is accommodated in the core substrate 830. The chip capacitor 20 includes first electrodes 21, second electrodes 22, a dielectric body 23, a first conductive film 24 connected to the first electrodes 21, a second conductive film 25 connected to the second electrodes 22, and electrodes 27 which are not connected to the first conductive film 24 and the second conductive film 25 and used for connecting the upper and lower surfaces of the chip capacitor. The chip capacitor is connected to the IC chip and the daughter board through the electrodes 27.

In the printed circuit board according to the fourth modification, the chip capacitor 20 having a large size is used. Therefore, a chip capacitor having a large capacity can be employed as the chip capacitor 20. In addition, the use of large-sized chip capacitor 20 prevents the warpage of the printed circuit board even if the printed circuit board is repeatedly subjected to heat cycle. In the fourth modification, the surface of the chip capacitors are subjected to roughening process.

Fifth Modification of Fifth Embodiment

Figure 71:
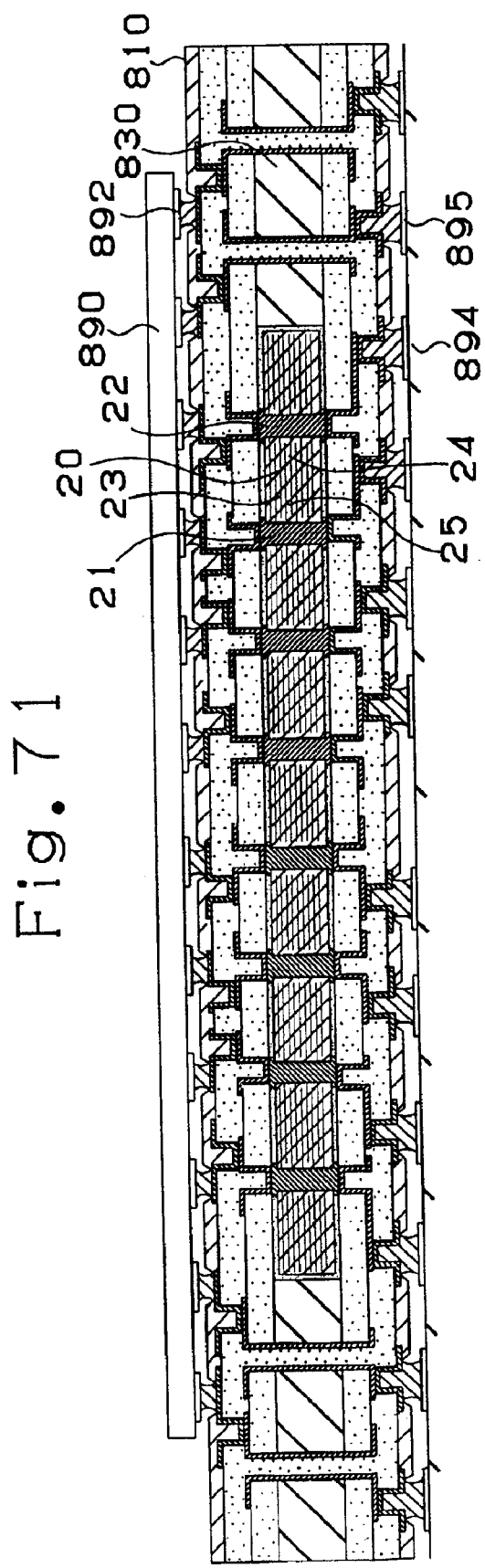
FIG. 71 is a diagram showing a cross section of the printed circuit board according to a fifth modification.

A printed circuit board according to a fifth modification will be described referring to FIGS. 71 and 20. FIG. 71 is a diagram showing a cross section of the printed circuit board. FIG. 20(A) is a diagram showing a chip capacitor before being cut from which a plurality of pieces are to be obtained by cutting. In FIG. 20(A), a chain line shows an ordinary cutting line. FIG. 20 (B) is a diagram showing a plan view of the chip capacitor. As shown in FIG. 20(B), a plurality of chip capacitors from each of which a plurality of pieces are to be obtained by cutting (in FIG. 20(B), three pieces) are connected into one piece unit having a large size.

In the fifth modification, the chip capacitor 20 having a large size is used. Therefore, a chip capacitor having a large capacity can be employed as the chip capacitor 20. In addition, the use of large-sized chip capacitor 20 prevents the warpage of the printed circuit board 810 even if the printed circuit board is repeatedly subjected to heat cycle. In the fifth modification, the surface of the chip capacitors are subjected to roughening process.

Sixth Modification of Fifth Embodiment

Figure 72:
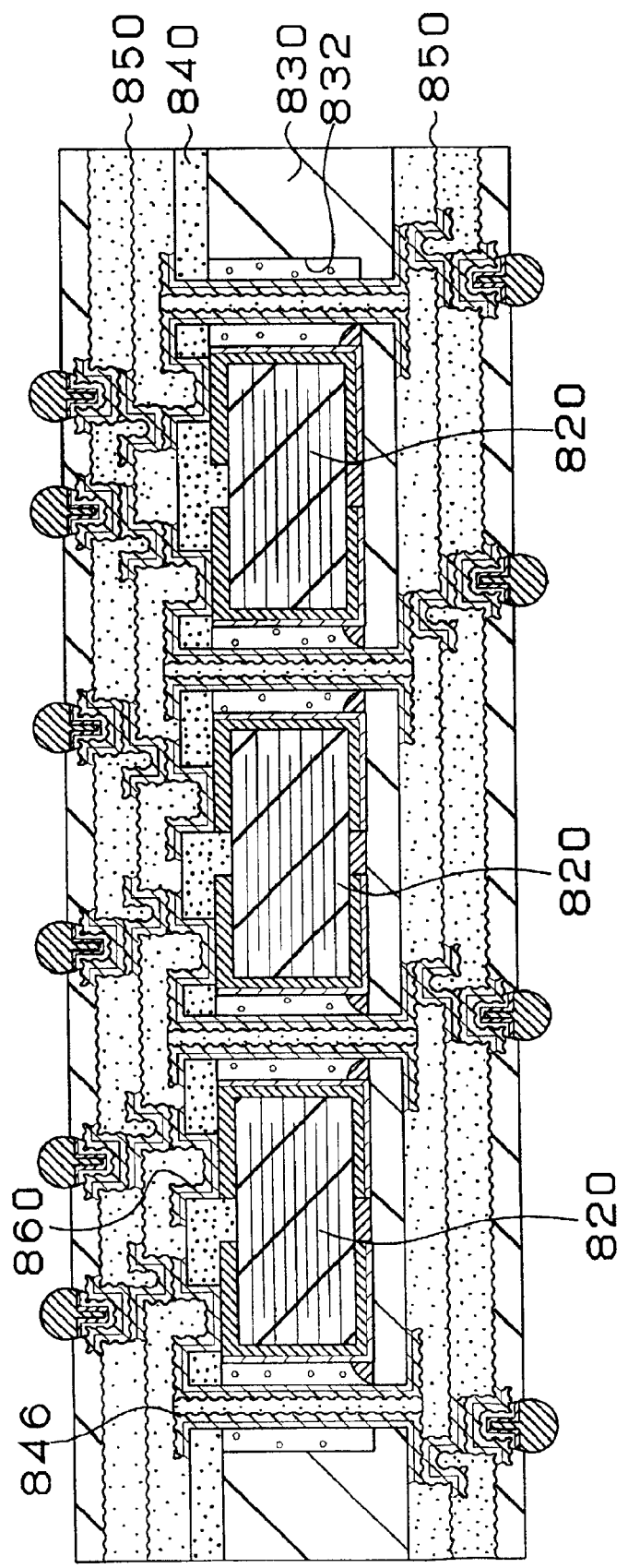
FIG. 72 is a diagram showing a cross section according to a sixth modification.

A printed circuit board according to a sixth modification will be described with reference to FIG. 72. FIG. 72 is a diagram showing a cross section of the printed circuit board. In the fifth modification described referring to FIG. 63, one chip capacitor 820 is accommodated in the cavity 832 of the core substrate 830. Contrary to this, in the sixth modification, a plurality of chip capacitors 820 are accommodated in the cavity 832. In the sixth modification, the chip capacitors can be incorporated in the core substrate with high density. In the sixth modification, the surface of the chip capacitors is subjected to roughening process.

In the above-described embodiment, the chip capacitor is incorporated in the printed circuit board. Instead of the chip capacitor, it is also possible to use a plate-like capacitor in which a conductive film is formed on a ceramic plate. In this embodiment, the surface of the chip capacitor is roughened to increase its adhesion with the resin insulating layer. Alternatively, the surface of the chip capacitor may be subjected to silane coupling process.

As to the printed circuit board of the second modification, the inductance of the chip capacitor 20 embedded in the core substrate, and the inductance of the chip capacitor mounted on the back surface of the printed circuit board (on the surface at the side of daughter board) are shown as follows. In the case of a single capacitor:

A capacitor of embedded type: 137 pH
    A capacitor of back surface mounted type: 287 pH In the case of eight capacitors connected in parallel:

Capacitors of embedded type: 60 pH
    Capacitors of back surface mounted type: 72 pH In both cases where a single capacitor is used and where a plurality of capacitors are connected in parallel to obtain an increased capacity, an inductance can be lowered by incorporating the chip capacitor.

Hereinafter, the results of reliability test will be described. In the test, the rate of change in the electrostatic capacity of a single chip capacitor in the printed circuit board of the second modification was measured.

Rate of change in electrostatic capacity (measured at a frequency of 100 Hz) (measured at a frequency of 1 kHz)

| | | |
|---|---|---|
| Steam 168 hours: | 0.3% | 0.4% |
| HAST 100 hours: | −0.9% | −0.9% |
| TS 1000 cycles: | 1.1% | 1.3% |

In the Steamtest, the chip capacitor was subjected to steam to be kept at a humidity of 100%. In the HAST test, the chip capacitor was left for 100 hours at a relative humidity of 100%, an applied voltage of 1.3V, and at a temperature of 121° C. In the TS test, the chip capacitor was left for 30 minutes at 125° C., and 30 minutes at 55° C., and this test was repeated 1000 times.

In the above-described reliability test, it was realized that the printed circuit board incorporating the chip capacitor attains a reliability of the same level as the conventional printed capacitor on which a capacitor is mounted on its surface. As described above, in the TS test, even if an internal stress is generated due to the difference in the thermal expansion coefficients between the capacitor made of ceramic, and the core substrate and the interlayer resin insulating layer made of resin, no problems are created such as a disconnection between the terminals of the chip capacitors and the via holes, a peeling of the chip capacitors from the interlayer resin insulating layer, and the cracks in the interlayer resin insulating layer. In this manner, high reliability can be attained over a long period of time.

According to the structure of the fifth embodiment, there is no problem of lowering the electric characteristics caused by inductance.

Under the conditions of the reliability test, neither deterioration in electric characteristics nor peeling and cracks in the printed circuit board are caused. Therefore, no problems are created between the chip capacitors and the via holes.

Since the resin is charged in the space between the core substrate and the capacitor, even if the stress caused by the capacitors is generated, the stress can be alleviated. In addition, no migration is created. As a result, neither peeling nor dissolution is caused between the electrodes of the capacitors and the connecting sections of the via holes. Due to these arrangements, the desired performance can be maintained in the reliability test.

In the case where the capacitor is coated with copper, the generation of migration can be prevented.

What is claimed is:

1. A printed circuit board arrangement comprising:
   a core substrate having a cavity therein, and
   a resin insulating layer and a conductor circuit laminated on the core substrate, and
   a plurality of capacitors accommodated in the cavity, wherein at least a part of electrodes of each capacitor is uncoated with a coating layer and exposed to the outside, and an electric connection for the electrode exposed from the coating layer is established by plating.

2. A printed circuit board arrangement according to claim 1, wherein each of the plurality of capacitors is a chip capacitor having electrodes formed along an inside of an outer edge thereof.

3. A printed circuit board arrangement according to claim 1, wherein each of the plurality of capacitors is a chip capacitor having electrodes formed in matrix.

4. A printed circuit board arrangement according to claim 1, wherein the plurality of capacitors are mounted on the surface of the printed circuit board.

* * * * *